US012628557B2

(12) United States Patent
Park et al.

(10) Patent No.: US 12,628,557 B2
(45) Date of Patent: May 12, 2026

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hyo-Soon Park, Gyeonggi-do (KR); Joon-Hyung Kil, Gyeonggi-do (KR); Kyoung-Jin Park, Gyeonggi-do (KR); Sang-Hee Cho, Gyeonggi-do (KR); So-Mi Park, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 920 days.

(21) Appl. No.: 17/883,537

(22) Filed: Aug. 8, 2022

(65) Prior Publication Data

US 2023/0128431 A1 Apr. 27, 2023

(30) Foreign Application Priority Data

Sep. 9, 2021 (KR) ........................ 10-2021-0120597

(51) Int. Cl.

| | |
|---|---|
| ***H01L 51/54*** | (2006.01) |
| ***H10K 85/60*** | (2023.01) |
| *H10K 50/11* | (2023.01) |
| *H10K 101/00* | (2023.01) |

(52) U.S. Cl.

CPC ....... *H10K 85/6572* (2023.02); *H10K 85/622* (2023.02); *H10K 85/631* (2023.02); *H10K 85/636* (2023.02); *H10K 85/654* (2023.02); *H10K 85/656* (2023.02); *H10K 85/6574* (2023.02); *H10K 85/6576* (2023.02); *H10K 50/11* (2023.02); *H10K 2101/90* (2023.02)

(58) Field of Classification Search

None

See application file for complete search history.

(56) References Cited

U.S. PATENT DOCUMENTS

| | | | | |
|---|---|---|---|---|
| 8,343,637 | B2 | 1/2013 | Parham et al. | |
| 2009/0026919 | A1* | 1/2009 | Stossel | C09K 11/06 313/504 |
| 2021/0328150 | A1* | 10/2021 | Park | H10K 85/654 |
| 2021/0359216 | A1* | 11/2021 | Kim | H10K 85/624 |

* cited by examiner

*Primary Examiner* — Andrew K Bohaty

(74) *Attorney, Agent, or Firm* — G. Creston Campbell

(57) ABSTRACT

The present disclosure relates to a plurality of host materials comprising at least one first host compound and at least one second host compound, and an organic electroluminescent device comprising the same. By comprising a specific combination of compounds according to the present disclosure as host materials, an organic electroluminescent device having a low driving voltage, high luminous efficiency, and long lifespan characteristics can be provided.

9 Claims, No Drawings

PLURALITY OF HOST MATERIALS AND ORGANIC ELECTROLUMINESCENT DEVICE COMPRISING THE SAME

TECHNICAL FIELD

The present disclosure relates to a plurality of host materials and an organic electroluminescent device comprising the same.

BACKGROUND ART

An organic electroluminescent device (OLED) was first developed by Eastman Kodak in 1987, by using small aromatic diamine molecules and aluminum complexes as materials for forming a light-emitting layer [Appl. Phys. Lett. 51, 913, 1987].

The light-emitting material of an OLED is the most important factor determining luminous efficiency of the device, and may be classified into a host material and a dopant material in a functional aspect. A light-emitting material can be used by mixing a host and a dopant in order to improve color purity, luminous efficiency, and stability. Generally, a device having excellent electroluminescent (EL) characteristics has a structure comprising a light-emitting layer formed by doping a dopant to a host. When using such a dopant/host material system as a light-emitting material, their selection is important since host materials greatly influence the efficiency and lifespan of the light-emitting device.

Generally, a device having excellent electroluminescent (EL) characteristics has a structure comprising a light-emitting layer formed by doping a dopant to a host. When using such a dopant/host material system as a light-emitting material, their selection is important since host materials greatly influence the efficiency and lifespan of the light-emitting device.

Recently, an urgent task is the development of an OLED having high efficiency and long lifespan characteristics. In particular, the development of highly excellent light-emitting material over conventional light-emitting materials is urgently required, considering the EL properties necessary for medium and large-sized OLED panels.

U.S. Pat. No. 8,343,637 B2 discloses a compound in which tetramethylphenanthrene is used as a linking group of a carbazole-carbazole compound as an example of a host material. However, the prior art does not disclose a specific device example and a synthesis method thereof, and does not use the same as a hole transport layer material.

DISCLOSURE OF THE INVENTION

Technical Problem

The object of the present disclosure is firstly, to provide a plurality of host materials which is able to produce an organic electroluminescent device having a low driving voltage, high luminous efficiency, and long lifespan characteristics, and secondly, to provide an organic electroluminescent device comprising the host materials.

Solution to Problems

As a result of intensive studies to solve the technical problem above, the present inventors found that the aforementioned objective can be achieved by a plurality of host materials comprising at least one first host material represented by the following formula 1 and at least one second host material represented by the following formula 2, so that the present invention was completed.

(1)

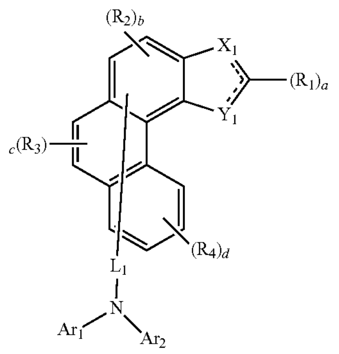

in formula 1, $X_1$ and $Y_1$ each independently represent, —N═, —$NR_5$—, —O— or —S—; provided that one of $X_1$ and $Y_1$ is —N═, and the other of $X_1$ and Y, is —$NR_5$—, —O— or —S—;

$R_1$ represents a substituted or unsubstituted (C6-C30)aryl or a substituted or unsubstituted (3- to 30-membered) heteroaryl;

$L_1$ represents a single bond, a substituted or unsubstituted (C6-C30)arylene, or a substituted or unsubstituted (3- to 30-membered)heteroarylene;

$Ar_1$ and $Ar_2$ each independently represent, a substituted or unsubstituted (C6-C30)aryl or a substituted or unsubstituted (3- to 30-membered)heteroaryl;

$R_2$ to $R_5$ each independently represent, hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)aryisilyl, a substituted or unsubstituted fused ring of (C3-C30) aliphatic ring and (C6-C30) aromatic ring, or -$L_2$-N(Ar')(Ar"); or may be linked to the adjacent substituents to form a ring(s);

$L_2$ represent a single bond, a substituted or unsubstituted (C6-C30)arylene, or a substituted or unsubstituted (3- to 30-membered)heteroalylene;

Ar' and Ar" each independently represent, a substituted or unsubstituted (C1-C30)alkyl, a substituted or unsubstituted (C2-C30)alkenyl, a substituted or unsubstituted fused ring of (C3-C30) aliphatic ring and (C6-C30) aromatic ring, a substituted or unsubstituted (C6-C30) aryl, or a substituted or unsubstituted (3- to 30-membered)heteroaryl;

a is 1, b and c each independently represent, an integer of 1 or 2, and d represents an integer of 1 to 4; and when b to d are an integer of 2 or more, each of $R_2$ to $R_4$ may be the same or different;

(2)

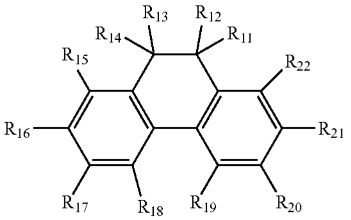

in formula 2, $R_{11}$ to $R_{14}$ each independently represent, *-$(L_3)_e$-$(Ar_3)_f$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, or a substituted or unsubstituted (3- to 30-membered)heteroaryl; or may be linked to the adjacent substituents to form a ring(s);

$R_{15}$ to $R_{22}$ each independently represent, *-$(L_3)_e$-$(Ar_3)_f$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted fused ring of (C3-C30) aliphatic ring and (C6-C30) aromatic ring, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)arylsilyl; or may be linked to the adjacent substituents to form a ring(s); provided that at least one of $R_{11}$ to $R_{22}$ is *-$(L_3)_e$-$(Ar_3)_f$;

$L_3$ represents a single bond, a substituted or unsubstituted (C6-C30)arylene, or a substituted or unsubstituted (3- to 30-membered)heteroarylene;

$Ar_3$ represents a substituted or unsubstituted (C6-C30)aryl or a substituted or unsubstituted (3- to 30-membered) heteroaryl;

e represents an integer of 1 to 4, and f represents an integer of 1 or 2; and when e and f are an integer of 2 or more, each of $L_3$ and each of $Ar_3$ may be the same or different.

Advantageous Effects of Invention

By comprising the specific combination of compounds according to the present disclosure as host materials, an organic electroluminescent device having a low driving voltage, high luminous efficiency, and long lifespan characteristics can be provided.

EMBODIMENTS OF THE INVENTION

Hereinafter, the present disclosure will be described in detail. However, the following description is intended to explain the invention, and is not meant in any way to restrict the scope of the invention.

The present disclosure relates to a plurality of host materials with at least one first host compound represented by formula 1 and at least one second host compound represented by formula 2, and an organic electroluminescent device comprising the host materials.

The term “a plurality of organic electroluminescent materials” in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. Such at least two compounds may be comprised in the same layer or different layers, and may be mixture-evaporated or co-evaporated, or may be individually evaporated.

Herein, “a plurality of host materials” means an organic electroluminescent material comprising a combination of at least two host materials. It may mean both a material before being comprised in an organic electroluminescent device (e.g., before vapor deposition) and a material after being comprised in an organic electroluminescent device (e.g., after vapor deposition). A plurality of host materials of the present disclosure may be comprised in any light-emitting layer constituting an organic electroluminescent device. The at least two compounds comprised in a plurality of host materials may be comprised together in one light-emitting layer, or may each be comprised in separate light-emitting layers. When at least two compounds are comprised in one light-emitting layer, two or more compounds may be mixture-evaporated to form a layer or may be individually and simultaneously co-evaporated to form a layer.

Herein, “(C1-C30)alkyl” is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, tert-butyl, sec-butyl, etc. Herein, the term “(C3-C30)cycloalkyl” is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. Herein, “(C6-C30)aryl(ene)” is a monocyclic or fused ring radical derived from an aromatic hydrocarbon having 6 to 30 ring backbone carbon atoms, in which the number of the ring backbone carbon atoms is preferably 6 to 20, more preferably 6 to 15, may be partially saturated, and may include a Spiro structure. Examples of the aryl specifically may be phenyl, biphenyl, terphenyl, quaterphenyl, naphthyl, binaphthyl, phenylnaphthyl, naphthylphenyl, fluorenyl, phenylfluorenyl, dimethylfluorenyl, diphenylfluorenyl, benzofluorenyl, diphenylbenzofluorenyl, dibenzofluorenyl, phenanthrenyl, benzophenanthrenyl, phenylphenanthrenyl, anthracenyl, benzanthracenyl, indenyl, triphenylenyl, pyrenyl, tetracenyl, perylenyl, chrysenyl, benzochrysenyl, naphthacenyl, fluoranthenyl, benzofluoranthenyl, tolyl, xylyl, mesityl, cumenyl, spiro[fluoren-fluoren]yl, spiro[fluoren-benzofluoren]yl, azulenyl, tetramethyl-dihydrophenanthrenyl, etc. More specifically, the aryl may be o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenyl, 4"-t-butyl-p-terphenyl-4-yl, o-biphenyl, m-biphenyl, p-biphenyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 1-naphthyl, 2-naphthyl, 1-fluorenyl, 2-fluorenyl, 3-fluorenyl, 4-fluorenyl, 9-fluorenyl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 1-anthryl, 2-anthryl, 9-anthryl, 1-phenanthryl, 2-phenanthryl, 3-phenanthryl, 4-phenanthryl, 9-phenanthryl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 3-fluoranthenyl, 4-fluoranthenyl, 8-fluoranthenyl, 9-fluoranthenyl, benzofluoranthenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc. Herein, "(3- to 30-membered) heteroaryl(ene)" is an aryl having 3 to 30 ring backbone atoms including at least one, preferably 1 to 4 heteroatoms selected from the group consisting of B, N, O, S, Si, P, Se, and Ge, in which the number of the ring backbone carbon atoms is preferably 3 to 30, and more preferably 5 to 20. The above heteroaryl(ene) may be a monocyclic ring, or a fused ring condensed with at least one benzene ring; and may be partially saturated. Also, the above heteroaryl or heteroarylene herein may be one formed by linking at least one heteroaryl or aryl group to a heteroaryl group via a single bond(s), and may include a spiro structure. Examples of the heteroaryl specifically may be a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, dibenzoselenophenyl, benzofuroquinolinyl, benzofuroquinazolinyl, benzofuronaphthiridinyl, benzofuropyrimidinyl, naphthofuropyrimidinyl, benzothienoquinolinyl, benzothienoquinazolinyl, benzothienonaphthirldinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzoimidazolyl, benzothiazolyl, benzoisothiazolyl, benzoisoxazolyl, benzoxazolyl, imidazopyridinyl, isoindolyl, indolyl, benzoindolyl, indazolyl, benzothiadiazolyl, quinolyl, isoquinolyl, cinnolinyl, quinazolinyl, quinoxalinyl, carbazolyl, azacarbazolyl, benzocarbazolyl, dibenzocarbazolyl, phenoxazinyl, phenanthridinyl, benzodioxolyl, indolizidinyl, acridinyl, silafluorenyl, gerrnafluorenyl, benzotriazolyl, phenazinyl, imidazopyridinyl, chromenoquinazolinyl, thiochromenoquinazolinyl, dimethyibenzopyrimidinyl, indolocarbazolyl, indenocarbazolyl, etc. More specifically, the heteroaryl may be 1-pyrrolyl, 2-pyrrolyl, 3-pyrrolyl, 2-pyridinyl, 3-pyridinyl, 4-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolizidinyl, 2-indolizidinyl, 3-indolizidinyl, 5-indolizidinyl, 6-indolizidinyl, 7-indolizidinyl, 8-indolizidinyl, 2-imidazopyridinyl, 3-imidazopyridinyl, 5-imidazopyridinyl, 6-imidazopyridinyl, 7-imidazopyridinyl, 8-imidazopyridinyl, 1-indolyl, 2-indolyl, 3-indolyl, 4-indolyl, 5-indolyl, 6-indolyl, 7-indolyl, 1-isoindolyl, 2-isoindolyl, 3 isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazol-1-yl, azacarbazol-2-yl, azacarbazol-3-yl, azacarbazol-4-yl, azacarbazol-5-yl, azacarbazol-6-yl, azacarbazol-7-yl, azacarbazol-8-yl, azacarbazol-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-Indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-Indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtha-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtha-[1,2-b]-benzofuranyl, 10-naphtho-[1,2-b]-benzofuranyl, 1-naphtho-[2,3-b]-benzofuranyl, 2-naphtha-[2,3-b]-benzofuranyl, 3-naphtho-[2,3-b]-benzofuranyl, 4-naphtha-[2,3-h]-benzofuranyl, 5-naphtha-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtha-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtha-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtha-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1 silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. Herein, the term "a fused ring of (C3-C30) aliphatic ring and (C6-C30) aromatic ring" means a ring formed by fusing at least one aliphatic ring having 3 to 30 ring backbone carbon atoms in which the number of carbon atoms is preferably 3 to 25, more preferably 3 to 18, and at least one aromatic ring having 6 to 30 ring backbone carbon atoms in which the number of carbon atoms is preferably 6 to 25, more preferably 6 to 18. For example, the fused ring may be a fused ring of at least one benzene and at least one cyclohexane, or a fused ring of at least one naphthalene and at least one cyclopentane, etc. Herein, the carbon atoms in the fused ring of (C3-C30) aliphatic ring and (C6-C30) aromatic ring may be replaced with at least one heteroatom selected from B, N, O, S, Si and P, preferably at least one heteroatom selected from N, O and S. The term "Halogen" in the present disclosure includes F, Cl, Br, and I.

In addition, "ortho (o)," "meta (m)," and "para (p)" are meant to signify the substitution position of all substituents. Ortho position is a compound with substituents, which are adjacent to each other, e.g., at the 1 and 2 positions on benzene. Meta position is the next substitution position of the immediately adjacent substitution position, e.g., a compound with substituents at the 1 and 3 positions on benzene. Para position is the next substitution position of the meta position, e.g., a compound with substituents at the 1 and 4 positions on benzene.

Herein, "a ring formed in linking to an adjacent substituent" means a substituted or unsubstituted (3- to 30-membered) mono- or polycyclic, alicyclic, aromatic ring, or a combination thereof, formed by linking or fusing two or more adjacent substituents, preferably may be a substituted or unsubstituted (5- to 25-membered) mono- or polycyclic, alicyclic, aromatic ring, or a combination thereof. Further, the formed ring may include at least one heteroatom selected from the group consisting of B, N, O, S, Si and P, preferably, N, O and S. According to one embodiment of the present disclosure, the number of atoms in the ring skeleton is 5 to 20; according to another embodiment of the present disclosure, the number of atoms in the ring skeleton is 5 to 15. In one embodiment, the fused ring may be, for example, a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted fluorene ring, a substituted or unsubstituted benzofluorene ring, a substituted or unsubstituted benzothiophene ring, a substituted or unsubstituted benzofuran ring, a substituted or unsubstituted indole ring, a substituted or unsubstituted indene ring, a substituted or unsubstituted benzene ring, or a substituted or unsubstituted carbazole ring, etc.

In addition, "substituted" in the expression "substituted or unsubstituted" means that a hydrogen atom in a certain functional group is replaced with another atom or functional group, i.e., a substituent, and substituted with a group to which two or more substituents are connected among the substituents. For example, "a substituent to which two or more substituents are connected" may be pyridine-triazine. That is, pyridine-triazine may be heteroaryl or may be interpreted as one substituent in which two heteroaryls are connected. The substituents of the substituent alkyl, the substituent alkenyl, the substituent heterocycloalkyl, the substituent aryl(ene), the substituent heteroaryl(ene), the substituent cycloalkyl, the substituent alkoxy, the substituent trialkylsilyl, the substituent dialkylarylsilyl, the substituent alkyldiarylsilyl, the substituent triarylsilyl, and the substituent fused ring of aliphatic ring and aromatic ring in the formulas of the present disclosure, each independently represent, at least one selected from the group consisting of deuterium; halogen; cyano; carboxyl; nitro; hydroxyl; phosphine oxide; (C1-C30)alkyl; halo(C1-C30)alkyl; (C2-C36) alkenyl; (C2-C30)alkynyl; (C1-C30)alkoxy, (C1-C30)alkylthio; (C3-C30)cycloalkyl; (C3-C30)cycloalkenyl; (3- to 7-membered)heterocycloalkyl; (C6-C30)aryloxy; (C6-C30) arylthio; (3- to 30-membered)heteroaryl unsubstituted or substituted with (C6-C30)aryl; (C6-C30)aryl unsubstituted or substituted with (3- to 30-membered)heteroaryl; tri(C1-C30)alkylsilyl; tri(C6-C30)arylsilyl; di(C1-C30)alkyl(C6-C30)arylsilyl; (C1-C30)alkyldi(C6-C30)arylsilyl; fused ring of (C3-C30) aliphatic ring and (C6-C30) aromatic ring; amino; mono- or di-(C1-C30)alkylamino; mono- or di-(C2-C30)alkenylamino; (C1-C30)alkyl(C2-C30)alkenylamino; mono- or di-(C6-C30)arylamino; (C1-C30)alkyl(C6-C30) arylamino; mono- or di-(3- to 30-membered) heteroarylamino; (C1-C30)alkyl(3- to 30-membered)heteroarylamino; (C2-C30)alkenyl(C6-C30)arylamino; (C2-C30)alkenyl(3- to 30-membered)heteroarylamino; (C6-C30)aryl(3- to 30-membered)heteroarylamino; (C1-C30)alkylcarbonyl; (C1-C30)alkoxycarbonyl; (C6-C30)arylcarbonyl; (C6-C30)arylphosphine; di(C6-C30)arylboronyl; di(C1-C30)alkylboronyl; (C1-C30)alkyl(C6-C30)arylboronyl: (C6-C30)ar(C1-C30)alkyl; and (C1-C30)alkyl(C6-C30)aryl. For example, the substituents of the above substituents may be deuterium; methyl; test-butyl; a substituted or unsubstituted phenyl; a substituted or unsubstituted biphenyl; a substituted or unsubstituted naphthyl; a substituted or unsubstituted chrysenyl; unsubstituted phenanthrobenzofuranyl; unsubstituted dibenzofuranyl; a substituted or unsubstituted pyridyl; and a substituted or unsubstituted carbazolyl, etc.

Hereinafter, the plurality of host materials according to one embodiment will be described.

A plurality of host materials according to one embodiment comprises a first host material including at least one compound represented by formula 1 and a second host material including at least one compound represented by formula 2.

The first host material as the host material according to one embodiment may be represented by the following formula 1.

(1)

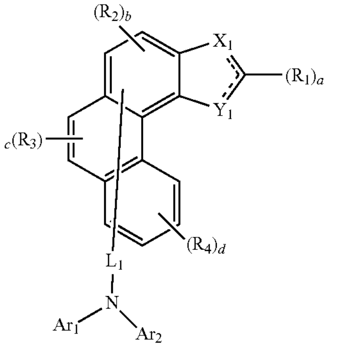

in formula 1, $X_1$ and $Y_1$ each independently represent, —N═, —$NR_5$—, —O— or —S—; provided that one of $X_1$ and $Y_1$ is —N═, and the other of $X_1$ and $Y_1$ is —$NR_5$—, —O— or —S—;

$R_1$ represents a substituted or unsubstituted (C6-C30)aryl or a substituted or unsubstituted (3- to 30-membered) heteroaryl;

$L_1$ represents a single bond, a substituted or unsubstituted (C6-C30)arylene, or a substituted or unsubstituted (3- to 30-membered)heteroarylene;

$Ar_1$ and $Ar_2$ each independently represent, a substituted or unsubstituted (C6-C30)aryl or a substituted or unsubstituted (3- to 30-membered)heteroaryl;

$R_2$ to $R_5$, each independently represent, hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30) aliphatic ring and (C6-C30) aromatic ring, or -$L_2$-N(Ar')(Ar"); or may be linked to the adjacent substituents to form a ring(s);

$L_2$ represents a single bond, a substituted or unsubstituted (C6-C30)arylene, or a substituted or unsubstituted (3- to 30-membered)heteroarylene;

Ar' and Ar" each independently represent, a substituted or unsubstituted (C1-C30)alkyl, a substituted or unsubstituted (C2-C30)alkenyl, a substituted or unsubstituted fused ring of (C3-C30) aliphatic ring and (C6-C30) aromatic ring, a substituted or unsubstituted (C6-C30) aryl, or a substituted or unsubstituted (3- to 30-membered)heteroaryl;

a is 1, b and c each independently represent, an integer of 1 or 2, and d represents an integer of 1 to 4; and when b to d are an integer of 2 or more, each of $R_2$ to $R_4$ may be the same or different.

In one embodiment, the compound represented by formula 1 may be represented by any one of the following formulas 1-1 to 1-4.

(1-1)

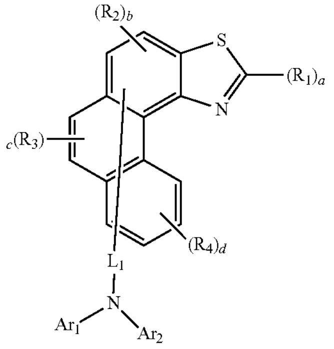

(1-2)

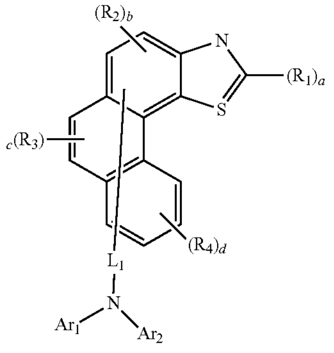

(1-3)

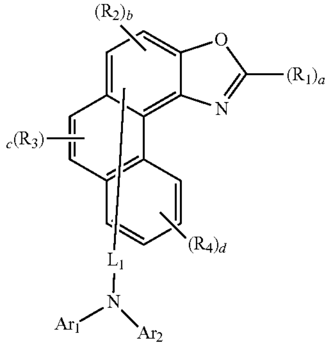

-continued (1-4)

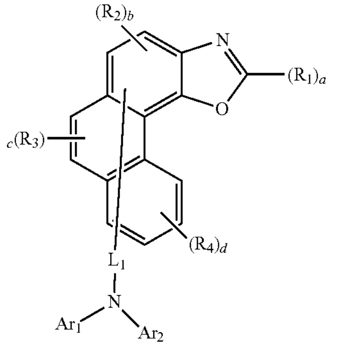

in formulas 1-1 to 1-4, $R_1$ to $R_4$, $Ar_1$, $Ar_2$, $L_1$ and a to d are as defined in formula 1.

According to one embodiment, $R_1$, $Ar_1$, and $Ar_2$ each independently may be, a substituted or unsubstituted phenyl, a substituted or unsubstituted naphthyl, a substituted or unsubstituted biphenyl, a substituted or unsubstituted terphenyl, a substituted or unsubstituted phenanthrenyl, a substituted or unsubstituted fluorenyl, a substituted or unsubstituted benzofluorenyl, a substituted or unsubstituted triphenylenyl, a substituted or unsubstituted anthracenyl, a substituted or unsubstituted spirobifluorenyl, a substituted or unsubstituted pyridyl, a substituted or unsubstituted triazinyl, a substituted or unsubstituted pyrimidinyl, a substituted or unsubstituted quinolyl, a substituted or unsubstituted quinazolinyl, a substituted or unsubstituted quinoxalinyl, a substituted or unsubstituted benzoquinazolinyl, a substituted or unsubstituted benzoquinoxalinyl, a substituted or unsubstituted benzofuropyridyl, a substituted or unsubstituted benzofuropyrimidinyl, a substituted or unsubstituted carbazolyl, a substituted or unsubstituted dibenzothiophenyl, a substituted or unsubstituted benzothiophenyl, a substituted or unsubstituted dibenzofuranyl, a substituted or unsubstituted benzofuranyl, a substituted or unsubstituted naphthyridinyl, a substituted or unsubstituted benzonaphthofuranyl, or a substituted or unsubstituted benzonaphthothiophenyl.

In one embodiment, $R_1$ may be a substituted or unsubstituted (C6-C30)aryl or a substituted or unsubstituted (5- to 30-membered)heteroaryl, preferably a substituted or unsubstituted (C6-C25)aryl or a substituted or unsubstituted (5- to 25-membered)heteroaryl, more preferably a substituted or unsubstituted (C6-C18)aryl or a substituted or unsubstituted (5- to 18-membered)heteroaryl. For example, $R_1$ may be phenyl, o-biphenyl, m-biphenyl, p-biphenyl, or pyridyl.

In one embodiment, $R_2$ to $R_5$ each independently may be, hydrogen or a substituted or unsubstituted (C6-C30)aryl, preferably hydrogen or a substituted or unsubstituted (C6-C25)aryl, more preferably hydrogen or a substituted or unsubstituted (C6-C18)aryl. For example, $R_2$ to $R_5$ each independently may be, hydrogen or phenyl.

In one embodiment, may be a single bond or a substituted or unsubstituted (C6-C30)arylene, preferably a single bond or a substituted or unsubstituted (C6-C25)arylene, more preferably a single bond or a substituted or unsubstituted (C6-C18)arylene. For example, may be a single bond, phenylene, or naphthalenylene.

In one embodiment, $Ar_1$ and $Ar_2$ each independently may be, a substituted or unsubstituted (C6-C30)aryl or a substituted or unsubstituted (5- to 30-membered)heteroaryl, preferably a substituted or unsubstituted (C6-C25)aryl or a substituted or unsubstituted (5- to 25-membered)heteroaryl, more preferably (C6-C25)aryl unsubstituted or substituted with at least one of a substituted or unsubstituted (C1-C30) alkyl, a substituted or unsubstituted (C6-C30)aryl, a substituted or unsubstituted (C3-C30)cycloalkyl, and a substituted or unsubstituted di(C8-C30)arylamino, or (5- to 18-membered)heteroaryl unsubstituted or substituted with at least one of a substituted or unsubstituted (C6-C30)aryl and a substituted or unsubstituted (5- to 30-membered)heteroaryl. For example, $Ar_1$ and $Ar_2$ each independently may be, phenyl unsubstituted or substituted with at least one of cyclohexane, phenyl, naphthyl, anthracenyl, fluorenyl substituted with phenyl, fluoranthenyl; phenoxazinyl, dibenzofuranyl, diphenylamino, pyridyl substituted with phenyl, and benzoimidazolyl substituted with phenyl, a substituted or unsubstituted o-biphenyl, a substituted or unsubstituted m-biphenyl, p-biphenyl unsubstituted or substituted with at least one of deuterium, methyl, and tert-butyl, a substituted or unsubstituted o-terphenyl, a substituted or unsubstituted m-terphenyl, a substituted or unsubstituted p-terphenyl, naphthyl unsubstituted or substituted with phenyl, a substituted or unsubstituted phenanthrenyl, a substituted or unsubstituted spirobifluorenyl, fluorenyl unsubstituted or substituted with at least one of methyl and phenyl, benzofluorenyl unsubstituted or substituted with at least one of methyl and phenyl, a substituted or unsubstituted anthracenyl, a substituted or unsubstituted C22 aryl, a substituted or unsubstituted benzothiophenyl, benzofuranyl unsubstituted or substituted with pyridyl, dibenzothiophenyl unsubstituted or substituted with phenyl, dibenzofuranyl unsubstituted or substituted with at least one of phenyl and pyridyl, carbazolyl unsubstituted or substituted with phenyl, a substituted or unsubstituted benzonaphthofuranyl, a substituted or unsubstituted benzonaphthothiophenyl, or a substituted or unsubstituted benzofuropyridyl.

According to one embodiment, the first host material represented by formula 1 may be more specifically illustrated by the following compounds, but is not limited thereto.

H1-1

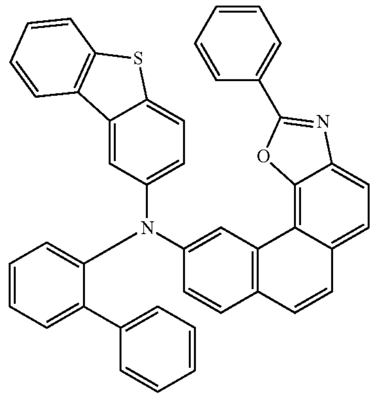

-continued
H1-2
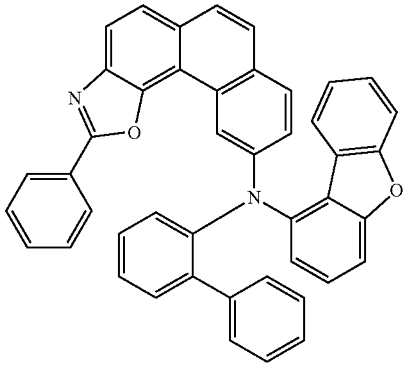
H1-3
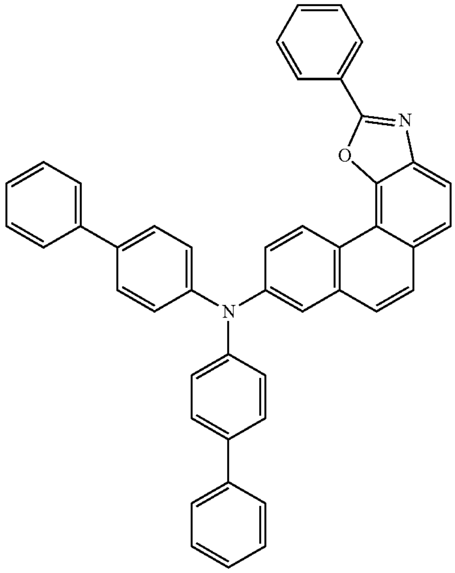
H1-4
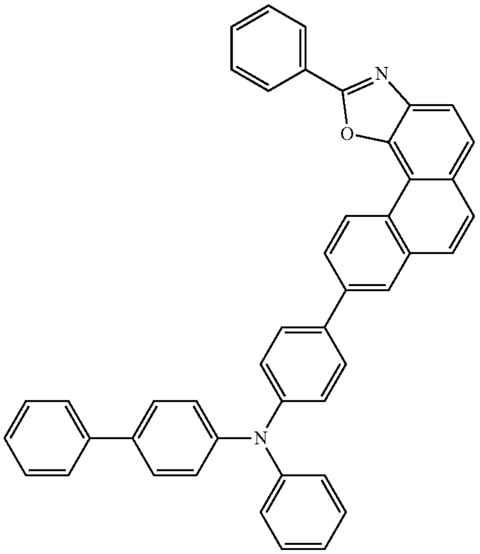
-continued
H1-5
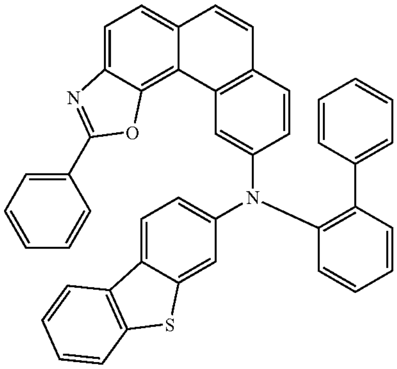
H1-6
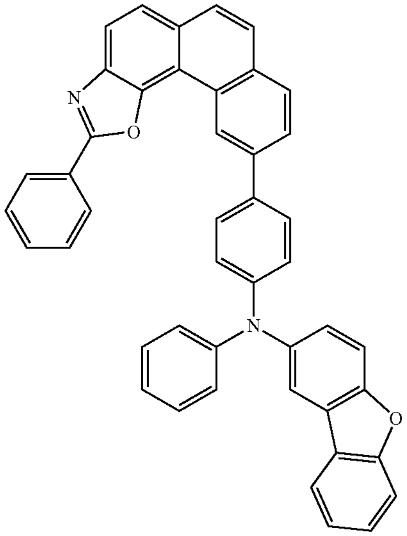
H1-7
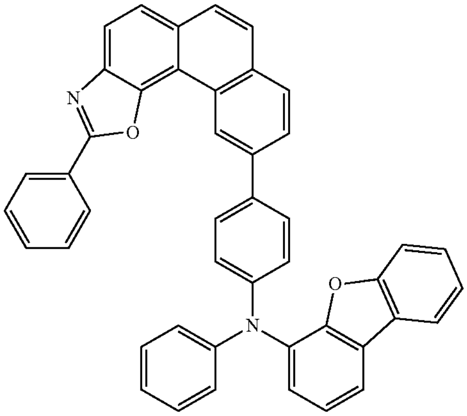

-continued
H1-8
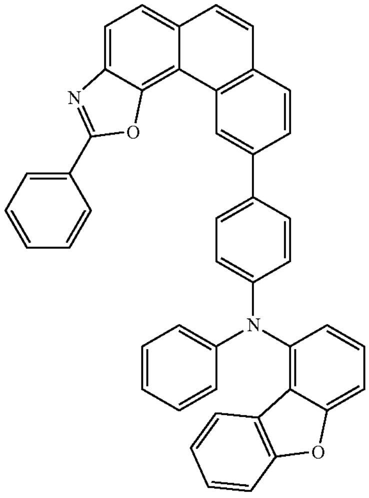
H1-9
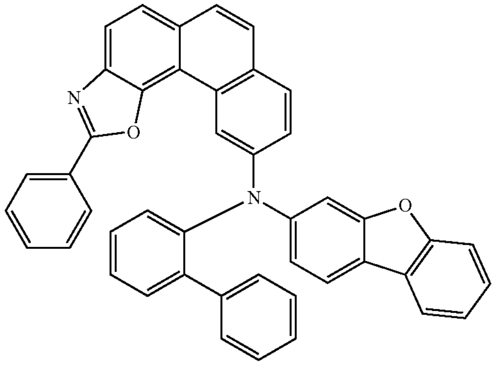
H1-10
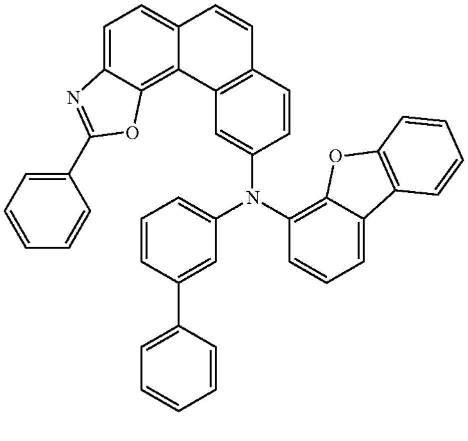
-continued
H1-11
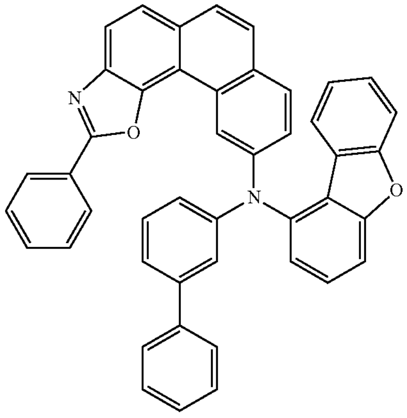
H1-12
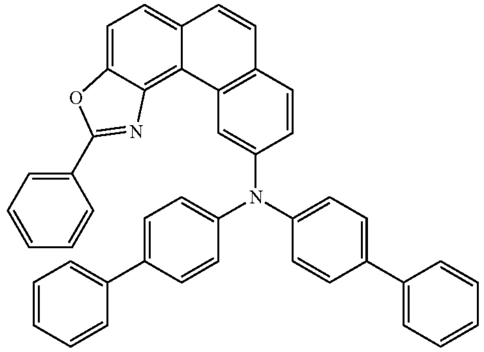
H1-13
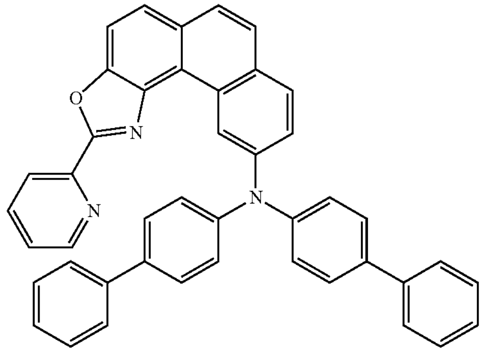
H1-14
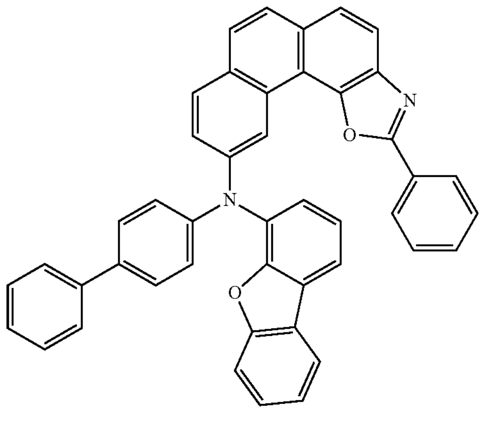

-continued
H1-15
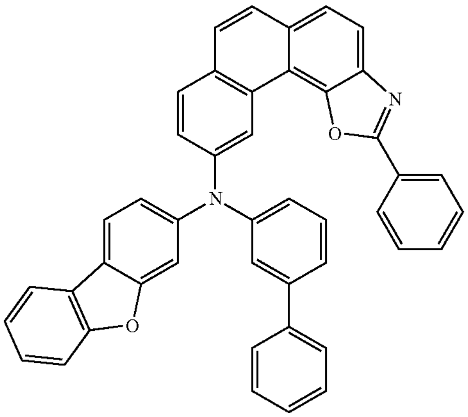
H1-16
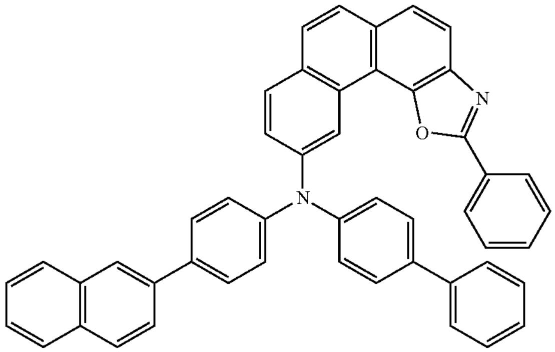
H1-17
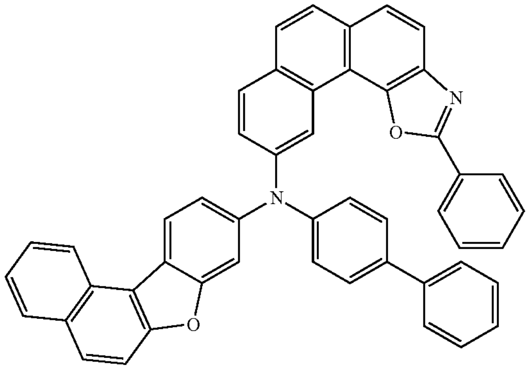
H1-18
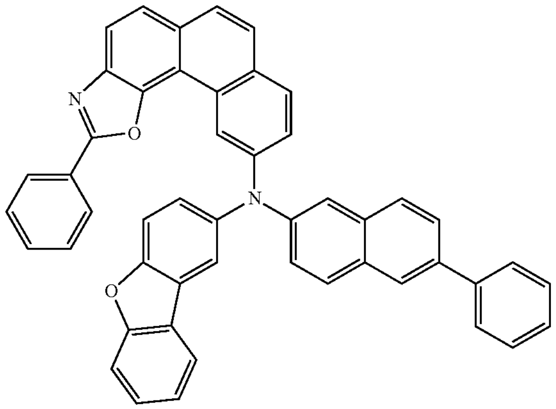
-continued
H1-19
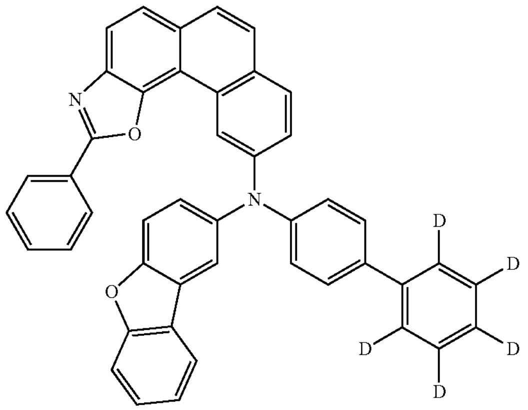
H1-20
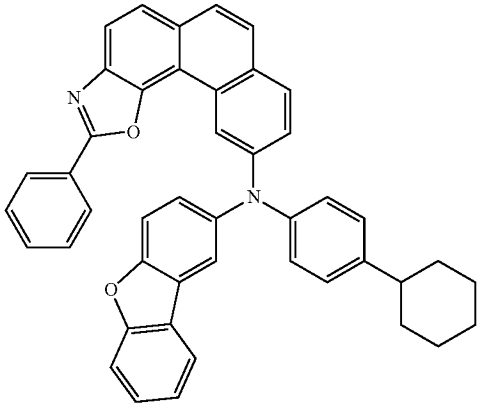
H1-21
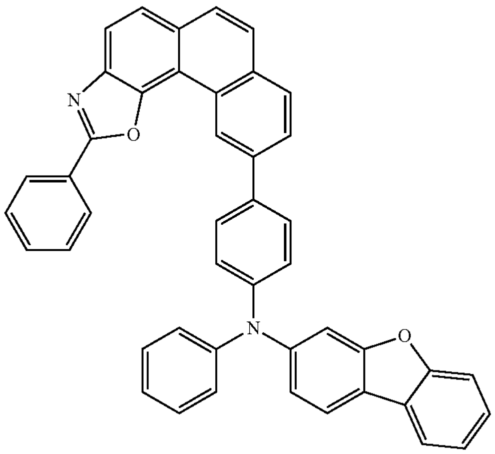

-continued
H1-22
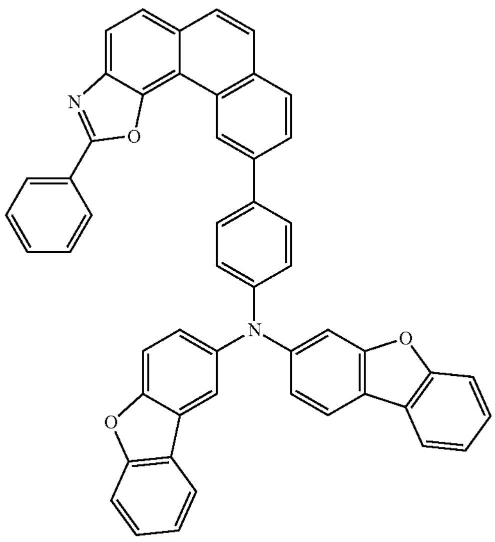
H1-23
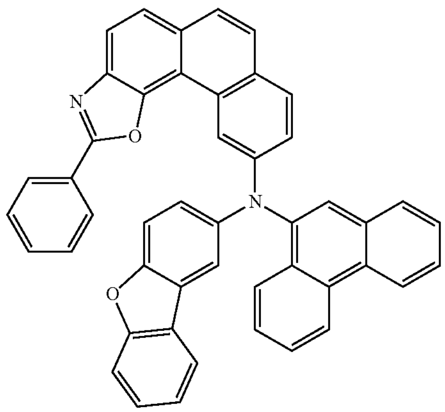
H1-24
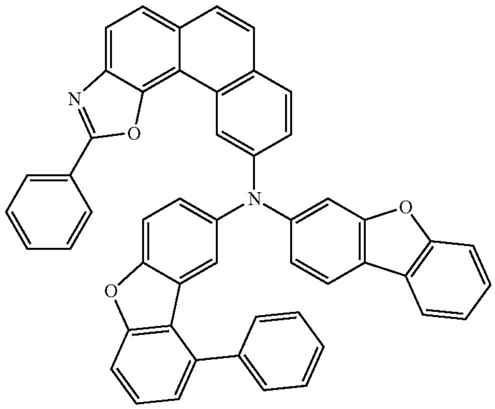
-continued
H1-25
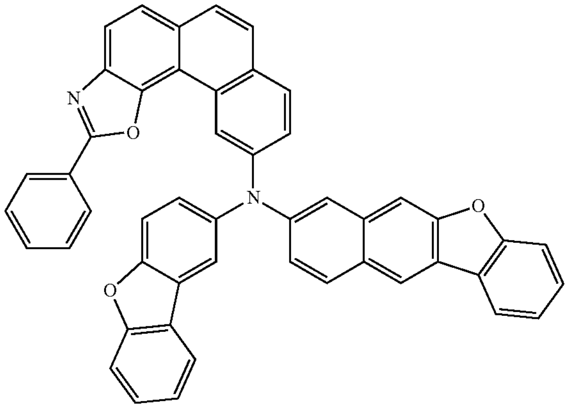
H1-26
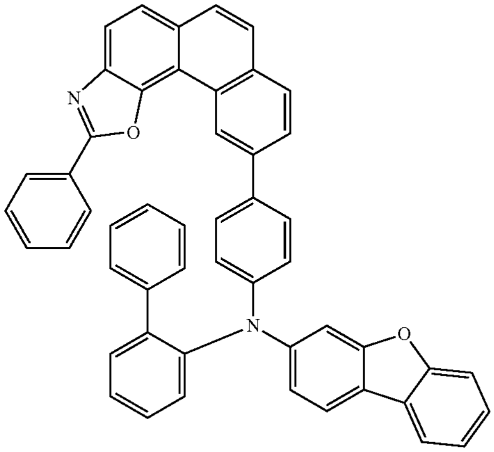
H1-27
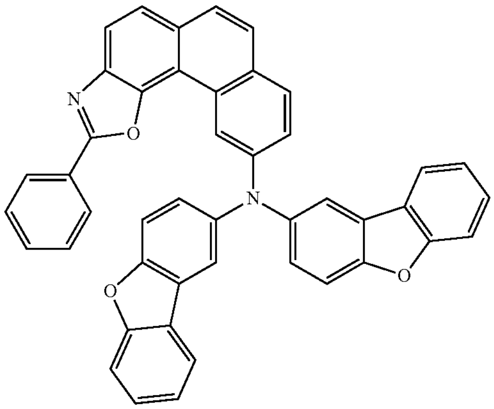

-continued
H1-28
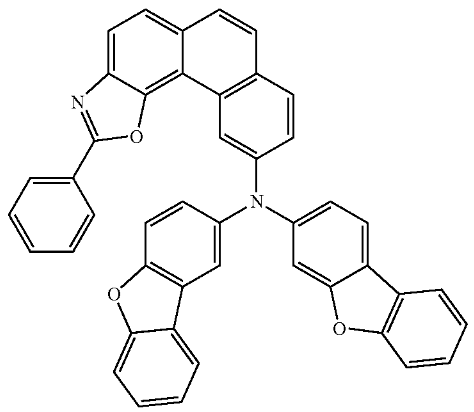
H1-29
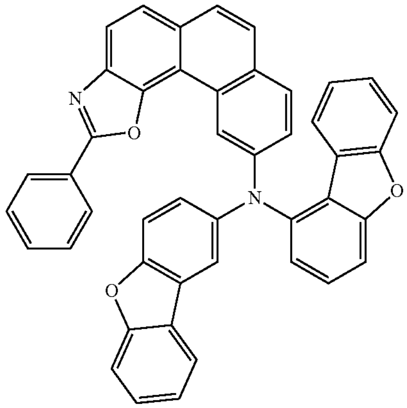
H1-30
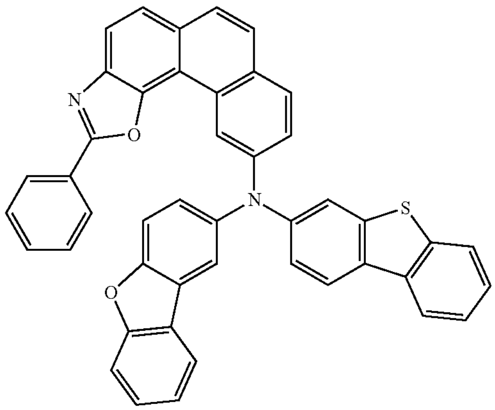
-continued
H1-31
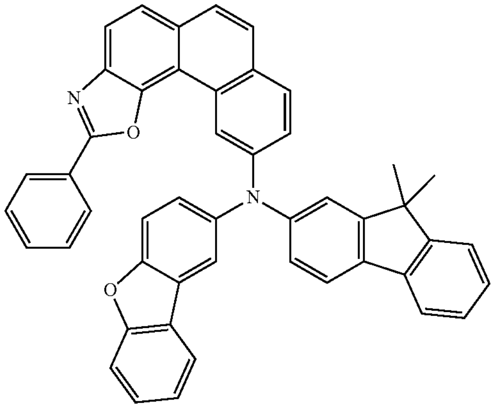
H1-32
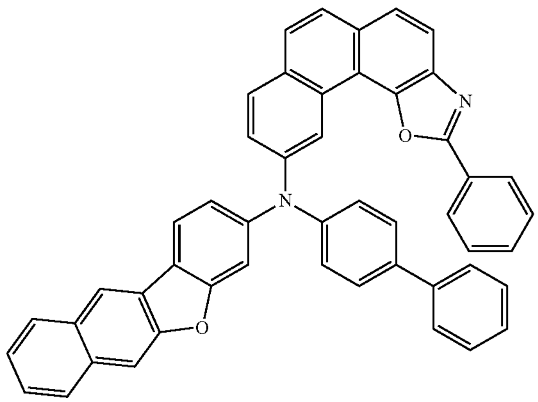
H1-33
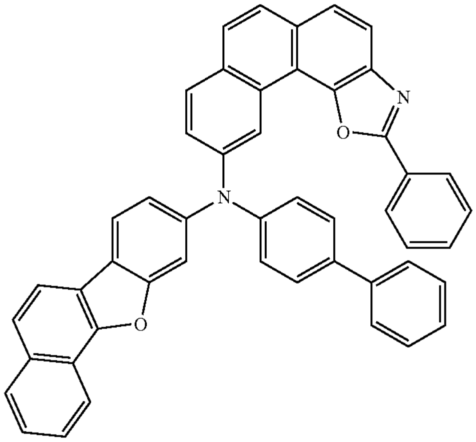

-continued
H1-34
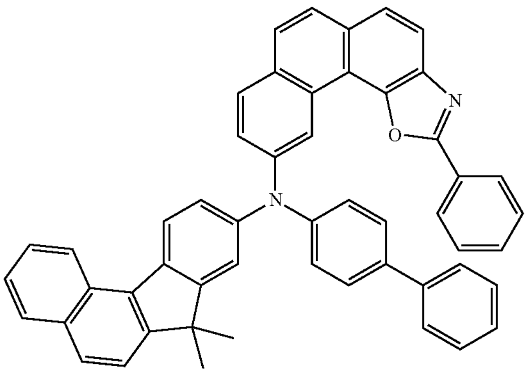
H1-35
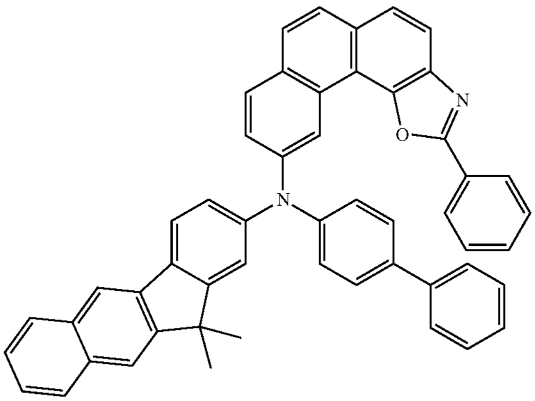
H1-36
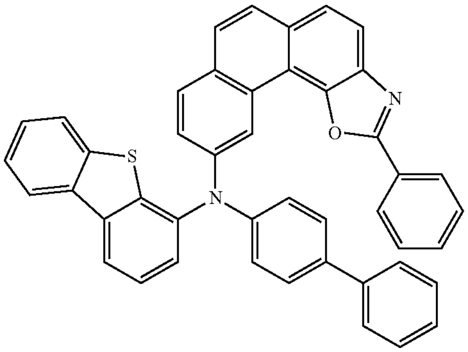
H1-37
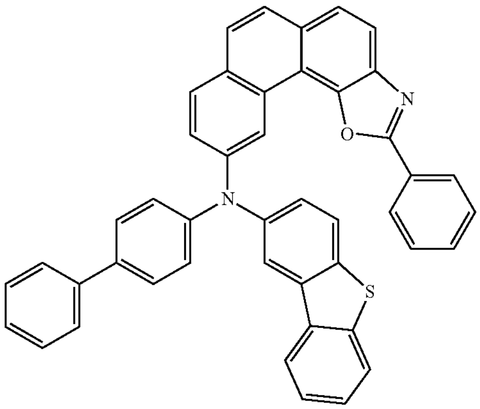
-continued
H1-38
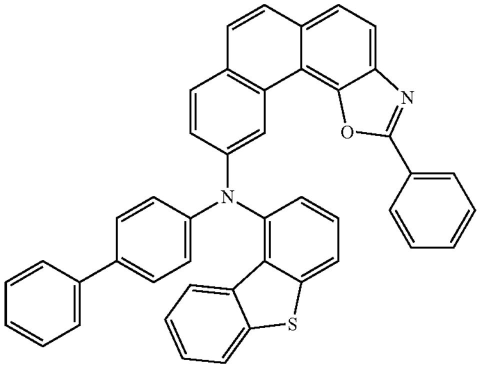
H1-39
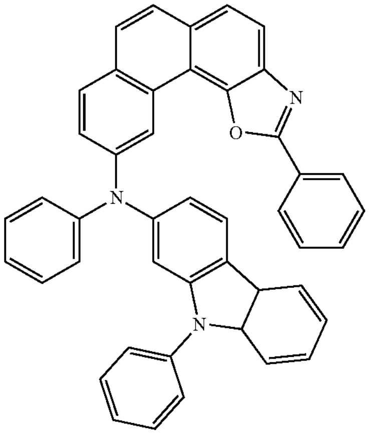
H1-40
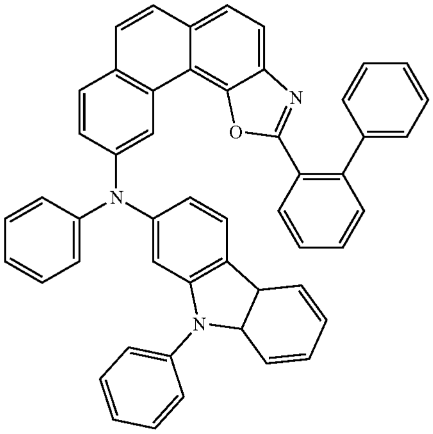
H1-41
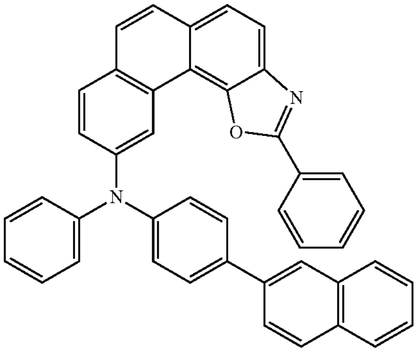

-continued
H1-42
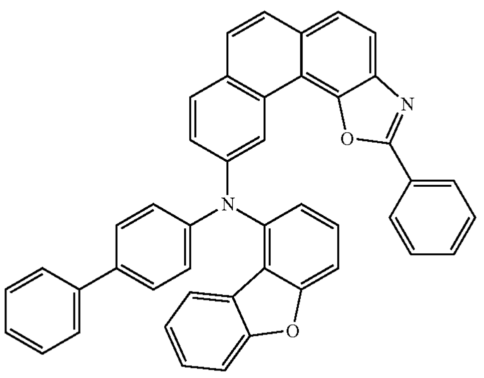
H1-43
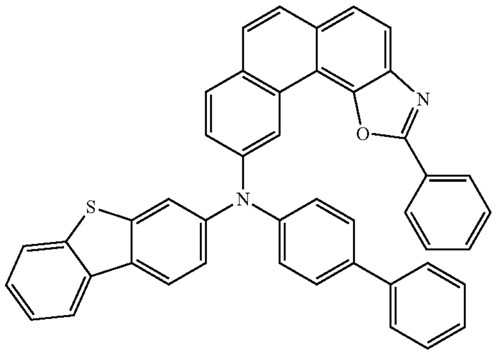
H1-44
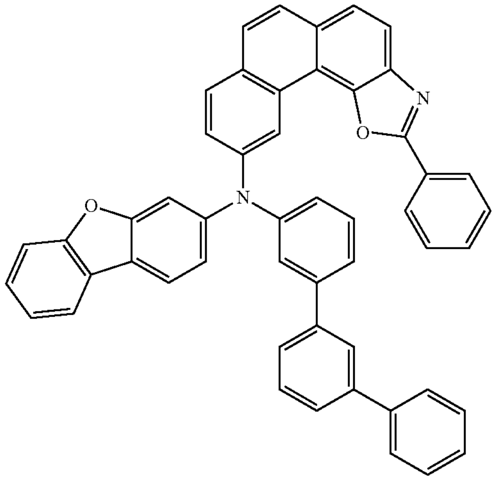
H1-45
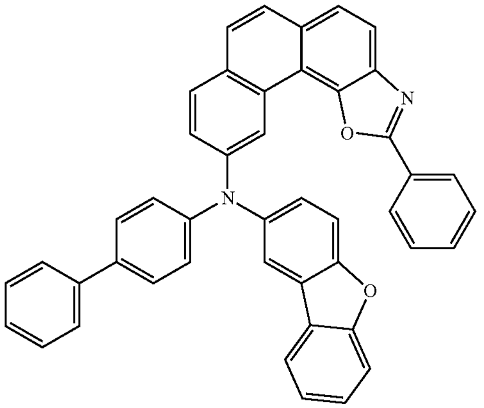
-continued
H1-46
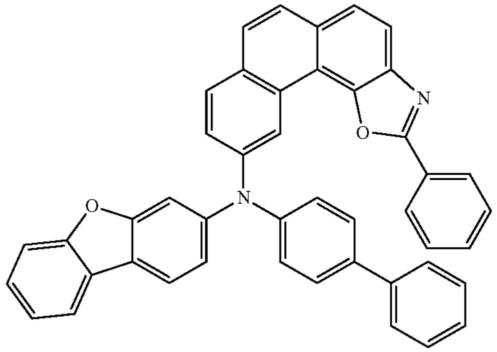
H1-47
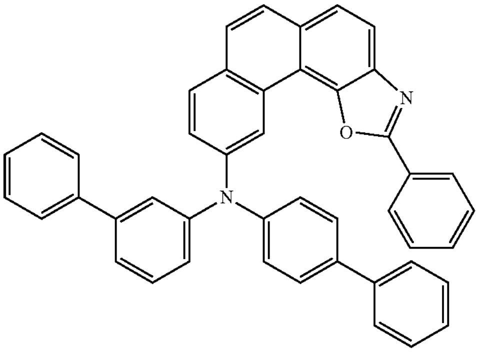
H1-48
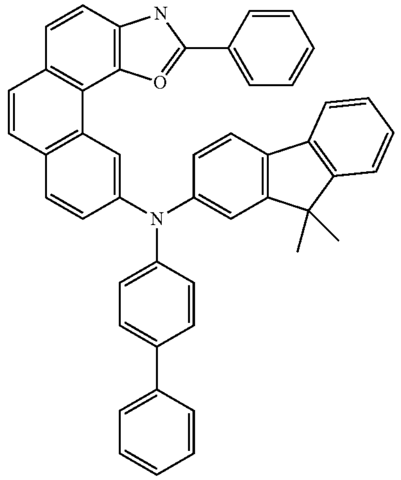
H1-49
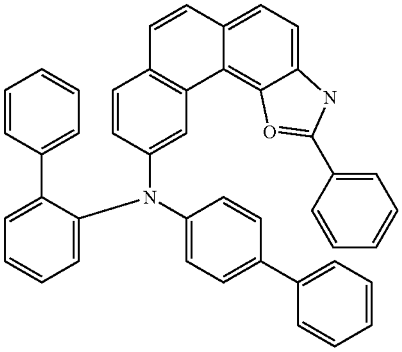

-continued
H1-50
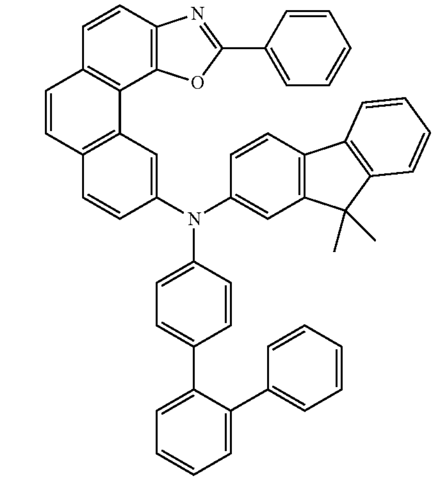
H1-51
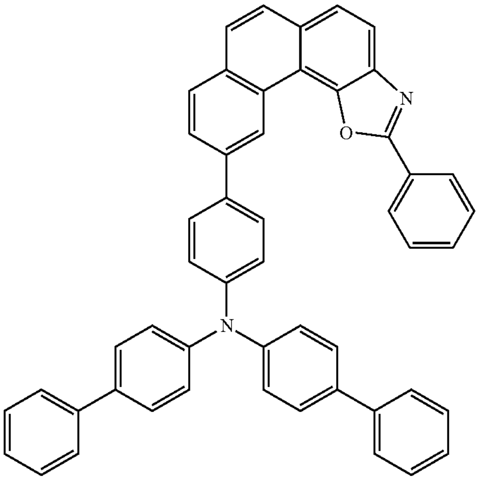
H1-52
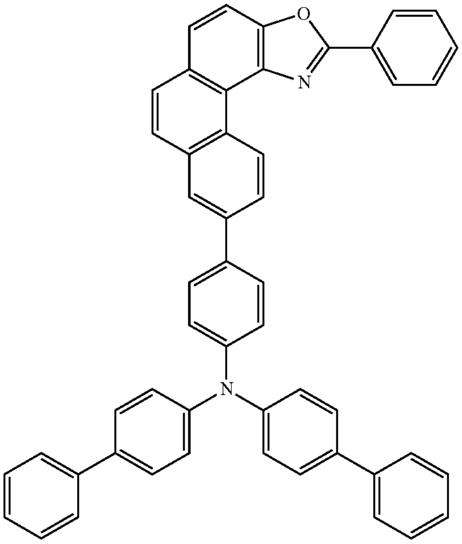
-continued
H1-53
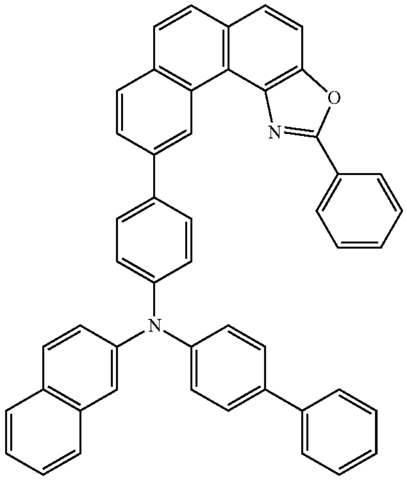
H1-54
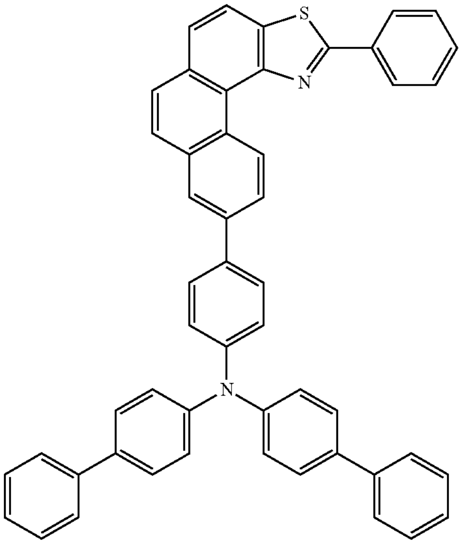
H1-55
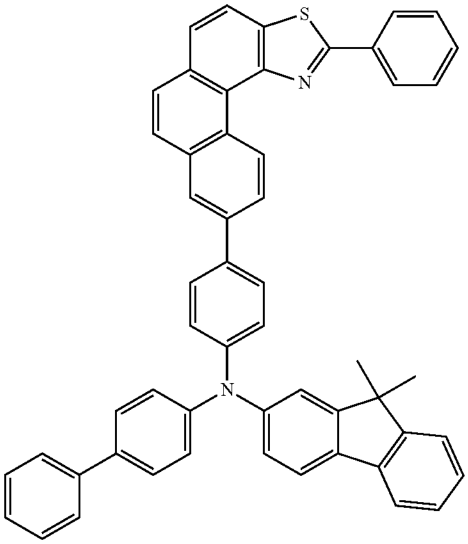

-continued
H1-56
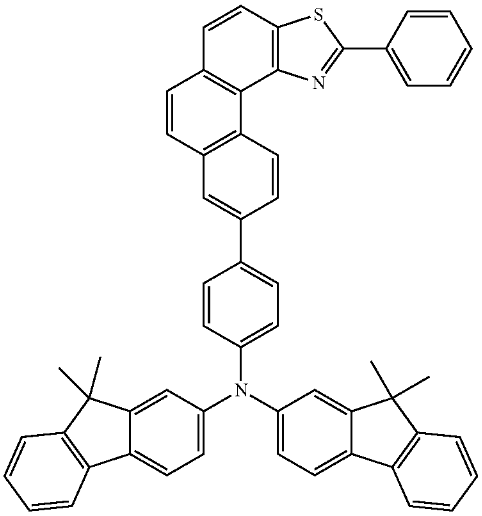
H1-57
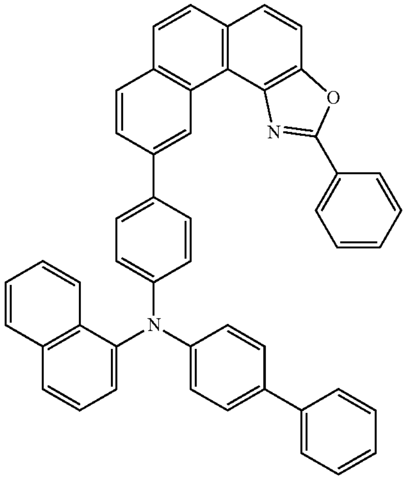
H1-58
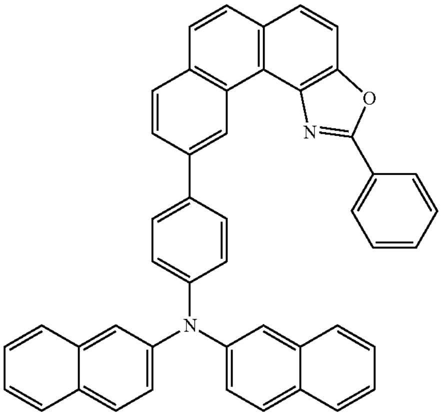
-continued
H1-59
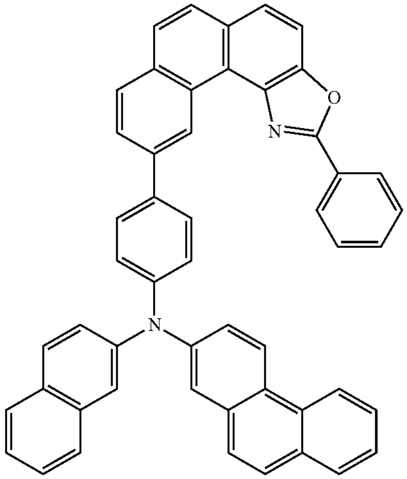
H1-60
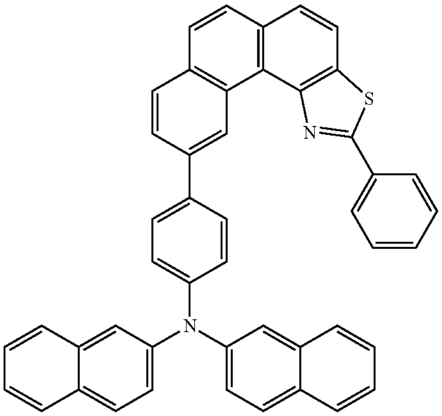
H1-61
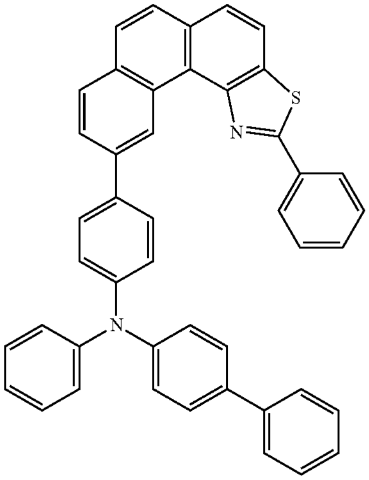

-continued
H1-62
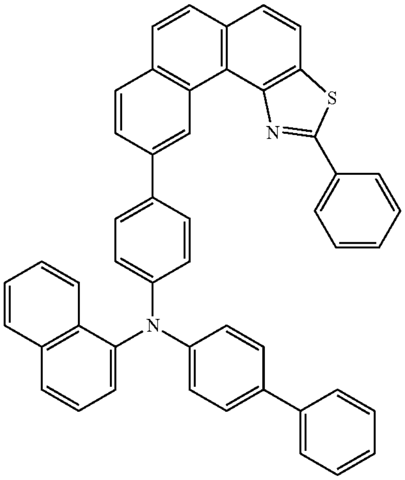
H1-63
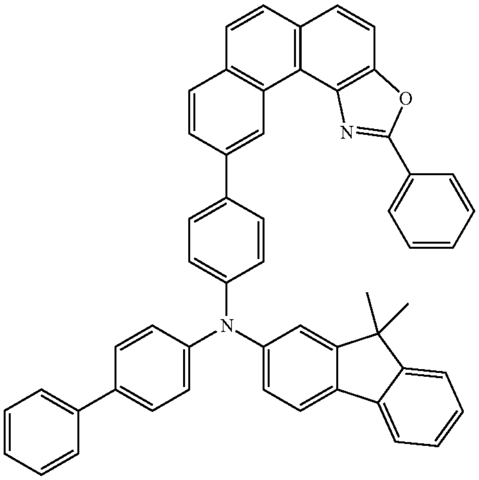
H1-64
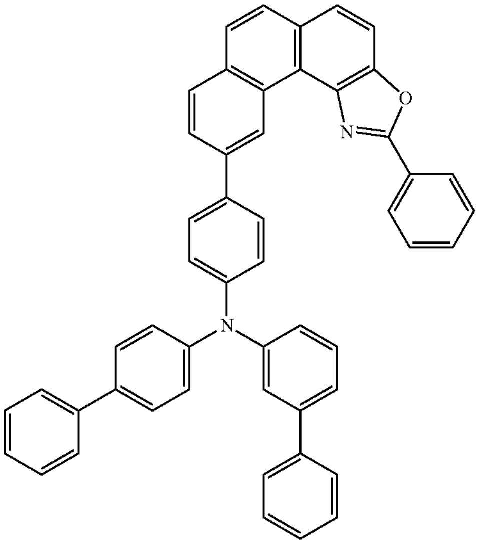
-continued
H1-65
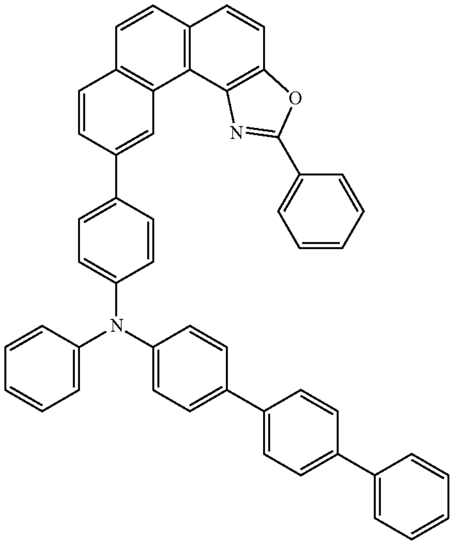
H1-66
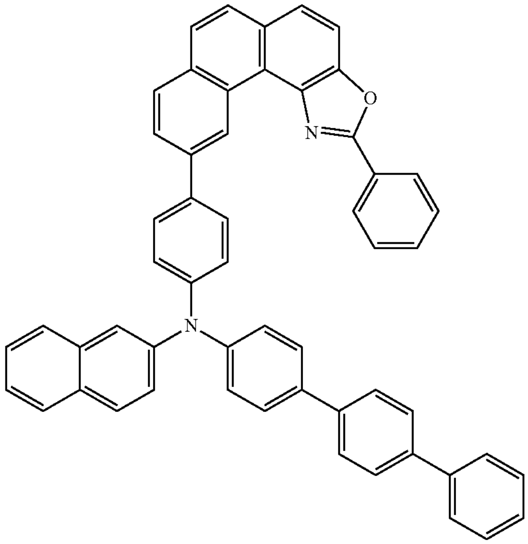
H1-67
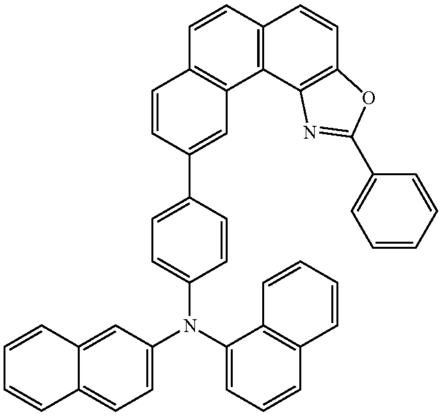

H1-68
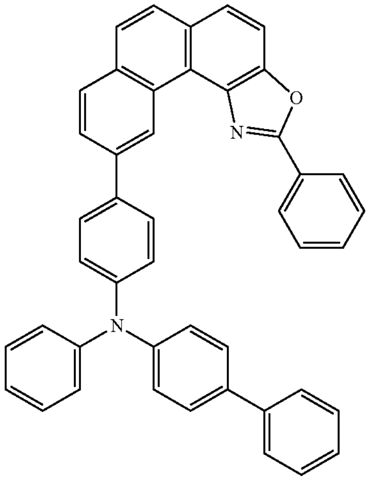
H1-69
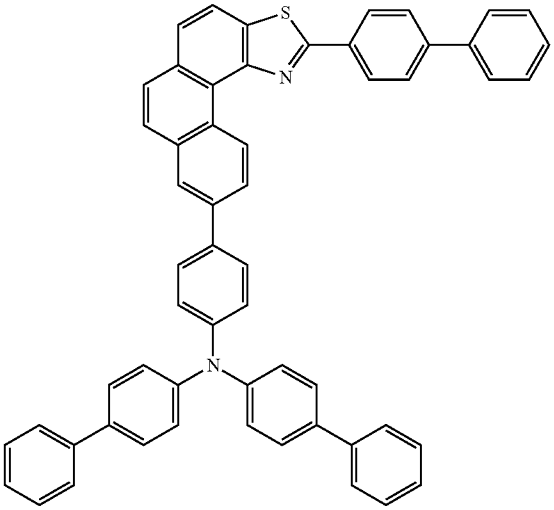
H1-70
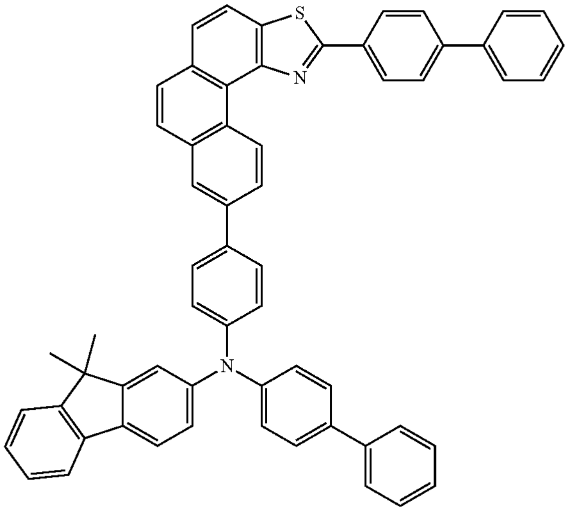
H1-71
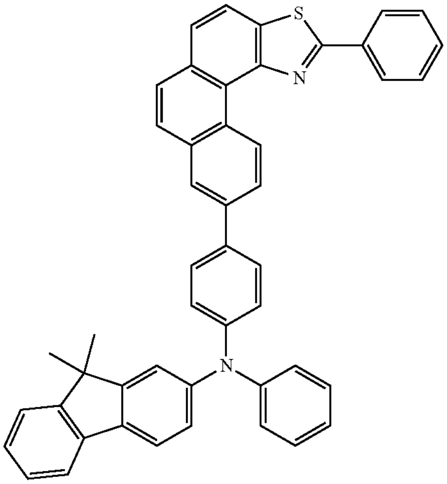
H1-72
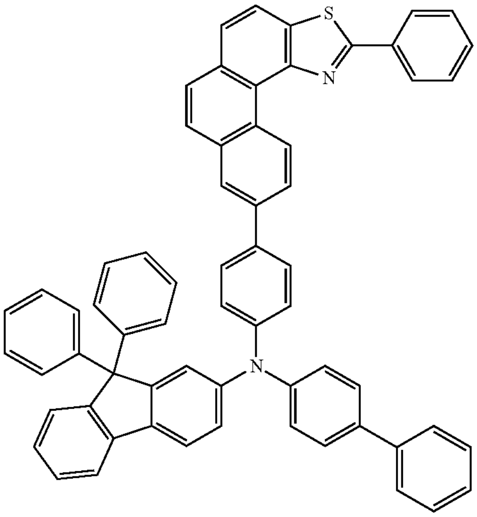
H1-73
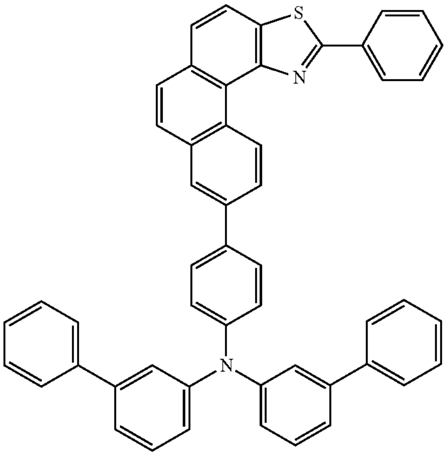

-continued
H1-74
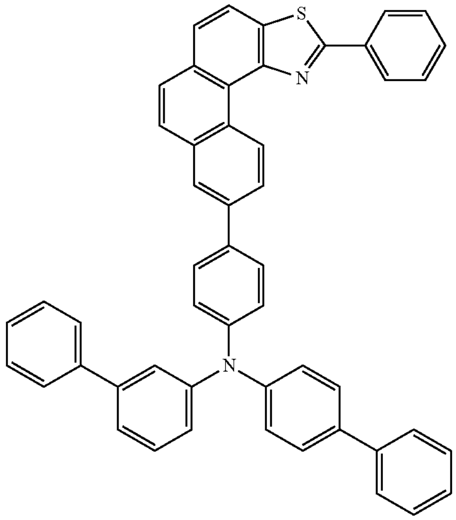
H1-75
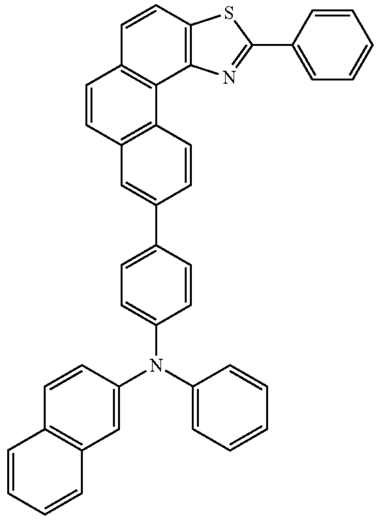
H1-76
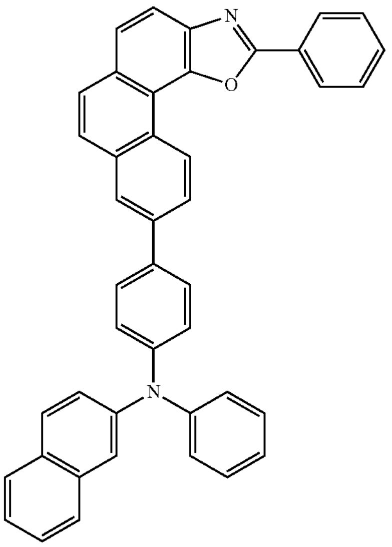
-continued
H1-77
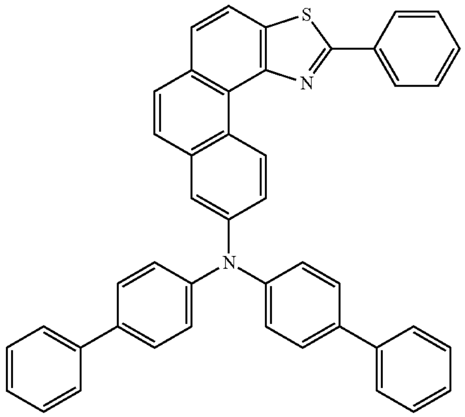
H1-78
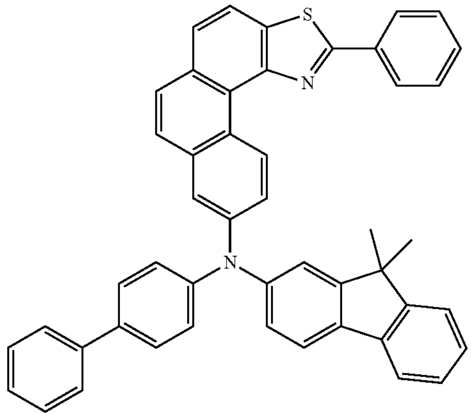
H1-79
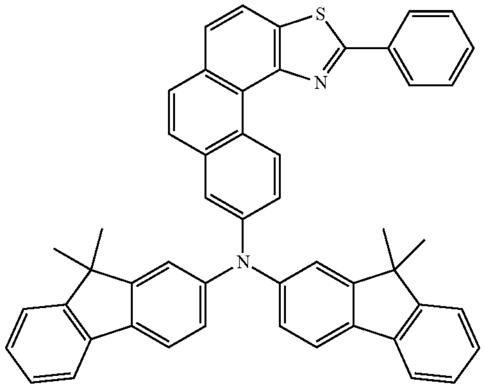

H1-80
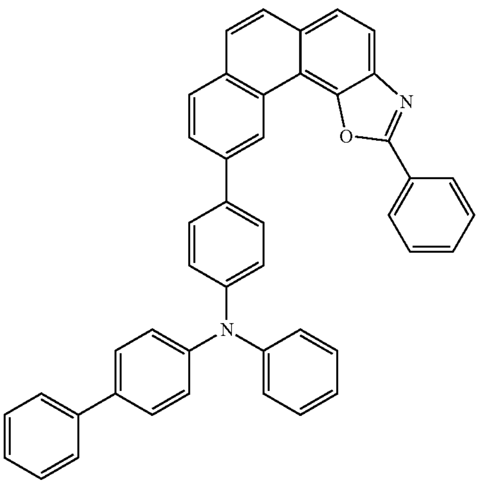
H1-81
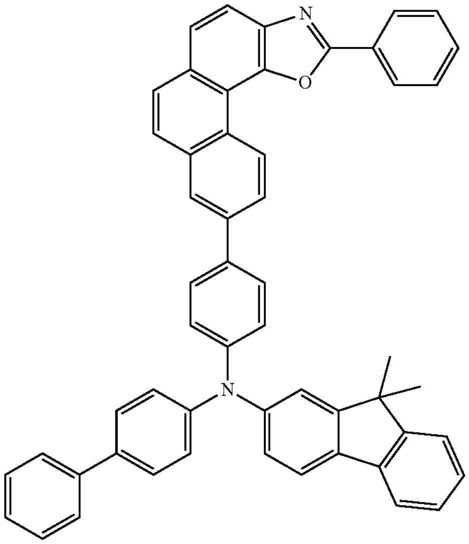
H1-82
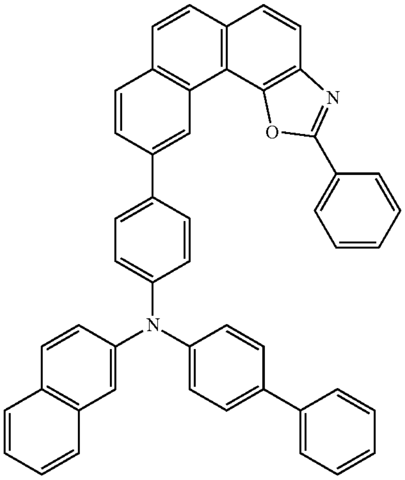
H1-83
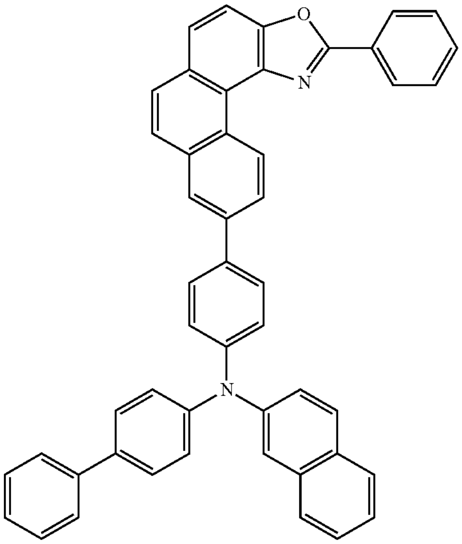
H1-84
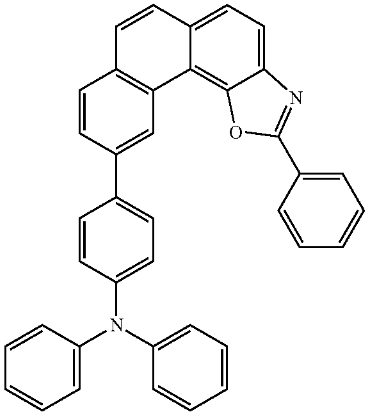
H1-85
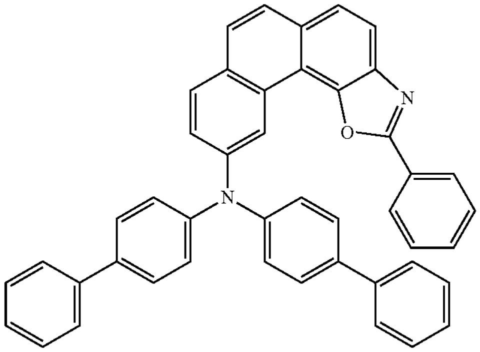

-continued
H1-86
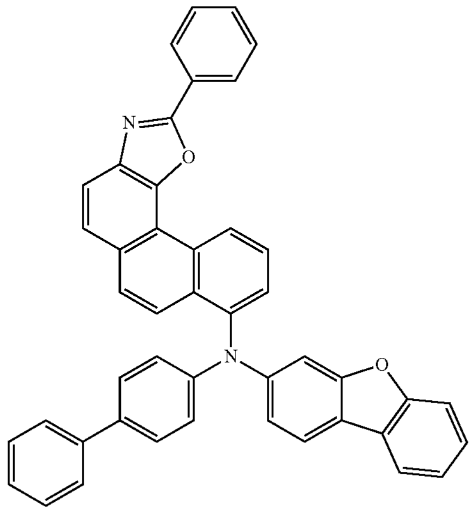
H1-87
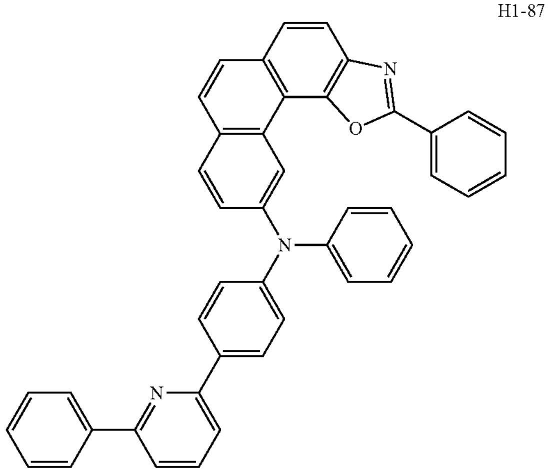
H1-88
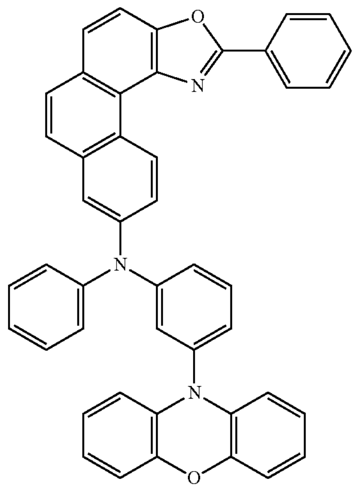
-continued
H1-89
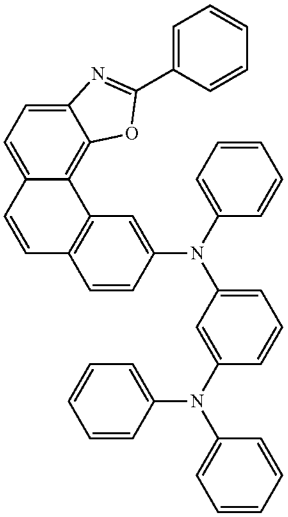
H1-90
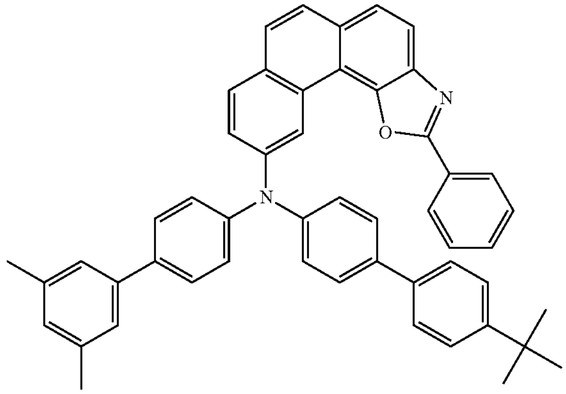
H1-91
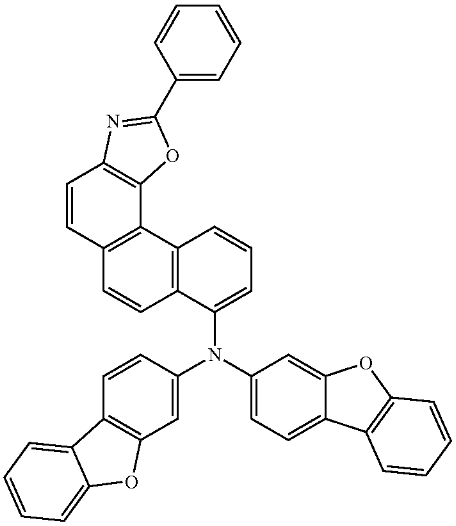

-continued
H1-92
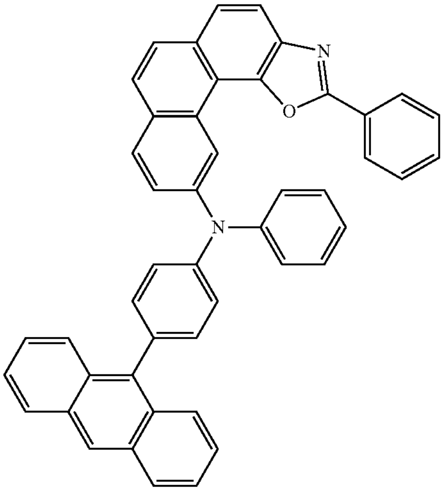
H1-93
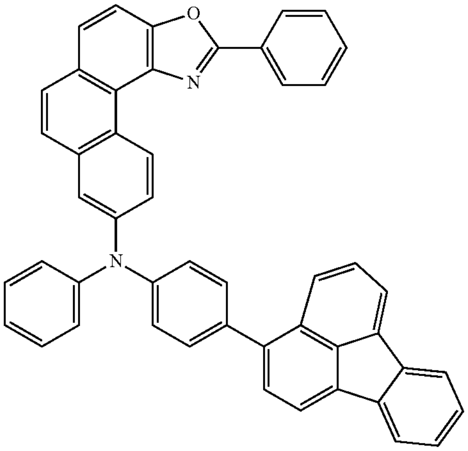
H1-94
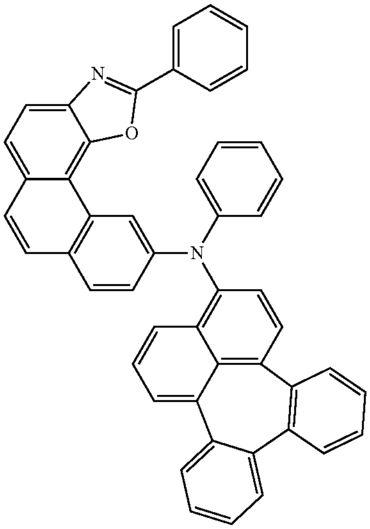
-continued
H1-95
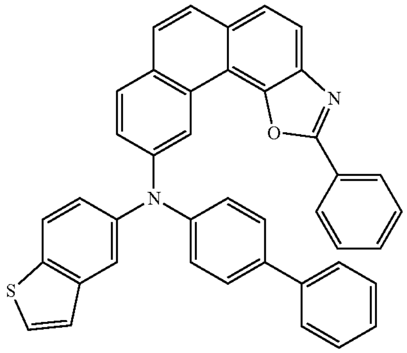
H1-96
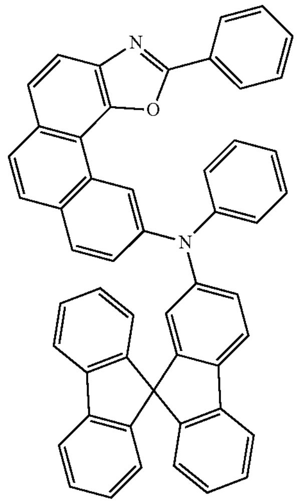
H1-97
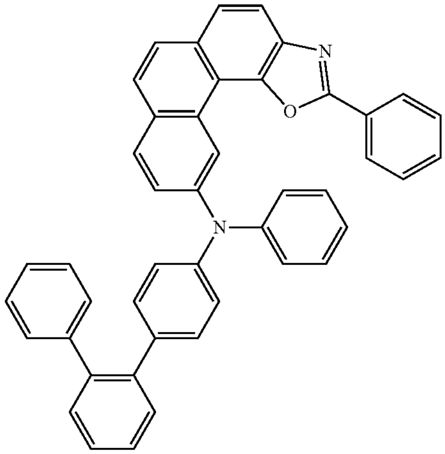

-continued
H1-98
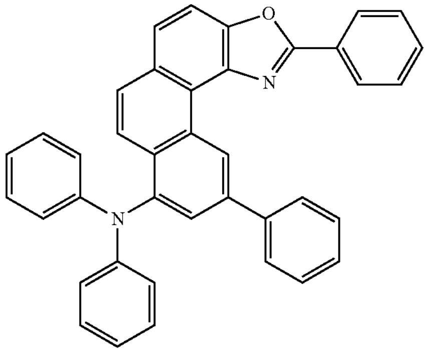
H1-99
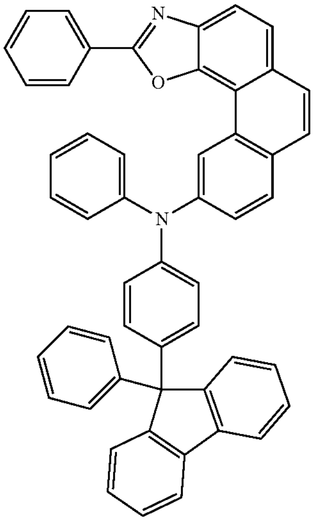
H1-100
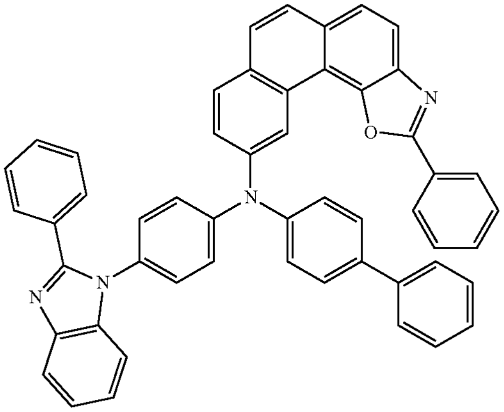
-continued
H-101
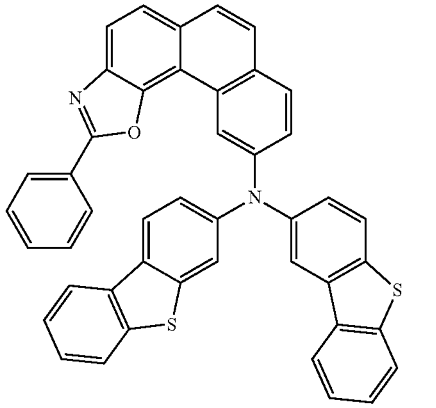
H1-102
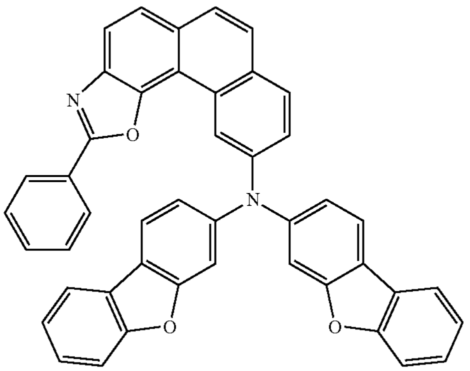
H1-103
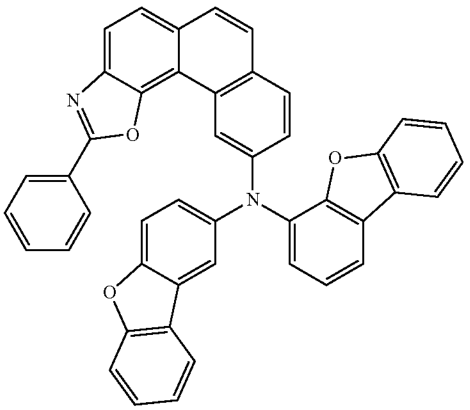

-continued
H1-104
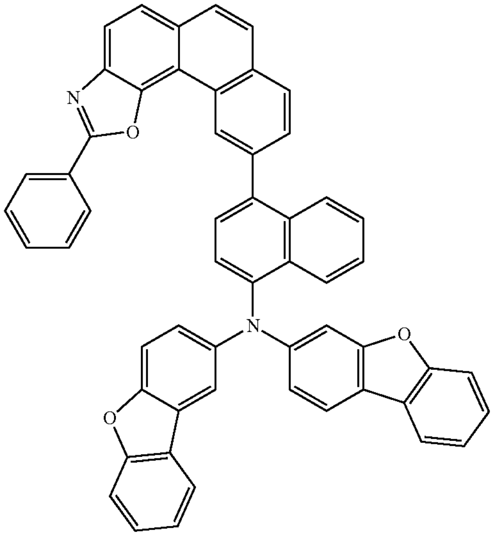
H1-105
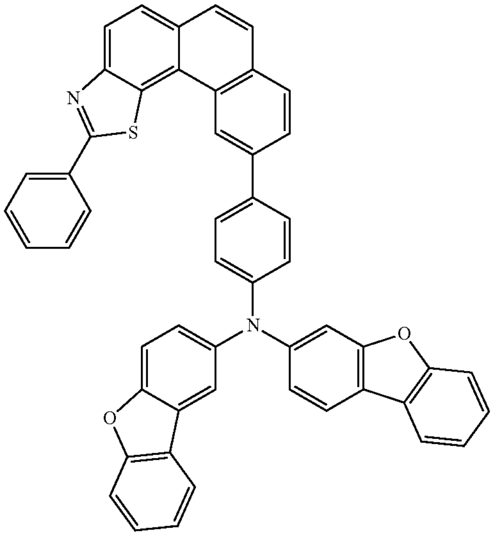
H1-106
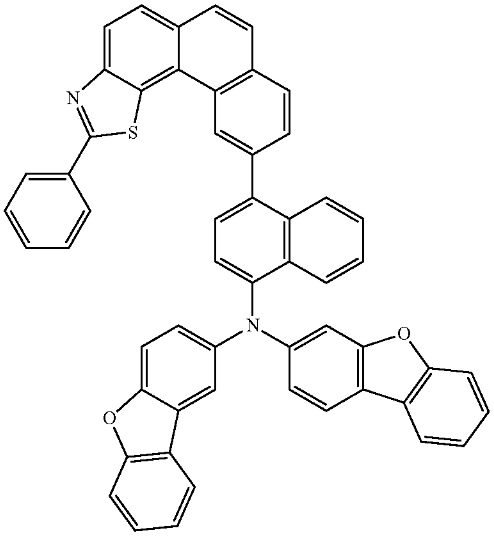
-continued
H1-107
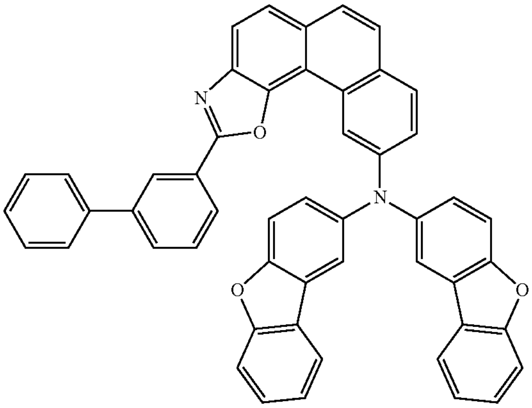
H1-108
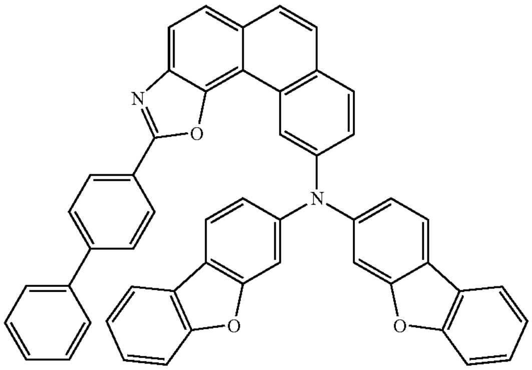
H1-109
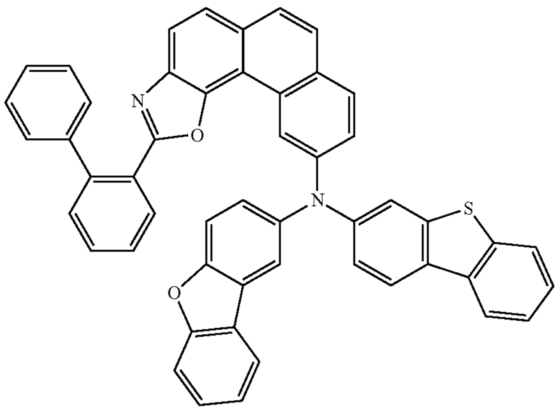

-continued
H1-110
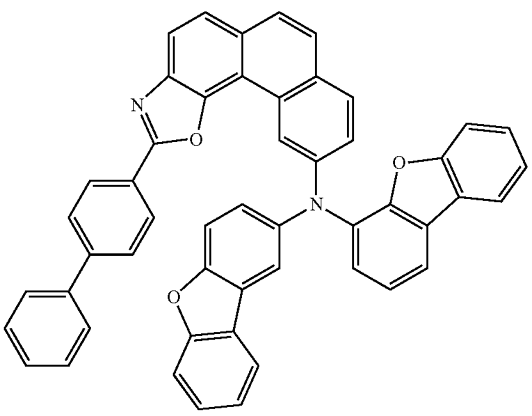
H1-111
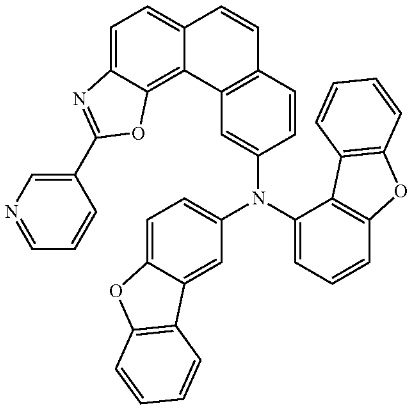
H1-112
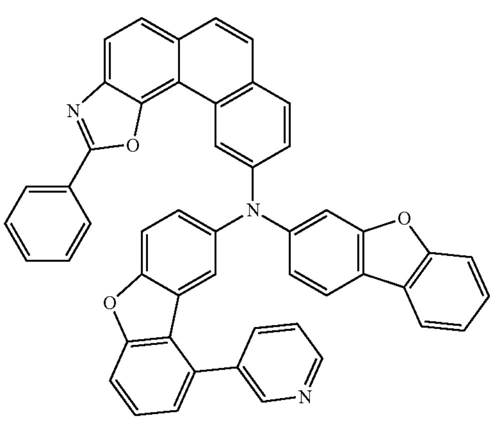
-continued
H1-113
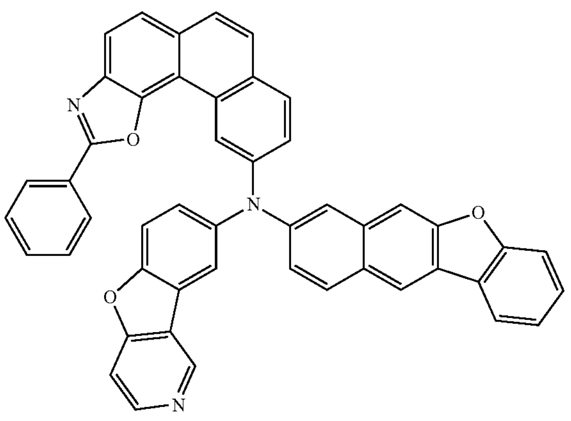
H1-114
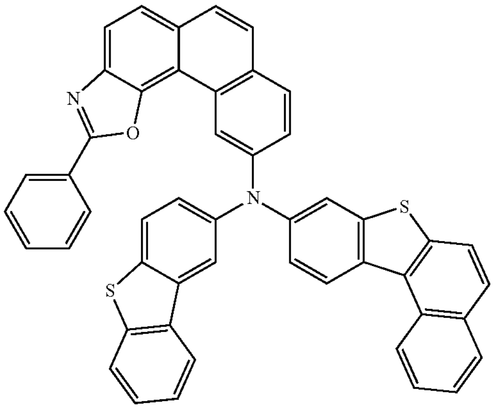
H1-115
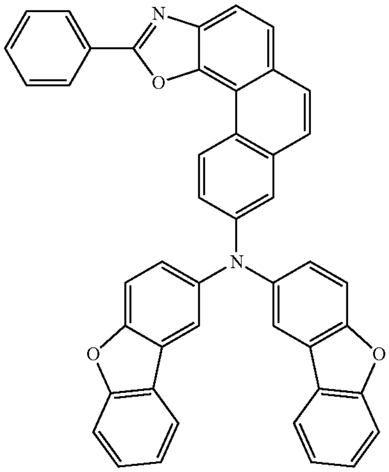

-continued
H1-116
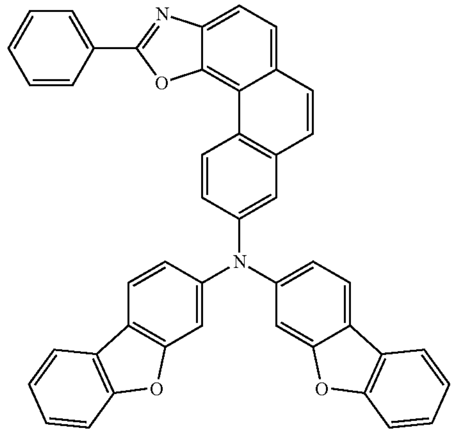
H1-117
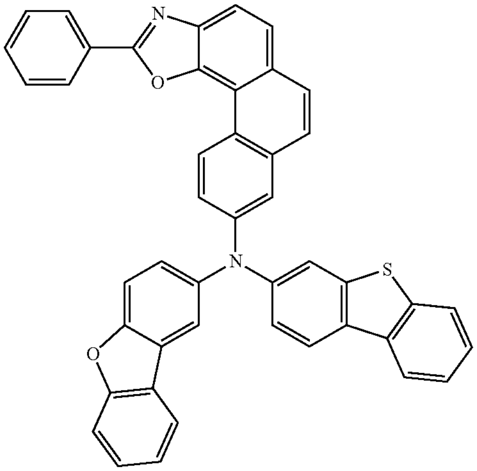
H1-118
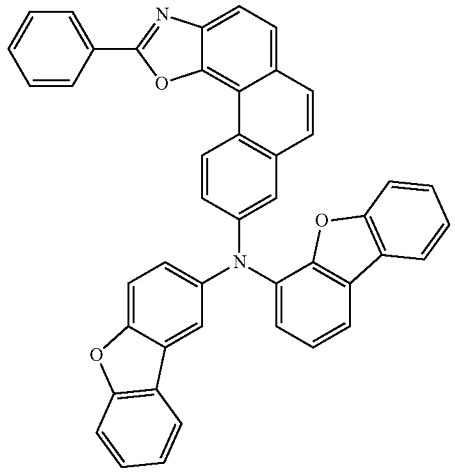
-continued
H1-119
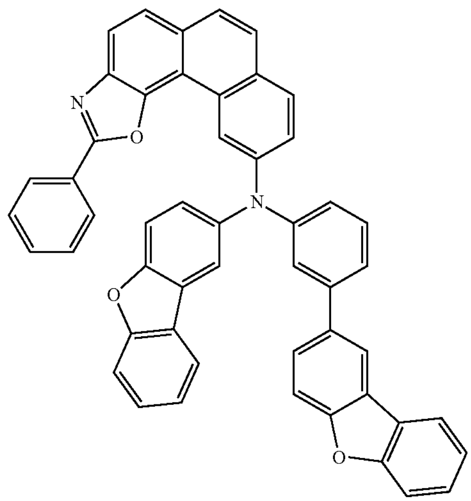
H1-120
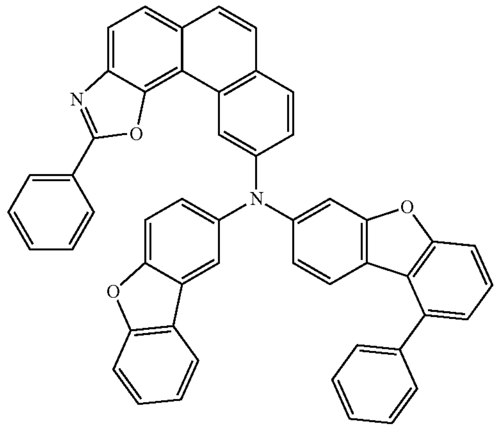
H1-121
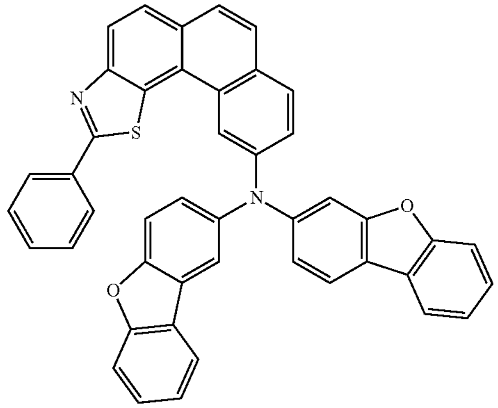

-continued
H1-122
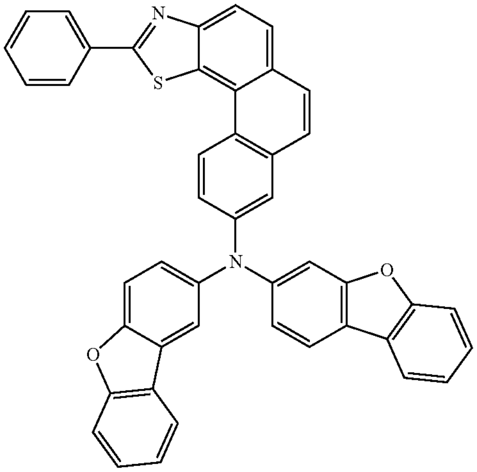
H1-123
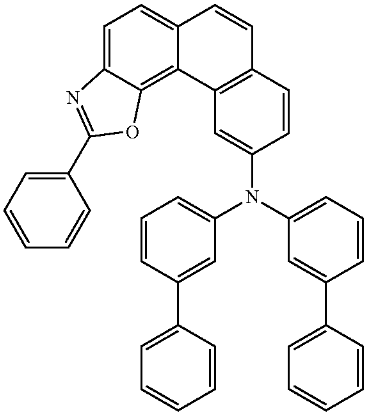
H1-124
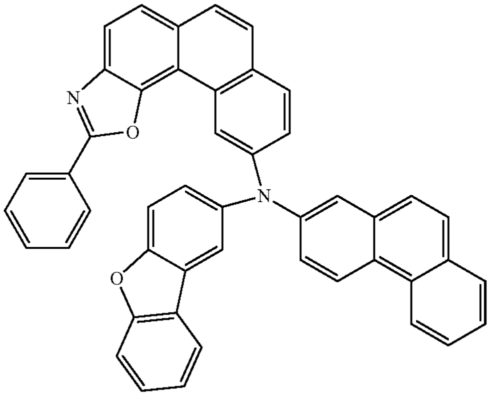
-continued
H1-125
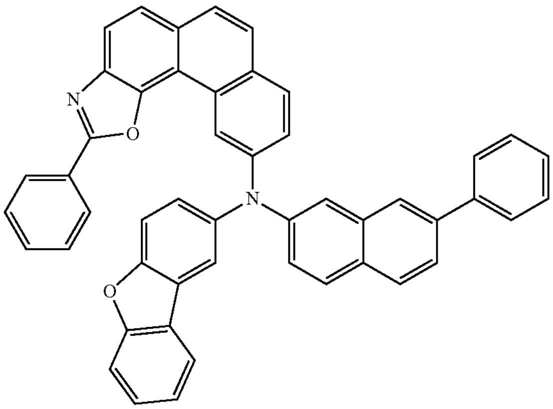
H1-126
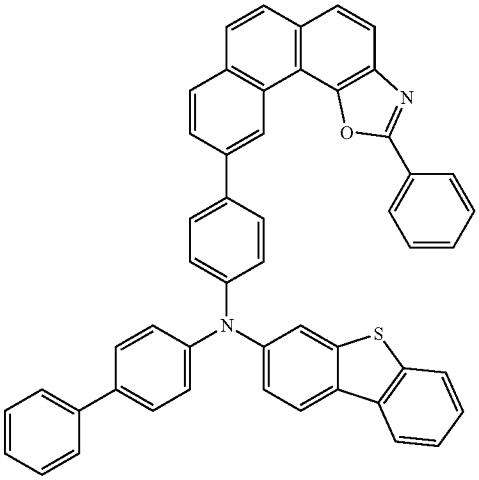
H1-127
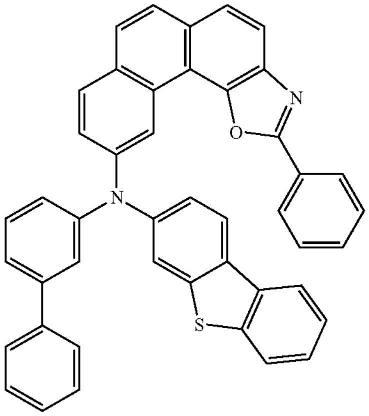

-continued
H1-128
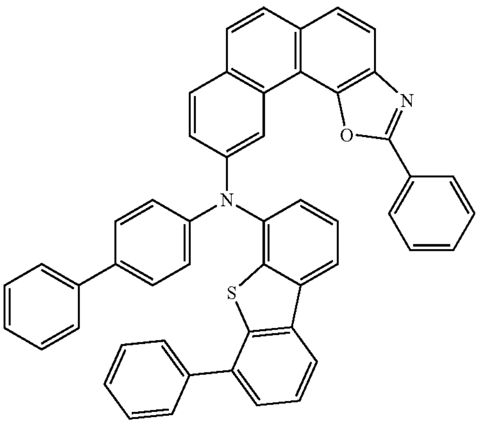
H1-129
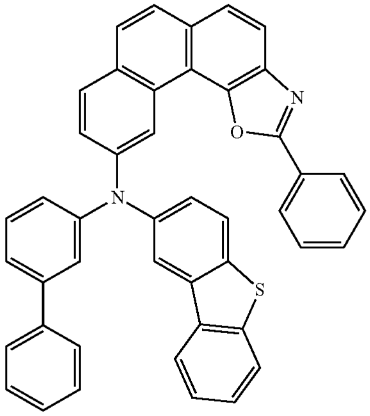
H1-130
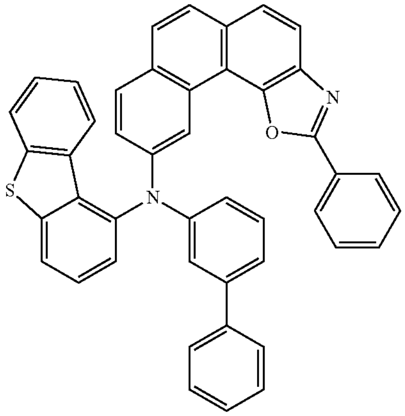
-continued
H1-131
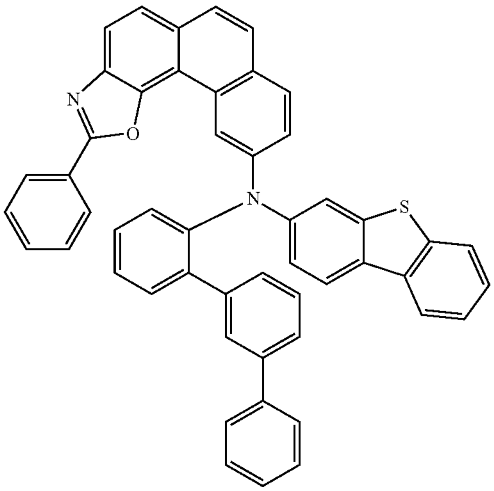
H1-132
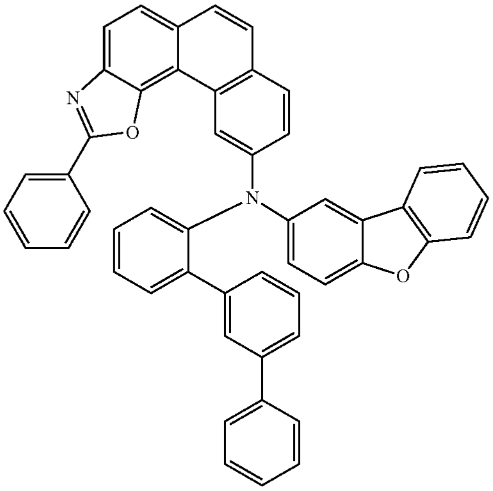
H1-133
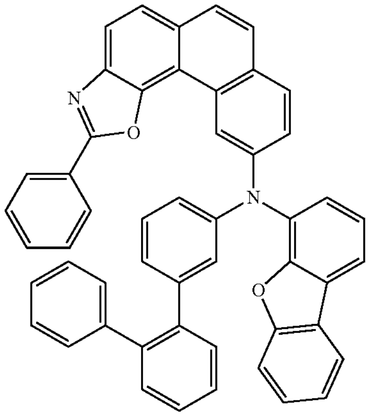

-continued

H1-134

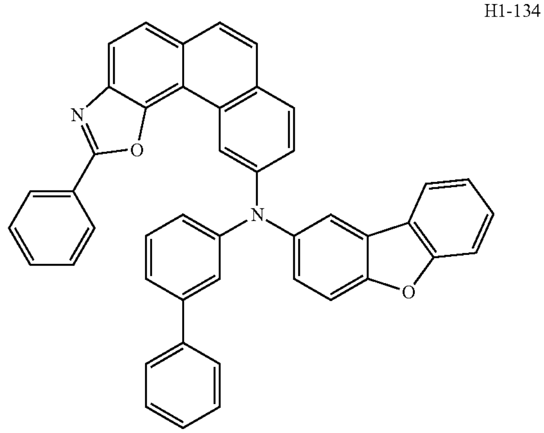

H1-135

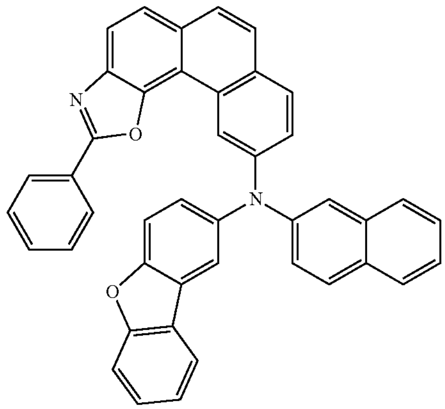

H1-136

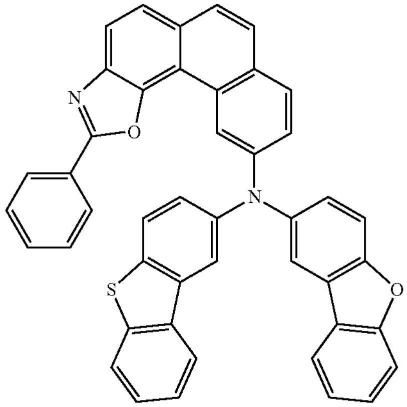

The compound represented by the formula 1 according to the present disclosure may be produced by a synthetic method known to a person skilled in the art.

The second host material as another host material according to one embodiment may be represented by the following formula 2.

(2)

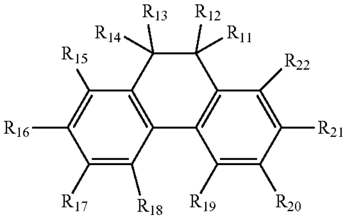

in formula 2, $R_{11}$ to $R_{14}$ each independently represent, $*-(L_3)_e-(Ar_3)_f$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, or a substituted or unsubstituted (3- to 30-membered)heteroaryl; or may be linked to the adjacent substituents to form a ring(s);

$R_{15}$ to $R_{22}$ each independently represent, $*-(L_3)_e-(Ar_3)_f$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted fused ring of (C3-C30) aliphatic ring and (C6-C30) aromatic ring, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, or a substituted or unsubstituted tri(C6-C30)arylsilyl; or may be linked to the adjacent substituents to form a ring(s); provided that at least one of $R_{11}$ to $R_{22}$ is $*-(L_3)_e-(Ar_3)_f$;

$L_3$ represents a single bond, a substituted or unsubstituted (C6-C30)arylene, or a substituted or unsubstituted (3- to 30-membered)heteroarylene;

$Ar_3$ represents a substituted or unsubstituted (C6-C30)aryl or a substituted or unsubstituted (3- to 30-membered) heteroaryl;

e represents an integer of 1 to 4, and f represents an integer of 1 or 2; and when e and f are an integer of 2 or more, each of $L_3$ and each of $Ar_3$ may be the same or different.

In one embodiment, $R_{11}$ to $R_{14}$ each independently may be, a substituted or unsubstituted (C1-C30)alkyl, preferably a substituted or unsubstituted (C1-C10)alkyl, more preferably a substituted or unsubstituted (C1-C4)alkyl. For example, all of $R_{11}$ to $R_{14}$ may be methyl. In one embodiment, $R_{15}$ to $R_{22}$ each independently may be, hydrogen or $*-(L_3)_e-(Ar_3)_f$, provided that, at least one of $R_{11}$ to $R_{22}$, preferably at least one of $R_{15}$ to $R_{22}$ is $*-(L_3)_e-(Ar_3)_f$.

In one embodiment, the compound represented by the above formula 2 may be represented by any one of the following formulas 2-1 to 2-4.

(2-1)

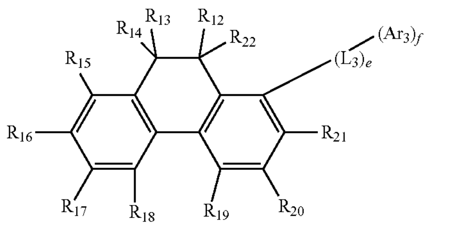

(2-2)

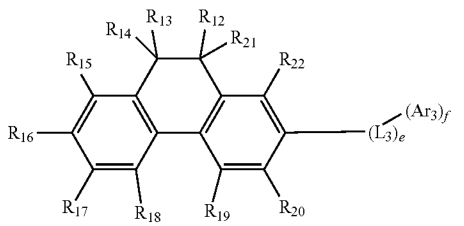

(2-3)

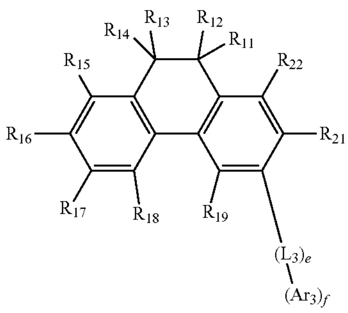

(2-4)

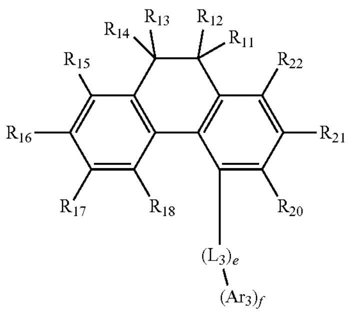

in formulas 2-1 to 2-4, $R_{11}$ to $R_{22}$, $L_3$, $Ar_3$, e, and f are as defined in formula 2.

In one embodiment, $L_3$ may be a single bond, a substituted or unsubstituted (C6-C30)arylene, or a substituted or unsubstituted (5- to 30-membered)heteroarylene, preferably a single bond, a substituted or unsubstituted (C6-C25)arylene, or a substituted or unsubstituted (5- to 25-membered)heteroarylene, more preferably a single bond, a substituted or unsubstituted (C6-C18)arylene, or a substituted or unsubstituted (5- to 18-membered)heteroarylene. For example, $L_3$ may be a single bond, a substituted or unsubstituted phenylene, a substituted or unsubstituted biphenylene, a substituted or unsubstituted terphenylene, a substituted or unsubstituted naphthalenylene, a substituted or unsubstituted phenanthrenylene, a substituted or unsubstituted triphenylenylene, a substituted or unsubstituted fluorenylene, a substituted or unsubstituted pyridylene, a substituted or unsubstituted triazinylene, a substituted or unsubstituted carbazolylene, a substituted or unsubstituted quinoxalinylene, a substituted or unsubstituted quinazolinylene, a substituted or unsubstituted dibenzofuranylene, or a substituted or unsubstituted benzoquinoxalinylene, preferably, a single bond, phenylene unsubstituted or substituted with phenyl, naphthalenylene, p-biphenylene, m-biphenylene, o-biphenylene, or carbazolylene.

In one embodiment, $Ar_3$ may be a substituted or unsubstituted (C6-C30)aryl or a substituted or unsubstituted (5- to 30-membered)heteroaryl, preferably nitrogen-containing (5- to 25-membered)heteroaryl unsubstituted or substituted with a substituted or unsubstituted (C6-C30)aryl and/or a substituted or unsubstituted (5- to 30-membered)heteroaryl, more preferably nitrogen-containing (5- to 20-membered)heteroaryl unsubstituted or substituted with a substituted or unsubstituted (C6-C25)aryl. For example, $Ar_3$ may be a substituted or unsubstituted pyridyl, a substituted or unsubstituted pyrimidinyl, a substituted or unsubstituted triazinyl, a substituted or unsubstituted pyrazinyl, a substituted or unsubstituted quinolinyl, a substituted or unsubstituted quinazolinyl, a substituted or unsubstituted quinoxalinyl, a substituted or unsubstituted benzoquinolinyl, a substituted or unsubstituted benzoquinazolinyl, a substituted or unsubstituted benzoquinoxalinyl, a substituted or unsubstituted dibenzoquinolinyl, a substituted or unsubstituted dibenzoquinazolinyl, a substituted or unsubstituted dibenzoquinoxalinyl, a substituted or unsubstituted indenopyridyl, a substituted or unsubstituted indenopyrimidinyl, a substituted or unsubstituted indenopyrazinyl, a substituted or unsubstituted benzofuropyridyl, a substituted or unsubstituted benzofuropyrimidinyl, a substituted or unsubstituted benzofuropyrazinyl, a substituted or unsubstituted benzothiopyridyl, a substituted or unsubstituted benzothiopyrimidinyl, a substituted or unsubstituted benzothiopyrazinyl, a substituted or unsubstituted carbazolyl, a substituted or unsubstituted benzocarbazolyl, a substituted or unsubstituted dibenzofuranyl, or a substituted or unsubstituted dibenzothiophenyl, preferably a substituted or unsubstituted triazinyl or a substituted or unsubstituted benzocarbazolyl, wherein the substituent of the substituents may be phenyl, p-biphenyl, carbazolyl unsubstituted or substituted with phenyl, naphthyl unsubstituted or substituted with phenyl, pyridyl unsubstituted or substituted with phenyl, chrysenyl, phenanthrobenzofuranyl, dibenzofuranyl, or naphthobenzoxazolyl unsubstituted or substituted with phenyl.

In one embodiment, e may be an integer of 1 to 3, and f may be 1.

According to one embodiment, the second host material represented by formula 2 may be more specifically illustrated by the following compounds, but is not limited thereto.

-continued
C-1
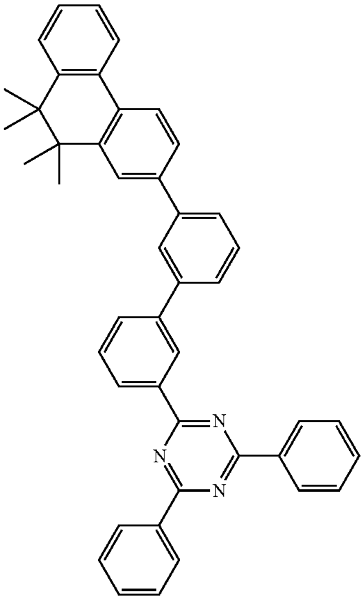
C-3
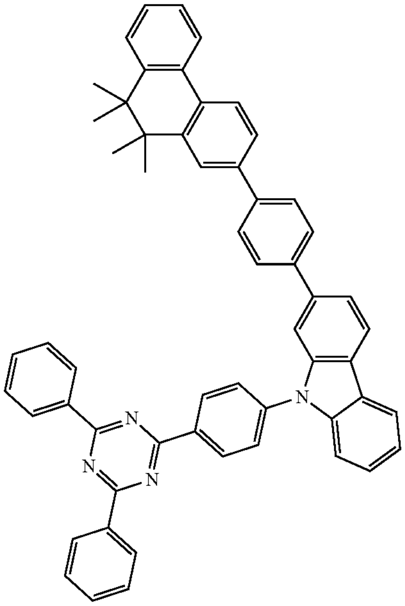
C-2
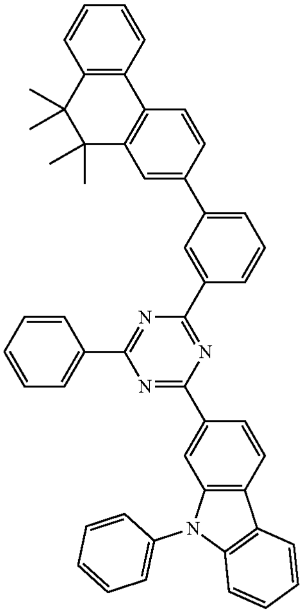
C-4
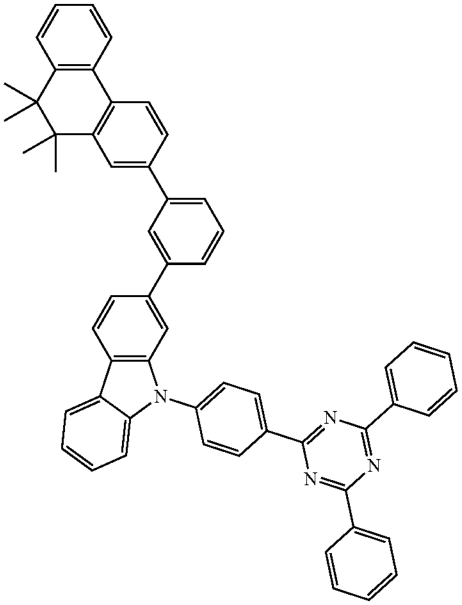

-continued
C-5
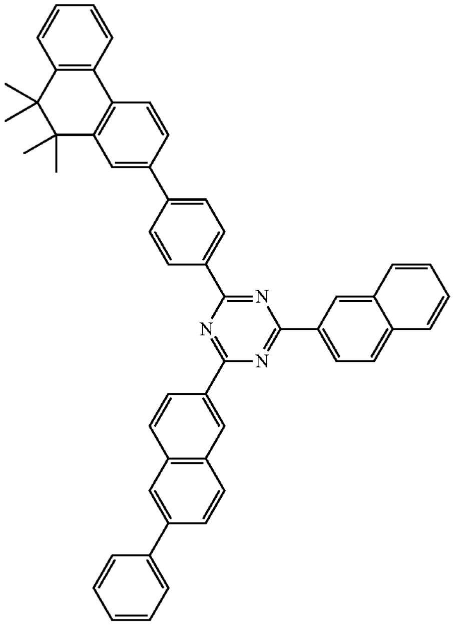
C-6
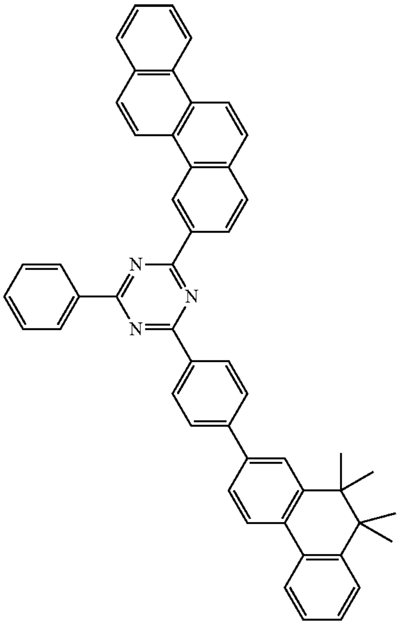
-continued
C-7
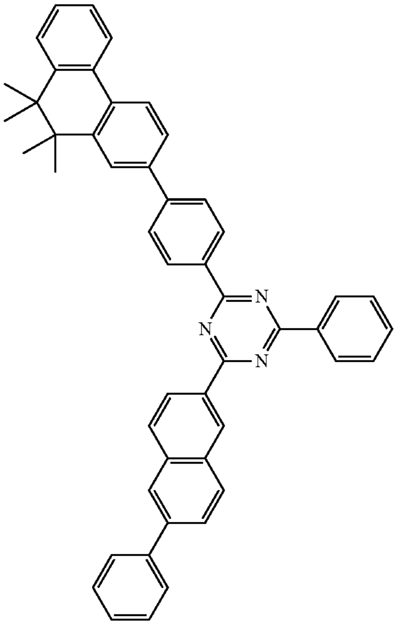
C-8
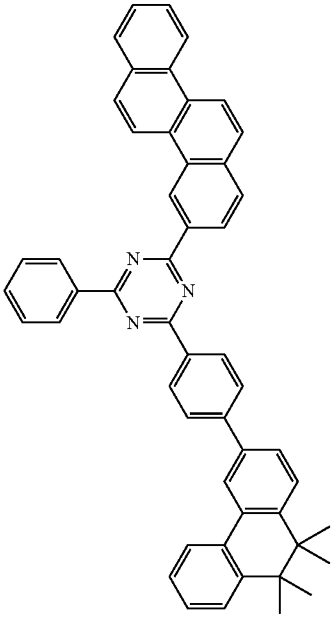

-continued
C-9
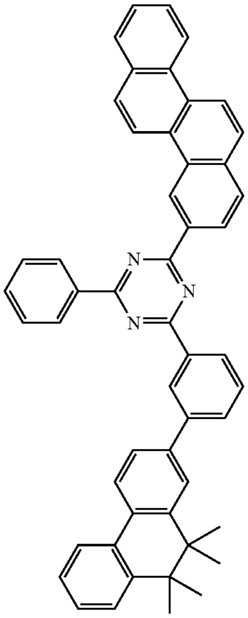
C-10
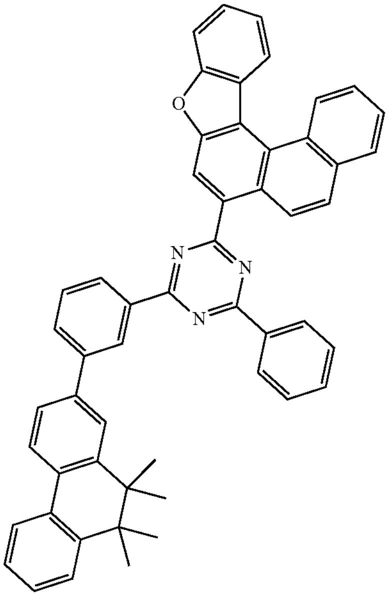
-continued
C-11
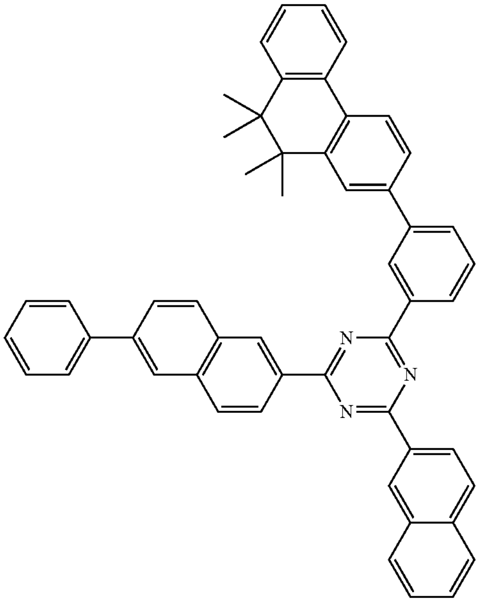
C-12
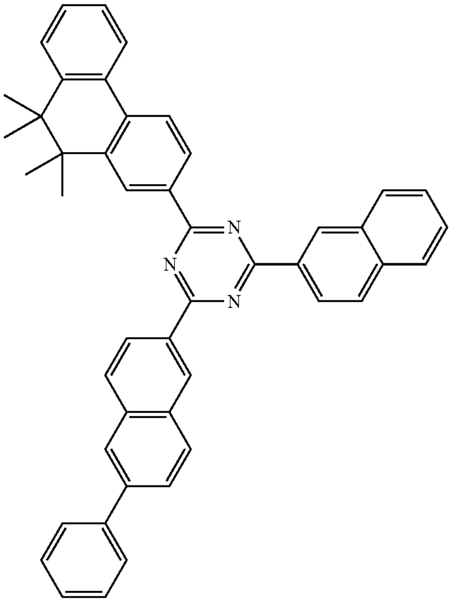

-continued
C-13
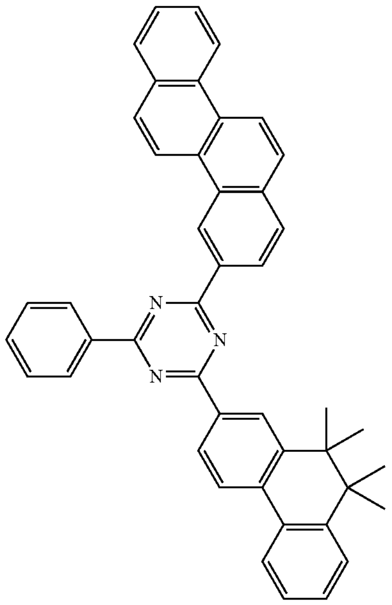
C-14
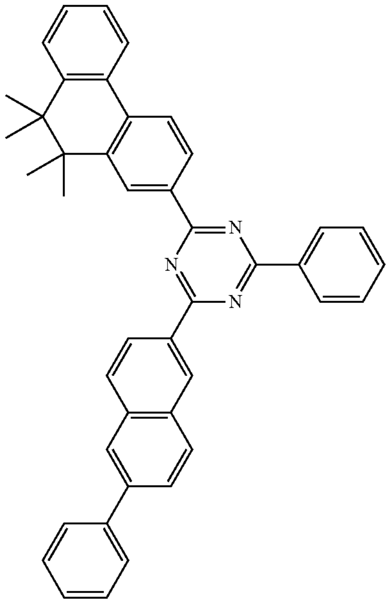
-continued
C-15
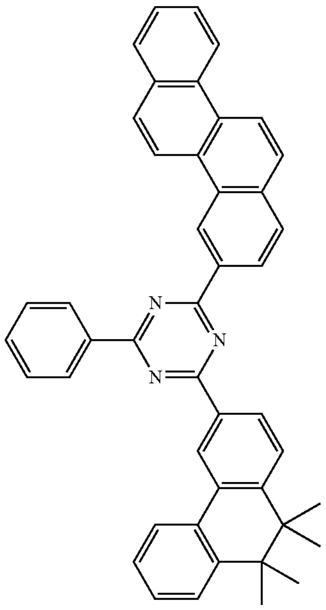
C-16
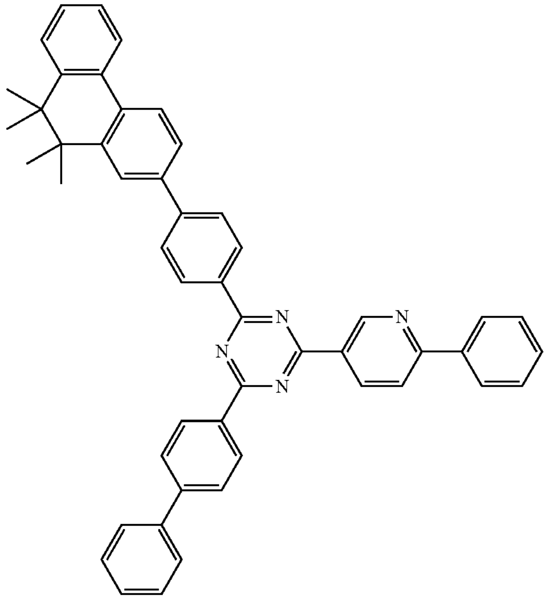

-continued
C-17
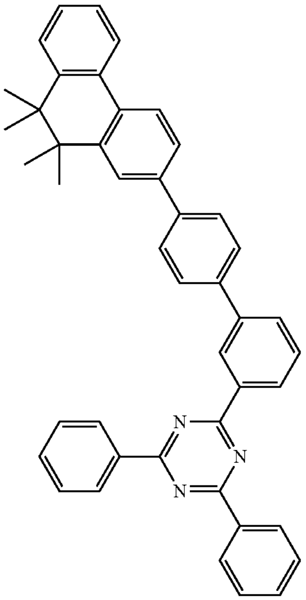
C-18
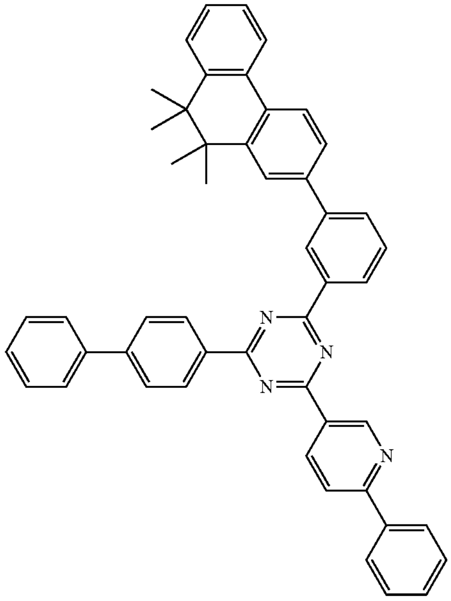
-continued
C-19
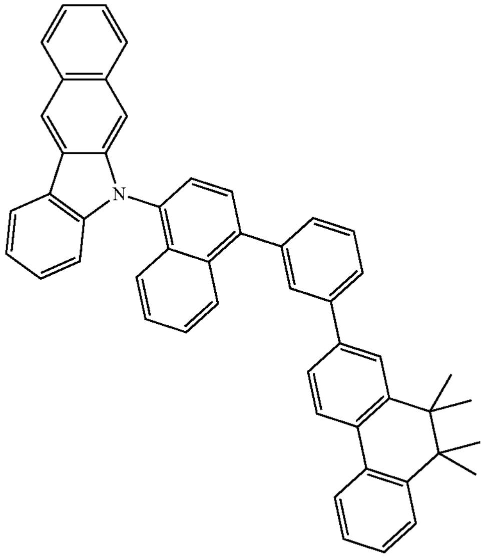
C-20
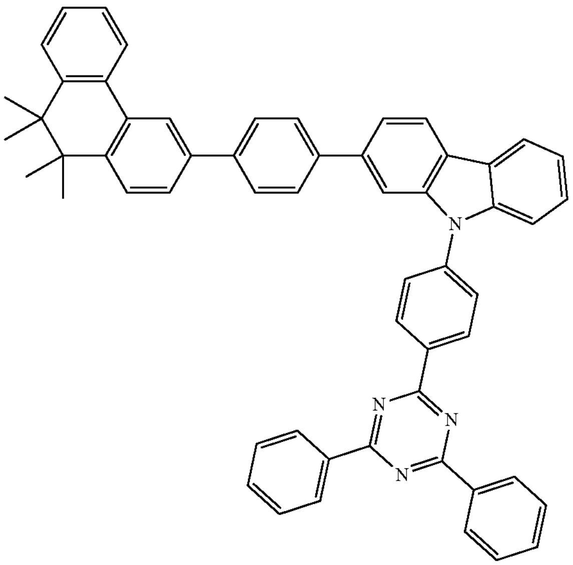

-continued
C-21
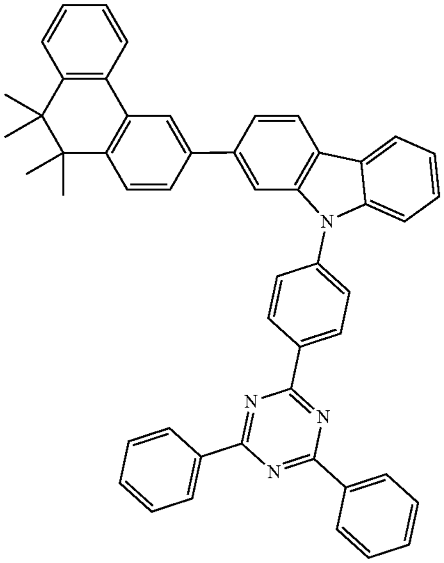
C-22
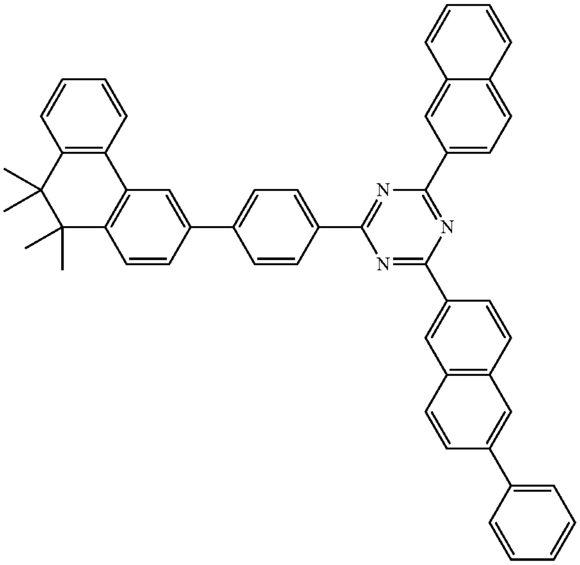
-continued
C-23
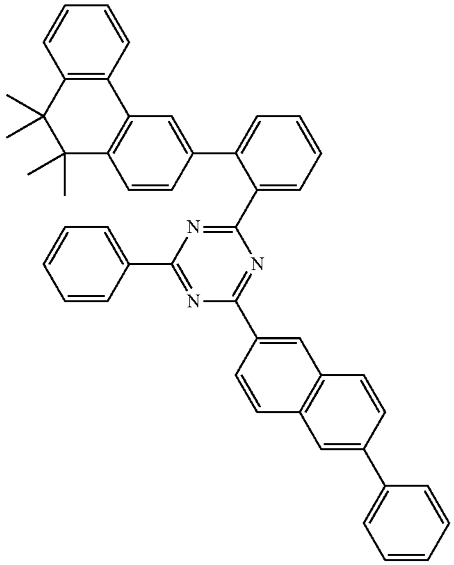
C-24
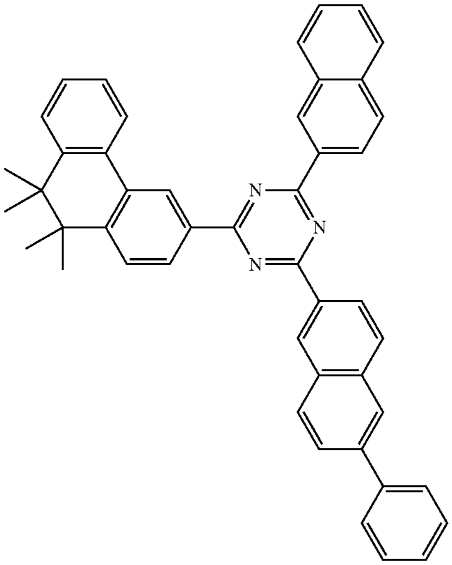

-continued
C-25
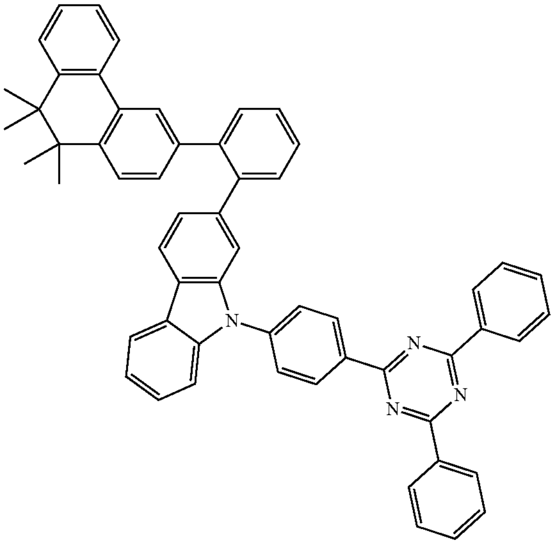
C-26
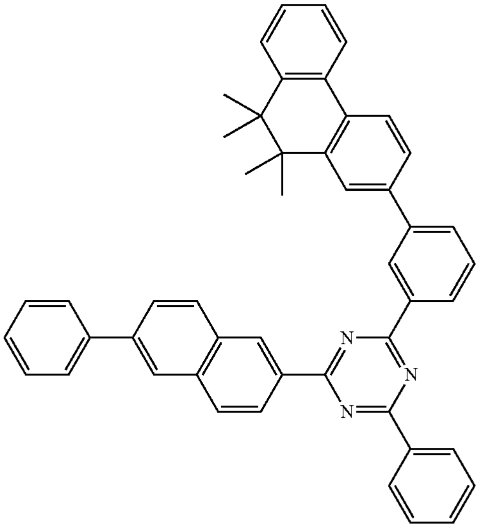
C-27
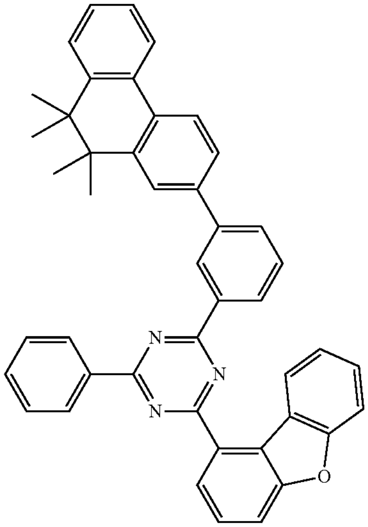
-continued
C-28
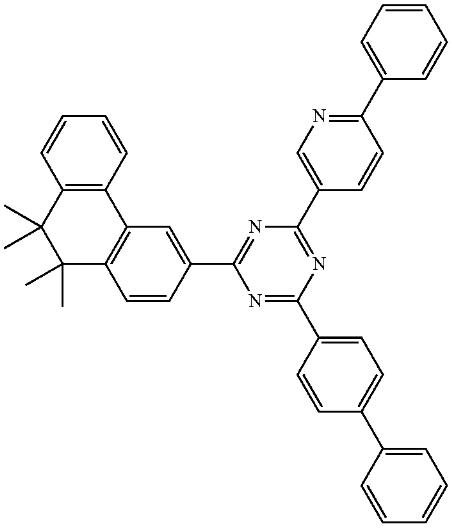
C-29
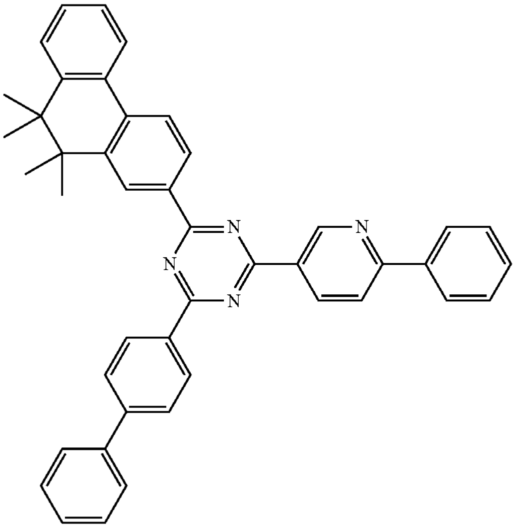
C-30
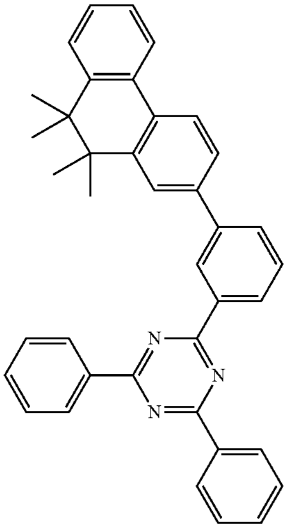

-continued
C-31
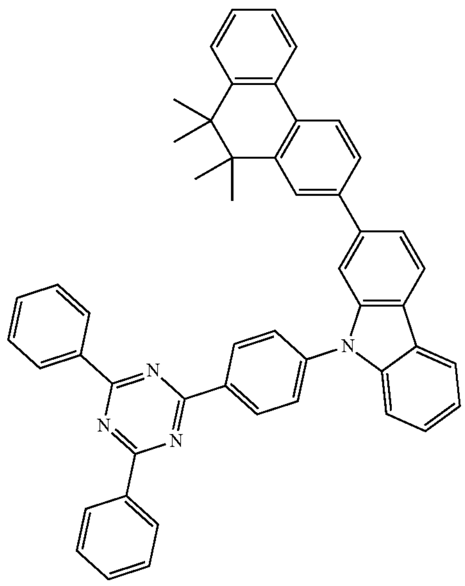
C-32
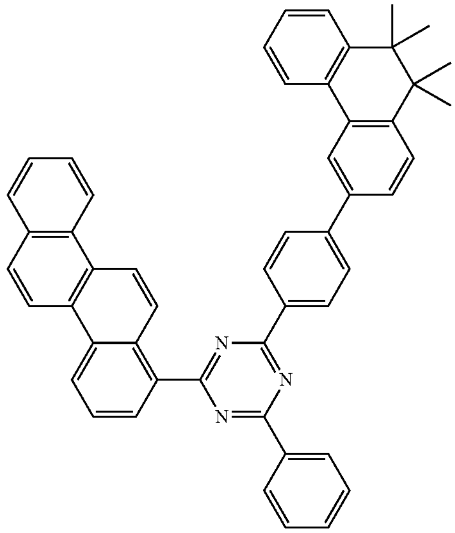
C-33
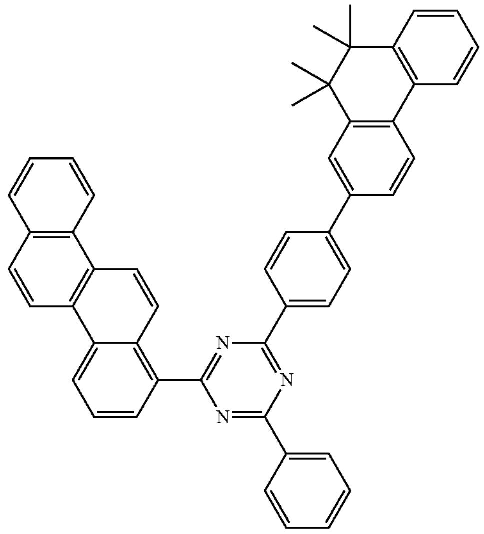
-continued
C-34
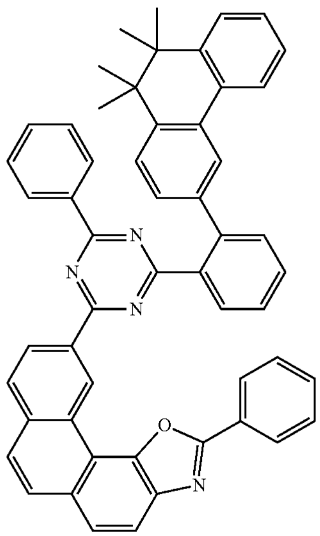
C-35
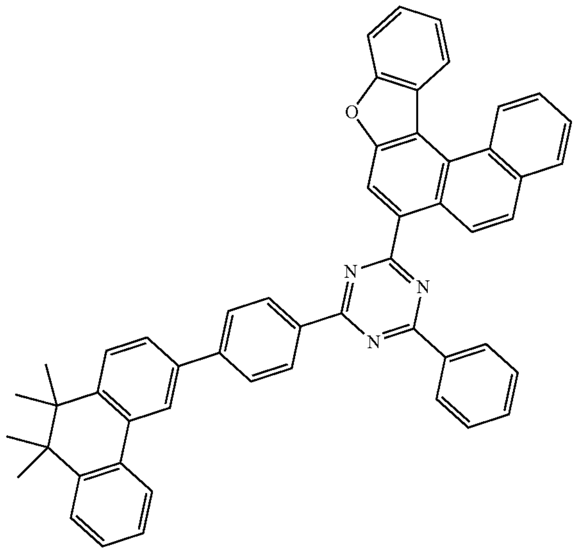
C-36
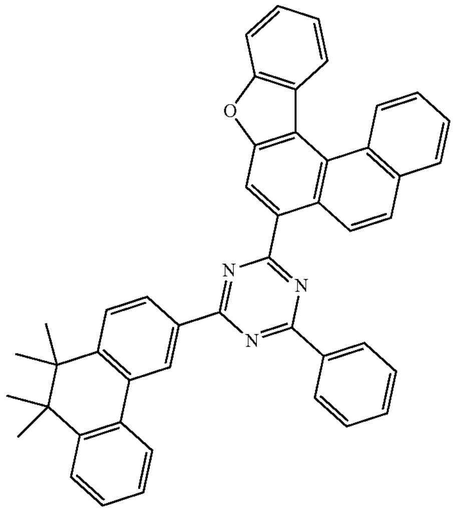

-continued
C-37
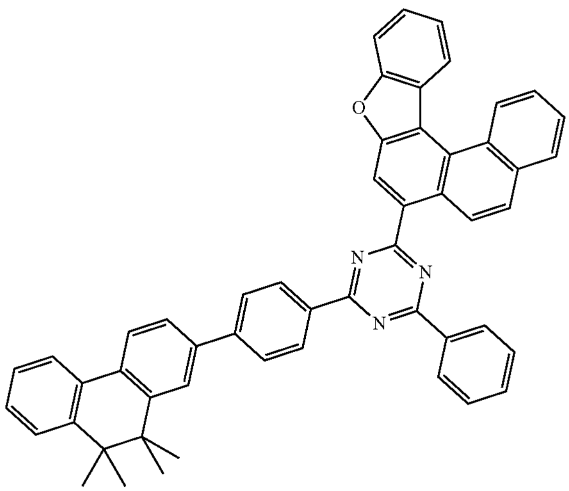
C-38
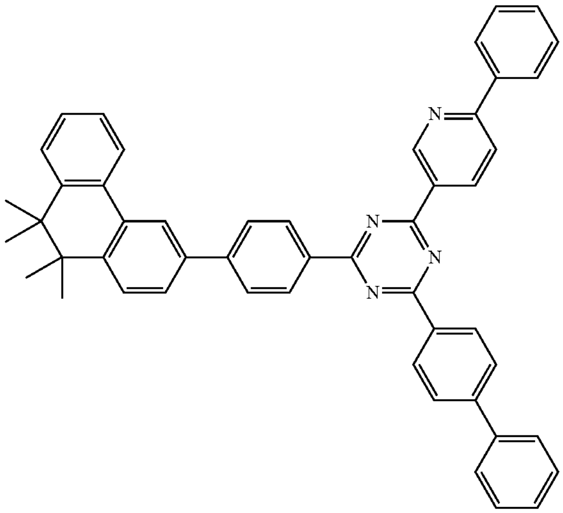
C-39
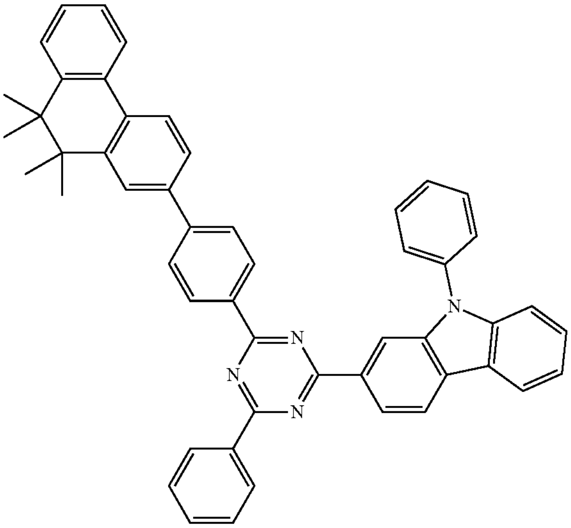
-continued
C-40
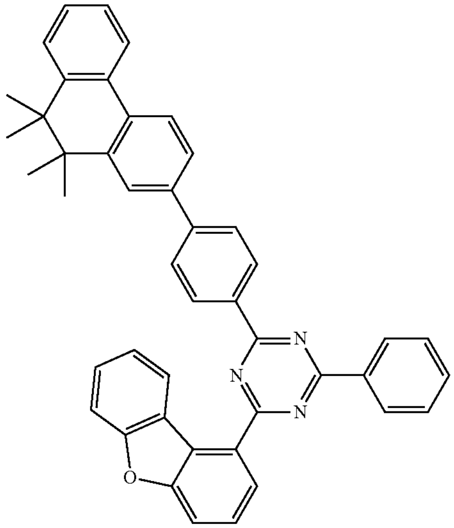
C-41
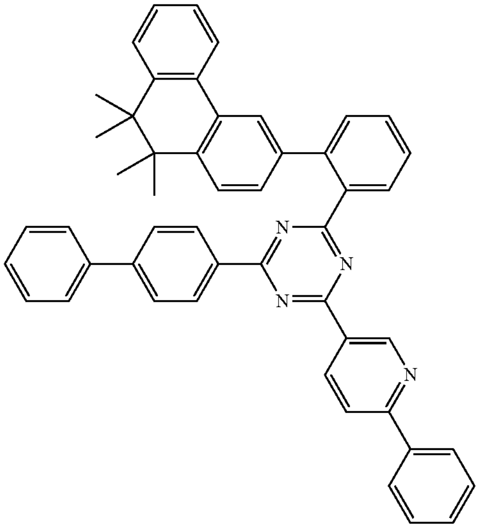
C-42
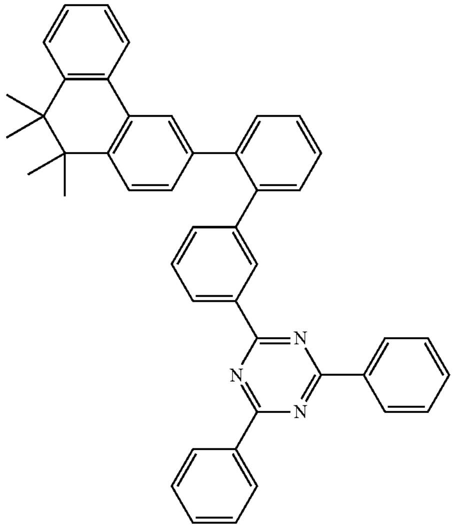

-continued
C-43
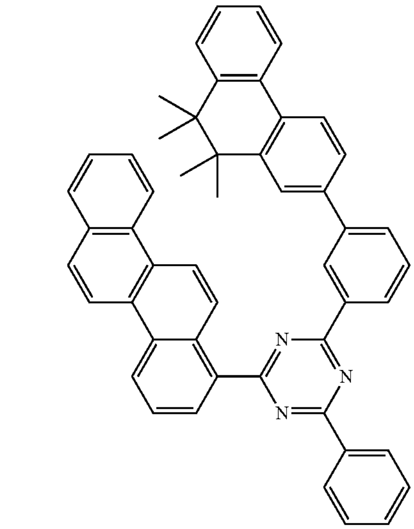
C-44
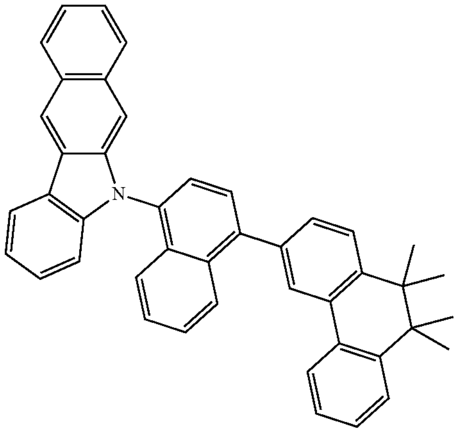
C-45
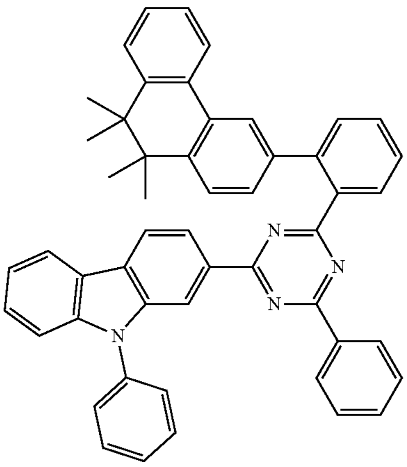
-continued
C-46
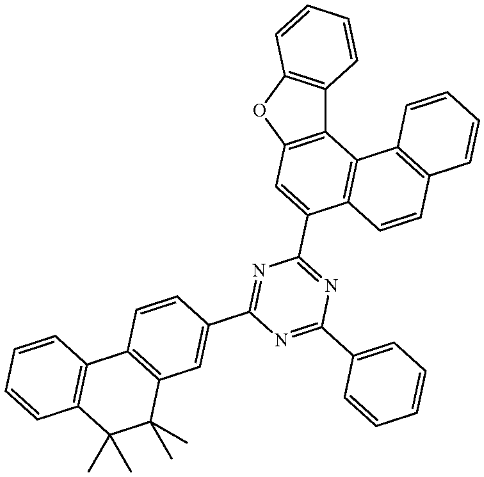
C-47
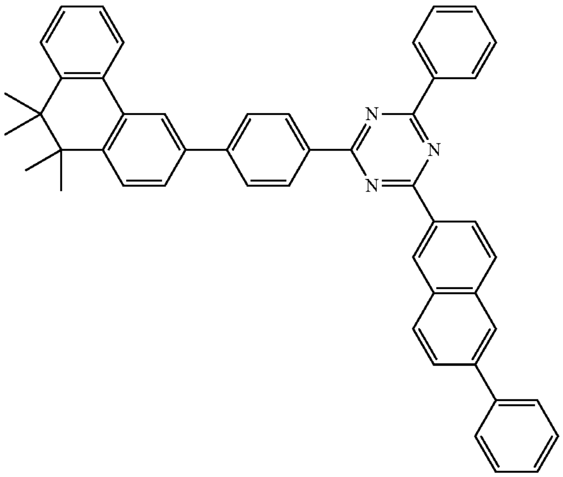
C-48
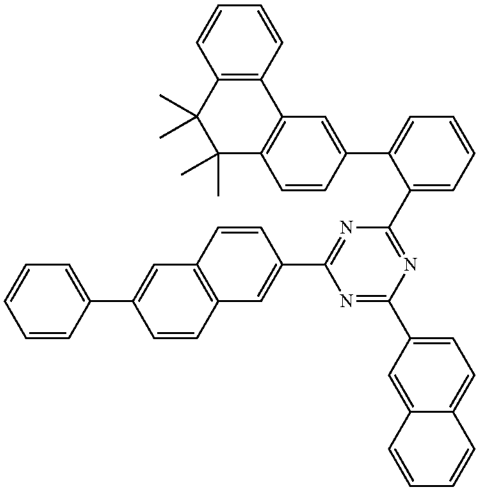

-continued
C-49
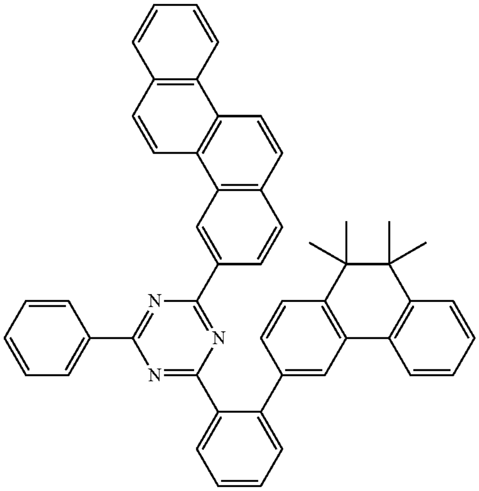
C-50
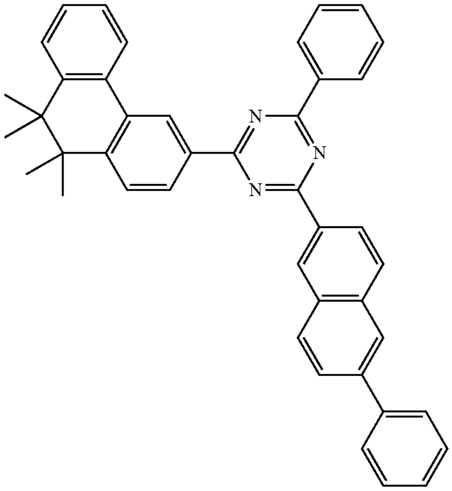
C-51
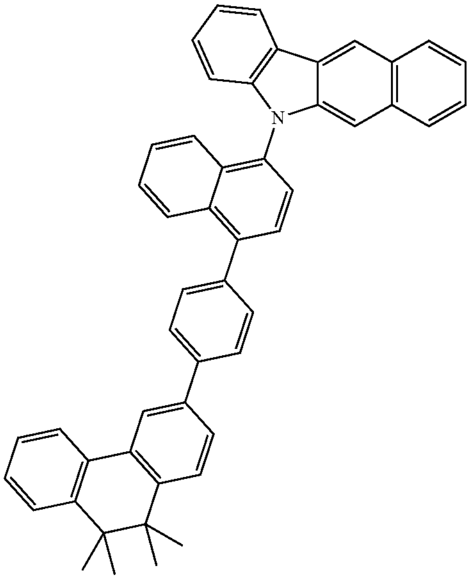
-continued
C-52
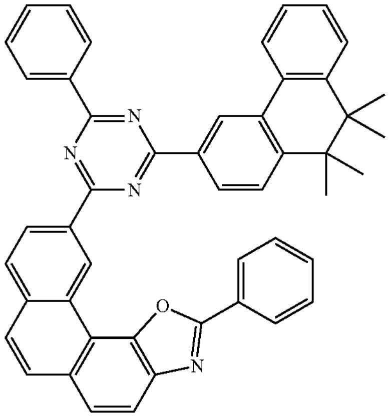
C-53
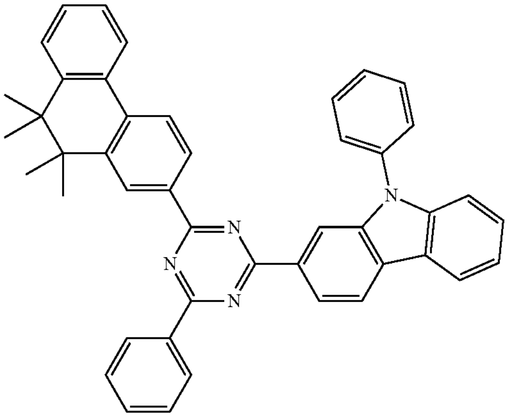
C-54
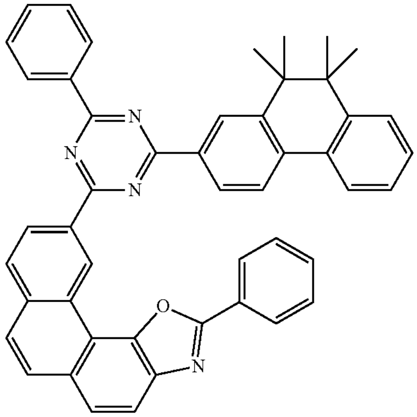

-continued
C-55
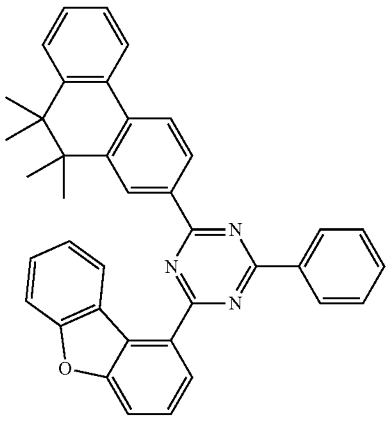
C-56
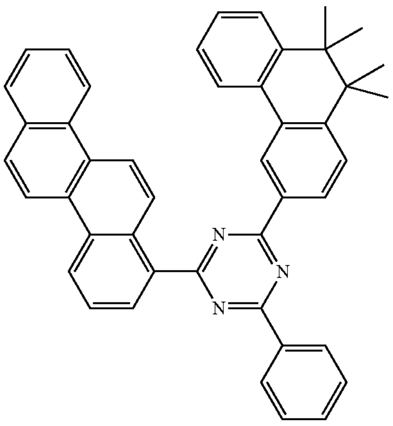
C-57
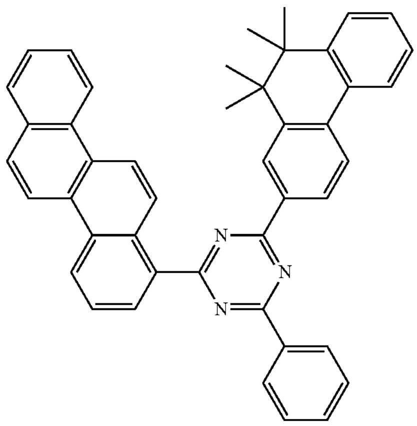
-continued
C-58
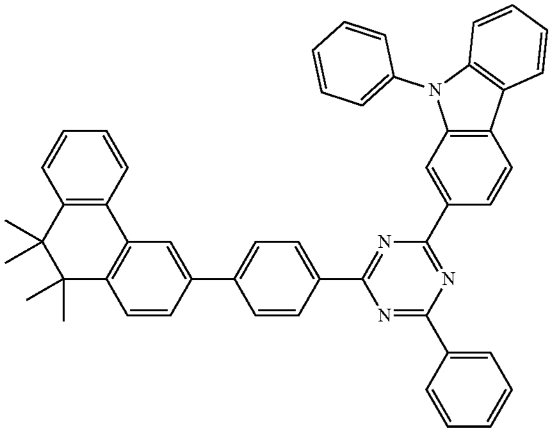
C-59
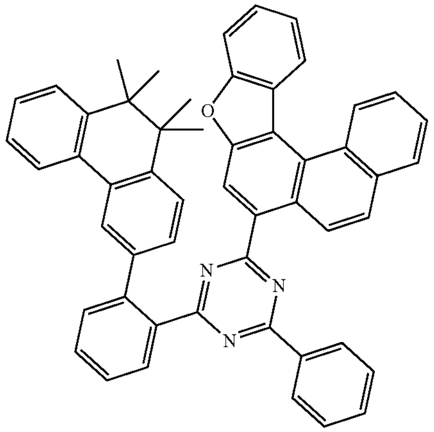
C-60
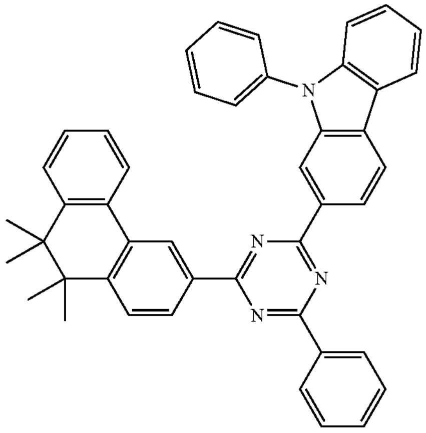

-continued
C-61
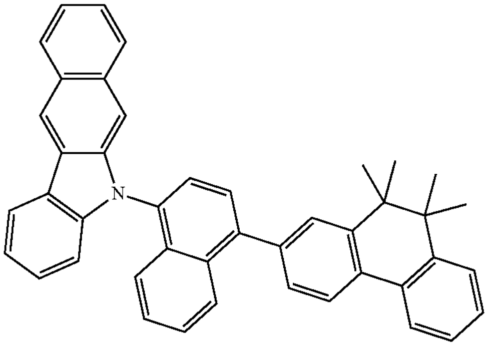
C-62
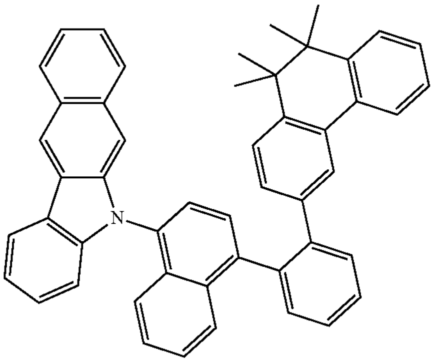
C-63
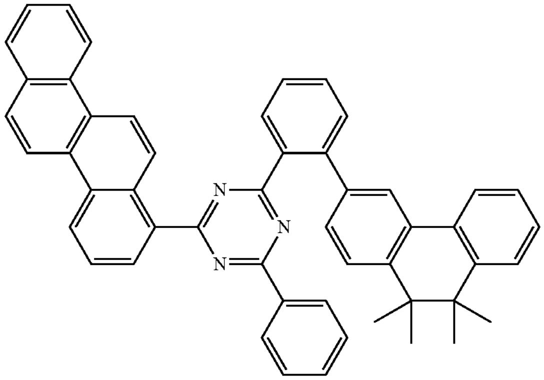
C-64
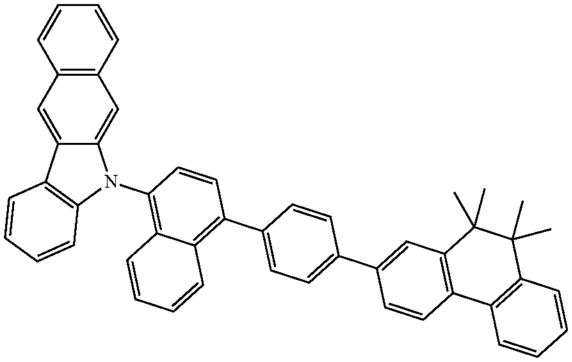
-continued
C-65
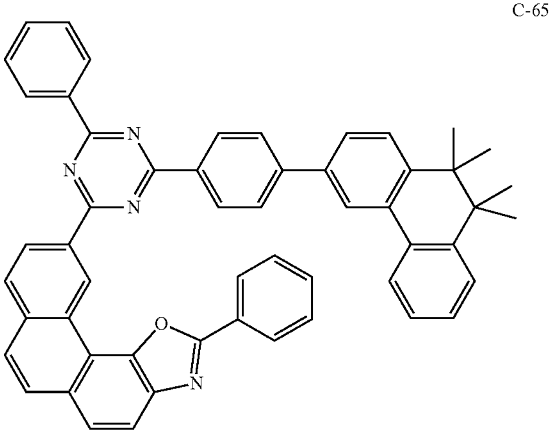
C-66
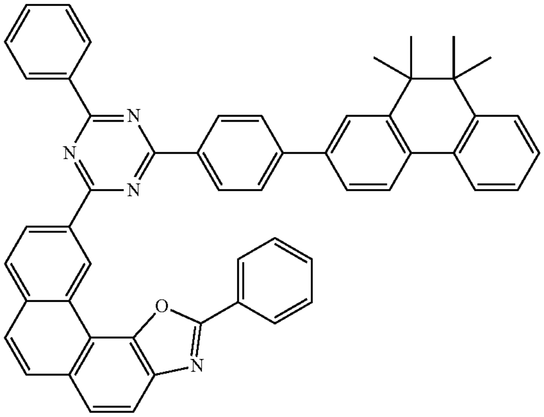
C-67
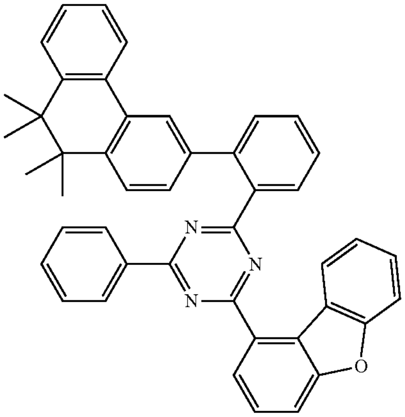

-continued
C-68
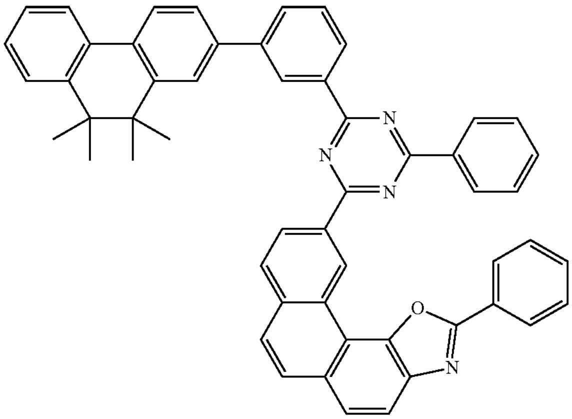
C-69
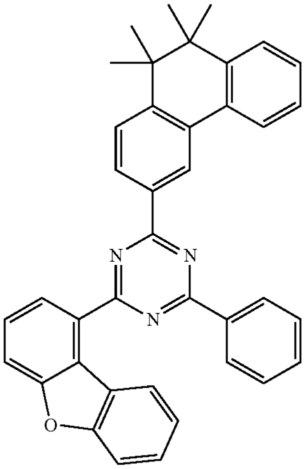
C-70
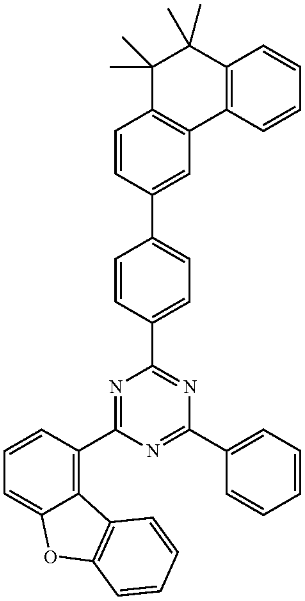
-continued
C-71
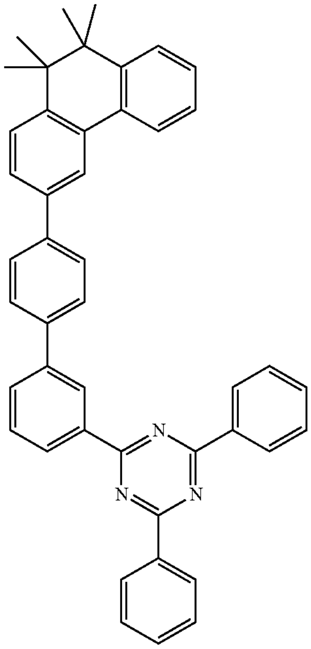
C-72
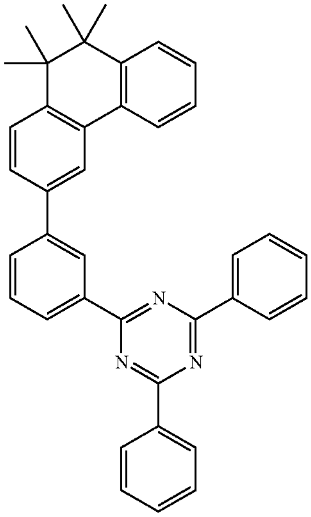

-continued

C-73

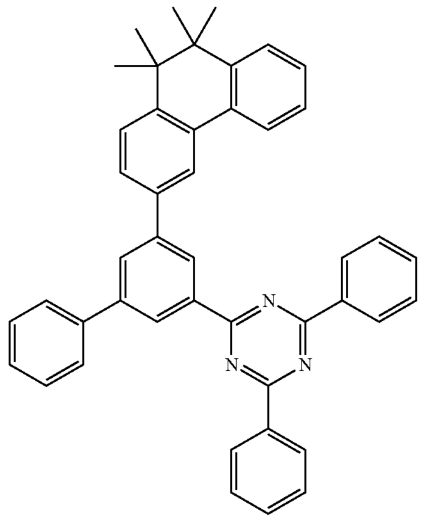

C-74

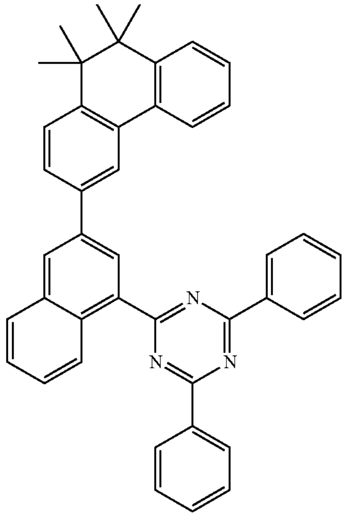

C-75

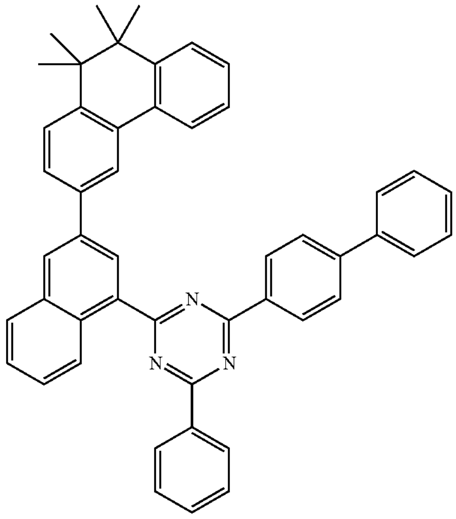

The compound represented by formula 2 according to the present disclosure may be prepared as shown in reaction scheme 1, but is not limited thereto, and may be prepared with reference to a synthesis method known to those skilled in the art.

[Reaction Scheme 1]

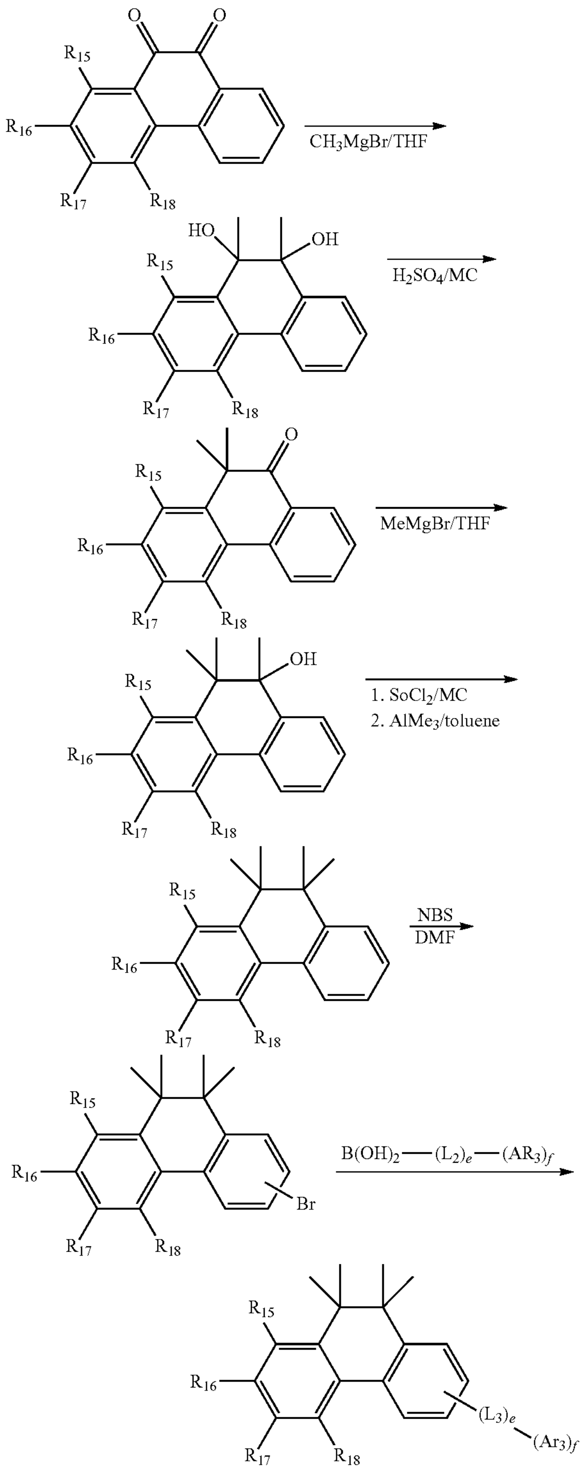

In reaction scheme 1, the definition of each substituent is as defined in formula 2.

As described above, exemplary synthesis examples of the compounds represented by formula 2 are described, but they are based on Sandmeyer reaction, Buchwald-Hartwig cross coupling reaction, N-arylation reaction, H-mont-mediated etherification reaction, Miyaura borylation reaction, Suzuki cross-coupling reaction, Intramolecular acid-induced cyclization reaction, Pd(II)-catalyzed oxidative cyclization reaction, Grignard reaction, Heck reaction, Cyclic Dehydration reaction, $SN_1$ substitution reaction, $SN_2$ substitution reaction, and Phosphine-mediated reductive cyclization reaction etc. It will be understood by one skilled in the art that the above reaction proceeds even if other substituents defined in formula 2, other than the substituents described in the specific synthesis examples, are bonded.

Hereinafter, an organic electroluminescent device to which the aforementioned plurality of host materials is applied, will be described.

The organic electroluminescent device according to one embodiment includes a first electrode; a second electrode; and at least one organic layer(s) interposed between the first electrode and the second electrode. The organic layer may include a light-emitting layer, and the light-emitting layer may comprise a plurality of host materials comprising at least one first host material represented by formula 1 and at least one second host material represented by formula 2. Wherein, the weight ratio of the first host compound to the second host compound may be in the range of about 1:99 to about 99:1, preferably about 10:90 to about 90:10, more preferably about 30:70 to about 70:30, more preferably about 40:60 to about 60:40, even more preferably about 50:50 in the light-emitting layer.

The plurality of host materials according to the present disclosure comprises at least one compound(s) of compounds H1-1 to H1-136, which is a first host compound represented by formula 1, and at least one compound(s) of compounds C-1 to C-75, which is a second host compound represented by formula 2. The plurality of host materials may be included in the same organic layer, for example a light-emitting layer, or may be included in different light-emitting layers, respectively.

The organic layer may further comprise at least one layer selected from a hole injection layer, a hole transport layer, a hole auxiliary layer, a light-emitting auxiliary layer, an electron transport layer, an electron injection layer, an interlayer, a hole blocking layer, an electron blocking layer, and an electron buffer layer in addition to the light-emitting layer. The organic layer may further comprise an amine-based compound and/or an azine-based compound other than the light-emitting material according to the present disclosure. Specifically, the hole injection layer, the hole transport layer, the hole auxiliary layer, the light-emitting layer, the light-emitting auxiliary layer, or the electron blocking layer may contain the amine-based compound, e.g., an arylamine-based compound and a styrylarylamine-based compound, etc., as a hole injection material, a hole transport material, a hole auxiliary material, a light-emitting material, a light-emitting auxiliary material, or an electron blocking material. Also, the electron transport layer, the electron injection layer, the electron buffer layer, or the hole blocking layer may contain the azine-based compound as an electron transport material, an electron injection material, an electron buffer material, or a hole blocking material. Further, the organic layer may further comprise at least one metal selected from the group consisting of metals of Group 1, metals of Group 2, transition metals of the $4^{th}$ period, transition metals of the $5^{th}$ period, lanthanides, and organic metals of the d-transition elements of the Periodic Table, or at least one complex compound comprising such a metal.

The plurality of host materials according to one embodiment may be used as light-emitting materials for a white organic light-emitting device. The white organic light-emitting device has suggested various structures such as a parallel side-by-side arrangement method, a stacking arrangement method, or CCM (color conversion material) method, etc., according to the arrangement of R (Red), G (Green), YG (yellowish green), or B (blue) light-emitting units. In addition, the plurality of host materials according to one embodiment may also be applied to the organic electroluminescent device comprising a QD (quantum dot).

One of the first electrode and the second electrode may be an anode and the other may be a cathode. Wherein, the first electrode and the second electrode may each be formed as a transmissive conductive material, a transflective conductive material, or a reflective conductive material. The organic electroluminescent device may be a top emission type, a bottom emission type, or a both-sides emission type according to the kinds of the material forming the first electrode and the second electrode.

A hole injection layer, a hole transport layer, an electron blocking layer, or a combination thereof can be used between the anode and the light-emitting layer. The hole injection layer may be multi-layers in order to lower the hole injection barrier (or hole injection voltage) from the anode to the hole transport layer or the electron blocking layer, wherein each of the multi-layers may use two compounds simultaneously. Also, the hole injection layer may be doped as a p-dopant. Also, the electron blocking layer may be placed between the hole transport layer (or hole injection layer) and the light-emitting layer, and can confine the excitons within the light-emitting layer by blocking the overflow of electrons from the light-emitting layer to prevent a light-emitting leakage. The hole transport layer or the electron blocking layer may be multi-layers, and wherein each layer may use a plurality of compounds.

An electron buffer layer, a hole blocking layer, an electron transport layer, an electron injection layer, or a combination thereof can be used between the light-emitting layer and the cathode. The electron buffer layer may be multi-layers in order to control the injection of the electron and improve the interfacial properties between the light-emitting layer and the electron injection layer, wherein each of the multi-layers may use two compounds simultaneously. The hole blocking layer may be placed between the electron transport layer (or electron injection layer) and the light-emitting layer, and blocks the arrival of holes to the cathode, thereby improving the probability of recombination of electrons and holes in the light-emitting layer. The hole blocking layer or the electron transport layer may also be multi-layers, wherein each layer may use a plurality of compounds. Also, the electron injection layer may be doped as an n-dopant.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. In addition, the hole auxiliary layer may be placed between the hole transport layer (or hole injection layer) and the light-emitting layer, and may be effective to promote or block the hole transport rate (or the hole injection rate), thereby enabling the charge balance to be controlled. When an organic electroluminescent device includes two or more hole transport layers, the hole transport layer, which is further included, may be used as the hole auxiliary layer or the electron blocking layer. The light-emitting auxiliary layer, the hole auxiliary layer, or the electron blocking layer may have an effect of improving the efficiency and/or the lifespan of the organic electroluminescent device.

In the organic electroluminescent device of the present disclosure, preferably, at least one layer (hereinafter, "a surface layer") selected from a chalcogenide layer, a halogenated metal layer, and a metal oxide layer may be placed on an inner surface(s) of one or both of a pair of electrodes. Specifically, a chalcogenide (including oxides) layer of silicon and aluminum is preferably placed on an anode surface of an electroluminescent medium layer, and a halogenated metal layer or a metal oxide layer is preferably placed on a cathode surface of an electroluminescent medium layer. The operation stability for the organic electroluminescent device may be obtained by the surface layer. Preferably, the chalcogenide includes $SiO_x(1 \le X \le 2)$, $AlO_x$ $(1 \le X \le 1.5)$, SiON, SiAlON, etc.; the halogenated metal includes LiF, $MgF_2$, $CaF_2$, a rare earth metal fluoride, etc.; and the metal oxide includes $Cs_2O$, $Li_2O$, MgO, SrO, BaO, CaO, etc.

In addition, in the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. Also, a reductive dopant layer may be employed as a charge generating layer to prepare an organic electroluminescent device having two or more light-emitting layers and emitting white light.

An organic electroluminescent device according to one embodiment may further comprise at least one dopant in the light-emitting layer. In one embodiment, the doping concentration of the dopant compound with respect to the host compound in the light-emitting layer may be less than 20 wt %.

The dopant comprised in the organic electroluminescent device of the present disclosure may be at least one phosphorescent or fluorescent dopant, preferably a phosphorescent dopant. The phosphorescent dopant material applied to the organic electroluminescent device of the present disclosure is not particularly limited, but may be preferably a metallated complex compound(s) of a metal atom(s) selected from iridium (Ir), osmium (Os), copper (Cu), and platinum (Pt), more preferably an ortho-metallated complex compound(s) of a metal atom(s) selected from iridium (Ir), osmium (Os), copper (Cu), and platinum (Pt), and even more preferably ortho-metallated iridium complex compound(s).

The dopant comprised in the organic electroluminescent device of the present disclosure may use the compound represented by the following formula 101, but is not limited thereto.

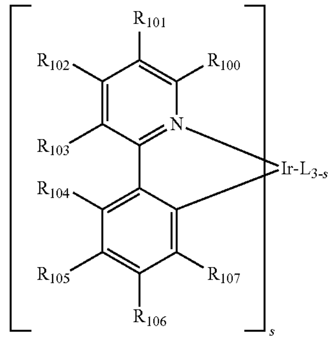

(101)

in formula 101,

L is selected from the following structures 1 and 2;

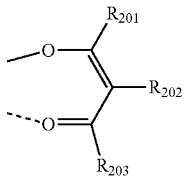

structure (1)

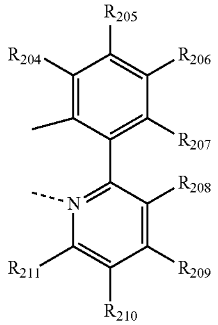

structure (2)

$R_{100}$ to $R_{103}$ each independently represent, hydrogen, deuterium, halogen, (C1-C30)alkyl unsubstituted or substituted with deuterium and/or halogen, a substituted or unsubstituted (C3-C30)cycloalkyl, a substituted or unsubstituted (C6-C30)aryl, cyano, a substituted or unsubstituted (3- to 30-membered)heteroaryl, or a substituted or unsubstituted (C1-C30)alkoxy; or may be linked to the adjacent substituents to form a ring(s), for example, to form a ring(s) with a pyridine, e.g., a substituted or unsubstituted quinoline, a substituted or unsubstituted benzofuropyridine, a substituted or unsubstituted benzothienopyridine, a substituted or unsubstituted indenopyridine, a substituted or unsubstituted benzofuro quinoline, a substituted or unsubstituted benzothienoquinoline, or a substituted or unsubstituted indenoquinoline;

$R_{104}$ to $R_{107}$ each independently represent, hydrogen, deuterium, halogen, (C1-C30)alkyl unsubstituted or substituted with deuterium and/or halogen, a substituted or unsubstituted (C3-C30)cycloalkyl, a substituted or unsubstituted (C6-C30)aryl, a substituted or unsubstituted (3- to 30-membered)heteroaryl, cyano, or a substituted or unsubstituted (C1-C30)alkoxy; or may be linked to an adjacent substituent(s) to form a substituted or unsubstituted ring(s), for example, to form a ring(s) with a benzene, e.g., a substituted or unsubstituted naphthalene, a substituted or unsubstituted fluorene, a substituted or unsubstituted dibenzothiophene, a substituted or unsubstituted dibenzofuran, a substituted or unsubstituted indenopyridine, a substituted or unsubstituted benzofuropyridine, or a substituted or unsubstituted benzothienopyridine;

$R_{201}$ to $R_{211}$ each independently represent, hydrogen, deuterium, halogen, (C1-C30)alkyl unsubstituted or substituted with deuterium and/or halogen, a substituted or unsubstituted (C3-C30)cycloalkyl, or a substituted or unsubstituted (C6-C30)aryl; or may be linked to an adjacent substituent(s) to form a ring(s); and s represents an integer of 1 to 3.

Specifically, the specific examples of the dopant compound include the following, but are not limited thereto.

D-1

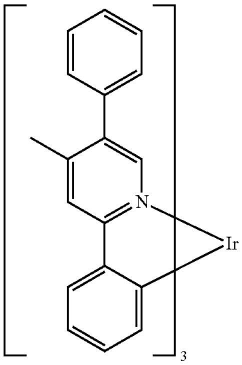

D-2

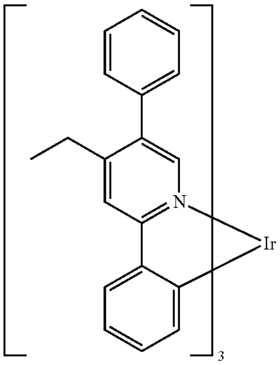

D-3

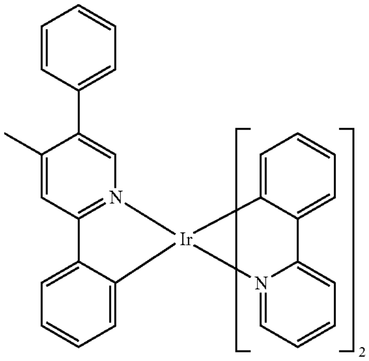

-continued

D-4

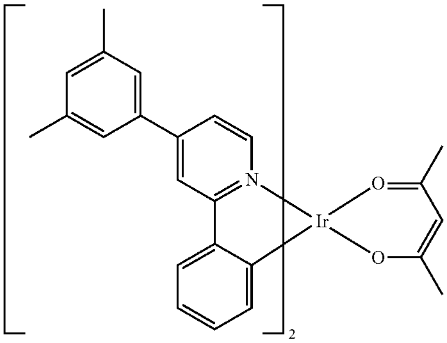

D-5

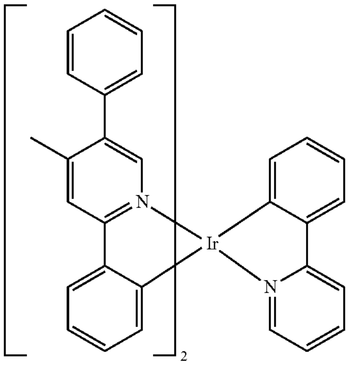

D-6

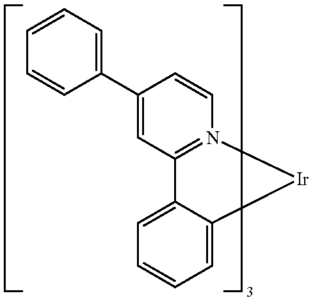

D-7

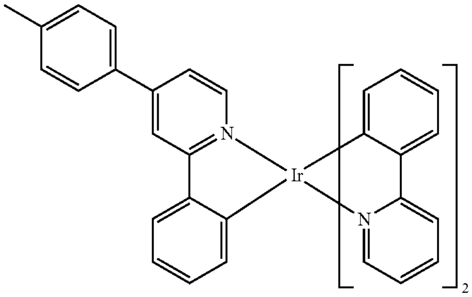

-continued
D-8
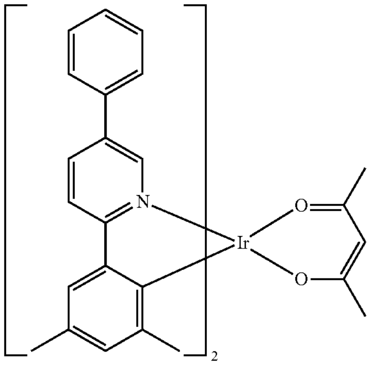
D-9
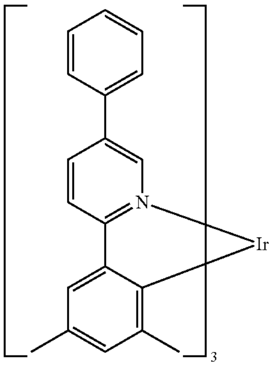
D-10
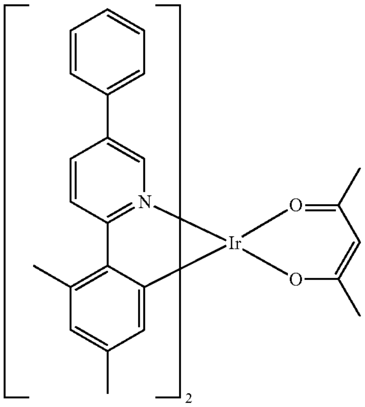
D-11
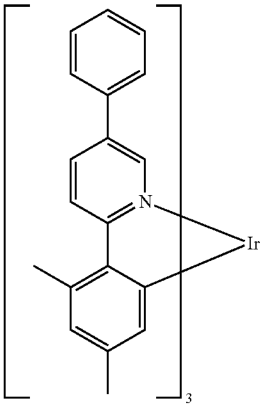
-continued
D-12
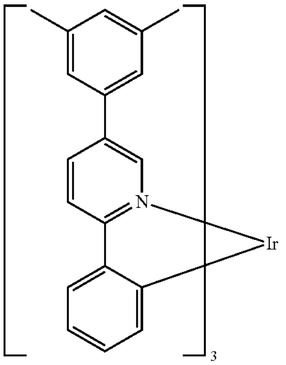
D-13
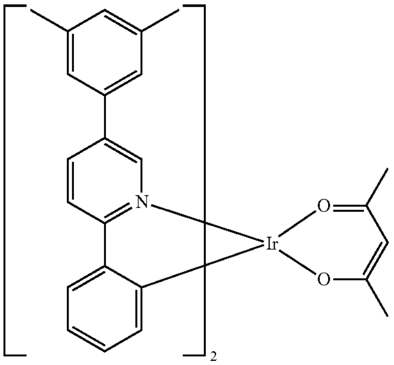
D-14
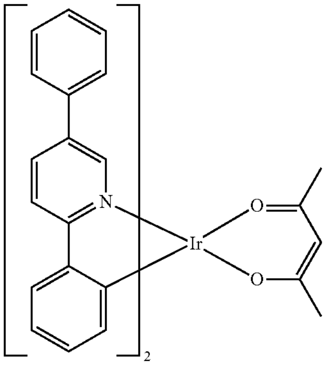
D-15
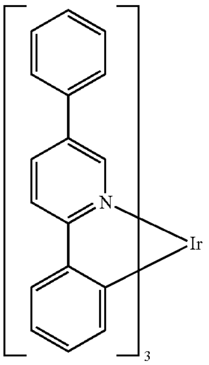

-continued
D-16
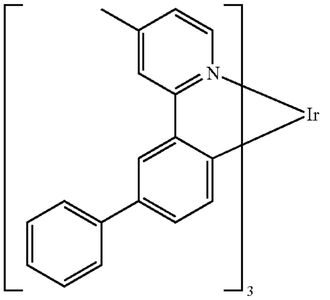
D-17
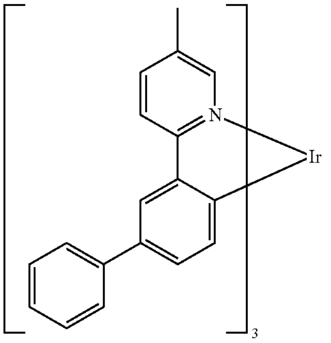
D-18
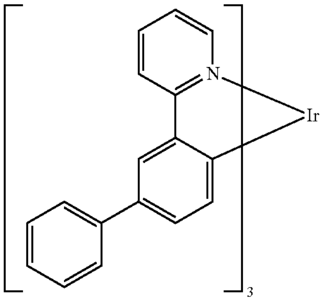
D-19
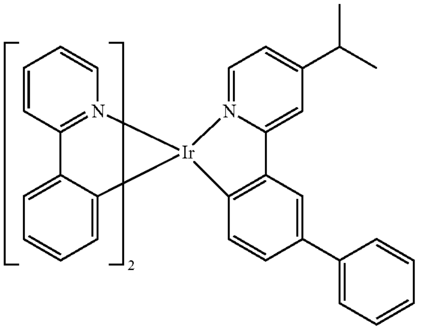
D-20
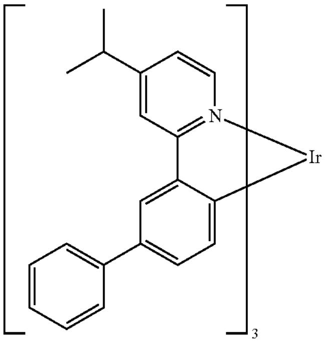
-continued
D-21
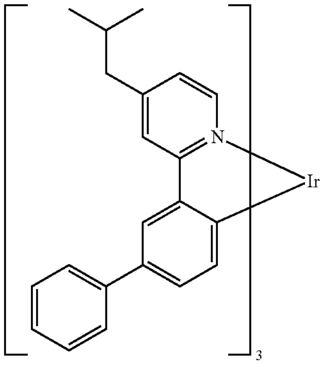
D-22
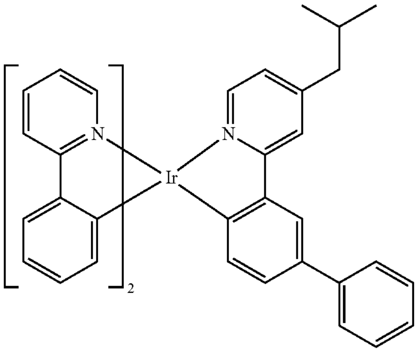
D-23
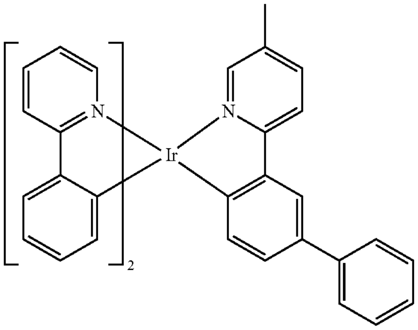
D-24
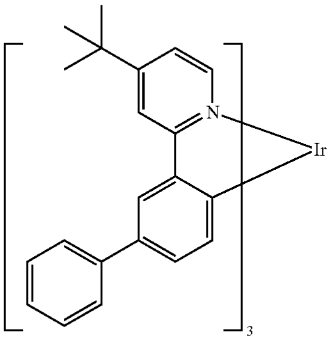

-continued
D-25
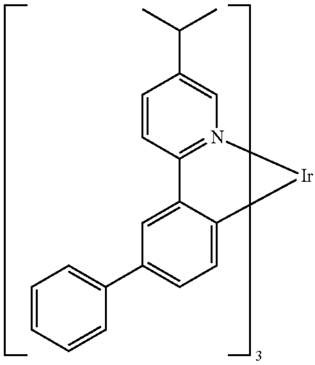
D-26
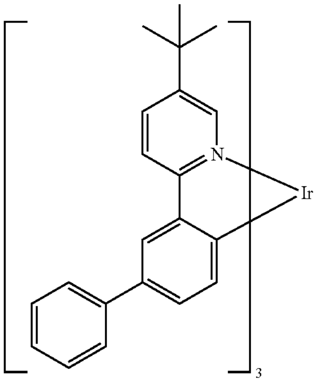
D-27
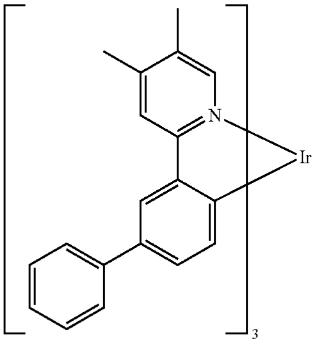
D-28
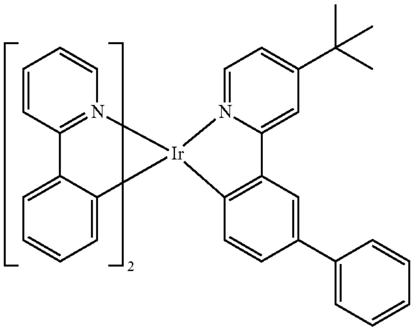
-continued
D-29
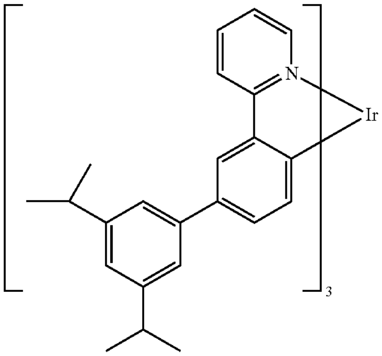
D-30
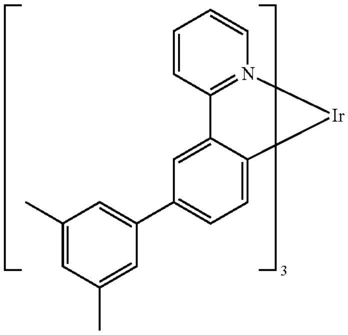
D-31
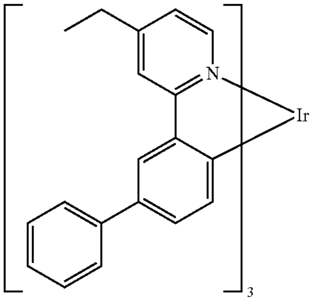
D-32
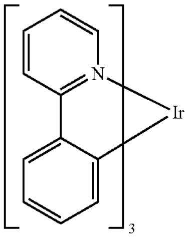
D-33
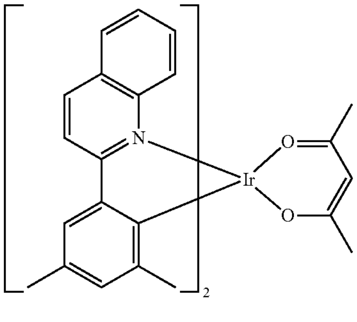

-continued
D-34
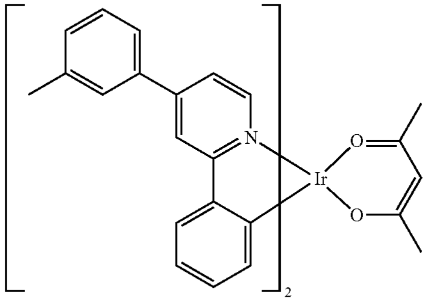
D-35
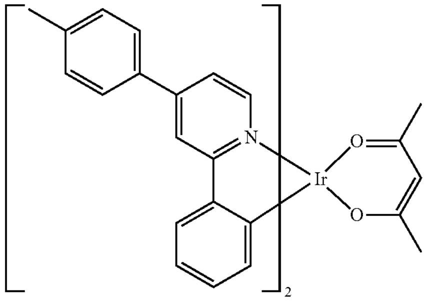
D-36
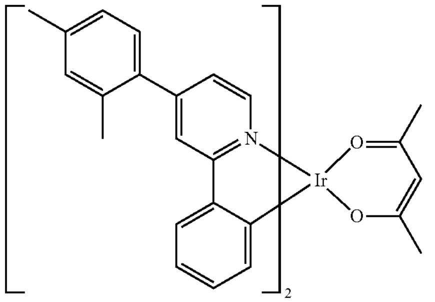
D-37
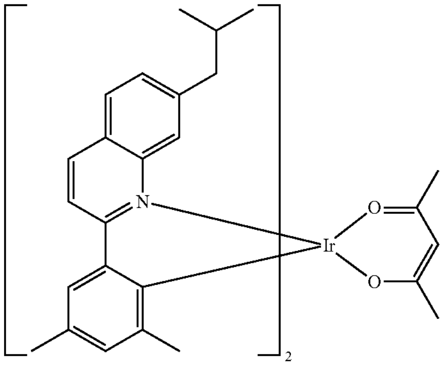
D-38
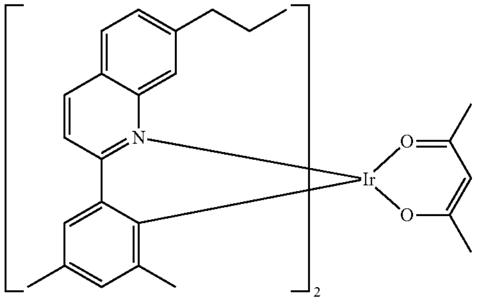
-continued
D-39
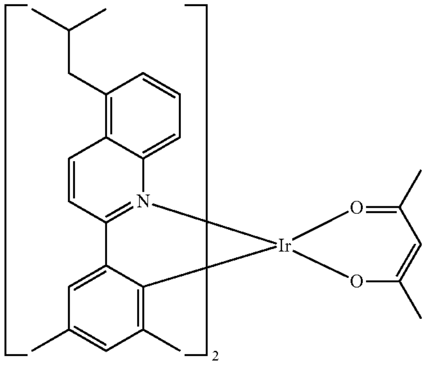
D-40
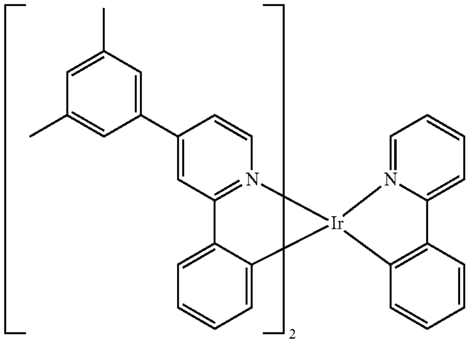
D-41
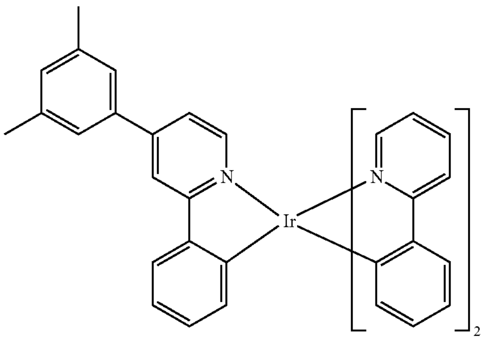
D-42
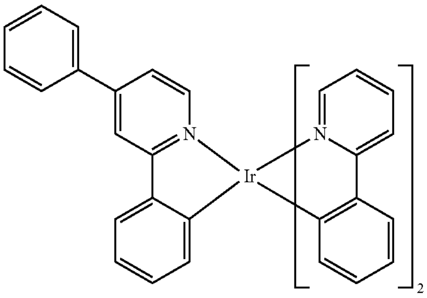

-continued
D-43
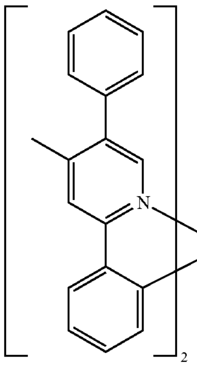
D-44
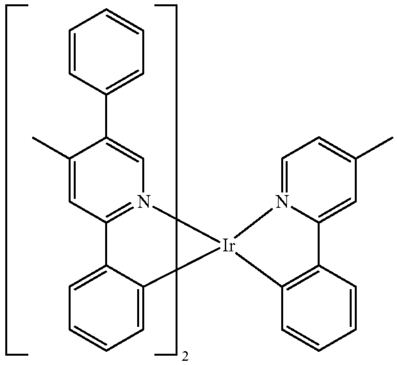
D-45
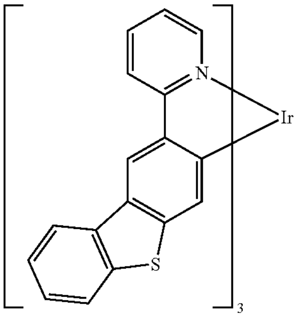
D-46
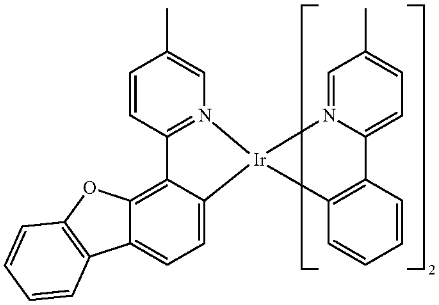
-continued
D-47
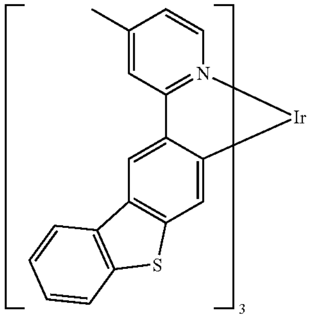
D-48
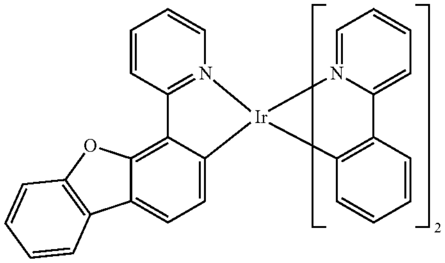
D-49
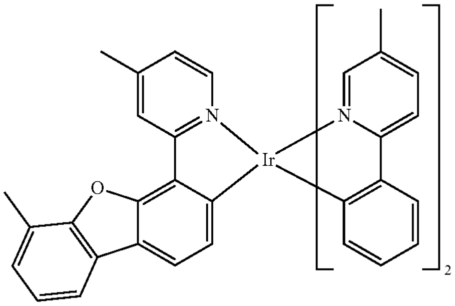
D-50
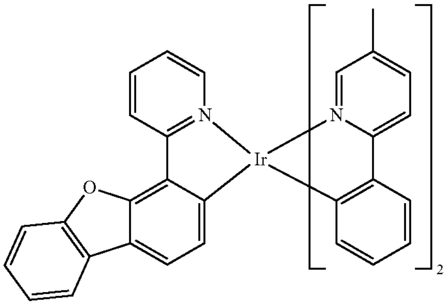
D-51
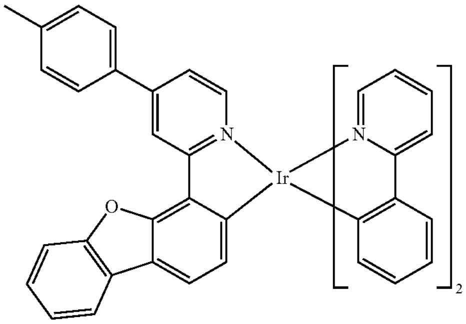

-continued
D-52
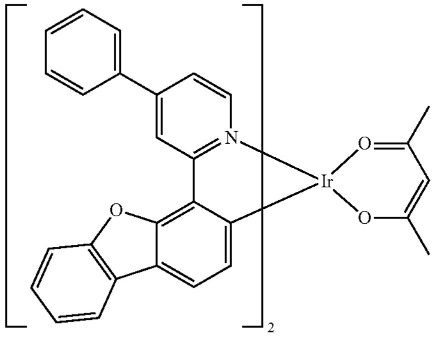
D-53
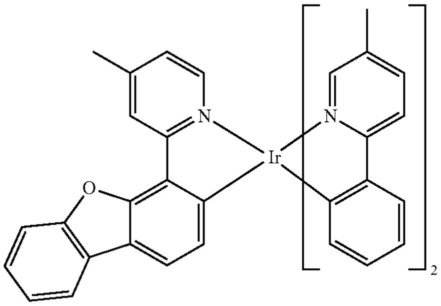
D-54
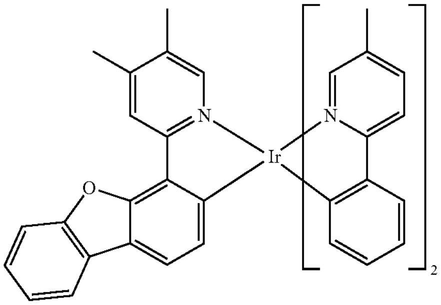
D-55
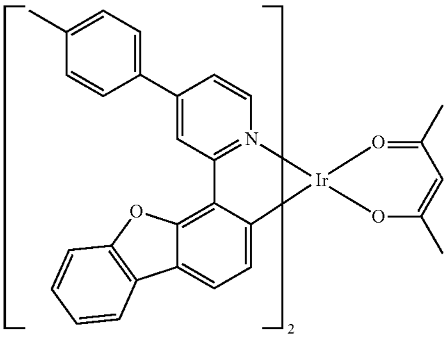
D-56
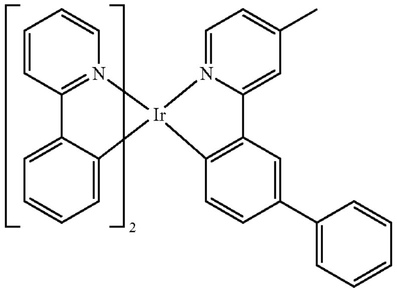
-continued
D-57
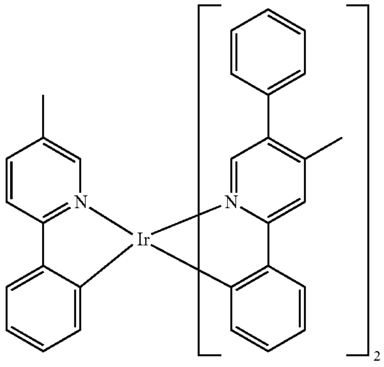
D-58
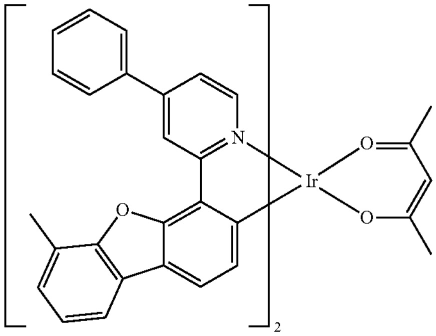
D-59
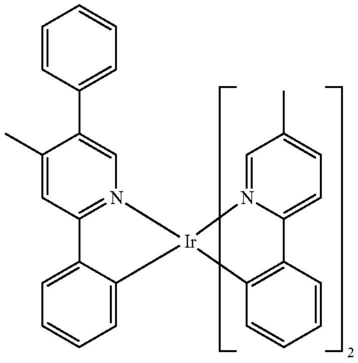
D-60
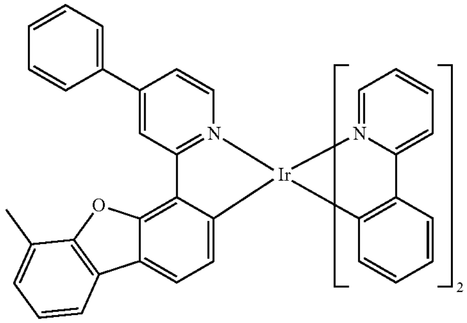

-continued
D-61
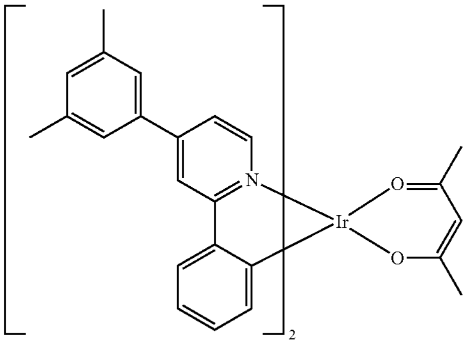
D-62
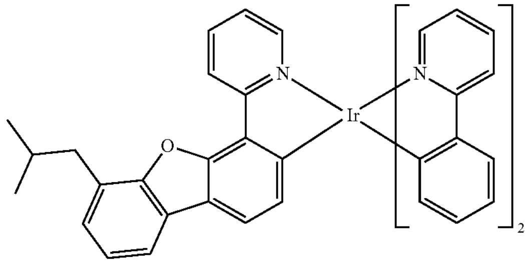
D-63
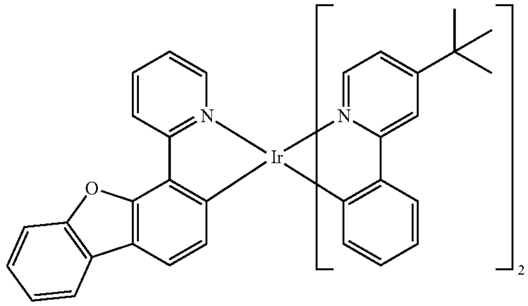
D-64
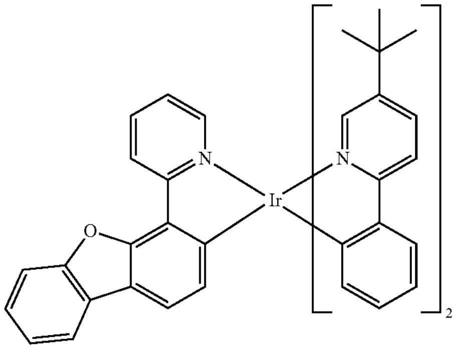
-continued
D-65
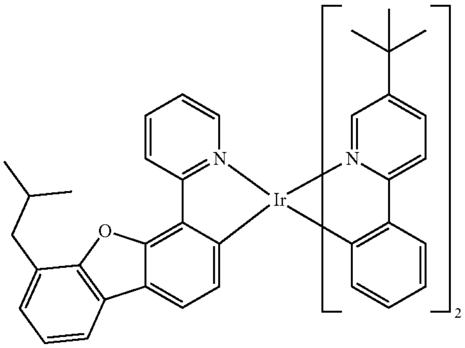
D-66
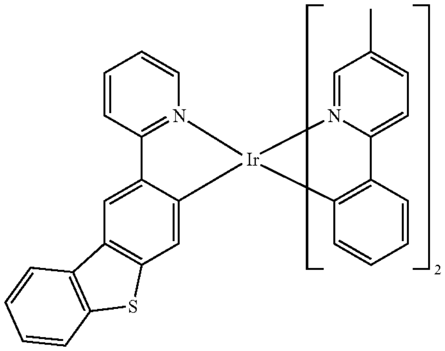
D-67
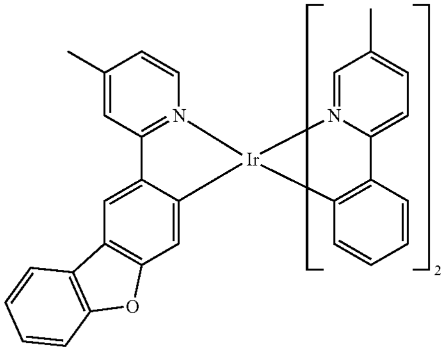
D-68
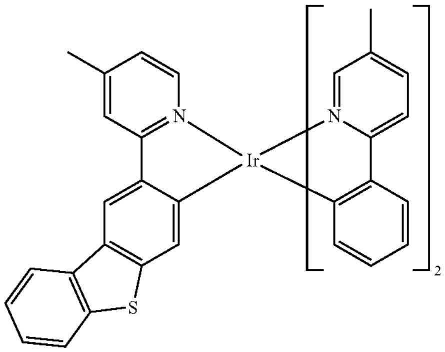

-continued
D-69
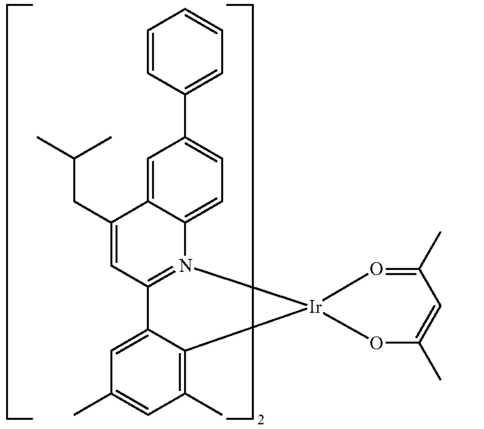
D-70
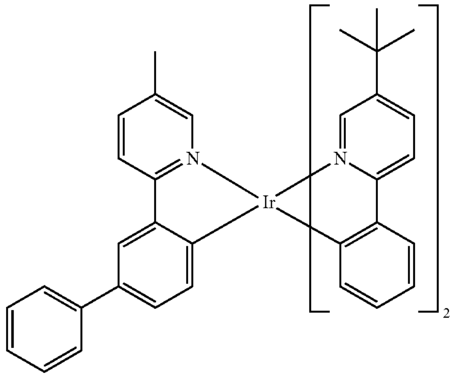
D-71
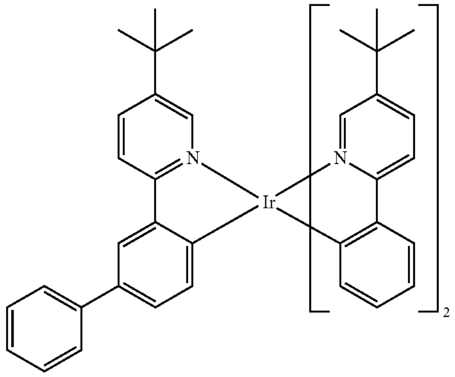
D-72
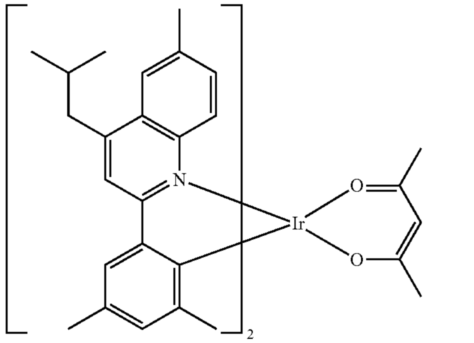
-continued
D-73
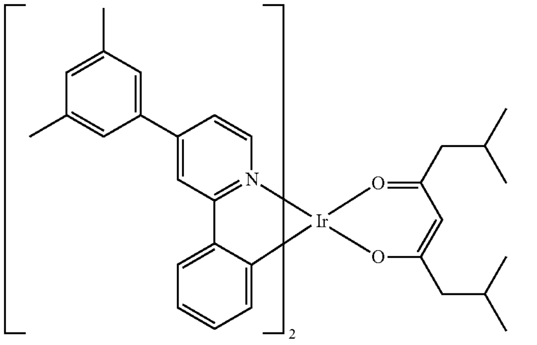
D-74
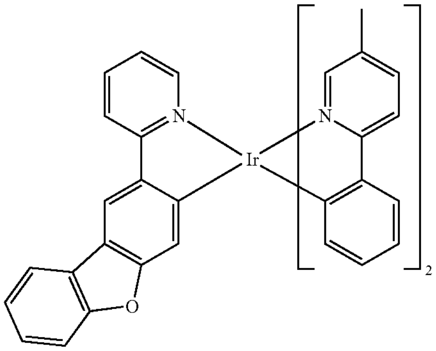
D-75
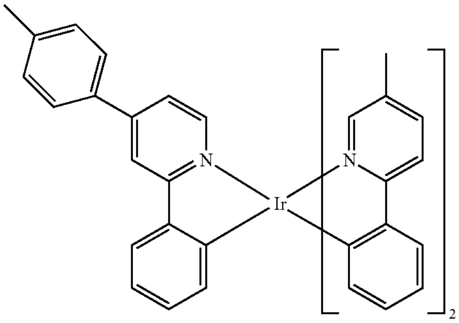
D-76
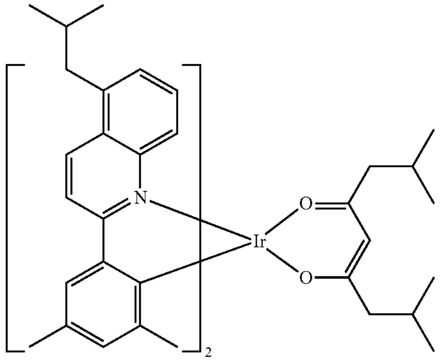

-continued
D-77
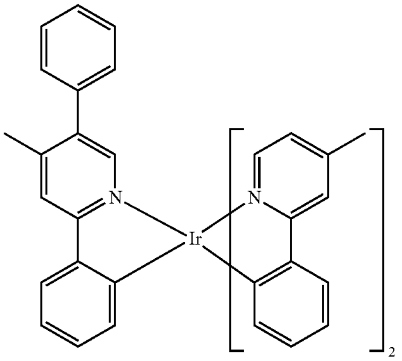
D-78
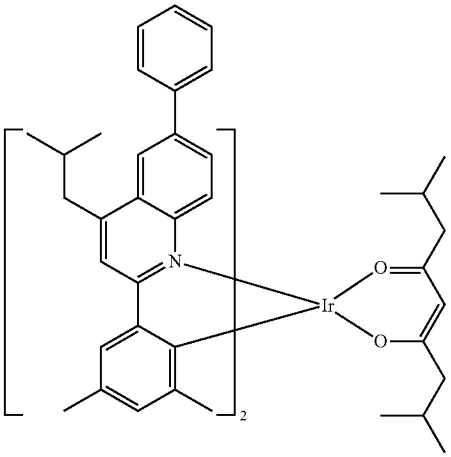
D-79
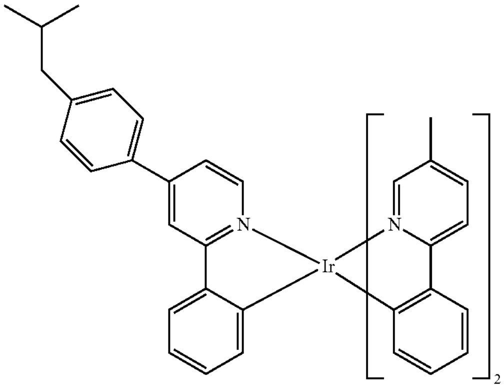
D-80
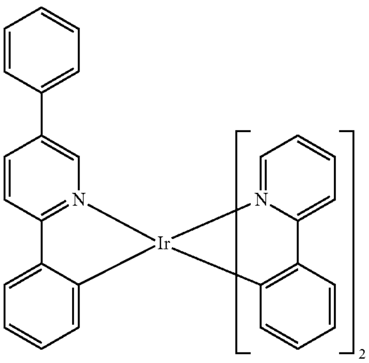
-continued
D-81
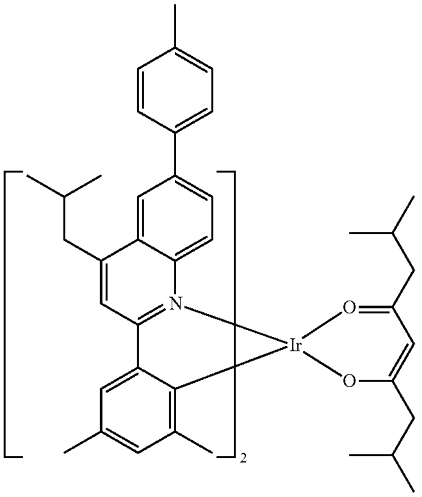
D-82
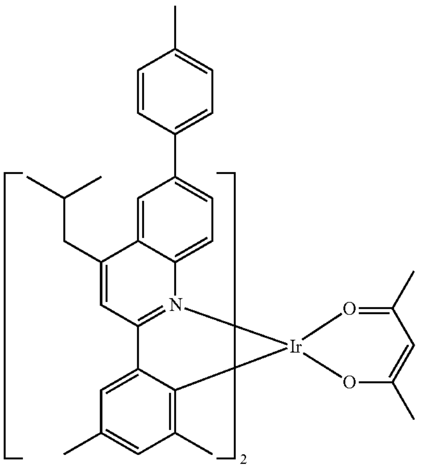
D-83
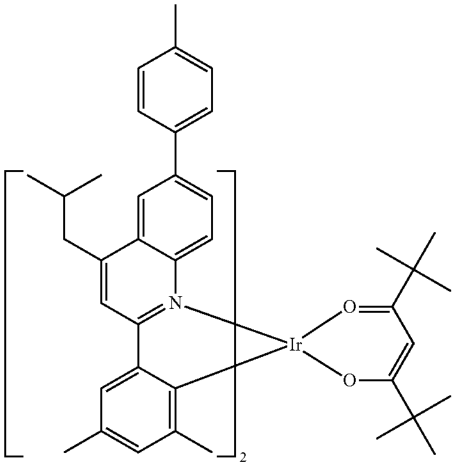

-continued
D-84
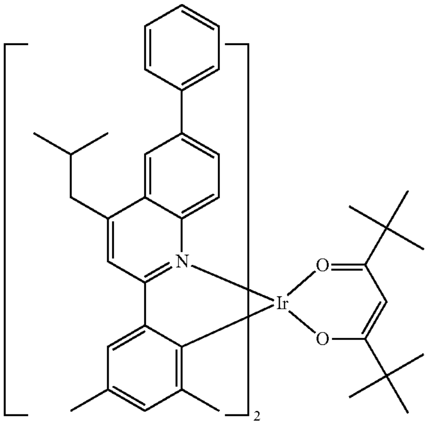
D-85
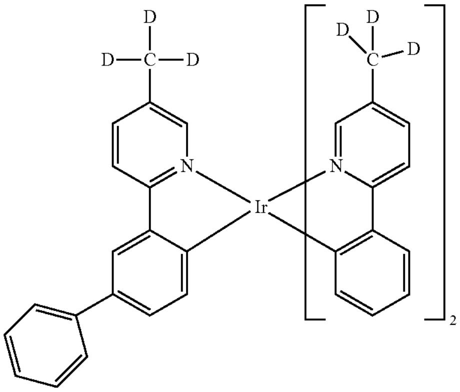
D-86
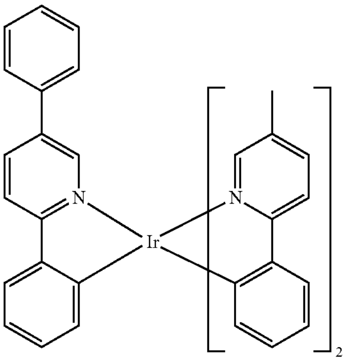
D-87
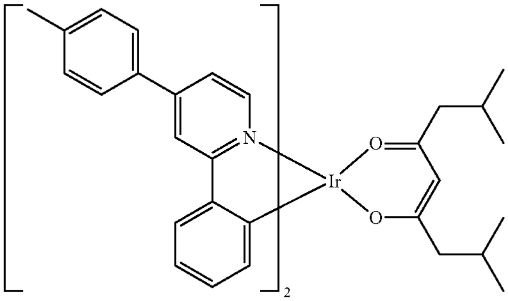
-continued
D-88
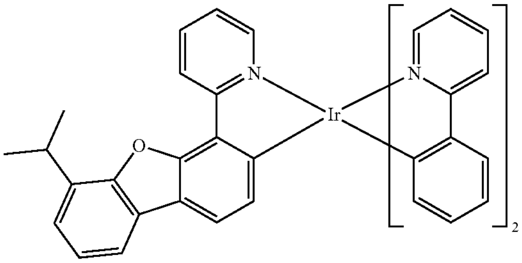
D-89
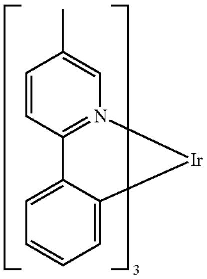
D-90
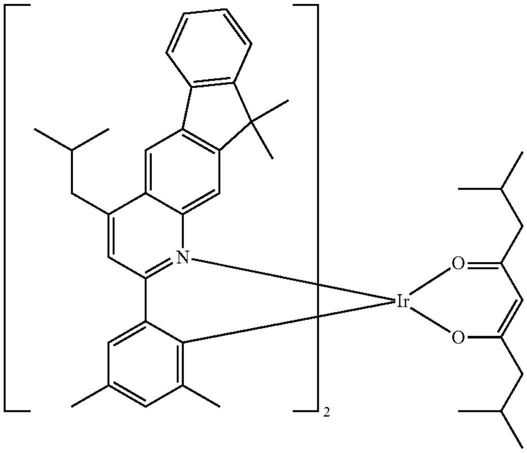
D-91
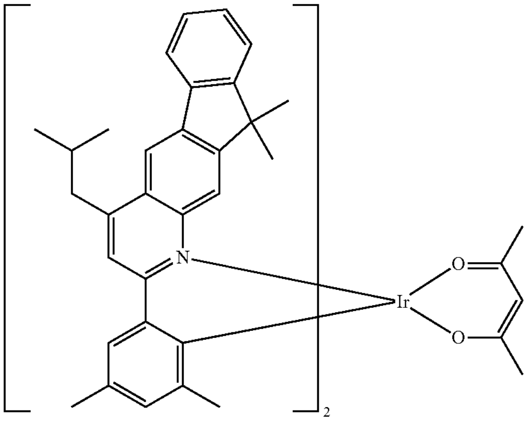

-continued
D-92
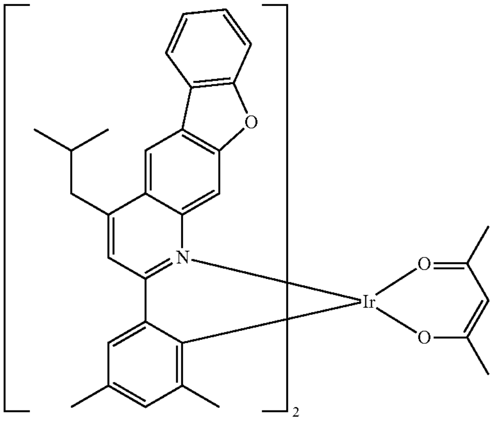
D-93
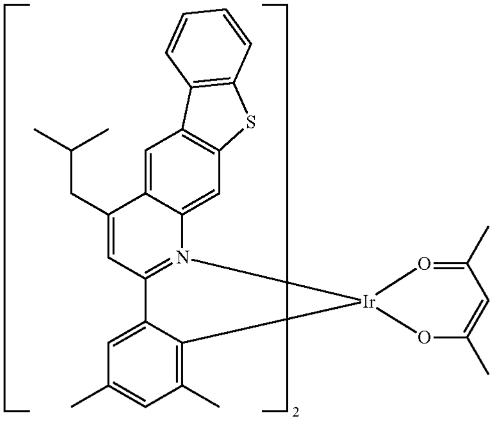
D-94
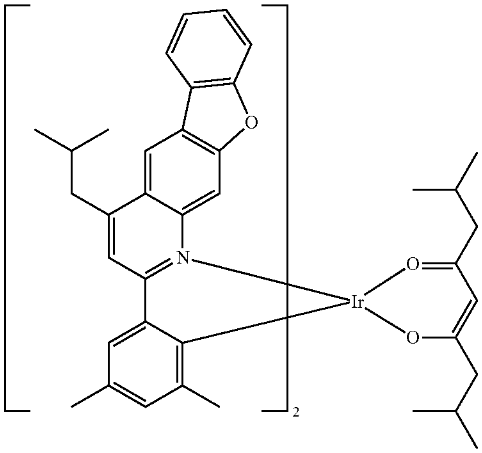
-continued
D-95
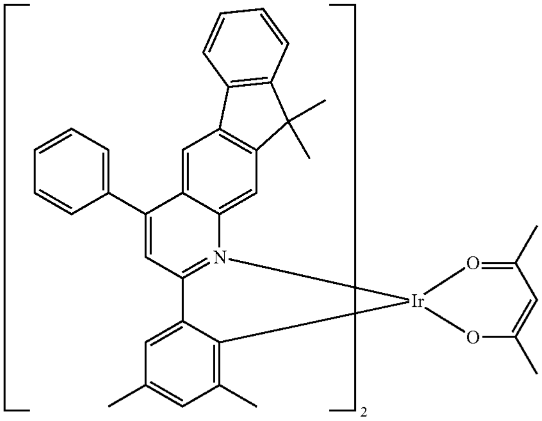
D-96
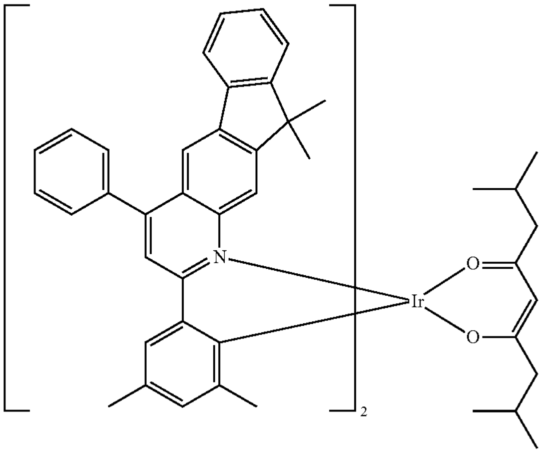
D-97
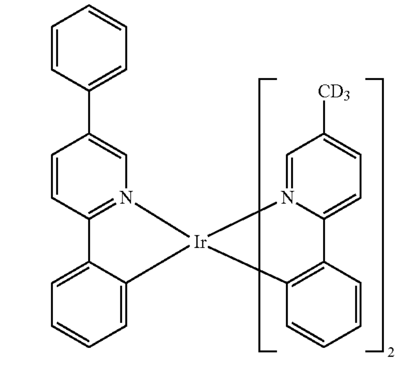
D-98
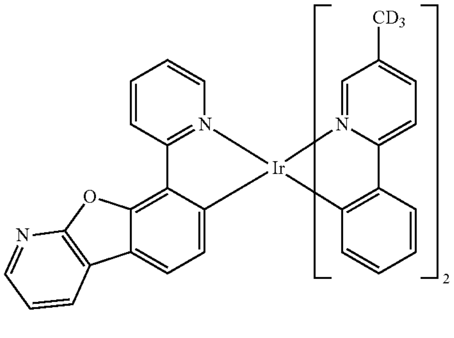

-continued
D-99
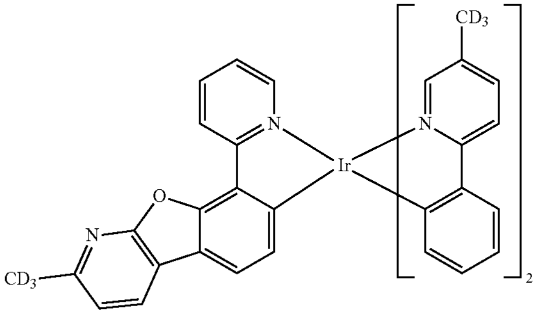
D-100
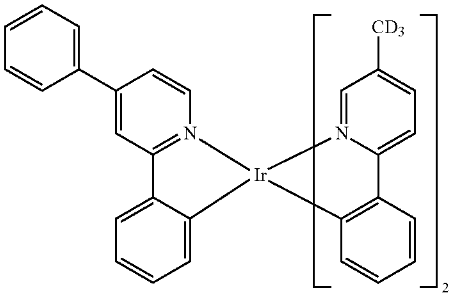
D-101
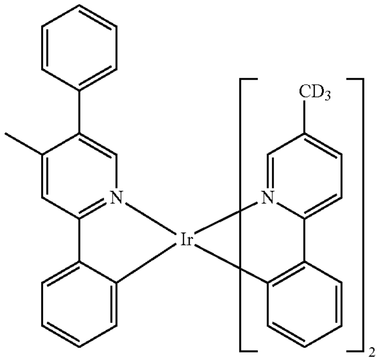
D-102
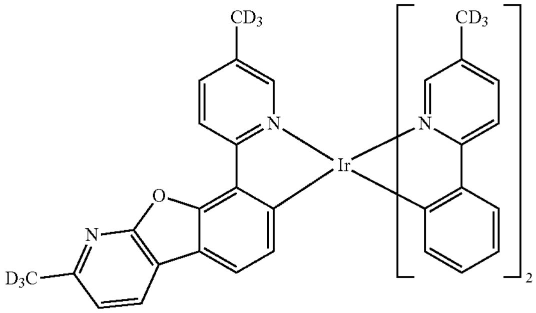
-continued
D-103
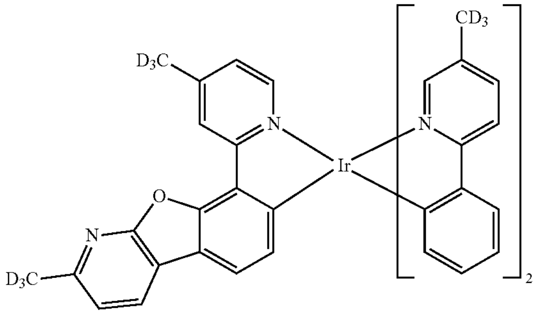
D-104
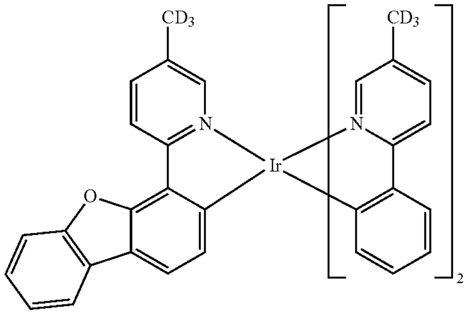
D-105
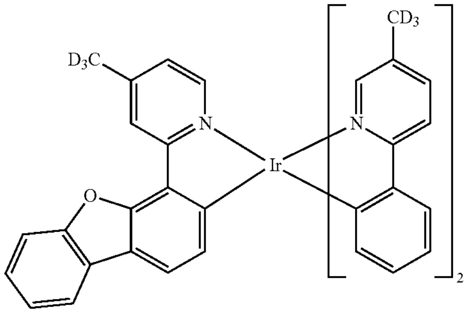
D-106
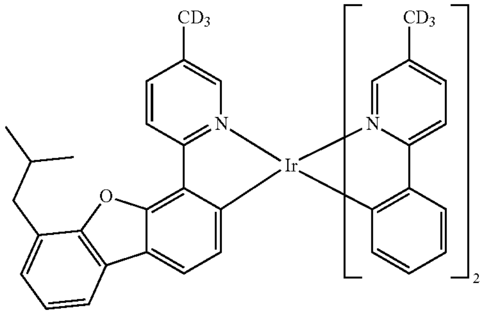

-continued
D-107
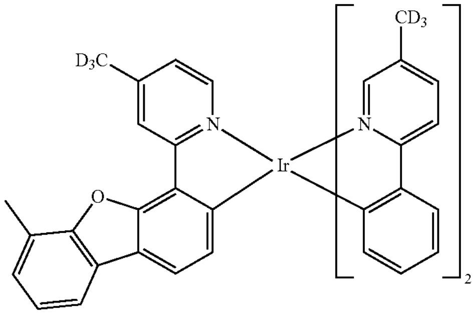
D-108
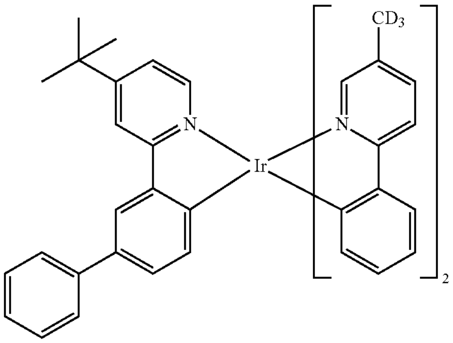
D-109
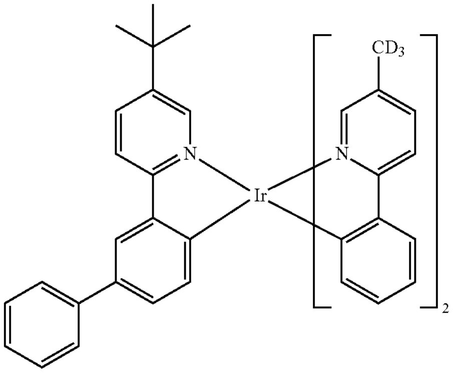
D-110
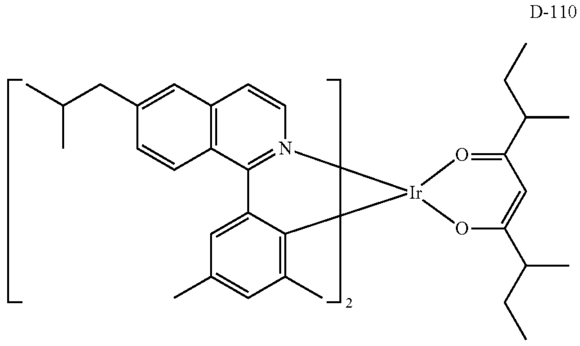
-continued
D-111
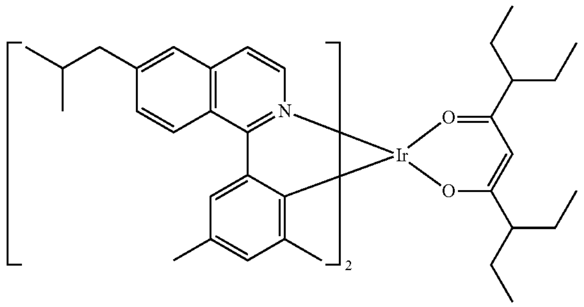
D-112
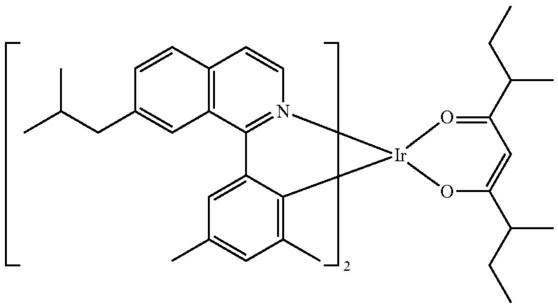
D-113
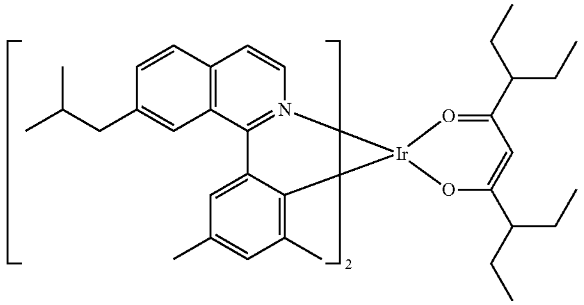
D-114
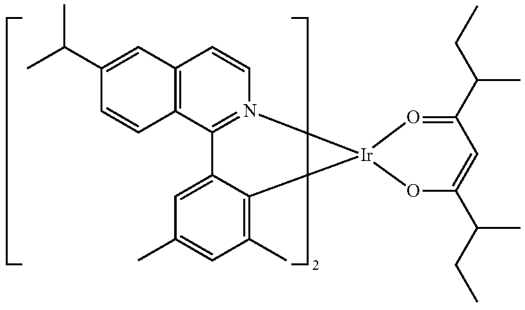
D-115
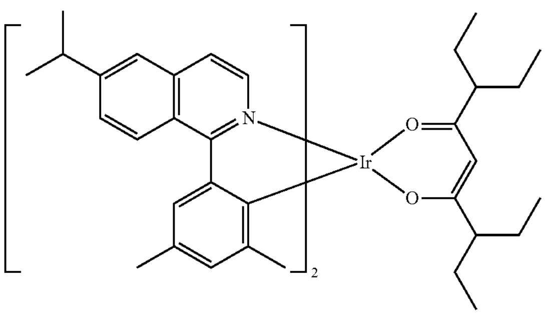

-continued

D-116

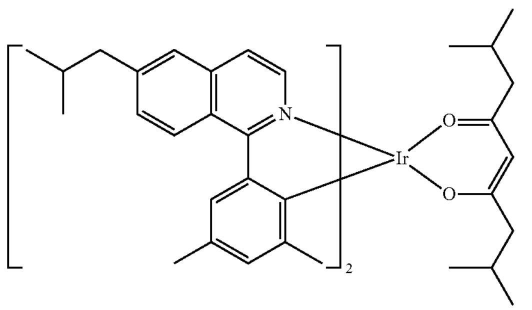

D-117

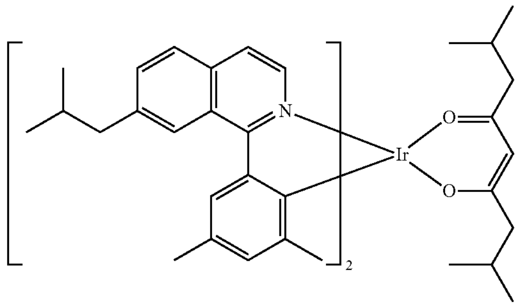

D-118

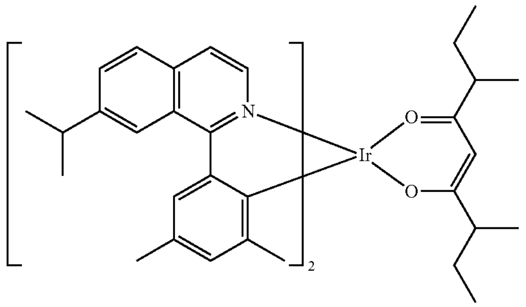

D-119

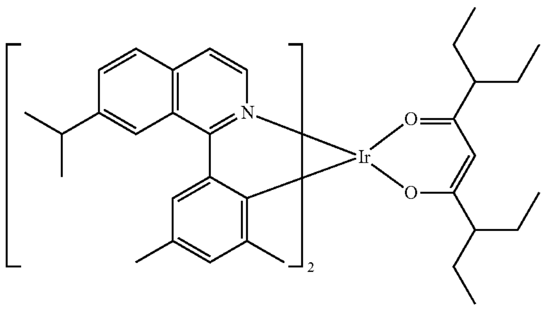

In order to form each layer of the organic electroluminescent device of the present disclosure, dry film-forming methods such as vacuum evaporation, sputtering, plasma, ion plating methods, etc., or wet film-forming methods such as spin coating, dip coating, flow coating methods, etc., can be used. When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

When forming a layer by the first host material and the second host material according to one embodiment, the layer can be formed by the above-listed methods, and can often be formed by co-deposition or mixture-deposition. The co-deposition is a mixed deposition method in which two or more materials are put into respective individual crucible sources and a current is applied to both cells simultaneously to evaporate the materials; and the mixed deposition is a method in which two or more materials are mixed in one crucible source before deposition, and then a current is applied to one cell to evaporate the materials.

According to one embodiment, when the first host compound and the second host compound are present in the same layer or different layers in the organic electroluminescent device, the two host compounds may be individually formed. For example, after depositing the first host material, a second host material may be deposited.

According to one embodiment, the present disclosure can provide display devices comprising a plurality of host materials including a first host material represented by formula 1 and a second host material represented by formula 2. In addition, by using the organic electroluminescent device of the present disclosure, display devices such as smartphones, tablets, notebooks, PCs, TVs, or display devices for vehicles, or lighting devices such as outdoor or indoor lighting can be prepared.

Hereinafter, the preparation method of compounds according to the present disclosure will be explained with reference to the synthesis method of a representative compound or intermediate compound in order to understand the present disclosure in detail.

EXAMPLE 1

Synthesis of Compound C-69

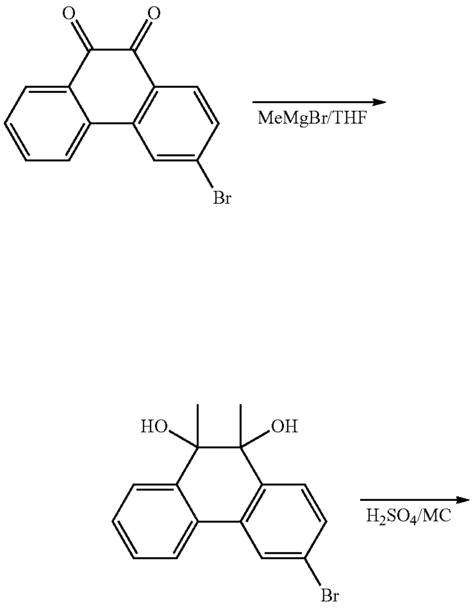

1

-continued

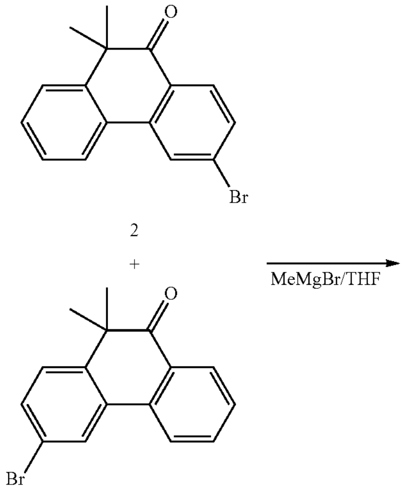

2

+

3

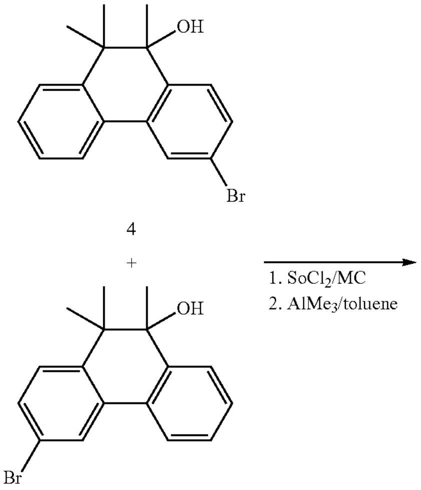

4

+

5

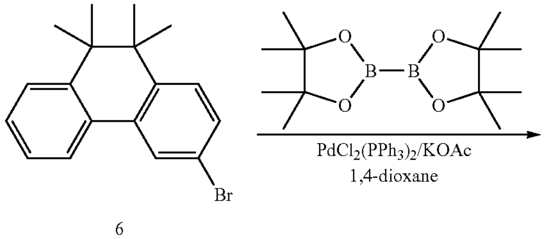

6

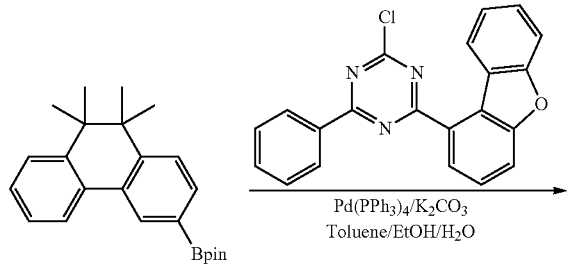

7

-continued

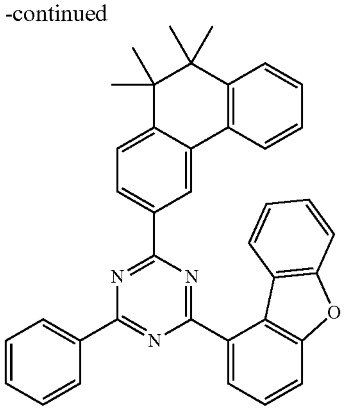

C-69

1) Synthesis of Compound 1

In a flask, 3-bromophenanthrene-9,10-dione (60.0 g, 209 mmol) was dissolved in THF solution (1 L), and then 209 mL (627 mmol) of methylmagnesium bromide (MeMgBr) (3 M in THF solution) was added dropwise thereto at 0° C. at a nitrogen charge followed by stirring for 1 hour. Upon completion of the reaction, after quenching MeMgBr with isopropyl alcohol (IPA), MeOH, and $H_2O$, the reaction mixture was neutralized with an aqueous $NH_4Cl$ solution and extracted with ethylene acetate (EA), and then dried over magnesium sulfate ($MgSO_4$). After separation with Celite filter, MeOH was added thereto, and the resulting solid was filtered under reduced pressure to obtain compound 1 (74.0 g, yield: 110%).

2) Synthesis of Compounds 2 and 3

Compound 1 (74.0 g, 232 mmol), $H_2SO_4$ (18.9 mL, 348 mmol) and 1,000 mL of methylchloride (MC) were added to a flask, and then stirred under reflux at 80° C. for 1 hour. After completion of the reaction, $H_2O$ was added to the reaction mixture to dilute $H_2SO$, and the reaction mixture was neutralized with $NaHCO_3$, extracted with MC, and dried over $MgSO_4$. After separation by column chromatography, MeOH was added thereto, and the resulting solid was filtered under reduced pressure to obtain compounds 2 and 3 (60.0 g, yield: 85%).

3) Synthesis of Compounds 4 and 5

In a flask, compounds 2 and 3 (60.0 g, 199 mmol) was dissolved in THF (1 L) and then 99.6 mL (299 mmol) of MeMgBr (3 M in THF solution) was added dropwise thereto at 0° C. at a nitrogen charge followed by stirring for 3 hours. After completion of the reaction, the reaction mixture was neutralized with IPA and aqueous $NH_4Cl$ solution, and extracted with MC and then dried over $MgSO_4$. After separation by column chromatography, MeOH was added thereto, and the resulting solid was filtered under reduced pressure to obtain compounds 4 and 5 (63.2 g, yield: 100%).

4) Synthesis of Compound 6

Compounds 4 and 5 (63.2 g, 199.2 mmol) and 183 mL of thionyl chloride ($SOCl_2$) (1M in MC solution) were added to a flask, and then stirred at 0° C. for 2 hours, Next, after lowering the temperature to −78° C., 183 mL of trimethylaluminum ($AlMe_3$) (2M in toluene solution) was added, stirred for 3 hours, and overnight reaction was performed at room temperature. Upon completion of the reaction, after quenching the solution with IPA and $H_2O$, the layers were separated with MC. After separation by column chromatography, MeOH was added thereto, and the resulting solid was filtered under reduced pressure to obtain compound 6 (59.0 g, yield: 94%).

5) Synthesis of Compound 7

Compound 6 (30.0 g. 95.2 mmol), 4,4,4',4',5,5,5',5'-octamethyl-2,2'-bi(1,3,2-dioxaborolane) (29.0 g, 114.1 mmol), $PdCl_2(PPh_3)_2$ (3.34 g. 4.76 mmol). KOAc (23.3 g, 237.9 mmol), and 500 mL of 1,4-dioxane were added to a flask, and then stirred under reflux at 140° C. for 2 hours. Upon completion of the reaction, after separation by column chromatography, MeOH was added thereto, and the resulting solid was filtered under reduced pressure to obtain compound 7 (31.0 g, yield: 90%).

6) Synthesis of Compound C-69

Compound 7 (4.5 g, 12.4 mmol), Z-chloro-4-(dibenzo[b, d]furan-1-yl)-6-phenyl-1,3,5-triazine (4.65 g, 13.0 mmol), $Pd(PPh_3)_4$ (0.716 g, 0.62 mmol), $K_2CO_3$ (6.88 g, 31.0 mmol), 30 mL of toluene, 15 mL of EtOH, and 15 mL of $H_2O$ were added to a flask, and then stirred at 140° C. for 2 hours. Upon completion of the reaction, after removing the organic solvent and separating the resulting solid by column chromatography, MeOH was added thereto, and the resulting solid was filtered under reduced pressure to obtain compound C-69 (2.8 g, yield: 40%).

| | MW | color | M.P |
|---|---|---|---|
| C-69 | 557.68 | white | 198.1° C. |

EXAMPLE 2

Synthesis of Compound C-21

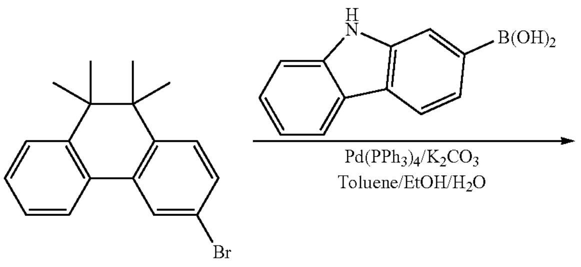

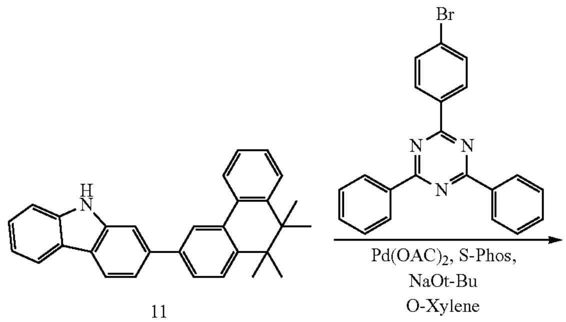

11

-continued

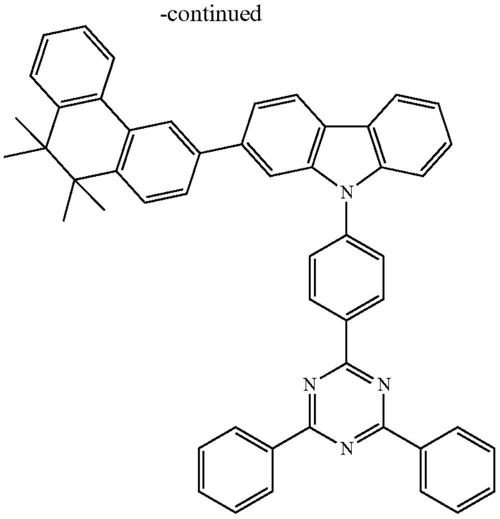

C-21

1) Synthesis of Compound 11

3-Bromo-9,9,10,10-tetramethyl-9,10-dihydrophenanthrene (13.3 g, 42.1 mmol), (9H-carbazol-2-yl)boronic acid (13.3 g, 63.1 mmol), $Pd(PPh_3)_4$ (2.43 g, 2.1 mmol), $K_2CO_3$ (11.6 g, 84.2 mmol), 210 mL of toluene, 40 mL of $H_2O$, and 20 mL of EtOH were added to a flask, and then stirred at 150° C. After completion of the reaction, EA and water were added to separate only the organic layer, and then the solvent was removed by filtration under reduced pressure. After separation by column chromatography, MeOH was added thereto, and the resulting solid was filtered under reduced pressure to obtain compound 11 (6.9 g, yield: 40.8%).

2) Synthesis of Compound C-21

Compound 11 (6.9 g. 15.9 mmol), 2-(4-bromophenyl)-4,6-diphenyl-1,3,5-triazine (6.8 g, 17.5 mmol), $Pd(OAC)_2$ (0.18 g, 0.8 mmol), S-Phos (0.65 g, 1.59 mmol), NaOt-Bu (3.0 g, 31.8 nmol) and 160 mL of o-xylene were added to a flask, and then stirred at 180° C. After completion of the reaction, EA and water were added to separate only the organic layer, and then the solvent was removed by filtration under reduced pressure. After separation by column chromatography, MeOH was added thereto, and the resulting solid was filtered under reduced pressure to obtain compound C-21 (4.8 g, yield: 42.8%).

| | MW | color | M.P |
|---|---|---|---|
| C-21 | 708.9 | white | 300° C. |

Hereinafter, the preparation method of an organic electroluminescent device comprising the plurality of host materials according to the present disclosure, and the device property thereof will be explained in order to understand the present disclosure in detail.

DEVICE EXAMPLE 1

Preparation of OLED by Co-Depositing the First Host Compound and the Second Host Compound According to the Present Disclosure An OLED according to the present disclosure was produced. First, a transparent electrode indium tin oxide (ITO)

thin film (10 Ω/sq) on a glass substrate for an OLED (GEOMATEC CO., LTD., Japan) was subjected to an ultrasonic washing with acetone and isopropyl alcohol, sequentially, and thereafter was stored in isopropyl alcohol and then used. Thereafter, the ITO substrate was mounted on a substrate holder of a vacuum vapor deposition apparatus. Then, compound HI-1 was introduced into a cell of the vacuum vapor deposition apparatus, and compound HT-1 was introduced into another cell. The two materials were evaporated at different rates and compound HI-1 was deposited in a doping amount of 3 wt % based on the total amount of compounds HI-1 and HT-1 to form a hole injection layer having a thickness of 10 nm. Next, compound HT-1 was deposited as a first hole transport layer having a thickness of 80 nm on the hole injection layer. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: each of the first host compound and the second host compound described in the following Table 1 were introduced into two cells of the vacuum vapor deposition apparatus as hosts, respectively, and compound D-39 was introduced into another cell as a dopant. The two host materials were evaporated at a rate of 1:1 and the dopant material was evaporated at a different rate, simultaneously, and was deposited in a doping amount of 3 wt % based on the total amount of the hosts and dopant to form a light-emitting layer having a thickness of 40 nm on the second hole transport layer. Next, compounds ETL-1 and EIL-1 as electron transport materials were deposited at a weight ratio of 50:50 to form an electron transport layer having a thickness of 35 nm on the light-emitting layer. After depositing compound EIL-1 as an electron injection layer having a thickness of 2 nm on the electron transport layer, an Al cathode having a thickness of 80 nm was deposited on the electron injection layer by another vacuum vapor deposition apparatus. Thus, an OLED was produced. Each compound used for all the materials were purified by vacuum sublimation under $10^{-6}$ torr.

DEVICE EXAMPLES 2 AND 3

Preparation of OLEDs by Co-Depositing the First Host Compound and the Second Host Compound According to the Present Disclosure OLEDs were manufactured in the same manner as in Device Example 1, except that the compounds of the following Table 1 were used as the second host of the light-emitting layer.

COMPARATIVE EXAMPLE 1

Preparation of OLED by Depositing a Single Host

An OLED was manufactured in the same manner as in Device Example 1, except that the first host compound of the following Table 1 was used as the host of the light-emitting layer alone.

The driving voltage, luminous efficiency, and the luminous color at a luminance of 1,000 nits and the time taken for luminance to decrease from 100% to 95% at a luminance of 5,000 nits (lifespan: T95) of the OLED devices of Device Examples 1 to 3 and Comparative Example 1 produced as described above, are measured, and the results thereof are shown in the following Table 1.

TABLE 1

| | First Host Compound | Second Host Compound | Driving Voltage (V) | Luminous Efficiency (cd/A) | Luminous Color | Lifespan (T95, hr) |
|---|---|---|---|---|---|---|
| Comparative Example 1 | H1-9 | — | 4.2 | 6.9 | Red | 13.2 |
| Device Example 1 | H1-9 | C-69 | 2.9 | 30.5 | Red | 287 |
| Device Example 2 | H1-9 | C-1 | 3.1 | 33.3 | Red | 230 |
| Device Example 3 | H1-9 | C-21 | 3.1 | 33.2 | Red | 354 |

From Table 1 above, it can be seen that the organic electroluminescent device comprising a specific combination of compounds according to the present disclosure as host materials has a low driving voltage and high luminous efficiency, and in particular, significantly improved lifespan characteristics compared to the organic electroluminescent device comprising a single host material (Comparative Example 1).

The compounds used in Device Examples 1 to 3 and Comparative Example 1 are specifically shown in the following Table 2.

TABLE 2
| | |
|---|---|
| Hole Injection Layer/ Hole Transport Layer | 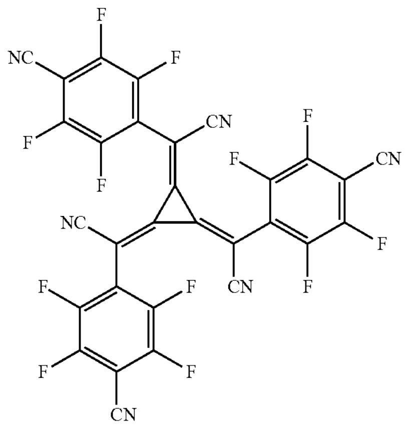 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F] HI-1 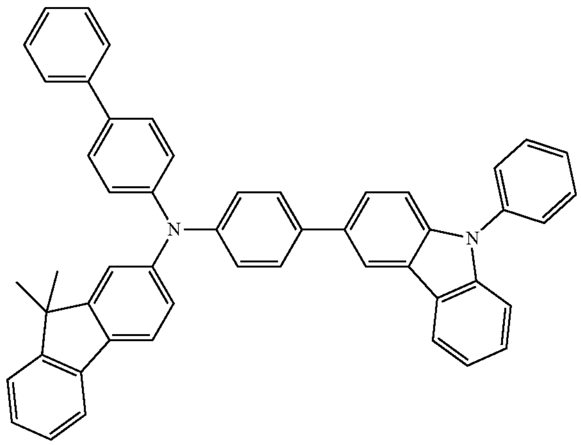 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21] HT-1 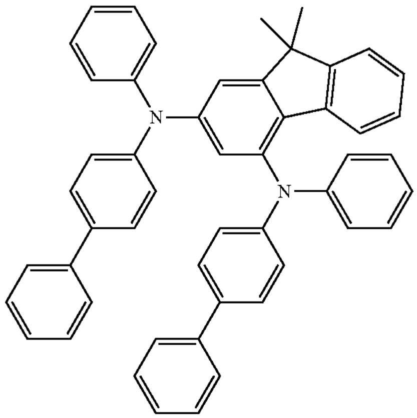 [SMILES: CC1(C)c2ccccc2-c2c(N(c3ccccc3)c3ccc(-c4ccccc4)cc3)cc(N(c3ccccc3)c3ccc(-c4ccccc4)cc3)cc21] HT-2 |

TABLE 2-continued
Light-Emitting Layer
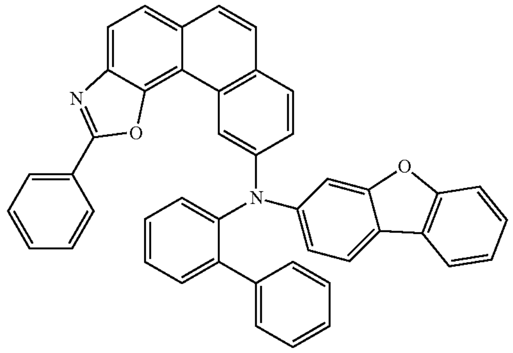 [SMILES: c1ccc(-c2nc3ccc4ccc5ccc(N(c6ccc7c(c6)oc6ccccc67)c6ccccc6-c6ccccc6)cc5c4c3o2)cc1]
H1-9
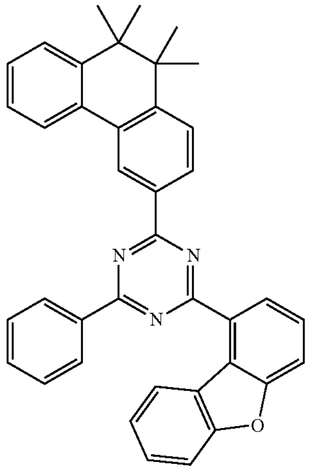 [SMILES: CC1(C)c2ccccc2-c2cc(-c3nc(-c4ccccc4)nc(-c4cccc5oc6ccccc6c45)n3)ccc2C1(C)C]
C-69
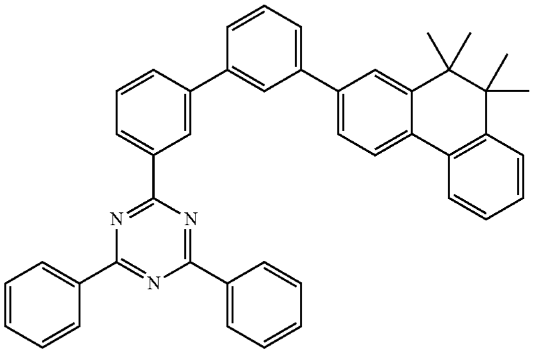 [SMILES: CC1(C)c2ccccc2-c2ccc(-c3cccc(-c4cccc(-c5nc(-c6ccccc6)nc(-c6ccccc6)n5)c4)c3)cc2C1(C)C]
C-1

TABLE 2-continued
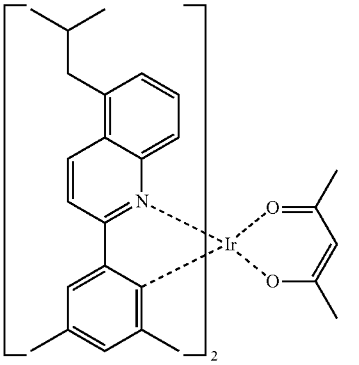
D-39
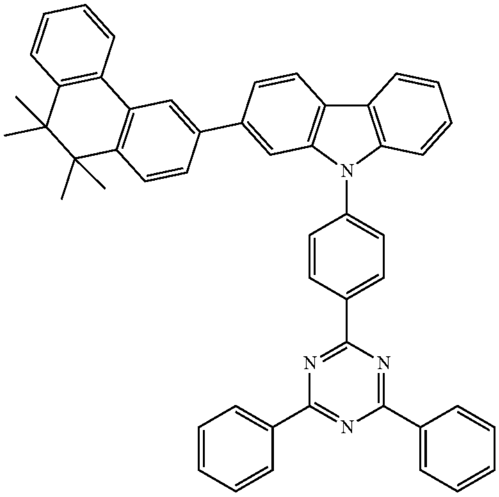 [SMILES: CC1(C)c2ccccc2-c2cc(-c3ccc4c5ccccc5n(-c5ccc(-c6nc(-c7ccccc7)nc(-c7ccccc7)n6)cc5)c4c3)ccc2C1(C)C]
C-21
Electron Transport Layer/ Electron Injection Layer
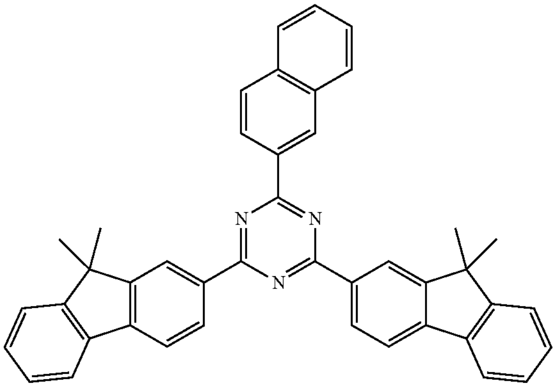 [SMILES: CC1(C)c2ccccc2-c2ccc(-c3nc(-c4ccc5c(c4)C(C)(C)c4ccccc4-5)nc(-c4ccc5ccccc5c4)n3)cc21]
ETL-1
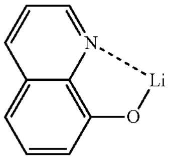
EIL-1

The invention claimed is:

1. A plurality of host materials comprising at least one first host compound and at least one second host compound, wherein the first host compound is represented by the following formula 1 and the second host compound is represented by the following formula 2:

(1)

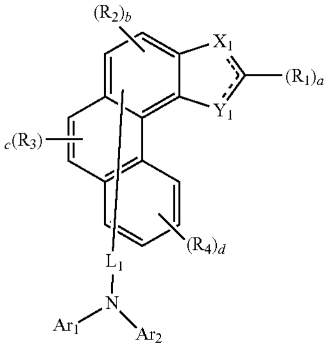

wherein, $X_1$ and $Y_1$ each independently represent, —N═, —$NR_5$—, —O— or —S—; provided that one of $X_1$ and $Y_1$ is —N═, and the other of $X_1$ and $Y_1$ is —$NR_5$—, —O— or —S—;

$R_1$ represents a substituted or unsubstituted (C6-C30)aryl or a substituted or unsubstituted (3- to 30-membered) heteroaryl;

$L_1$ represents a single bond, a substituted or unsubstituted (C6-C30)arylene, or a substituted or unsubstituted (3- to 30-membered)heteroarylene;

$Ar_1$ and $Ar_2$ each independently represent, a substituted or unsubstituted (C6-C30)aryl or a substituted or unsubstituted (3- to 30-membered)heteroaryl;

$R_2$ to $R_5$ each independently represent, hydrogen, deuterium, halogen, cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted fused ring of (C3-C30) aliphatic ring and (C6-C30) aromatic ring, or -$L_2$-N(Ar')(Ar"); or may be linked to the adjacent substituents to form a ring(s);

$L_2$ represents a single bond, a substituted or unsubstituted (C6-C30)arylene, or a substituted or unsubstituted (3- to 30-membered)heteroarylene;

Ar' and Ar" each independently represent, a substituted or unsubstituted (C1-C30)alkyl, a substituted or unsubstituted (C2-C30)alkenyl, a substituted or unsubstituted fused ring of (C3-C30) aliphatic ring and (C6-C30) aromatic ring, a substituted or unsubstituted (C6-C30) aryl, or a substituted or unsubstituted (3- to 30-membered)heteroaryl;

a is 1, b and c each independently represent, an integer of 1 or 2, and d represents an integer of 1 to 4; and when b to d are an integer of 2 or more, each of $R_2$ to $R_4$ may be the same or different;

(2)

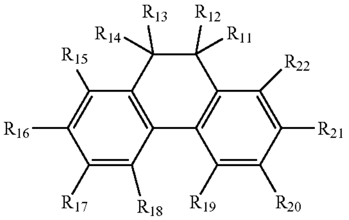

wherein, $R_{11}$ to $R_{14}$ each independently represent, *-$(L_3)_e$-$(Ar_3)_f$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted (C6-C30)aryl, or a substituted or unsubstituted (3- to 30-membered)heteroaryl; or may be linked to the adjacent substituents to form a ring(s);

$R_{15}$ to $R_{22}$ each independently represent, *-$(L_3)_e$-$(Ar_3)_f$, hydrogen, deuterium, halogen, cyano, a substituted or unsubstituted (C1-C30)alkyl, a substituted or unsubstituted (C3-C30)cycloalkyl, a substituted or unsubstituted (3- to 7-membered)heterocycloalkyl, a substituted or unsubstituted fused ring of (C3-C30) aliphatic ring and (C6-C30) aromatic ring, a substituted or unsubstituted (C6-C30)aryl, a substituted or unsubstituted (3- to 30-membered)heteroaryl, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30) arylsilyl, or a substituted or unsubstituted tri(C6-C30) arylsilyl; or may be linked to the adjacent substituents to form a ring(s); provided that at least one of $R_{11}$ to $R_{22}$ is *-$(L_3)_e$-$(Ar_3)_f$;

$L_3$ represents a single bond, a substituted or unsubstituted (C6-C30)arylene, or a substituted or unsubstituted (3- to 30-membered)heteroarylene;

$Ar_3$ represents a substituted or unsubstituted (C6-C30)aryl or a substituted or unsubstituted (3- to 30-membered) heteroaryl;

e represents an integer of 1 to 4, and f represents an integer of 1 or 2; and when e and f are an integer of 2 or more, each of $L_3$ and each of $Ar_3$ may be the same or different.

2. The plurality of host materials according to claim 1, wherein the formula 1 is represented by any one of the following formulas 1-1 to 1-4:

(1-1)

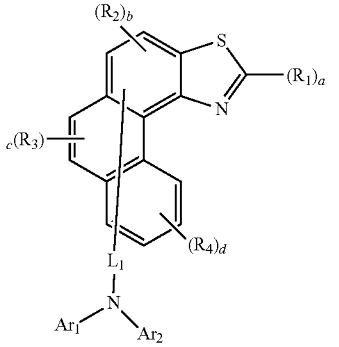

-continued (1-2)

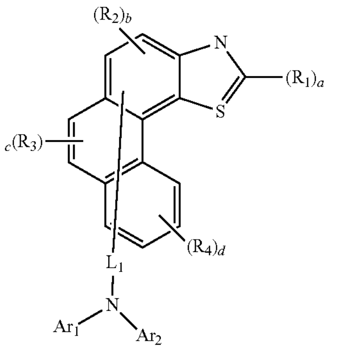

(1-3)

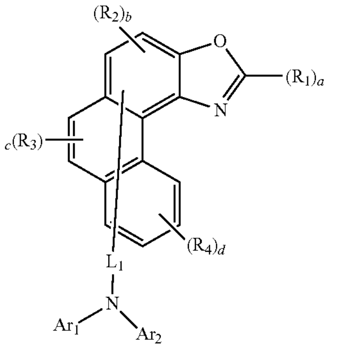

(1-4)

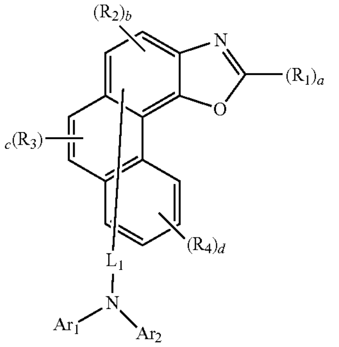

wherein, $R_1$ to $R_4$, $Ar_1$, $Ar_2$, $L_1$, and a to d are as defined in claim 1.

3. The plurality of host materials according to claim 1, wherein the formula 2 is represented by any one of the following formulas 2-1 to 2-4:

(2-1)

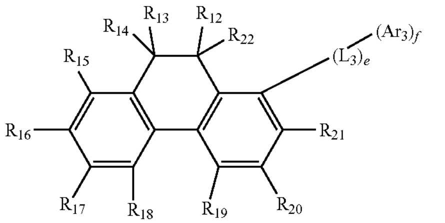

-continued (2-2)

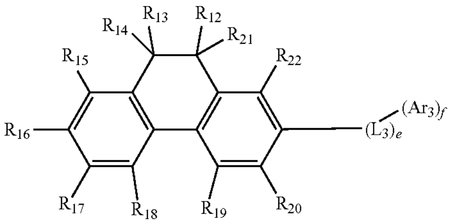

(2-3)

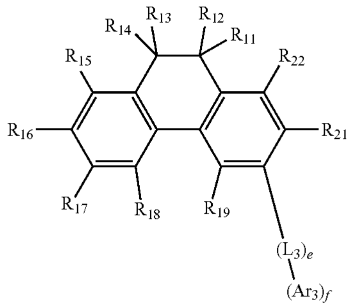

(2-4)

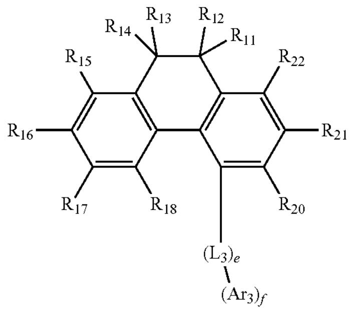

wherein, $R_{11}$ to $R_{22}$, $L_3$, $Ar_3$, e, and f are as defined in claim 1.

4. The plurality of host materials according to claim 1, wherein $R_1$, $Ar_1$, and $Ar_2$ of formula 1 each independently represent, a substituted or unsubstituted phenyl, a substituted or unsubstituted naphthyl, a substituted or unsubstituted biphenyl, a substituted or unsubstituted terphenyl, a substituted or unsubstituted phenanthrenyl, a substituted or unsubstituted fluorenyl, a substituted or unsubstituted benzofluorenyl, a substituted or unsubstituted triphenylenyl, a substituted or unsubstituted anthracenyl, a substituted or unsubstituted spirobifluorenyl, a substituted or unsubstituted pyridyl, a substituted or unsubstituted triazinyl, a substituted or unsubstituted pyrimidinyl, a substituted or unsubstituted quinolyl, a substituted or unsubstituted quinazolinyl, a substituted or unsubstituted quinoxalinyl, a substituted or unsubstituted benzoquinazolinyl, a substituted or unsubstituted benzoquinoxalinyl, a substituted or unsubstituted benzofuropyridyl, a substituted or unsubstituted benzofuropyrimidinyl, a substituted or unsubstituted carbazolyl, a substituted or unsubstituted dibenzothiophenyl, a substituted or unsubstituted benzothiophenyl, a substituted or unsubstituted dibenzofuranyl, a substituted or unsubstituted benzofuranyl, a substituted or unsubstituted naphthyridinyl, a substituted or unsubstituted benzonaphthofuranyl, or a substituted or unsubstituted benzonaphthothiophenyl.

5. The plurality of host materials according to claim 1, wherein $L_3$ of formula 2 represents a single bond, a substituted or unsubstituted phenylene, a substituted or unsubstituted biphenylene, a substituted or unsubstituted terphenylene, a substituted or unsubstituted naphthalenylene, a substituted or unsubstituted phenanthrenylene, a substituted or unsubstituted triphenylenylene, a substituted or unsubstituted fluorenylene, a substituted or unsubstituted pyridylene, a substituted or unsubstituted triazinylene, a substituted or unsubstituted carbazolylene, a substituted or unsubstituted quinoxalinylene, a substituted or unsubstituted quinazolinylene, a substituted or unsubstituted dibenzofuranylene, or a substituted or unsubstituted benzoquinoxalinylene.

6. The plurality of host materials according to claim 1, wherein a substituted or unsubstituted (3- to 30-membered) heteroaryl of $Ar_3$ in formula 2 represents a substituted or unsubstituted pyridyl, a substituted or unsubstituted pyrimidinyl, a substituted or unsubstituted triazinyl, a substituted or unsubstituted pyrazinyl, a substituted or unsubstituted quinolinyl, a substituted or unsubstituted quinazolinyl, a substituted or unsubstituted quinoxalinyl, a substituted or unsubstituted benzoquinolinyl, a substituted or unsubstituted benzoquinazolinyl, a substituted or unsubstituted benzoquinoxalinyl, a substituted or unsubstituted dibenzoquinolinyl, a substituted or unsubstituted dibenzoquinazolinyl, a substituted or unsubstituted dibenzoquinoxalinyl, a substituted or unsubstituted indenopyridyl, a substituted or unsubstituted indenopyrimidinyl, a substituted or unsubstituted indenopyrazinyl, a substituted or unsubstituted benzofuropyridyl, a substituted or unsubstituted benzofuropyrimidinyl, a substituted or unsubstituted benzofuropyrazinyl, a substituted or unsubstituted benzothiopyridyl, a substituted or unsubstituted benzothiopyrimidinyl, a substituted or unsubstituted benzothiopyrazinyl, a substituted or unsubstituted carbazolyl, a substituted or unsubstituted benzocarbazolyl, a substituted or unsubstituted dibenzofuranyl, or a substituted or unsubstituted dibenzothiophenyl.

7. The plurality of host materials according to claim 1, wherein the compound represented by formula 1 is selected from the following compounds:

H1-1

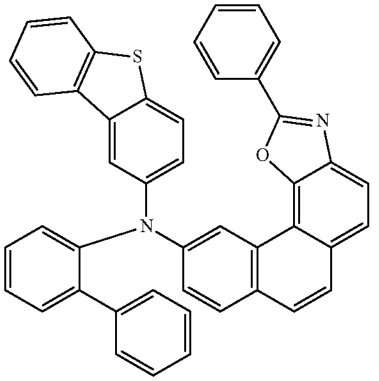

H1-2

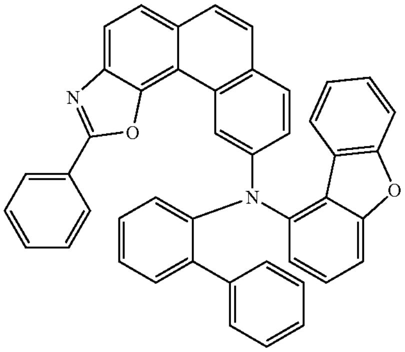

-continued

H1-3

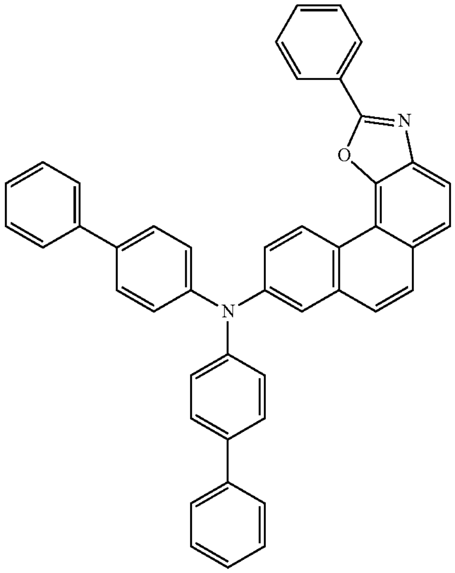

H1-4

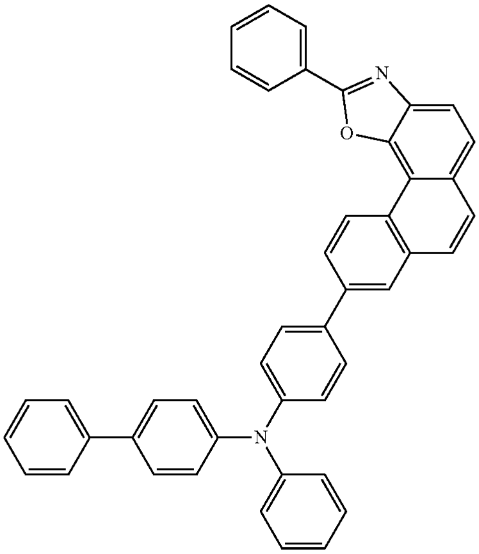

H1-5

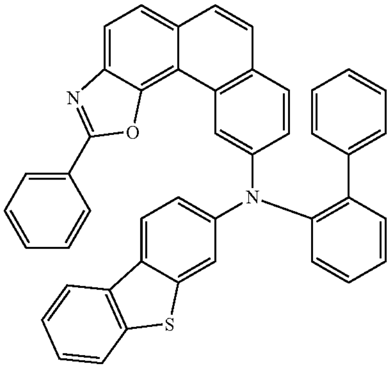

-continued
H1-6
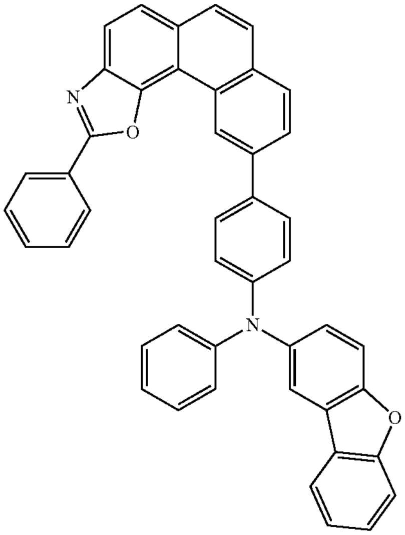
H1-7
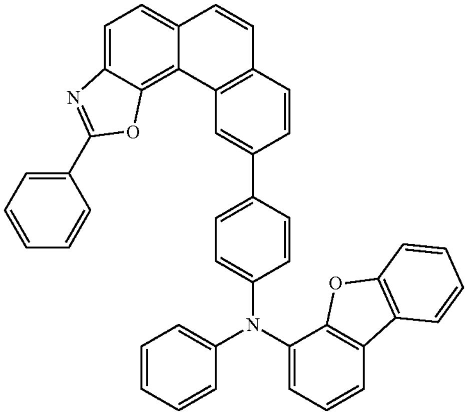
H1-8
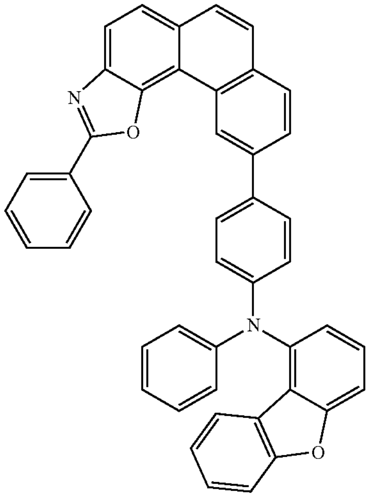
-continued
H1-9
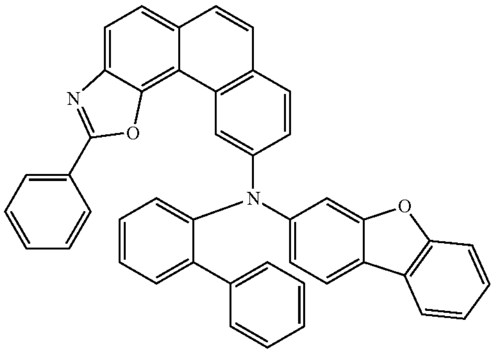
H1-10
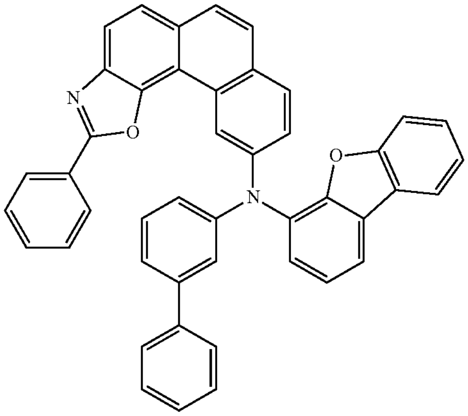
H1-11
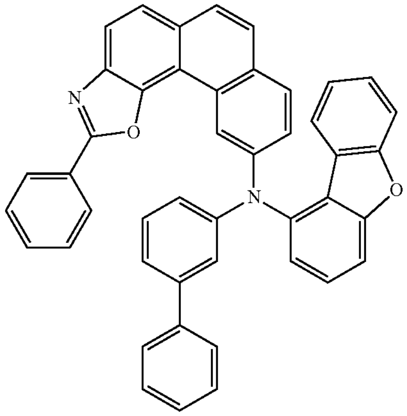
H1-12
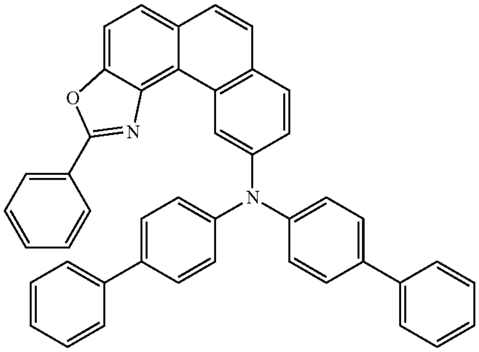

-continued
H1-13
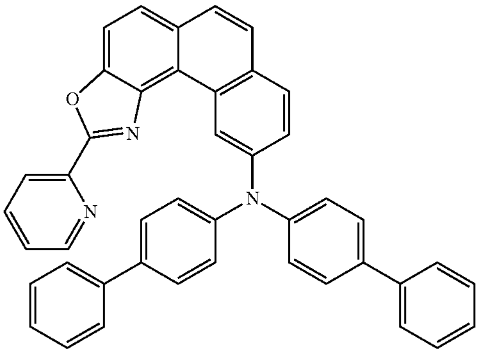
H1-14
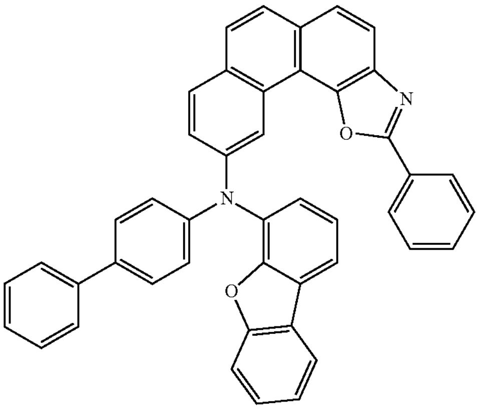
H1-15
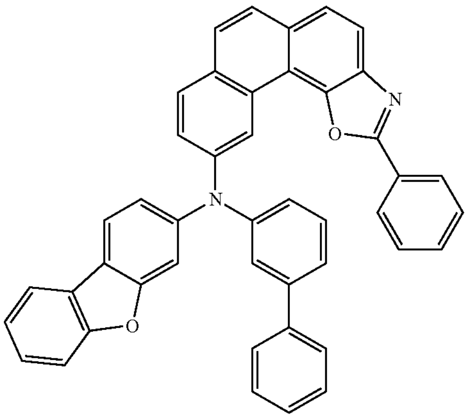
H1-16
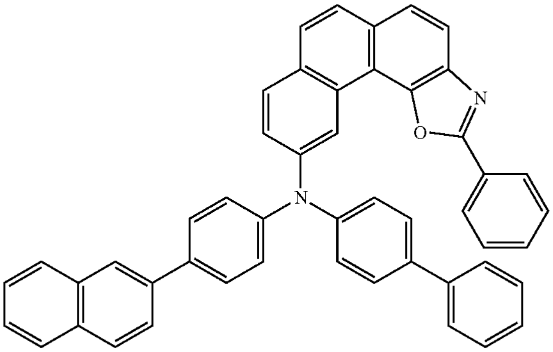
-continued
H1-17
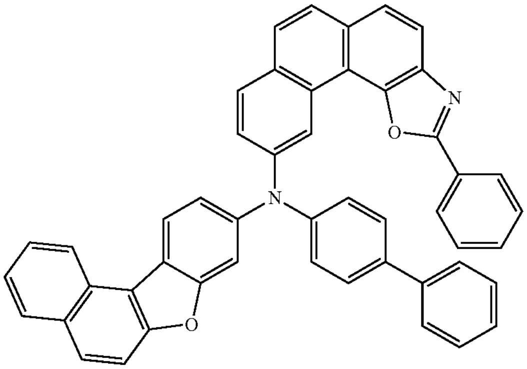
H1-18
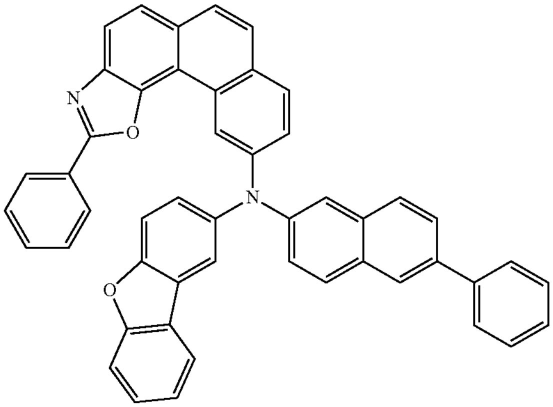
H1-19
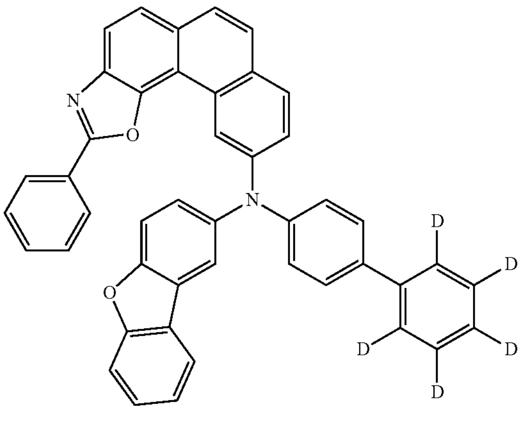

-continued
H1-20
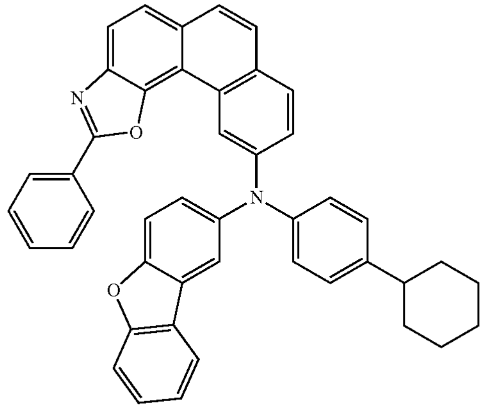
H1-21
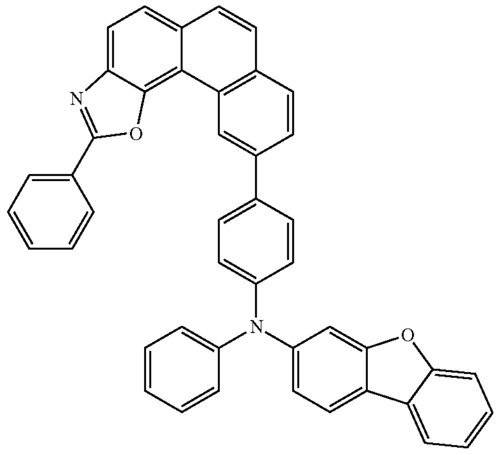
H1-22
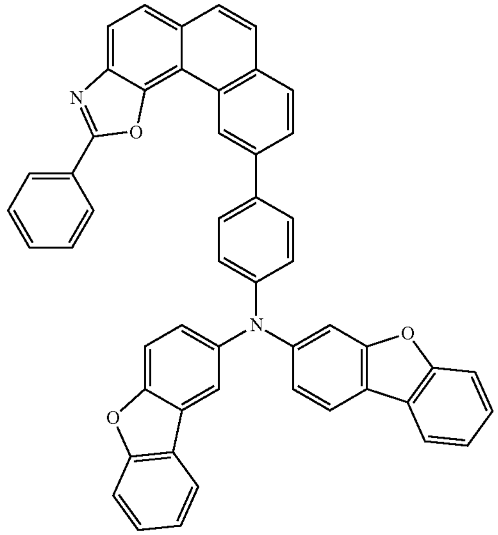
-continued
H1-23
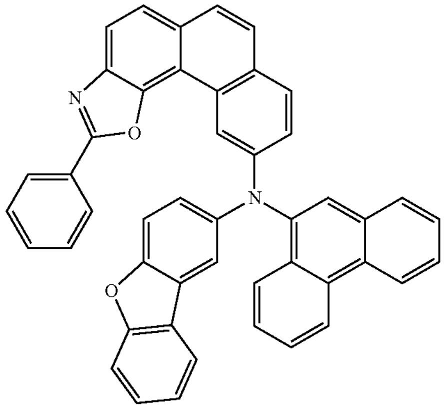
H1-24
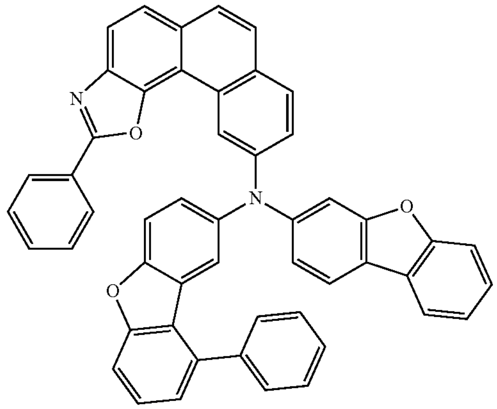
H1-25
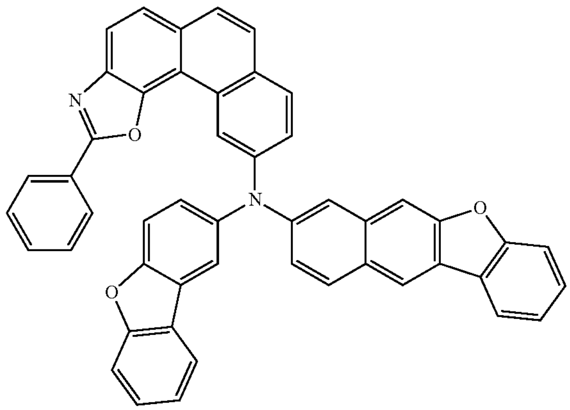

-continued
H1-26
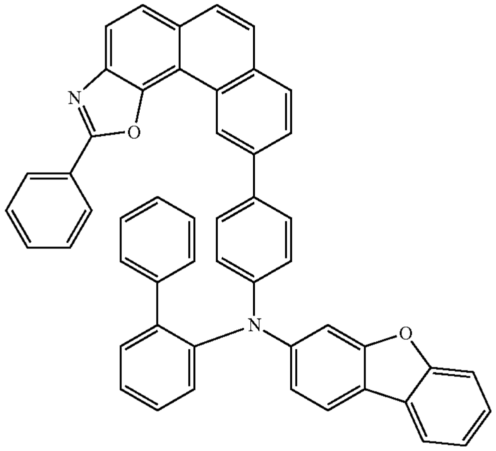
H1-27
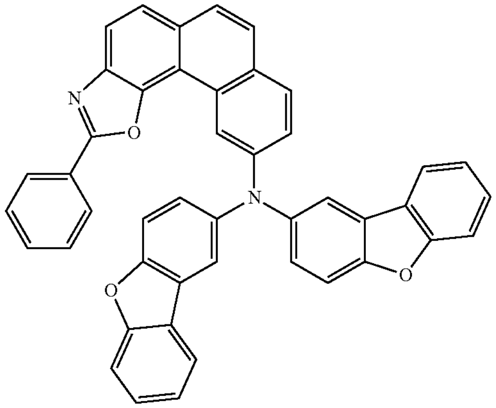
H1-28
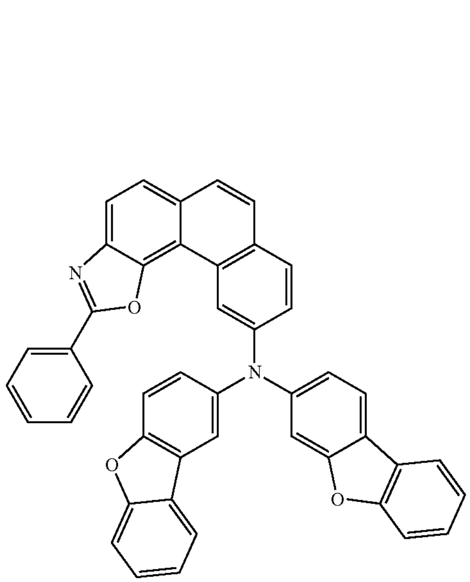
-continued
H1-29
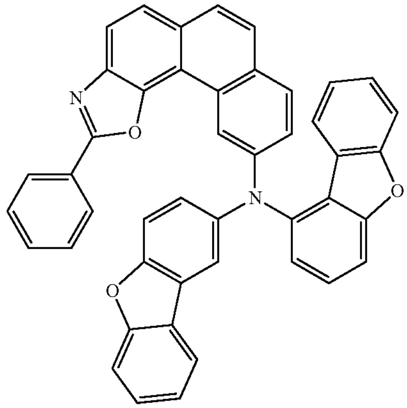
H1-30
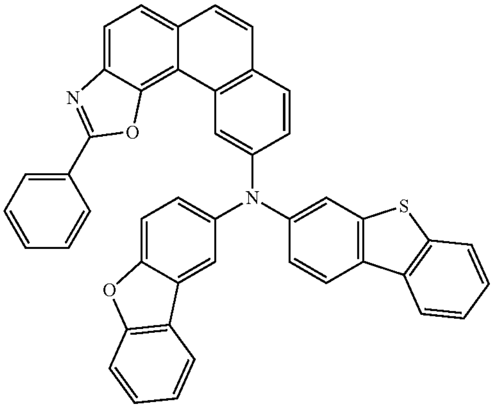
H1-31
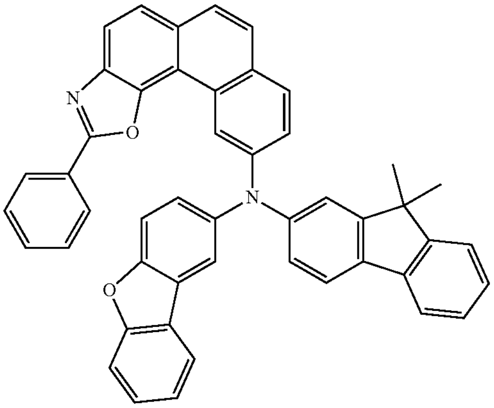
H1-32
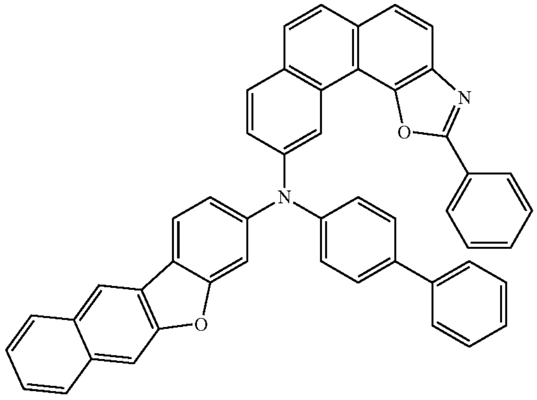

H1-33
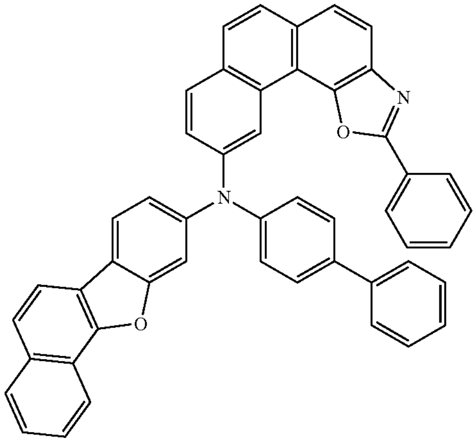
H1-34
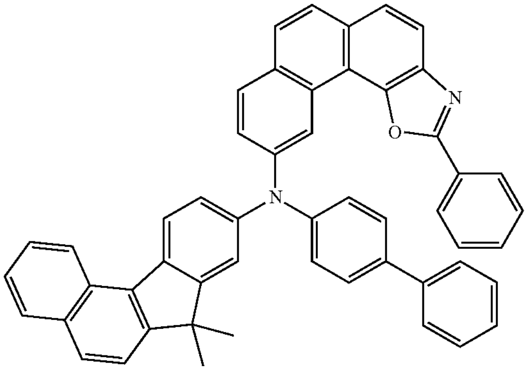
H1-35
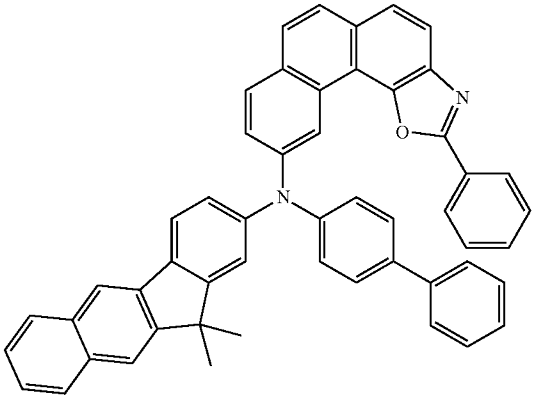
H1-36
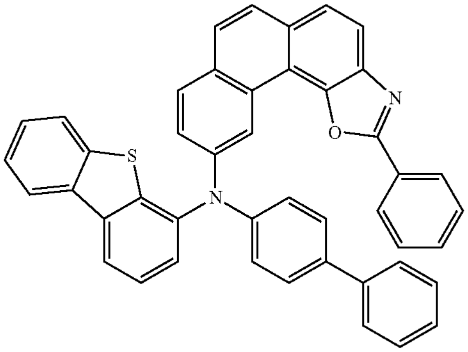
H1-37
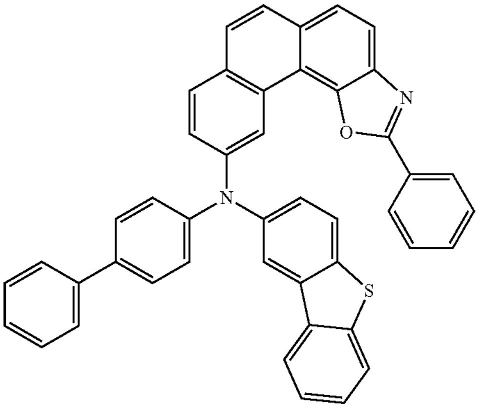
H1-38
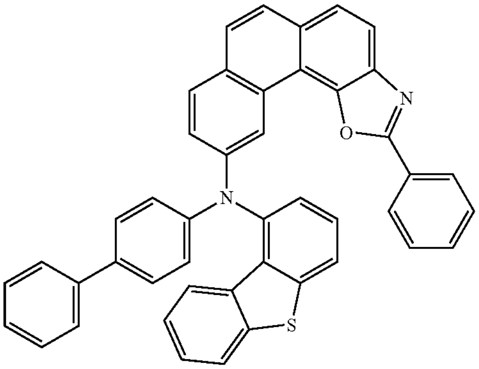
H1-39
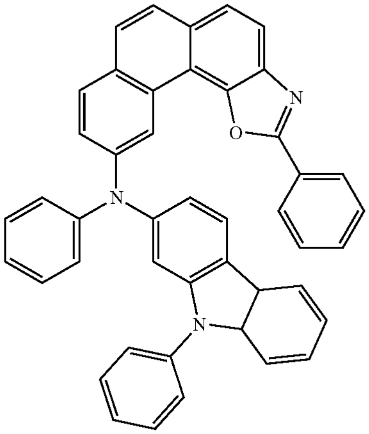

-continued
H1-40
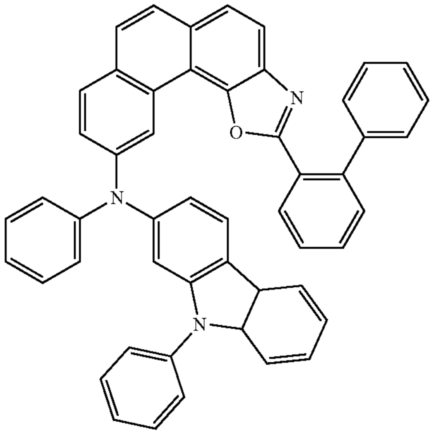
H1-41
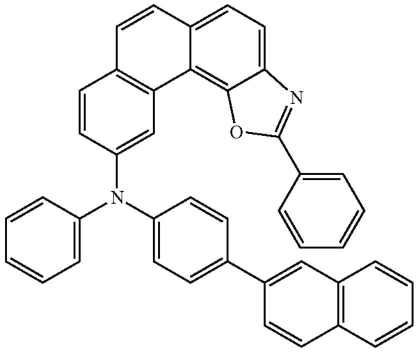
H1-42
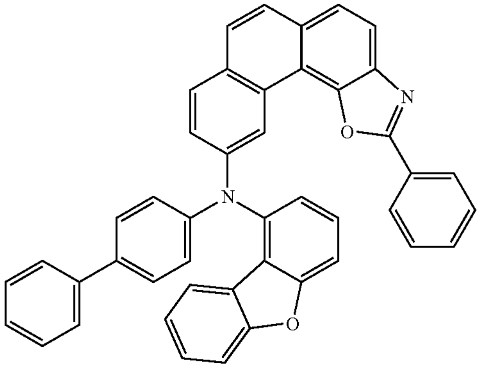
H1-43
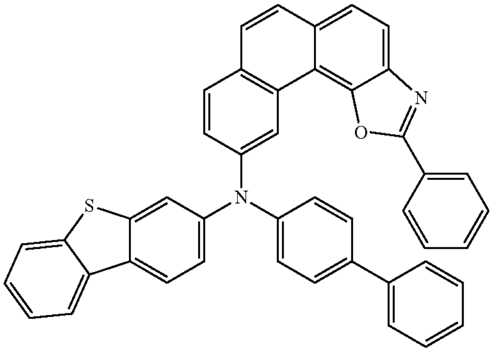
-continued
H1-44
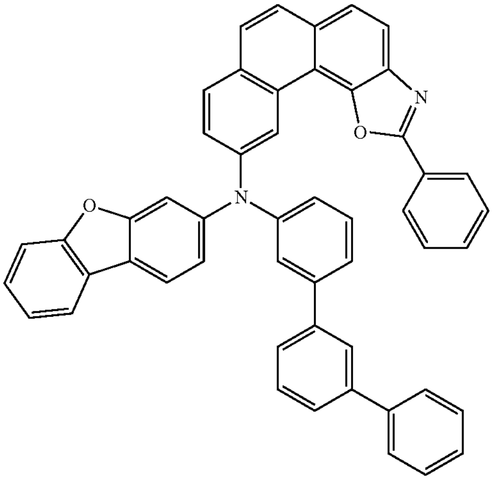
H1-45
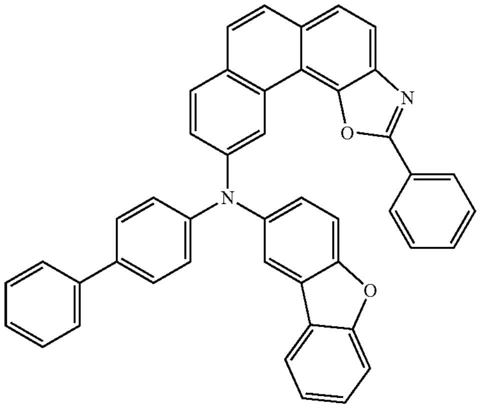
H1-46
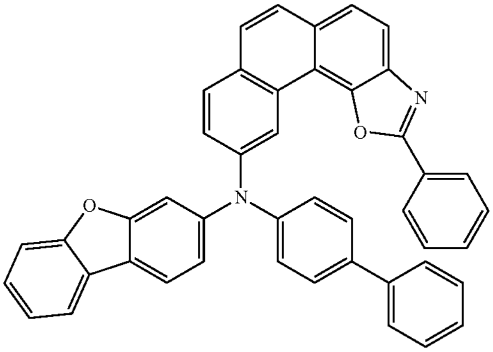
H1-47
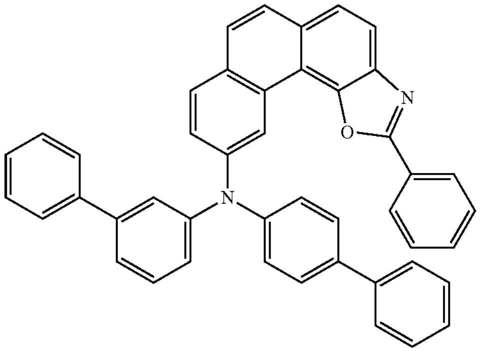

-continued
H1-48
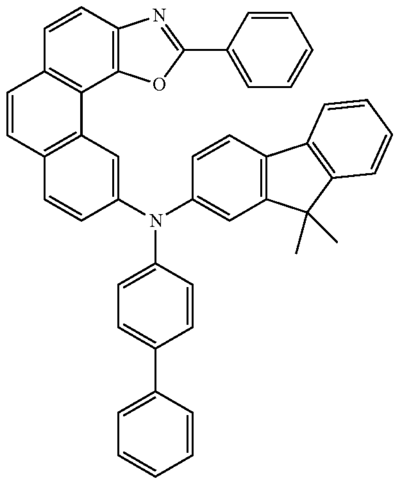
H1-49
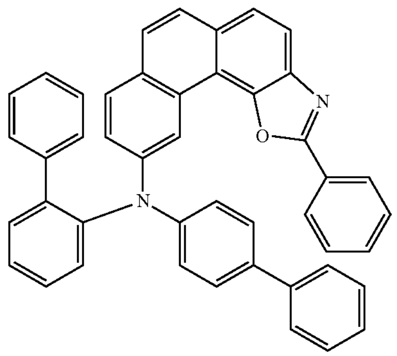
H1-50
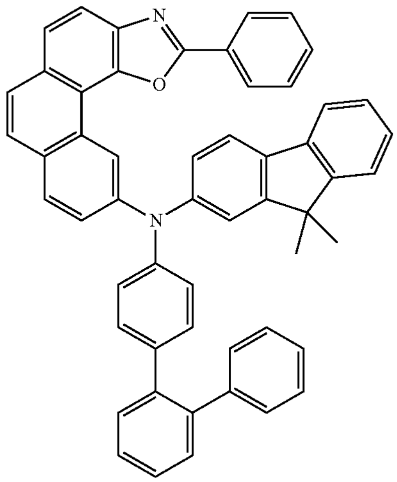
-continued
H1-51
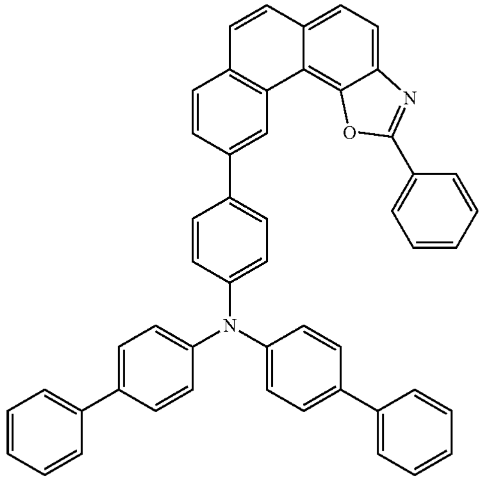
H1-52
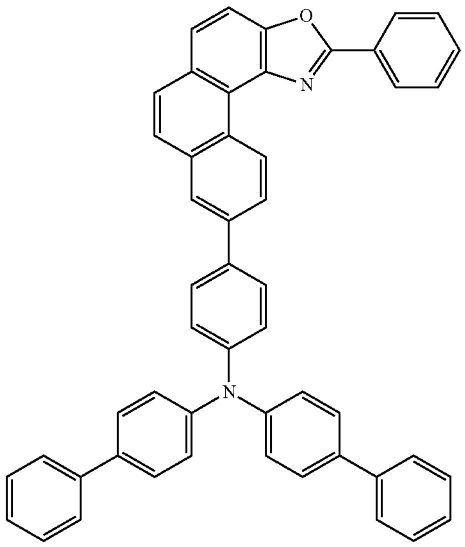
H1-53
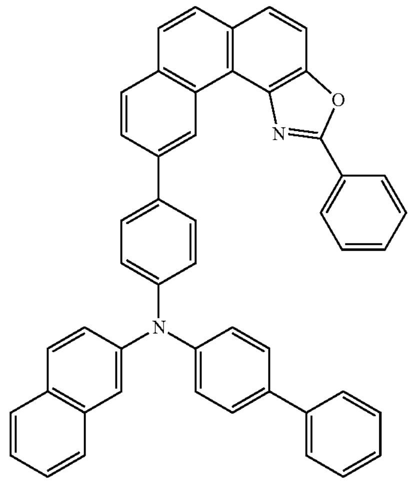

-continued
H1-54
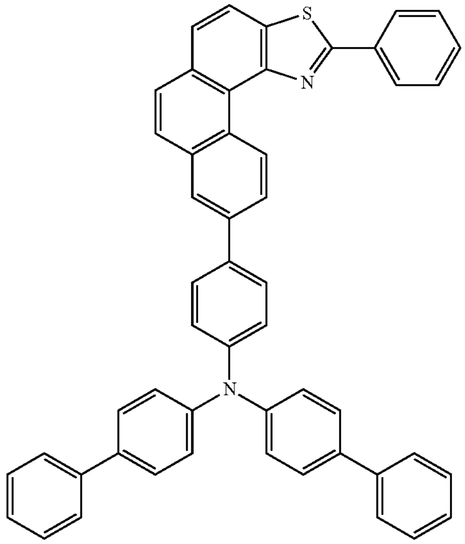
H1-55
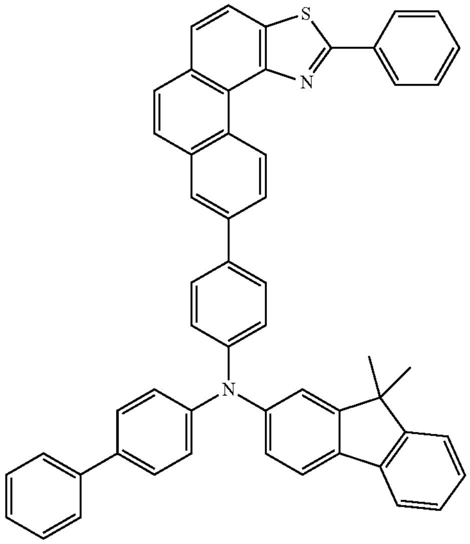
H1-56
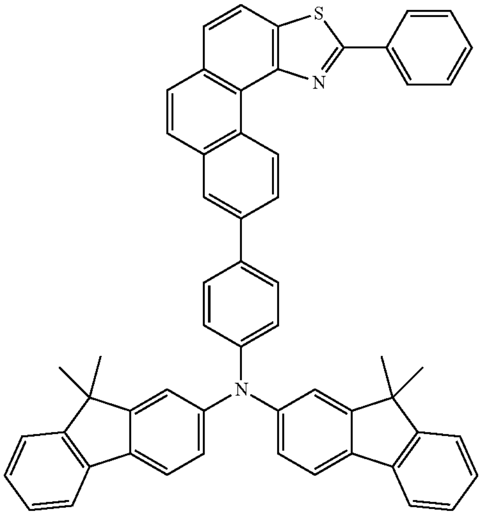
-continued
H1-57
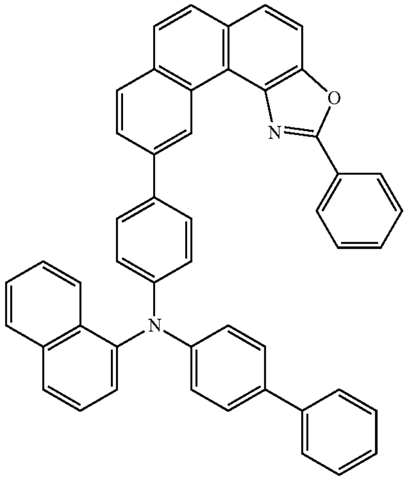
H1-58
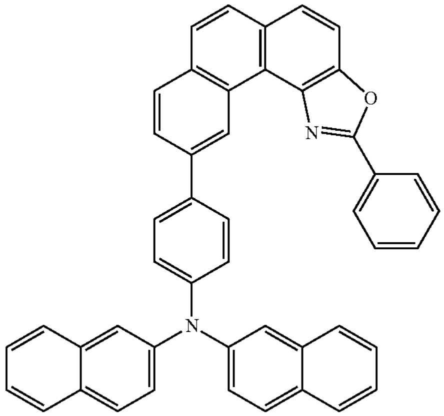
H1-59
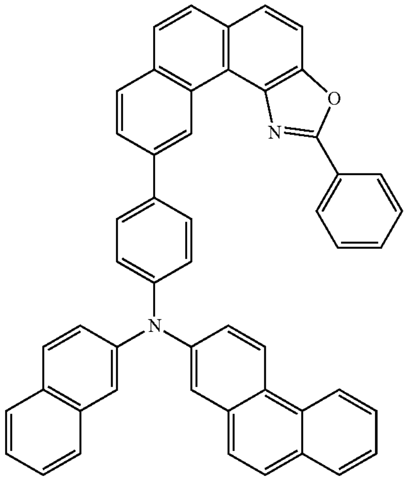

-continued
H1-60
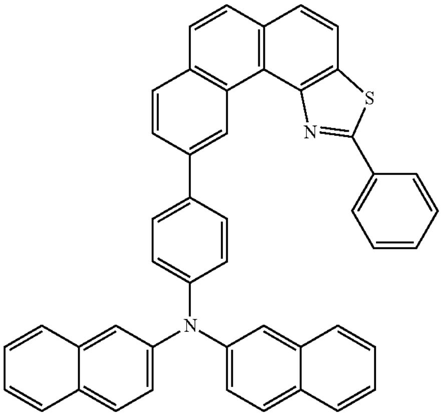
H1-61
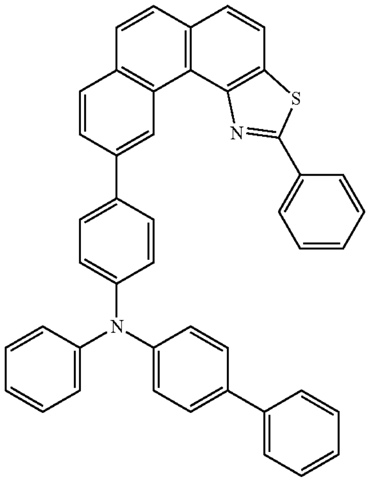
H1-62
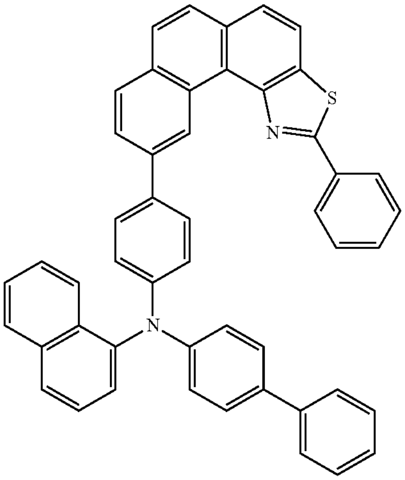
-continued
H1-63
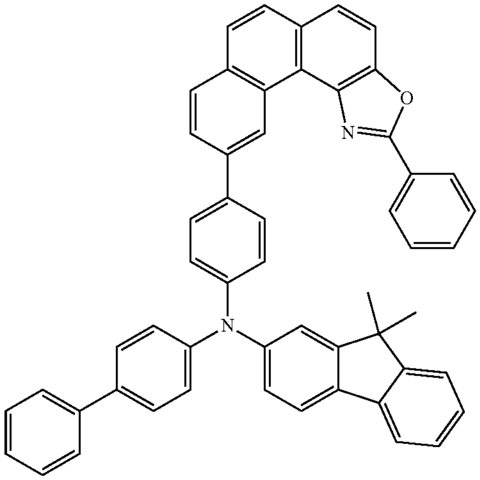
H1-64
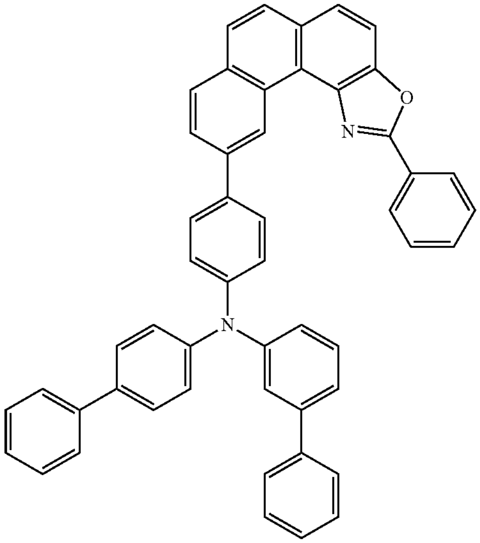
H1-65
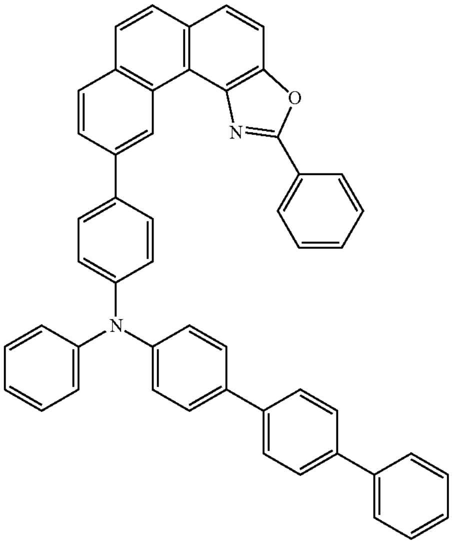

-continued
H1-66
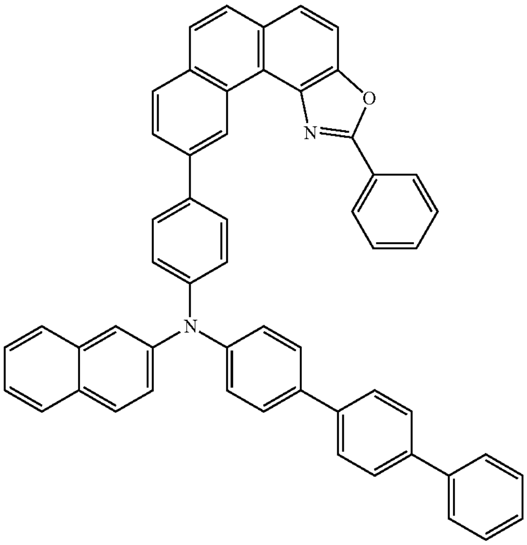
H1-67
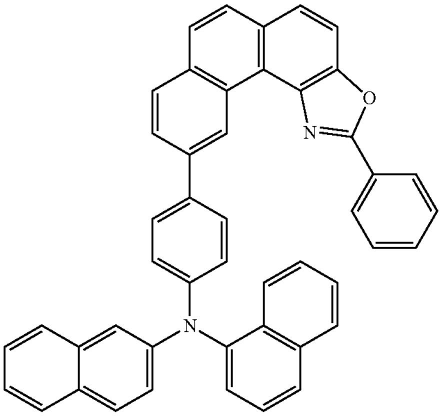
H1-68
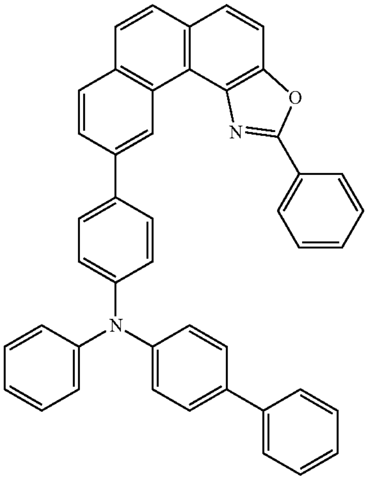
-continued
H1-69
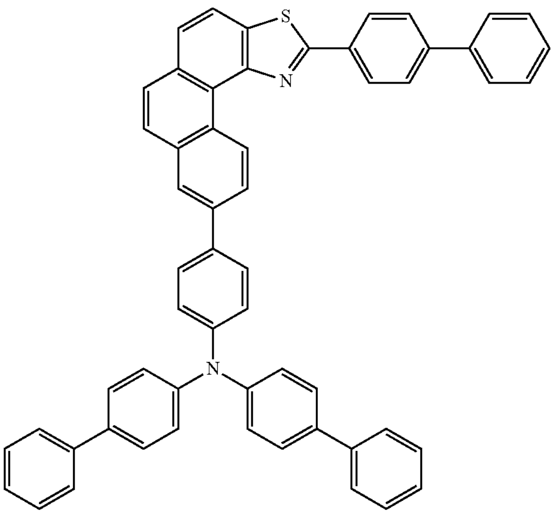
H1-70
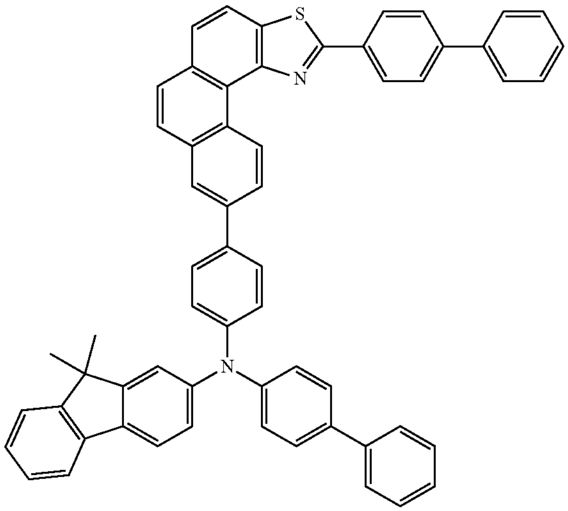
H1-71
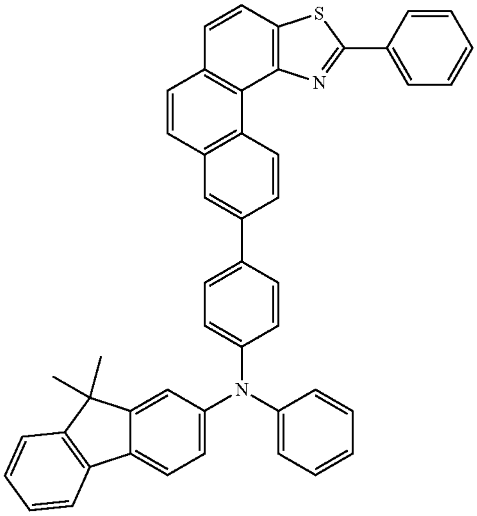

-continued
H1-72
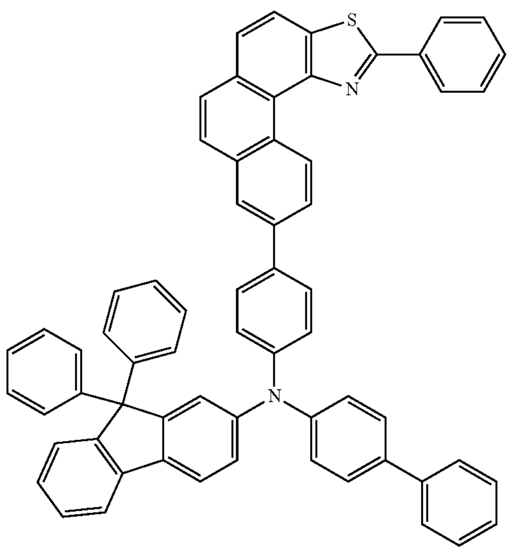
H1-73
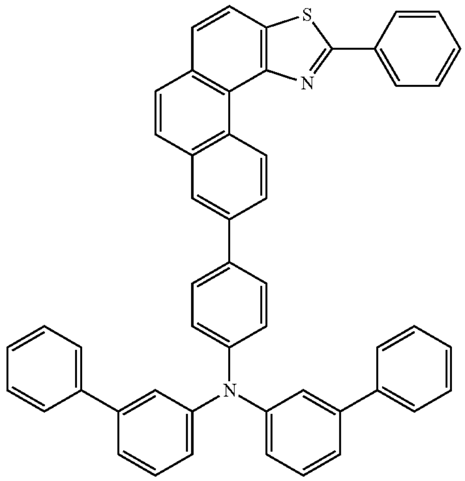
H1-74
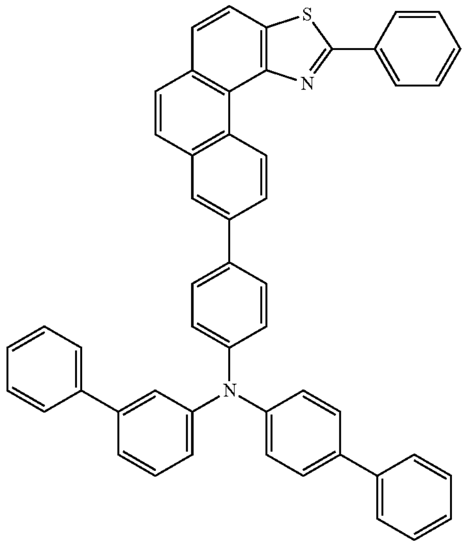
H1-75
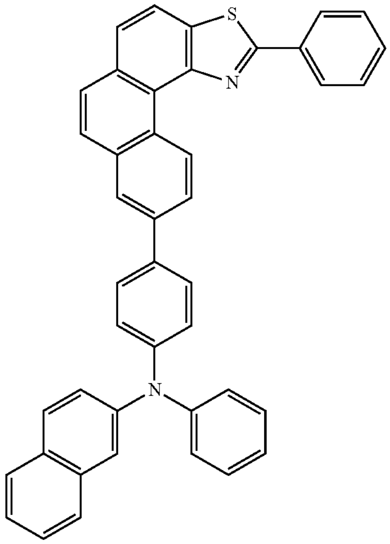
H1-76
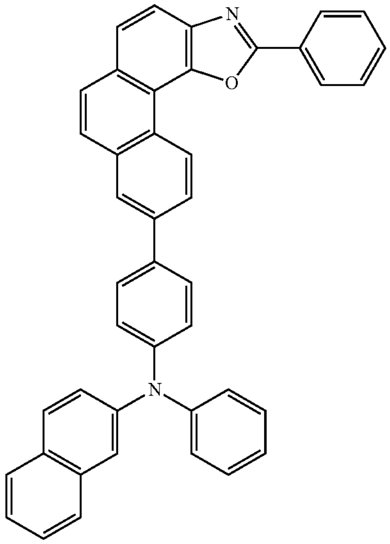
H1-77
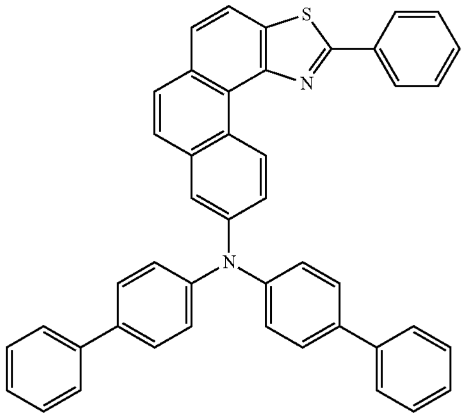

-continued
H1-78
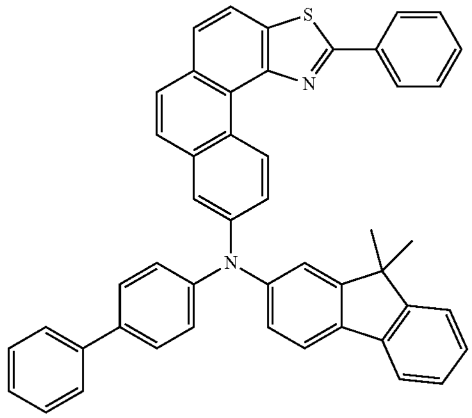
H1-79
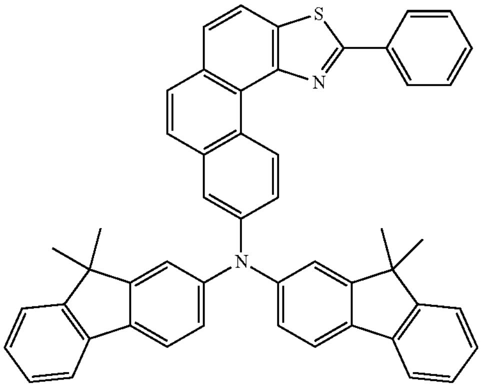
H1-80
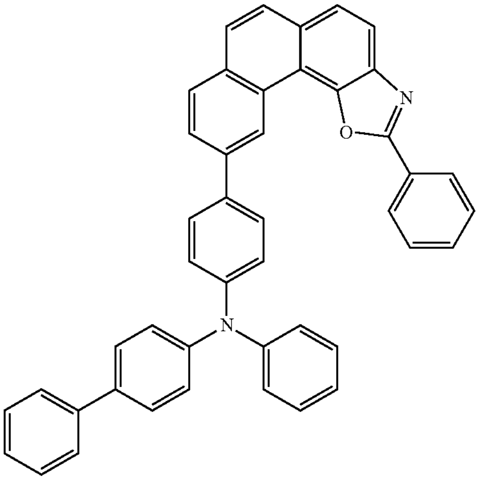
-continued
H1-81
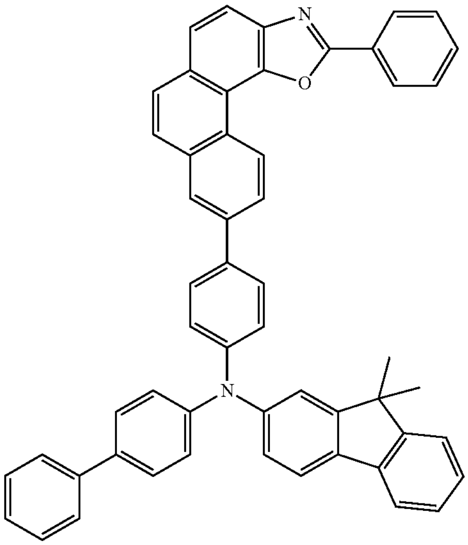
H1-82
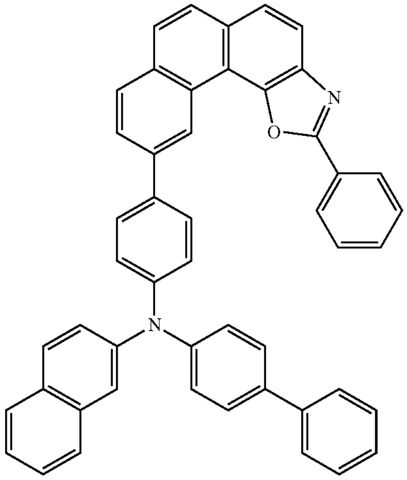
H1-83
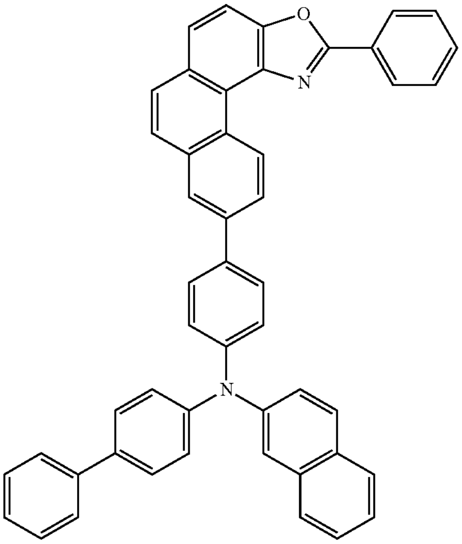

-continued
H1-84
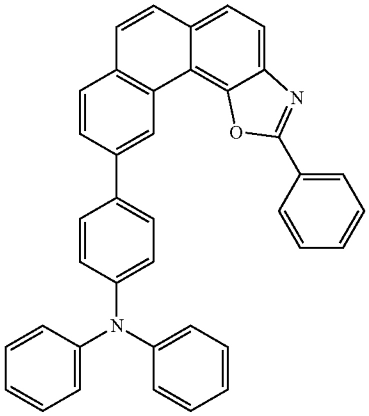
H1-85
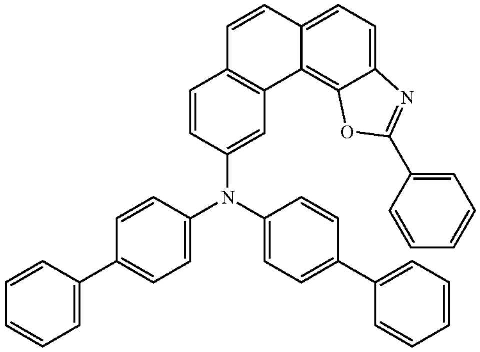
H1-86
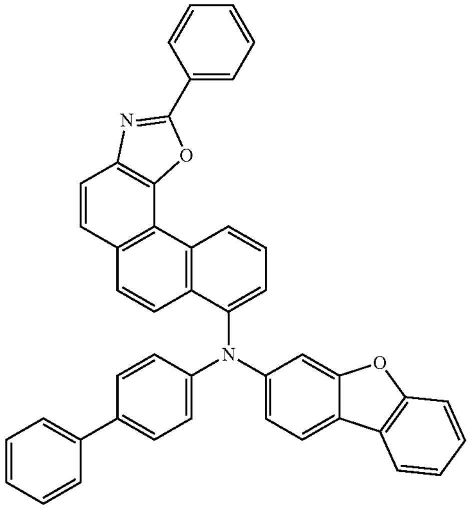
-continued
H1-87
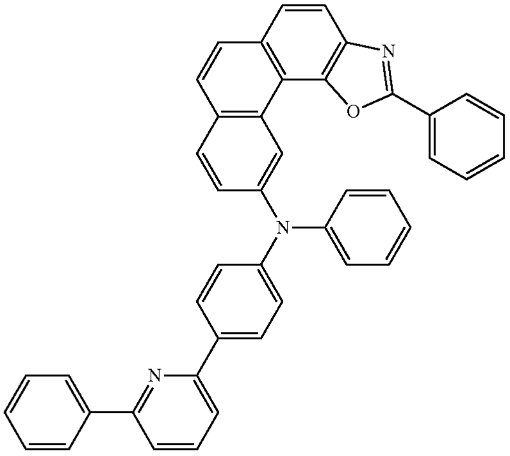
H1-88
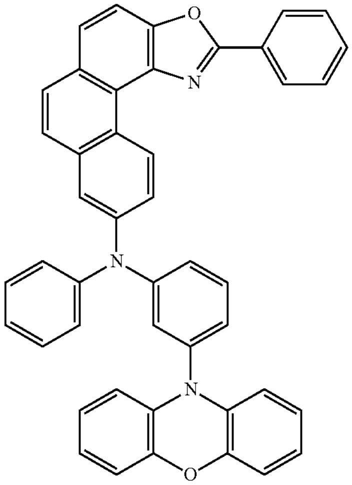
H1-89
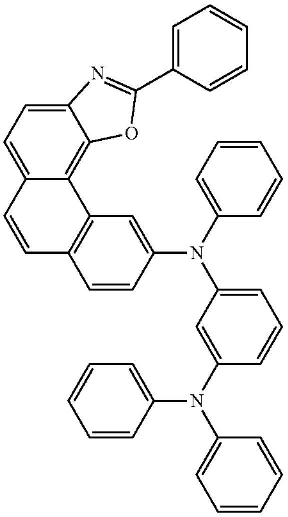

-continued
H1-90
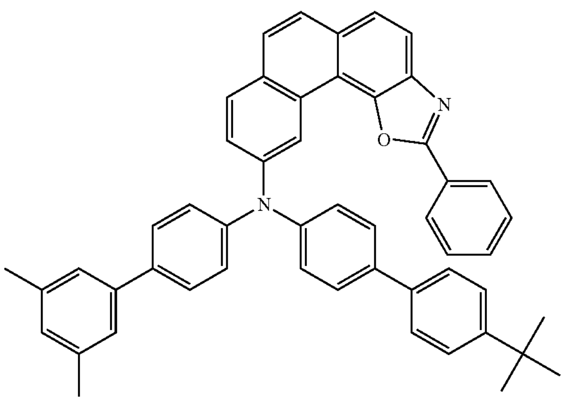
H1-91
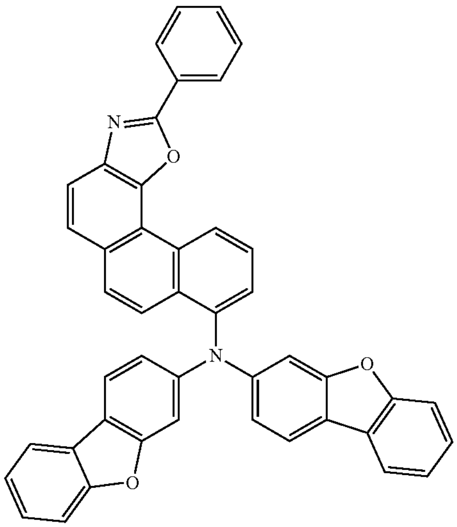
H1-92
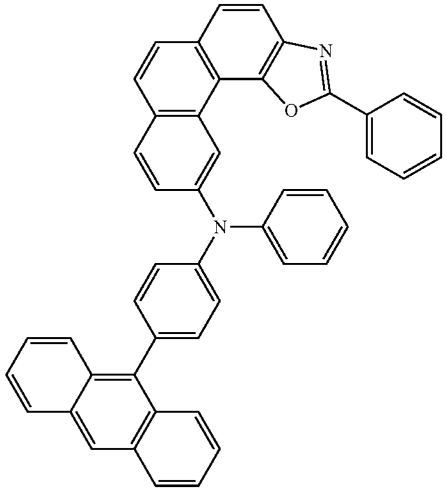
-continued
H1-93
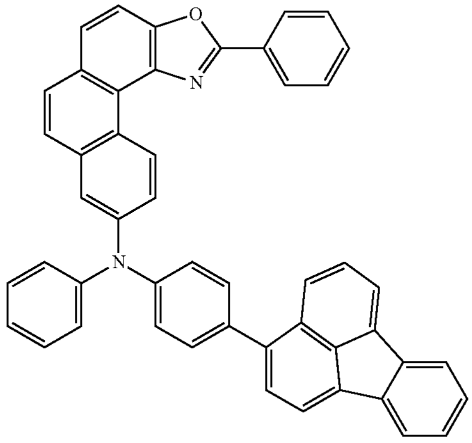
H1-94
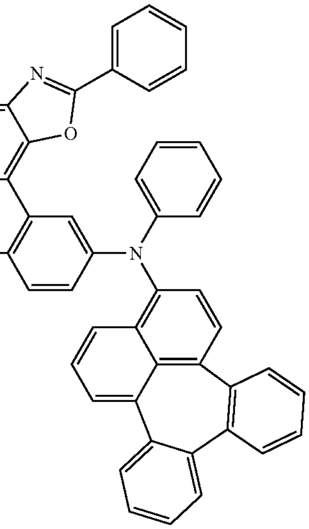
H1-95
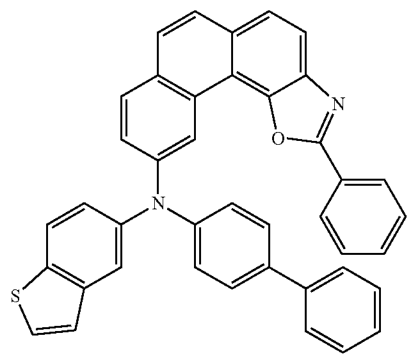

-continued
H1-96
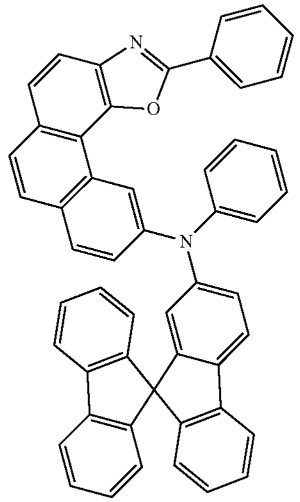
H1-97
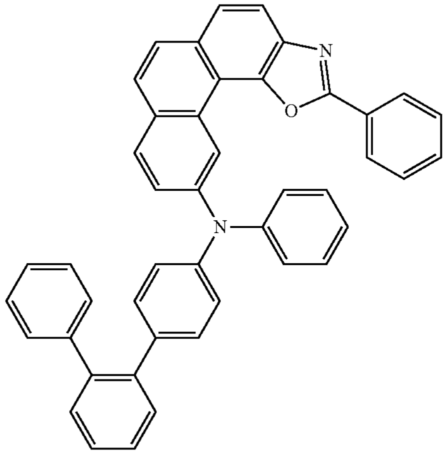
H1-98
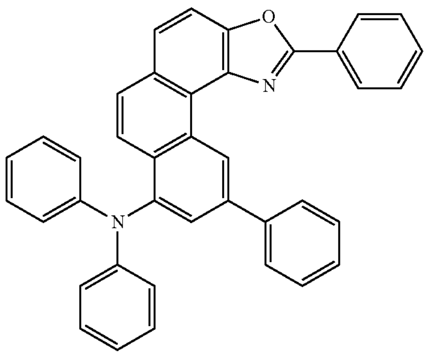
-continued
H1-99
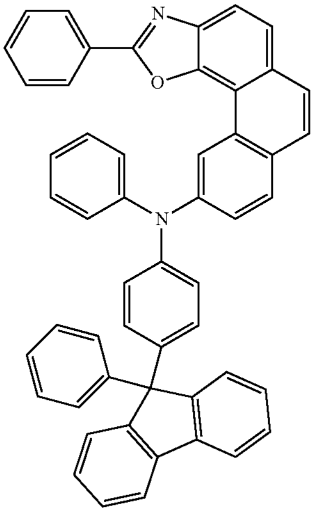
H1-100
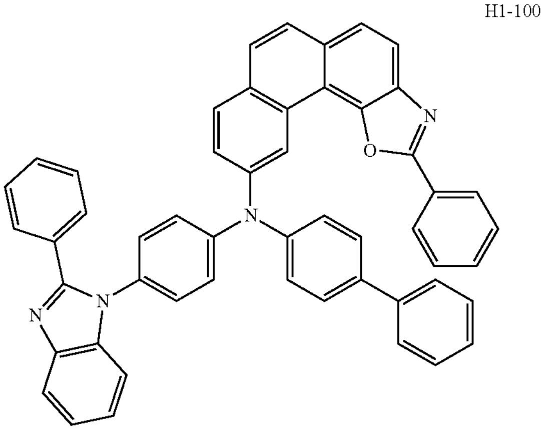
H1-101
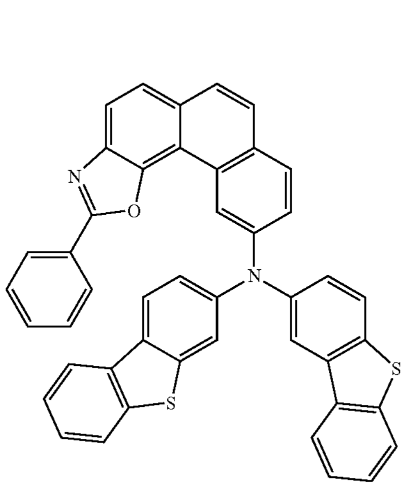

-continued
H1-102
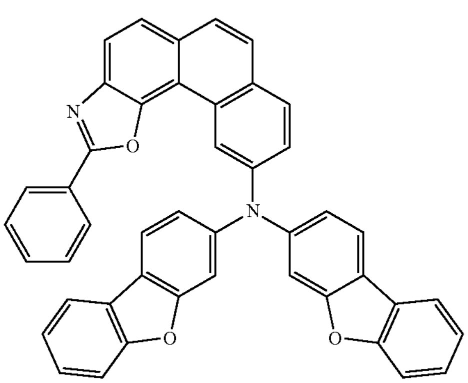
H1-103
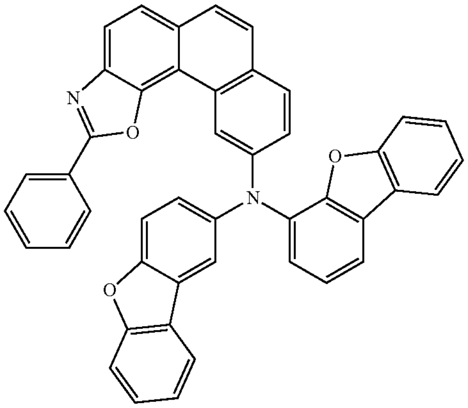
H1-104
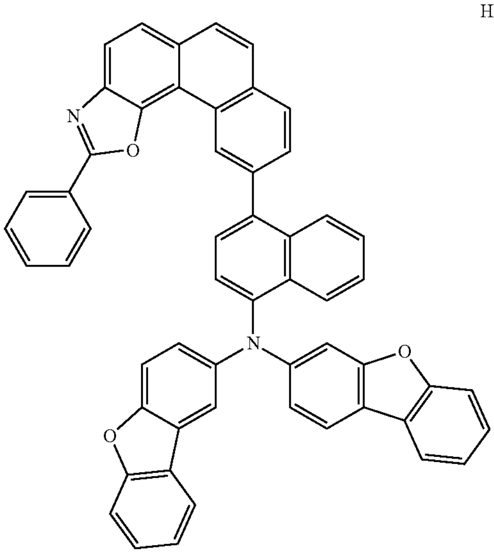
-continued
H1-105
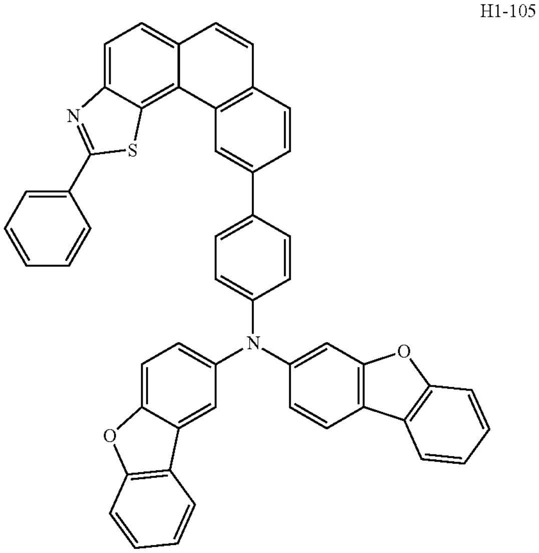
H1-106
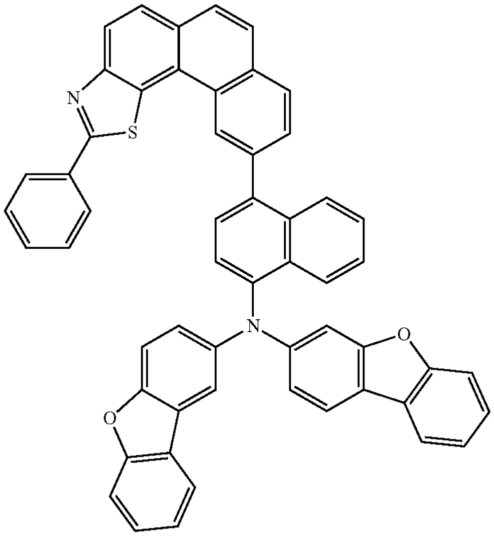
H1-107
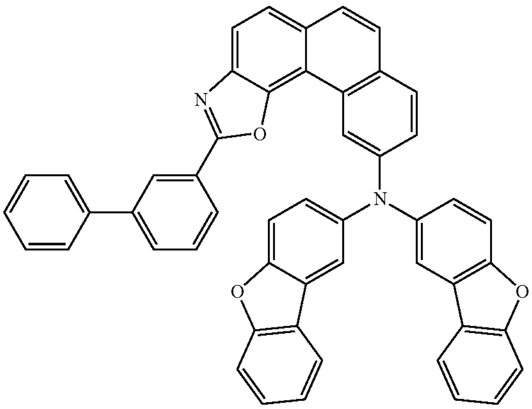

-continued
H1-108
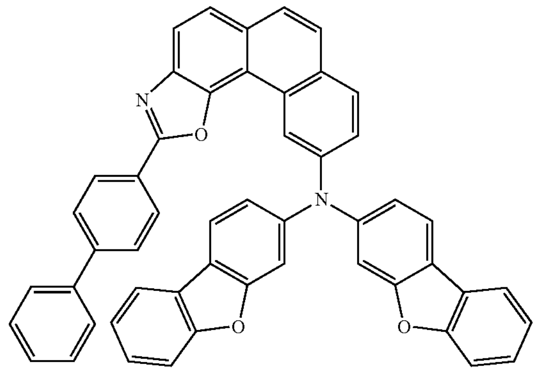
H1-109
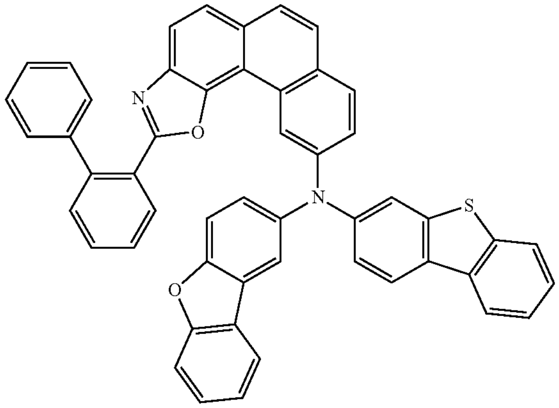
H1-110
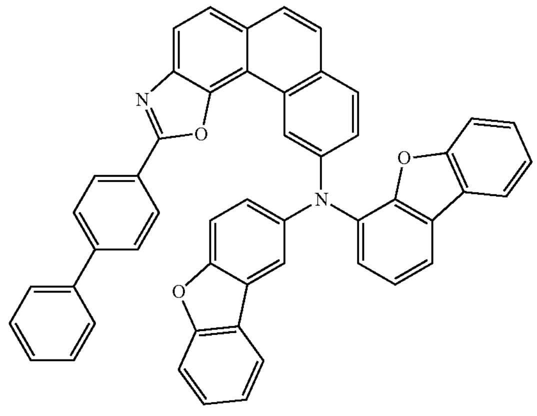
-continued
H1-111
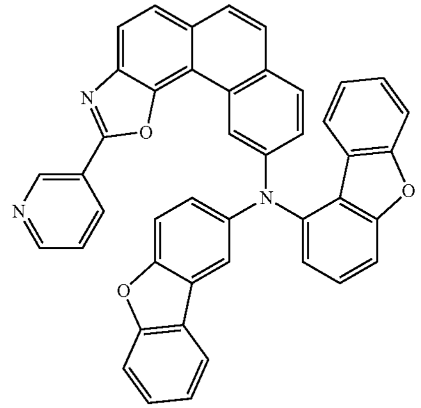
H1-112
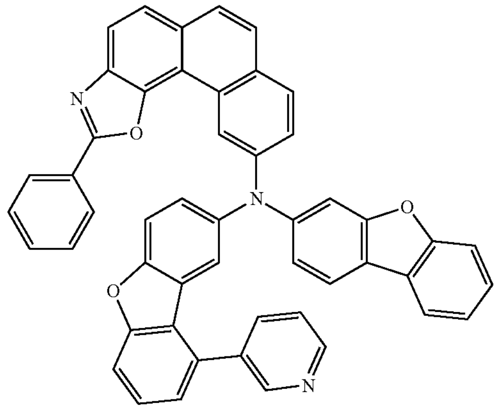
H1-113
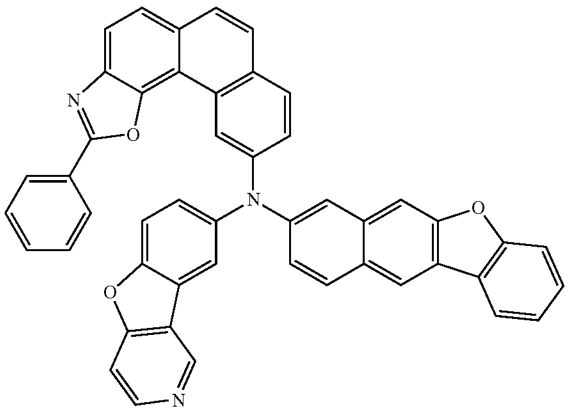

-continued
H1-114
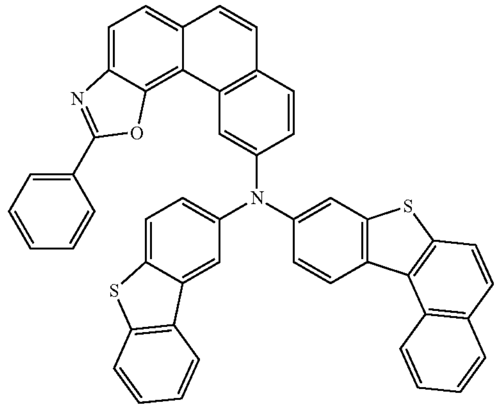
H1-115
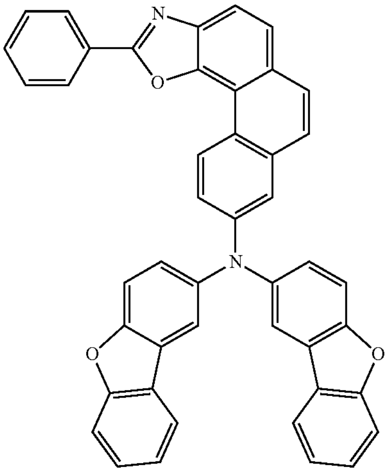
H1-116
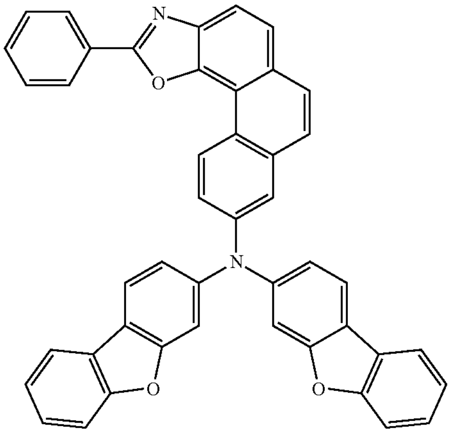
-continued
H1-117
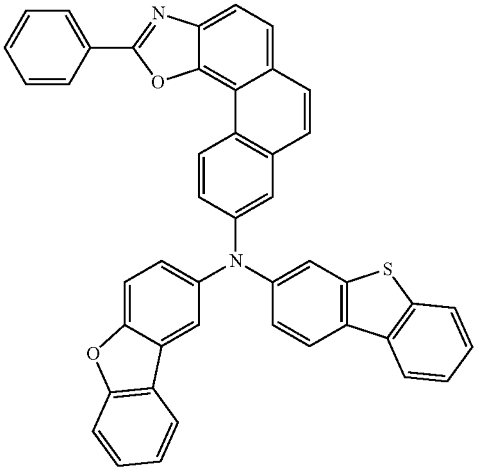
H1-118
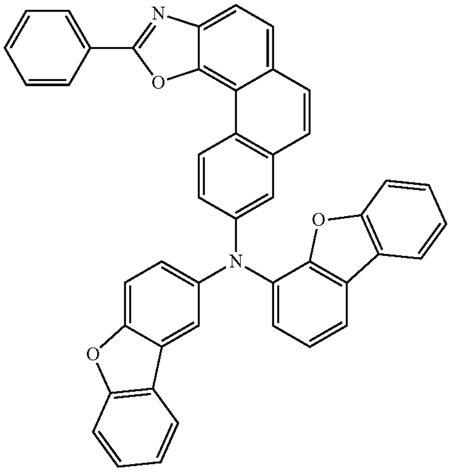
H1-119
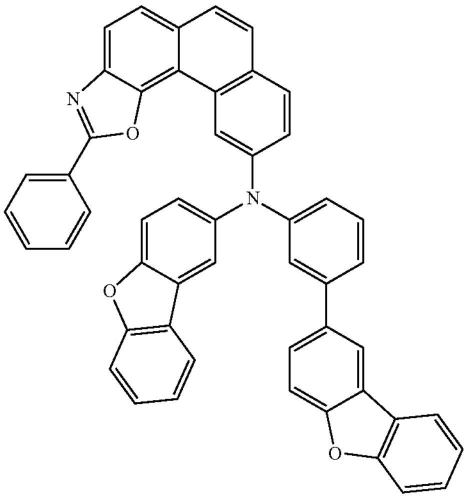

-continued
H1-120
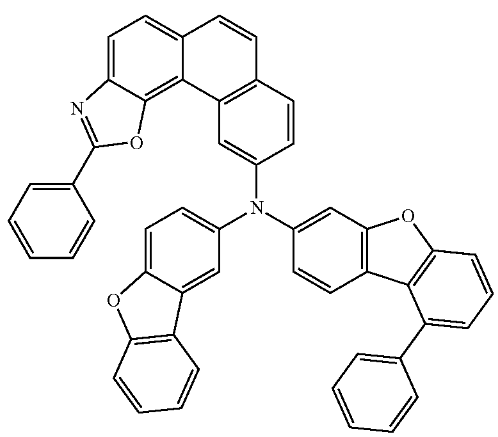
H1-121
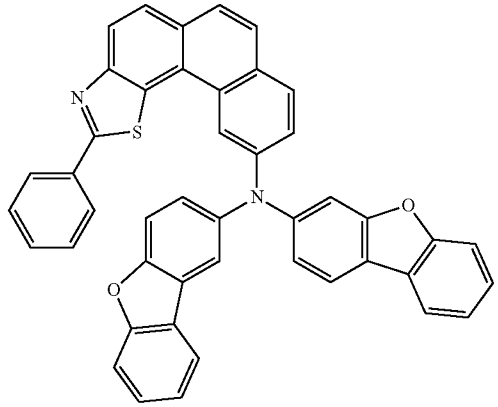
H1-122
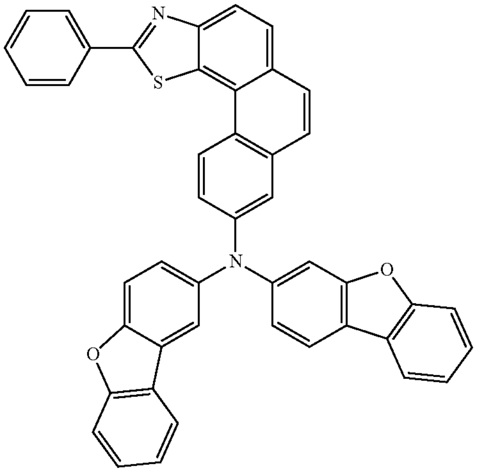
-continued
H1-123
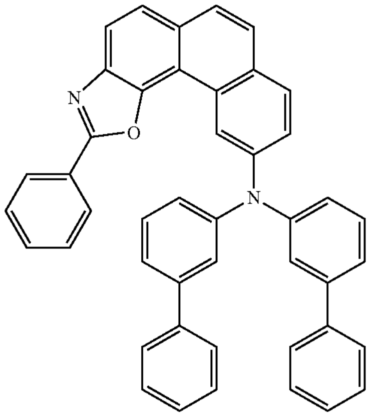
H1-124
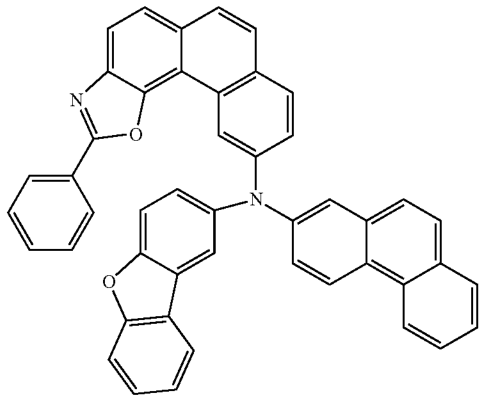
H1-125
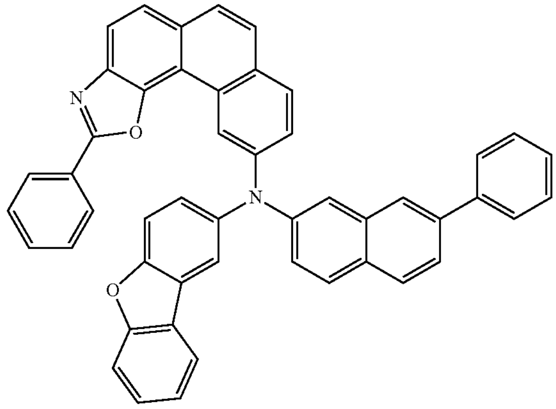

-continued
H1-126
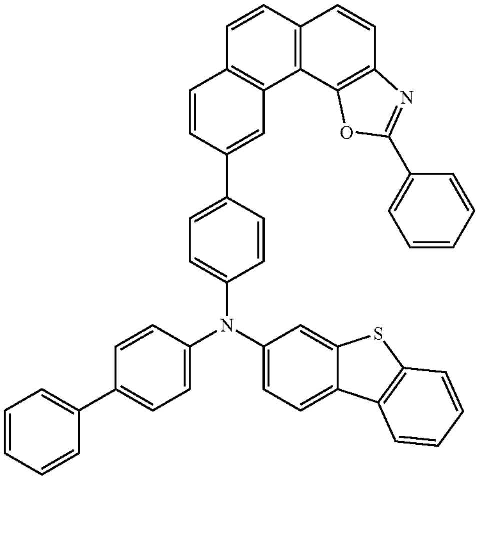
H1-127
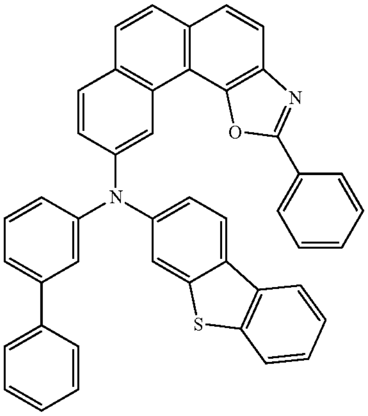
H1-128
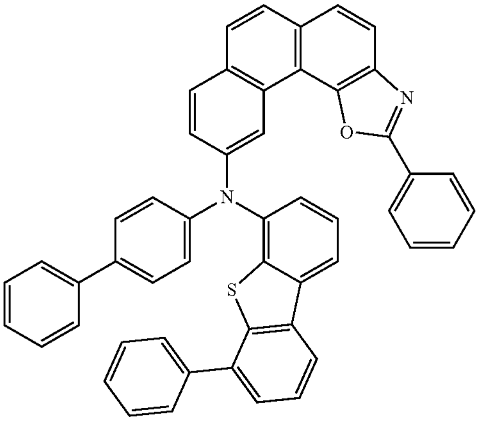
-continued
H1-129
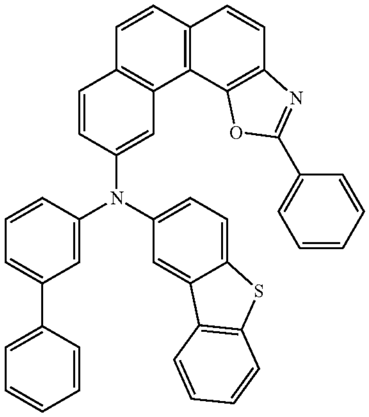
H1-130
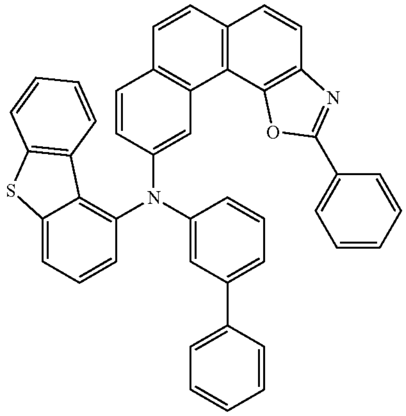
H1-131
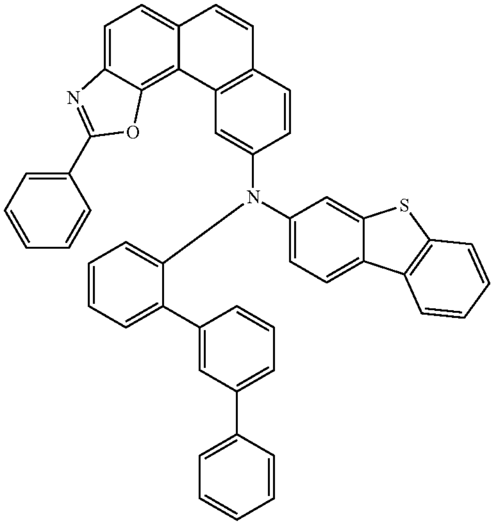

-continued
H1-132
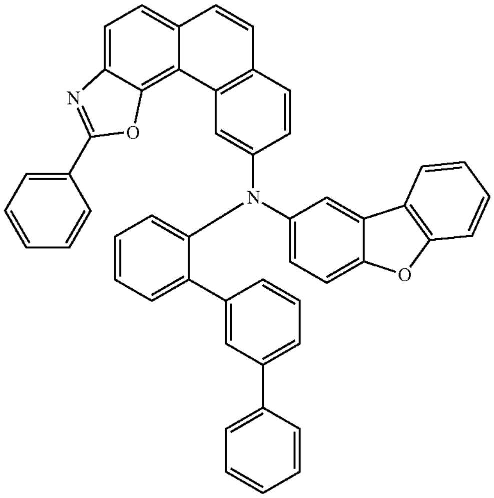
H1-133
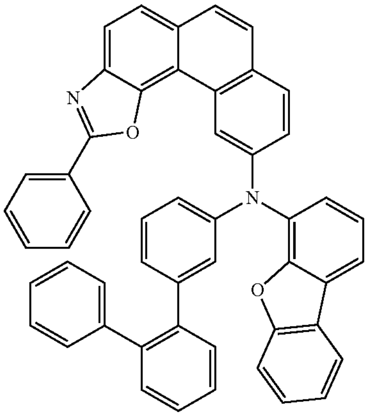
H1-134
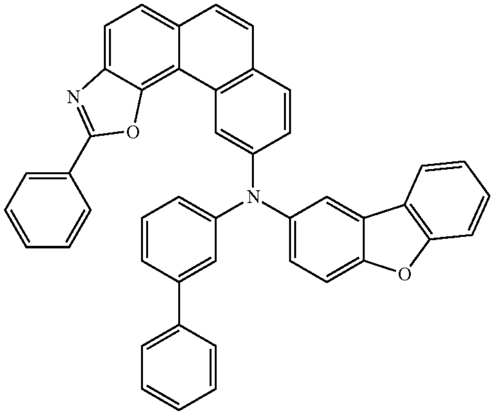
-continued
H1-135
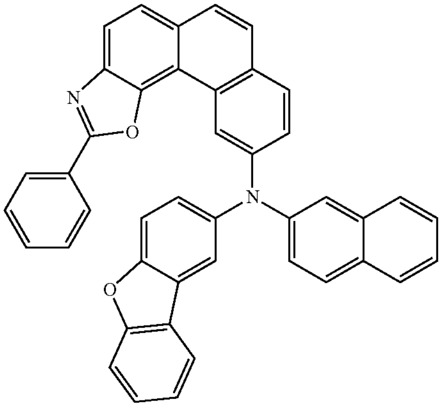
and
H1-136
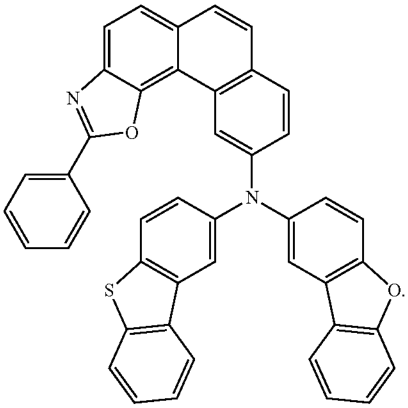
8. The plurality of host materials according to claim 1, wherein the compound represented by formula 2 is selected from the following compounds:
C-1
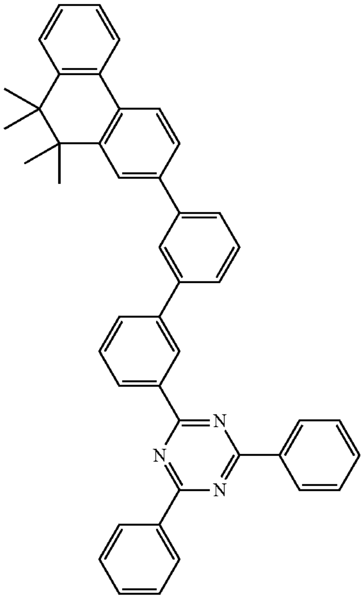

-continued
C-2
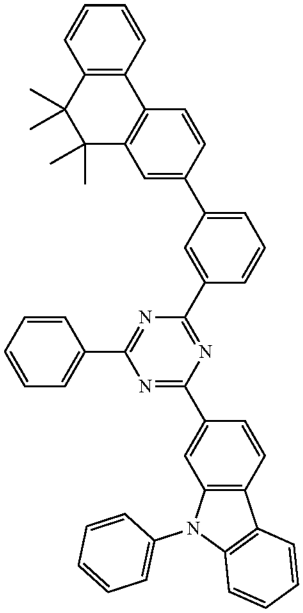
C-3
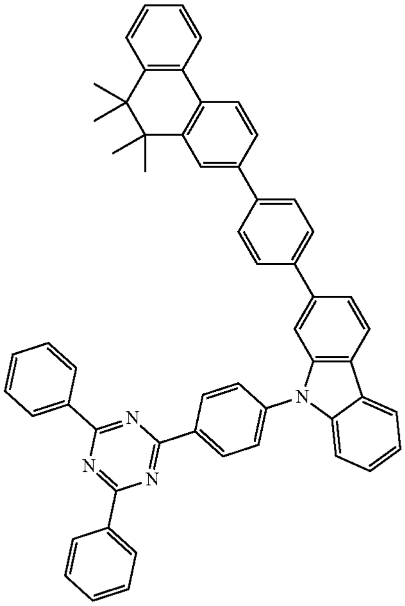
-continued
C-4
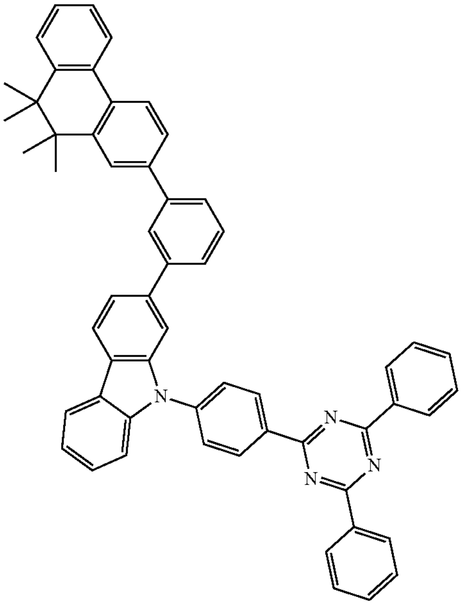
C-5
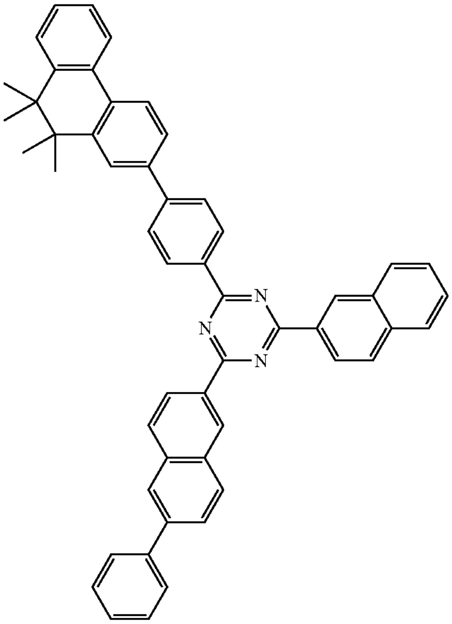

-continued
C-6
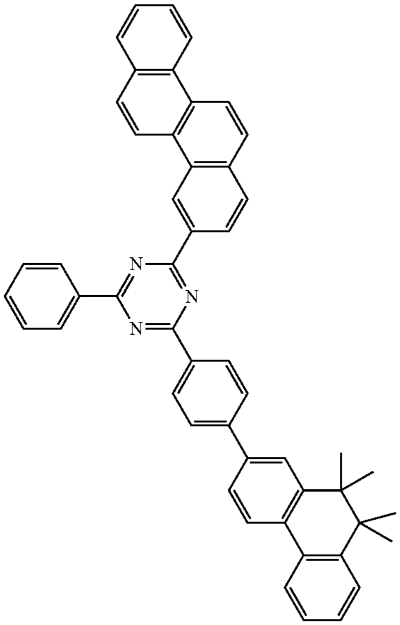
C-7
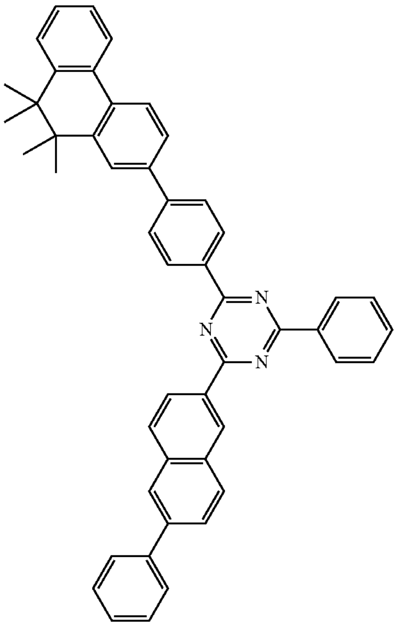
-continued
C-8
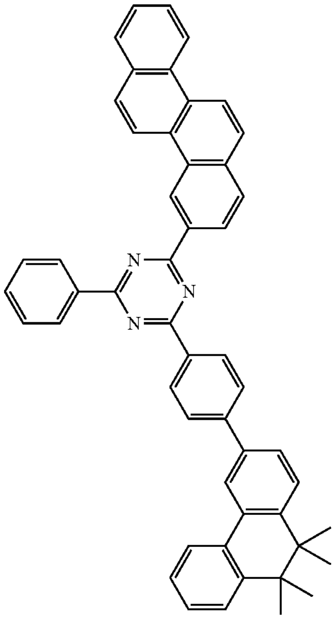
C-9
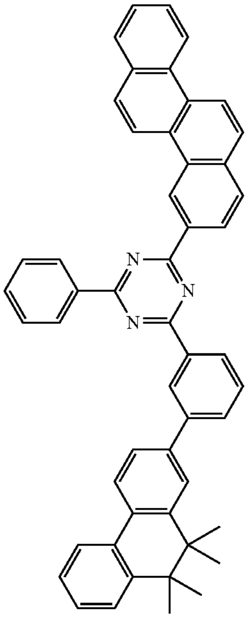

-continued
C-10
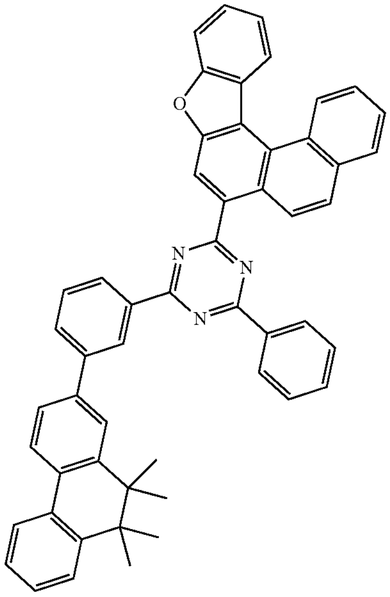
C-11
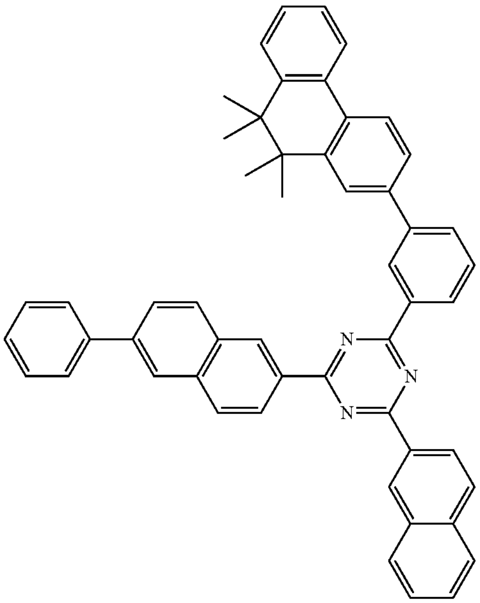
-continued
C-12
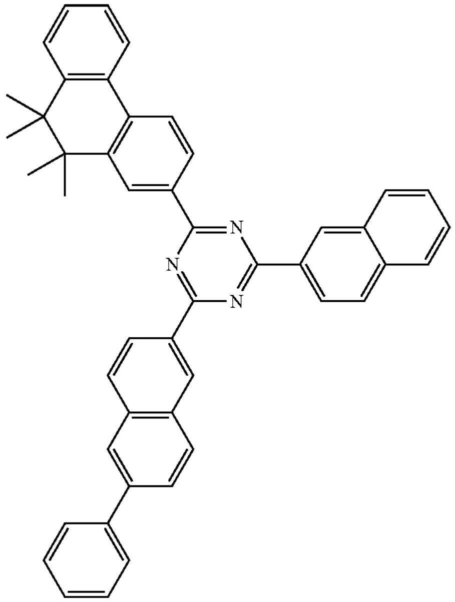
C-13
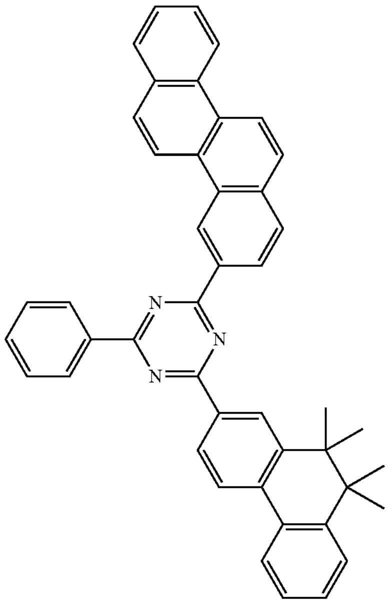

-continued
C-14
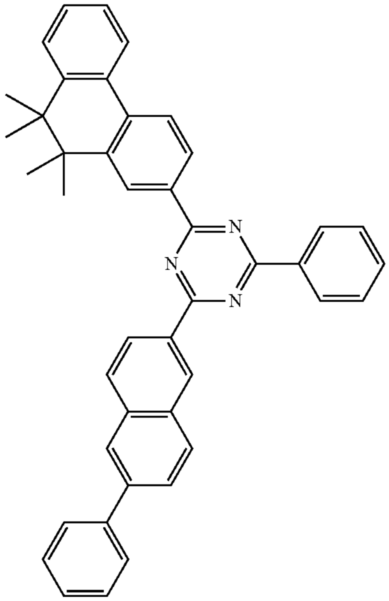
C-15
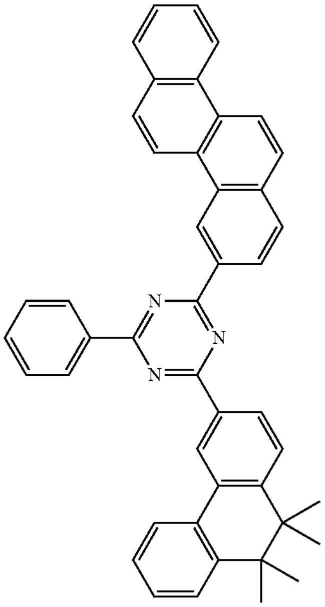
-continued
C-16
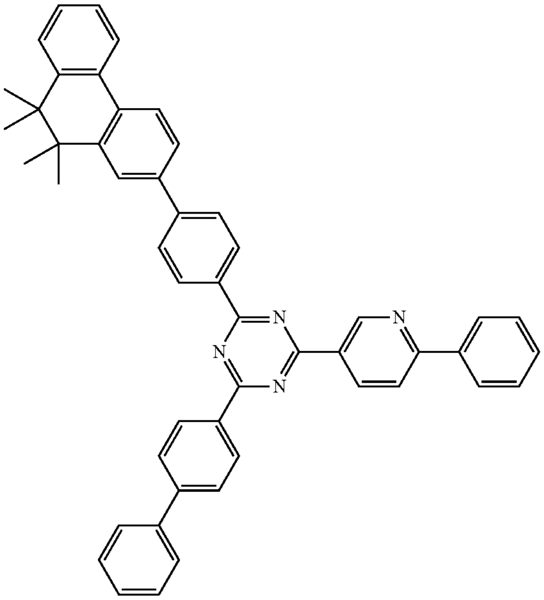
C-17
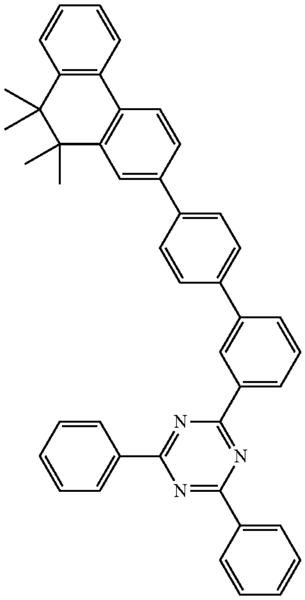

-continued
C-18
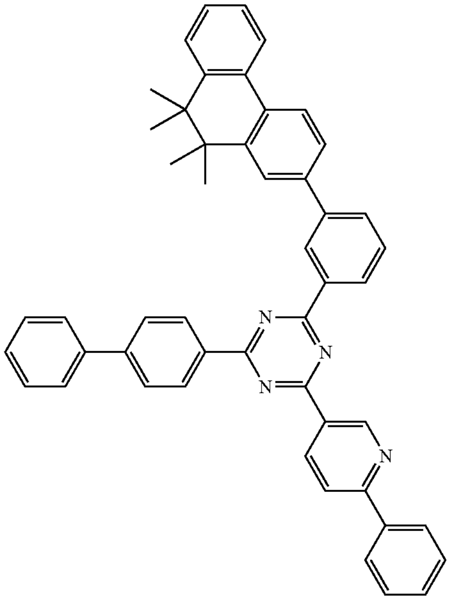
C-19
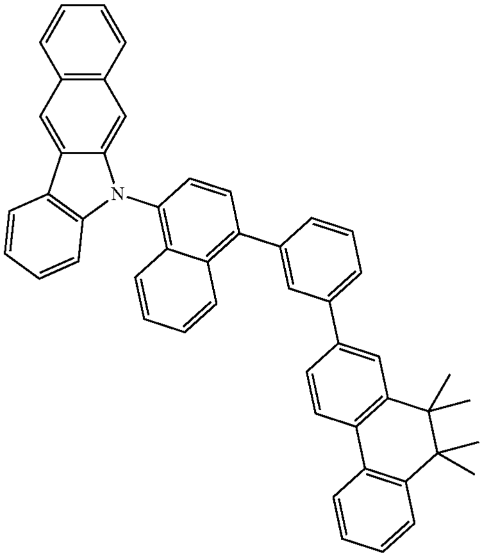
-continued
C-20
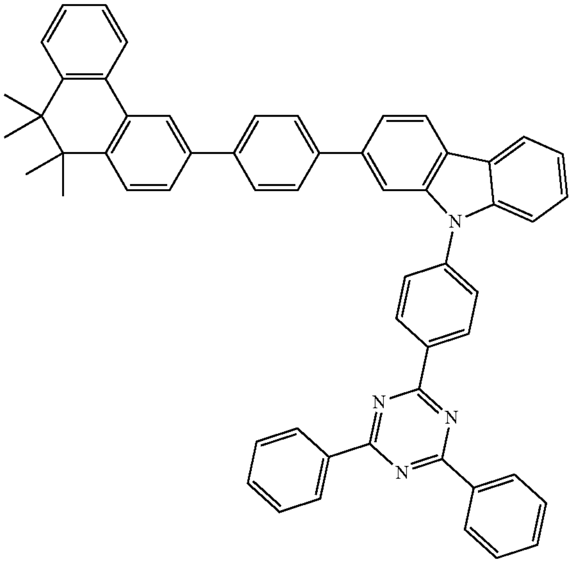
C-21
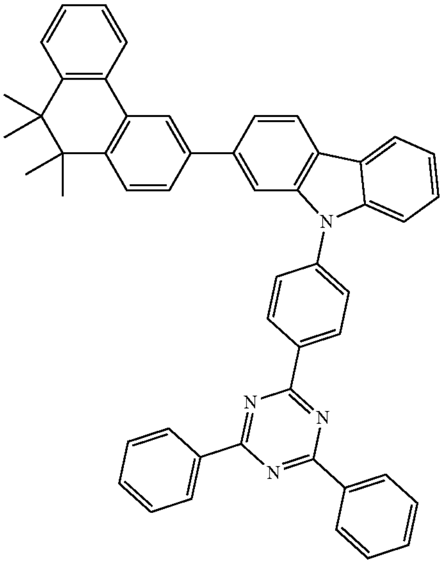

-continued
C-22
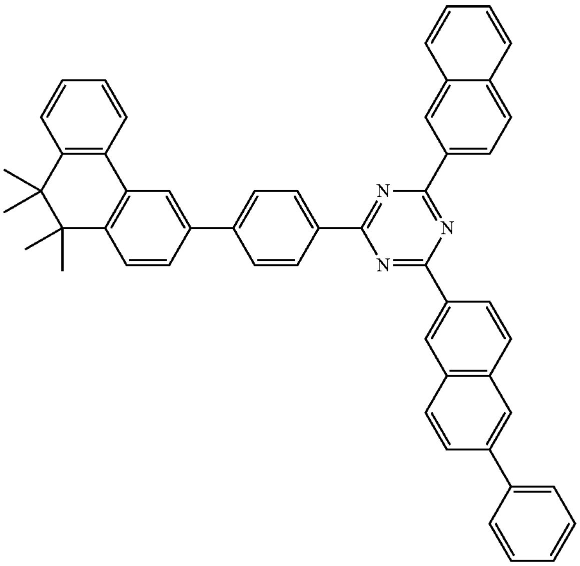
C-23
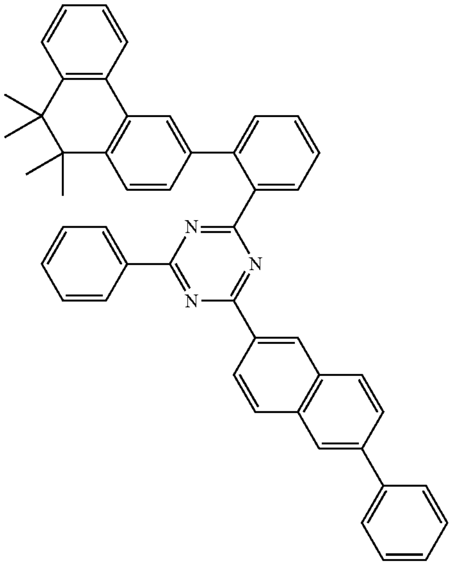
-continued
C-24
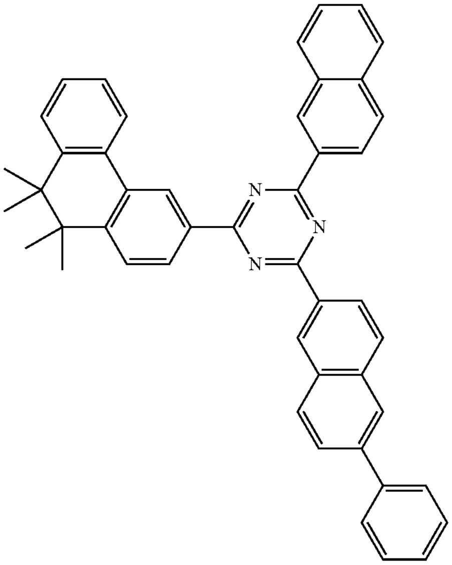
C-25
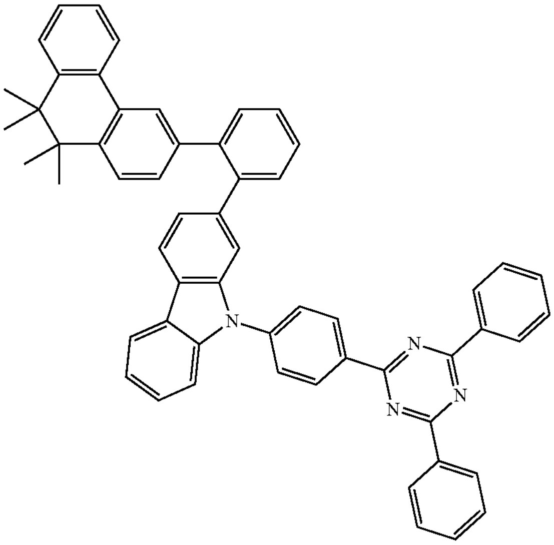
C-26
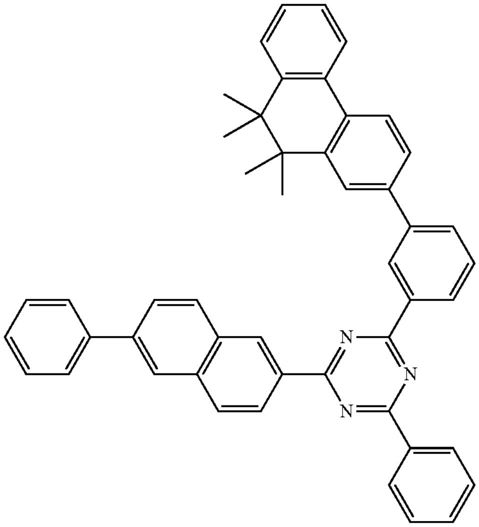

-continued
C-27
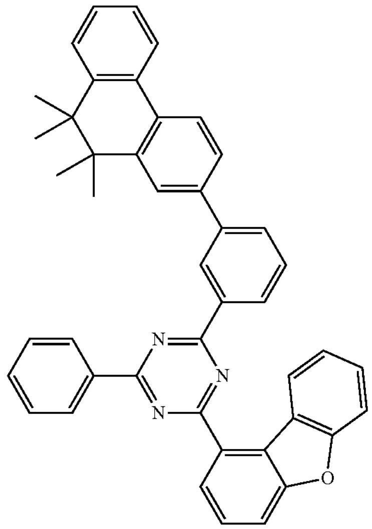
C-28
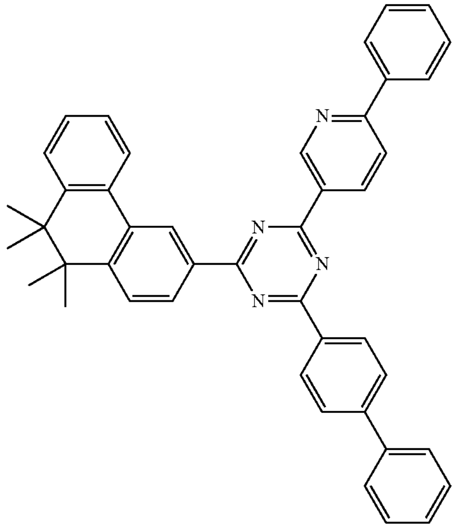
C-29
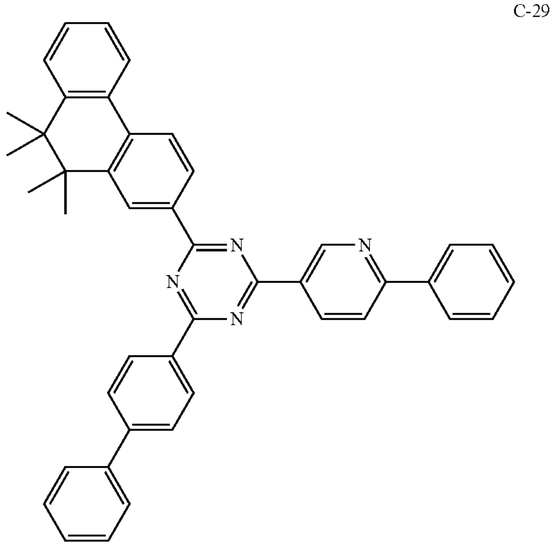
-continued
C-30
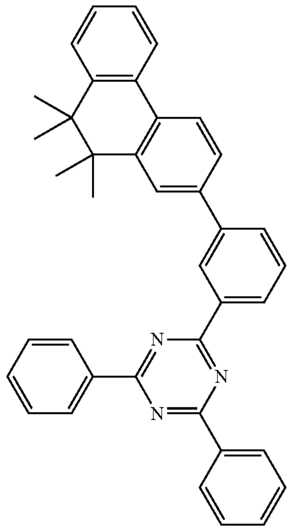
C-31
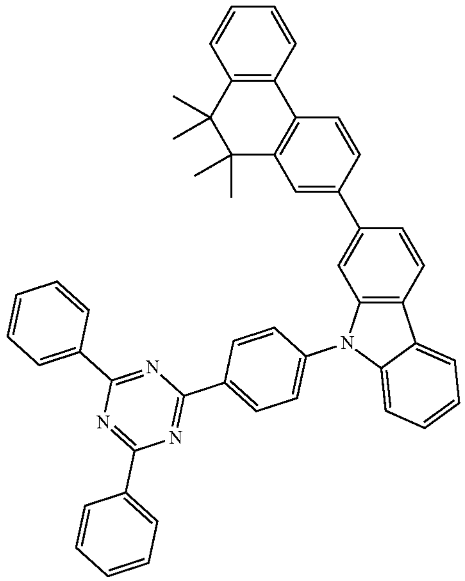
C-32
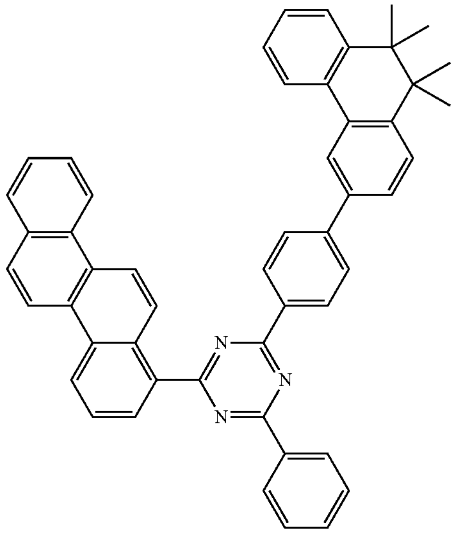

-continued
C-33
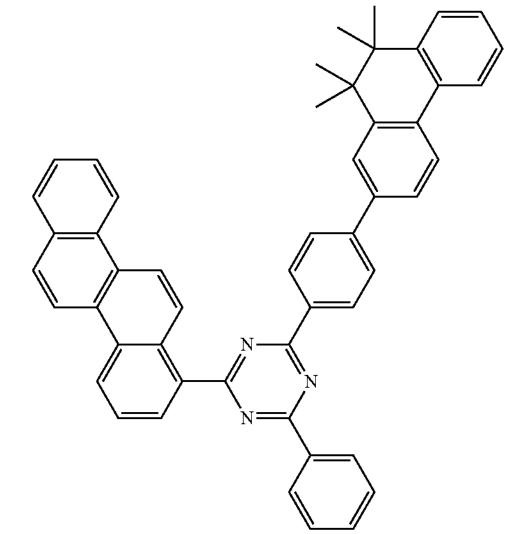
C-34
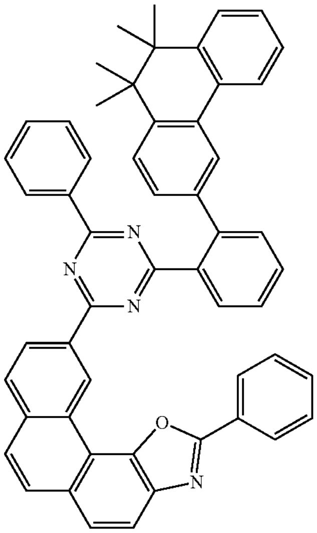
C-35
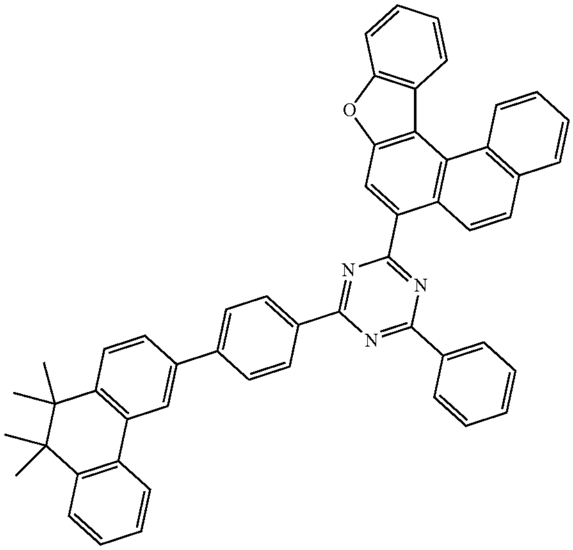
-continued
C-36
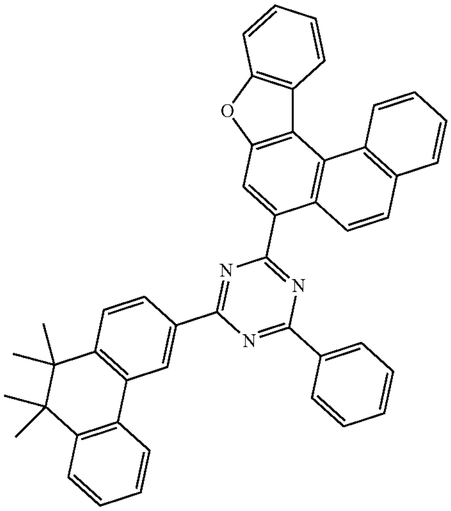
C-37
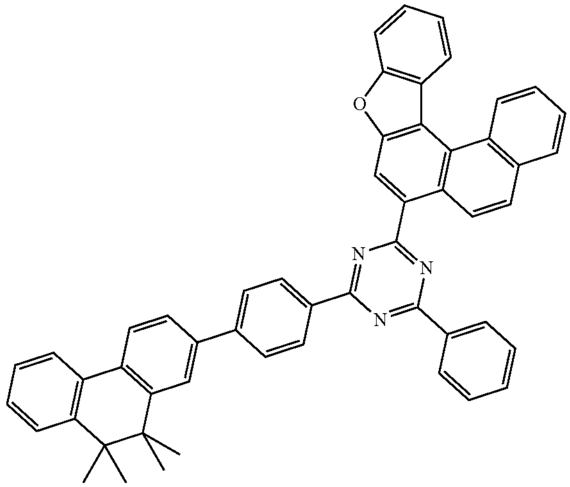
C-38
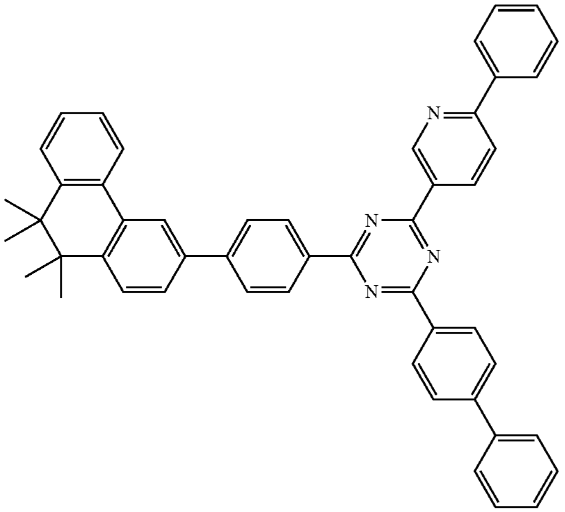

-continued
C-39
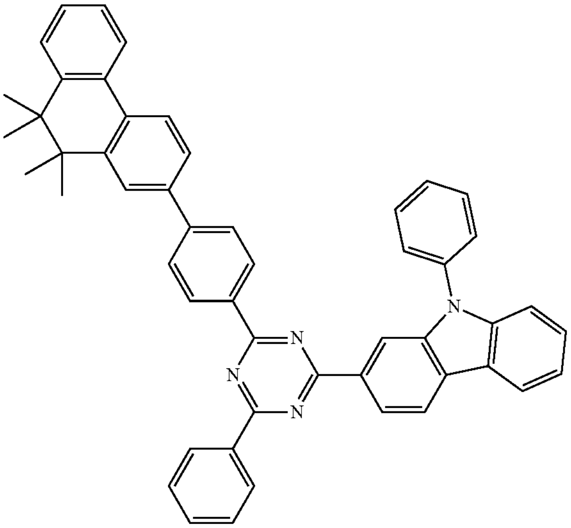
C-40
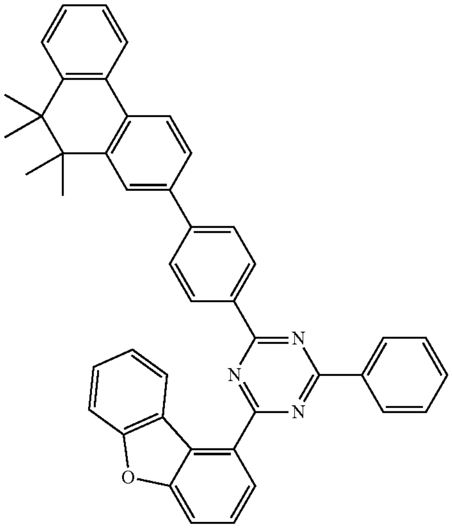
C-41
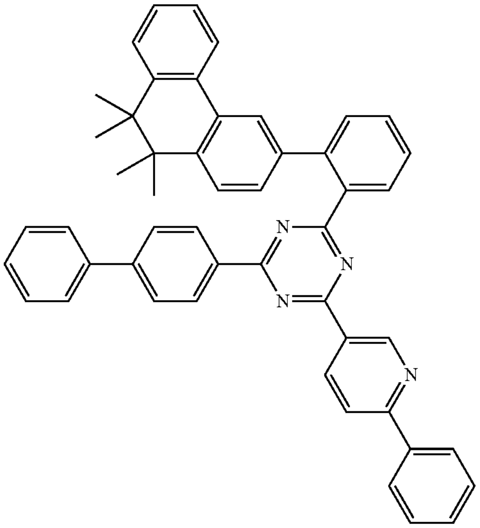
-continued
C-42
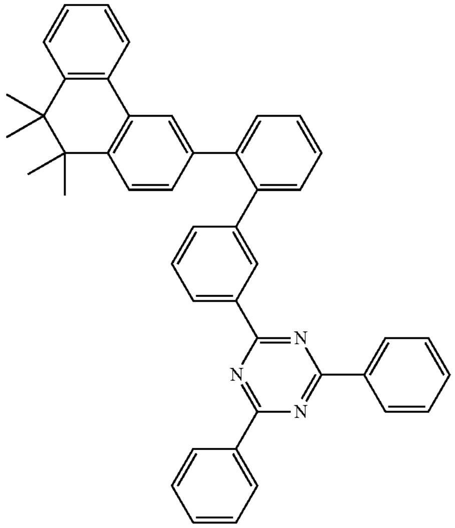
C-43
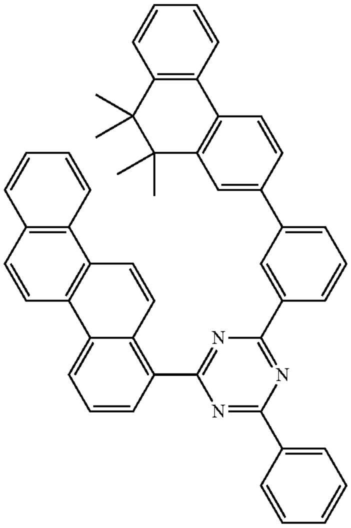
C-44
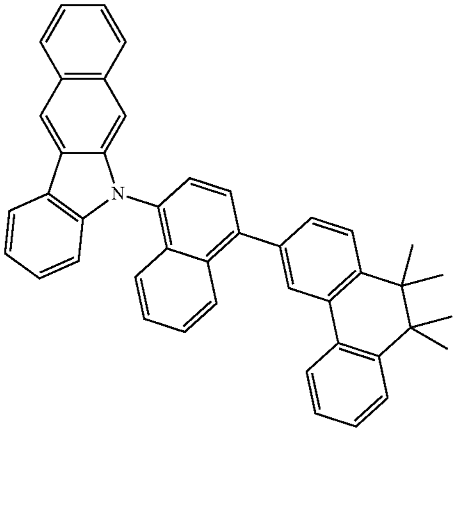

-continued
C-45
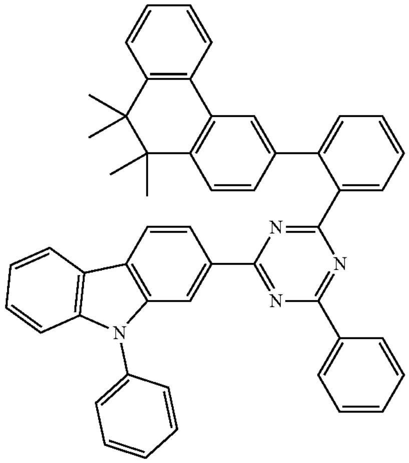
C-46
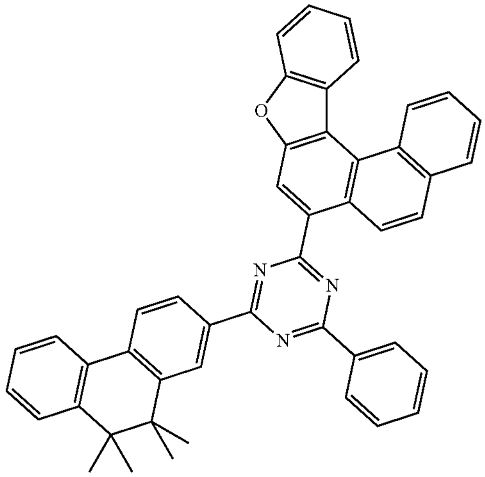
C-47
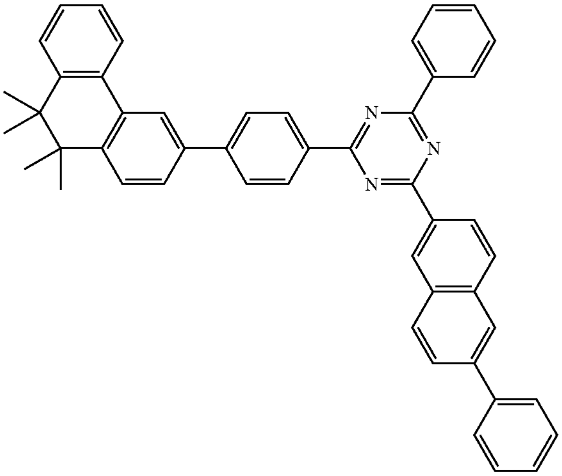
-continued
C-48
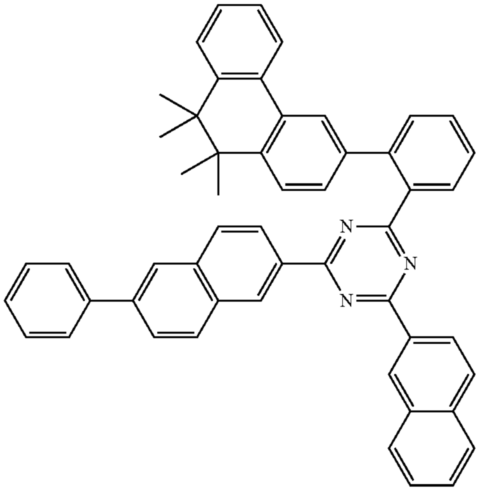
C-49
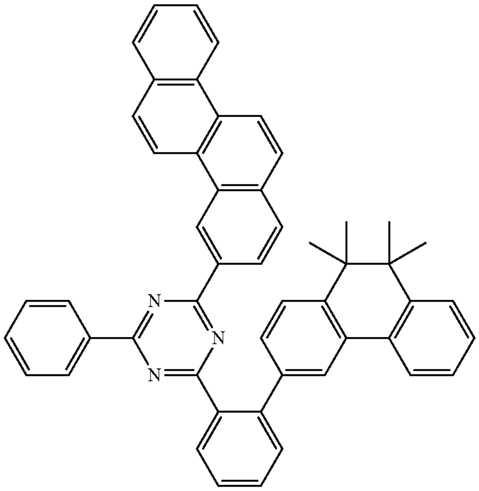
C-50
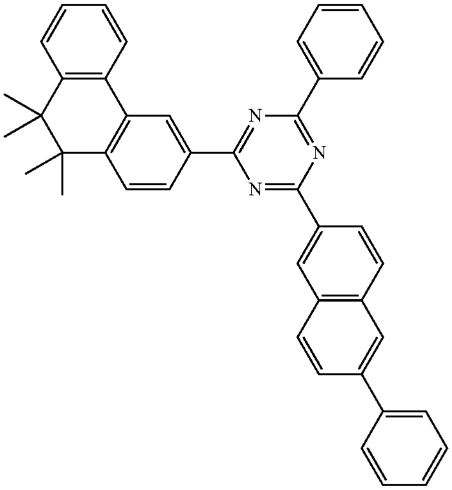

-continued
C-51
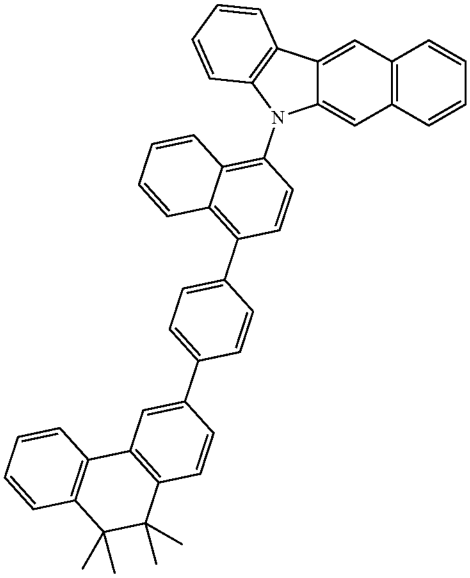
C-52
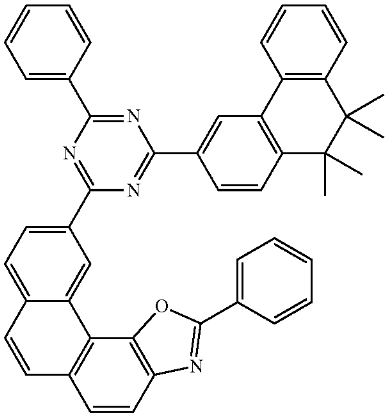
C-53
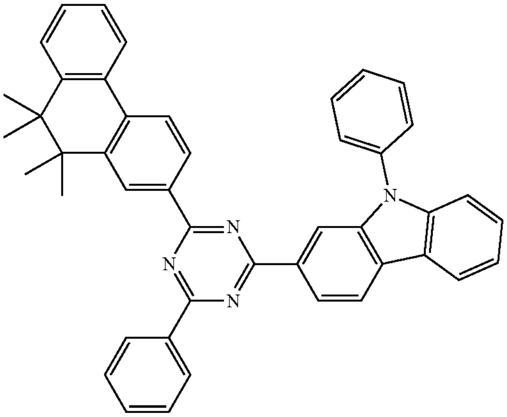
-continued
C-54
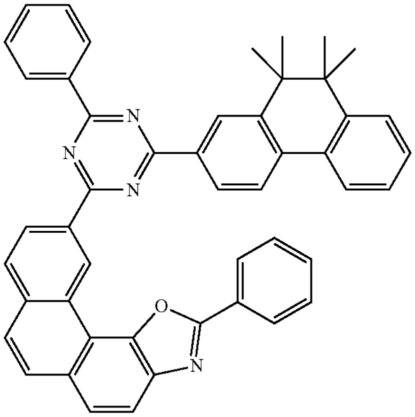
C-55
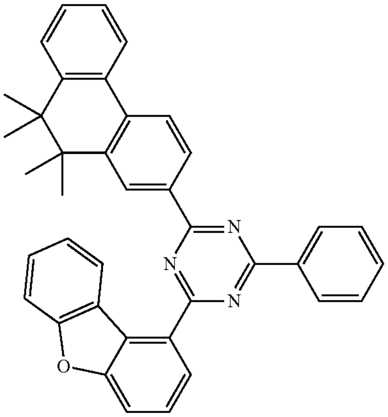
C-56
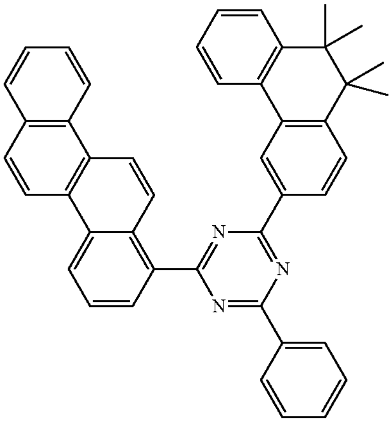

-continued
C-57
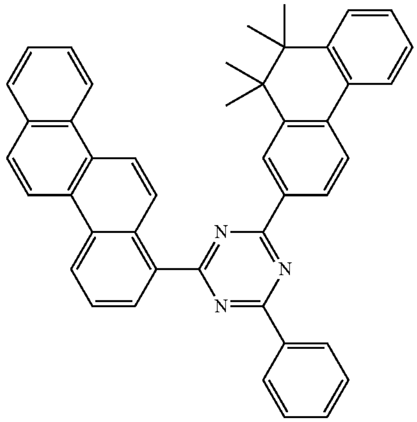
C-58
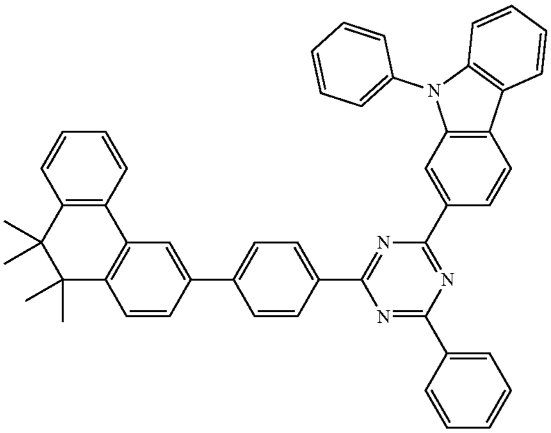
C-59
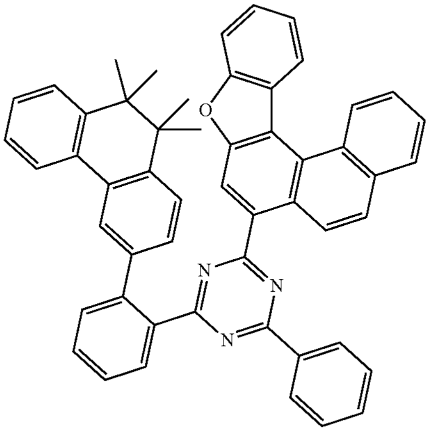
-continued
C-60
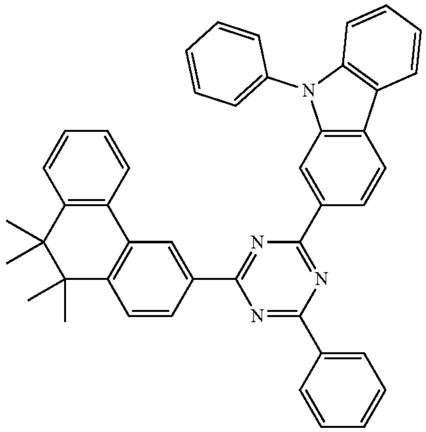
C-61
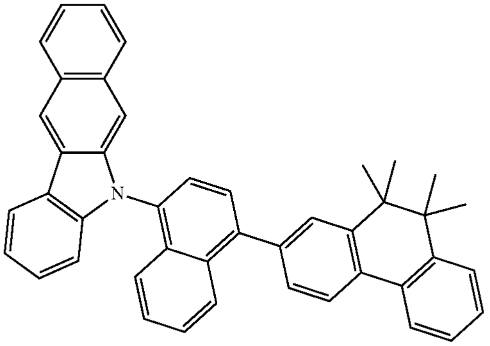
C-62
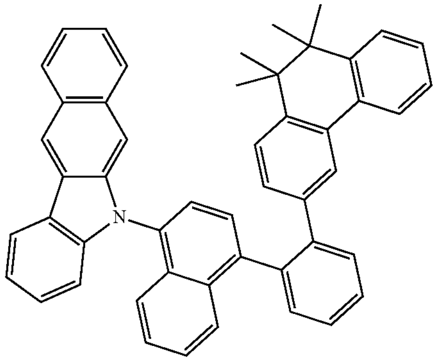
C-63
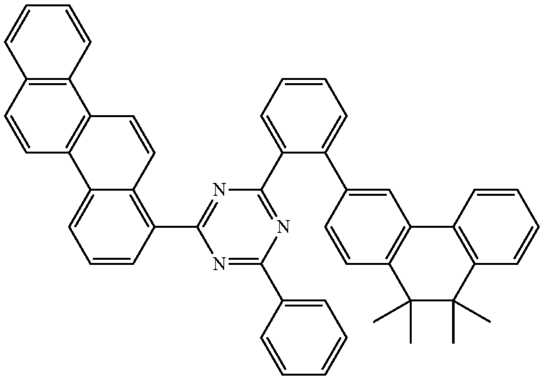

-continued
C-64
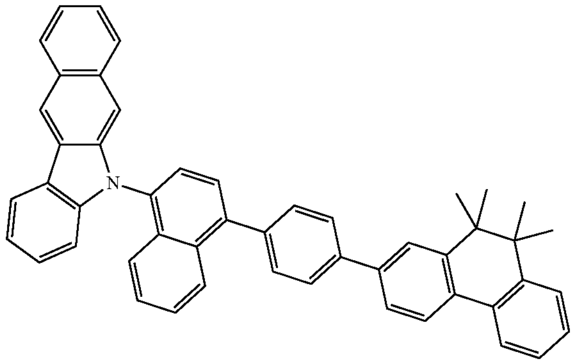
C-65
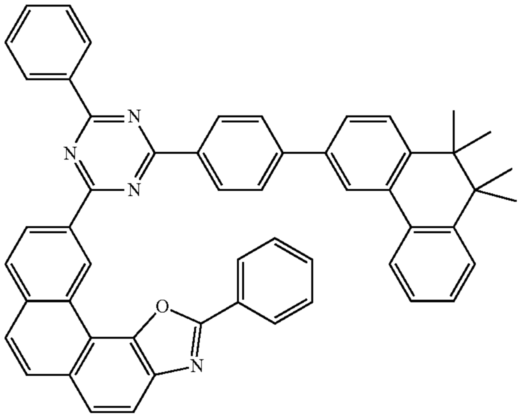
C-66
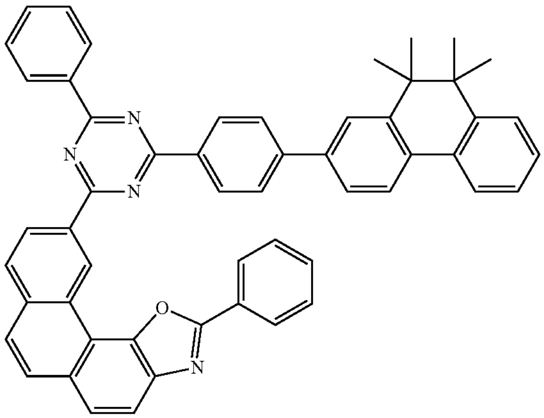
-continued
C-67
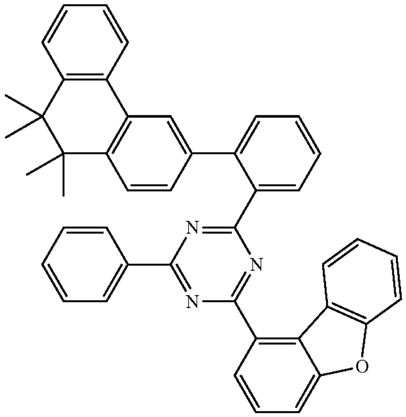
C-68
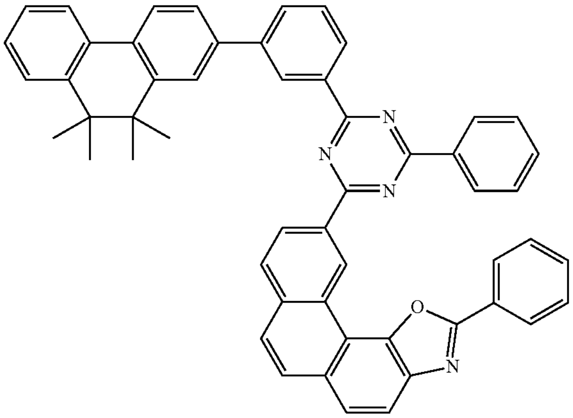
C-69
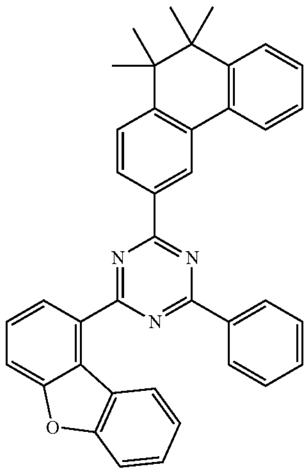

C-70
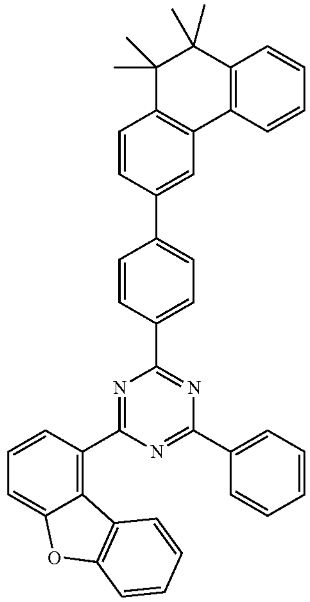
C-71
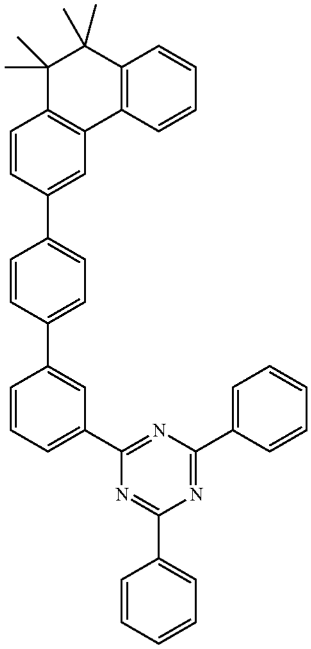
C-72
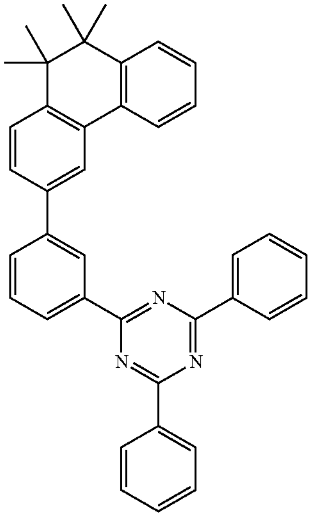
C-73
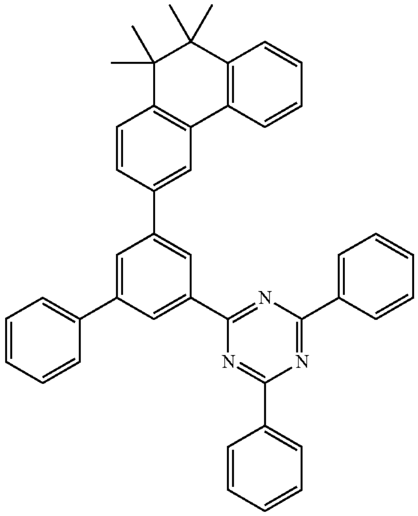
C-74
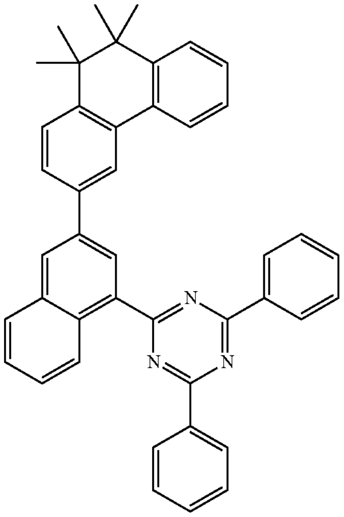
and -continued
C-75
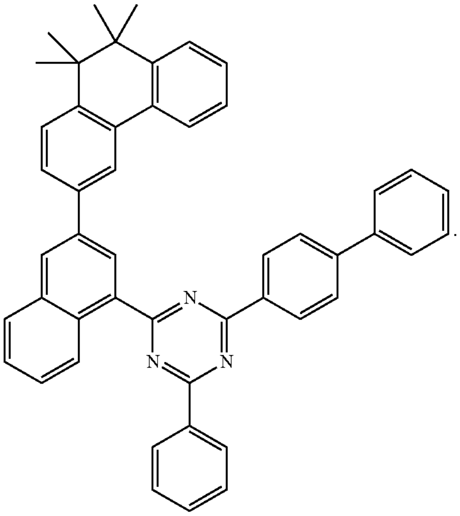
9. An organic electroluminescent device comprising: a first electrode; a second electrode; and at least one light-emitting layer(s) between the first electrode and the second electrode, wherein the at least one light-emitting layer(s) comprises the plurality of host materials according to claim 1.
* * * * *